United States Patent
Mitsunaga et al.

(10) Patent No.: US 7,570,285 B2
(45) Date of Patent: Aug. 4, 2009

(54) IMAGE PROCESSING DEVICE SUPPRESSING COLOR MOIRE WHEN RESTORING AN IMAGE

(75) Inventors: Tomoo Mitsunaga, Kanagawa (JP); Seiji Kobayashi, Tokyo (JP); Hiroaki Ono, Saitama (JP)

(73) Assignee: Sony Corporation, Tokyo (JP)

( * ) Notice: Subject to any disclaimer, the term of this patent is extended or adjusted under 35 U.S.C. 154(b) by 903 days.

(21) Appl. No.: 10/221,114

(22) PCT Filed: Jan. 9, 2002

(86) PCT No.: PCT/JP02/00034

§ 371 (c)(1),
(2), (4) Date: Jan. 24, 2003

(87) PCT Pub. No.: WO02/056602

PCT Pub. Date: Jul. 18, 2002

(65) Prior Publication Data

US 2003/0160875 A1      Aug. 28, 2003

(30) Foreign Application Priority Data

Jan. 9, 2001   (JP)   ............................. 2001-000977

(51) Int. Cl.
*H04N 9/68*   (2006.01)
(52) U.S. Cl. ...................................... 348/234; 348/266
(58) Field of Classification Search .................. 348/266
See application file for complete search history.

(56) References Cited

U.S. PATENT DOCUMENTS 5,119,180 A    6/1992  Okamoto
5,289,286 A *  2/1994  Nakamura et al. ........ 348/223.1
5,471,243 A * 11/1995  Suzuki et al. ............... 348/234
6,091,862 A    7/2000  Okisu
6,229,578 B1 * 5/2001  Acharya et al. ............. 348/607

(Continued)

FOREIGN PATENT DOCUMENTS

| JP | 2-166987    | 6/1990 |
| JP | 10-164602   | 6/1998 |
| JP | P2001-61157 A | 3/2001 |

*Primary Examiner*—Sinh N Tran
*Assistant Examiner*—Anthony J Daniels
(74) *Attorney, Agent, or Firm*—K&L Gates LLP

(57) ABSTRACT

The present invention relates to an image processing apparatus which suppresses appearance of a color moire of a color image signal of a wide dynamic range which is produced using an image signal acquired using, for example, a CCD image sensor of the single plate type or the like. A gradation conversion section 71 performs a gradation conversion process for a color mosaic image M to produce a modulated color mosaic image Mg. Color difference image production sections 72 and 3 use the modulated color mosaic image Mg to produce color difference images C and D, respectively. A luminance image production section 74 uses the modulated color mosaic image Mg and the color difference signals C and D to produce a luminance image L. A color space conversion section 75 performs a color space conversion process for the color difference images C and D and the luminance image L to produce modulated images. Gradation reverse conversion sections 76 to 78 perform a modulation reverse conversion process for the modulated images to produce output images R, G and B, respectively. The present invention can be applied, for example, to a digital camera.

36 Claims, 90 Drawing Sheets

U.S. PATENT DOCUMENTS 6,563,534 B1 * 5/2003 Shimizu ................. 348/222.1
6,570,616 B1 * 5/2003 Chen ........................ 348/272
2005/0285968 A1 * 12/2005 Sugimori ................... 348/345

* cited by examiner

FIG. 5

| $R_1$ | $G_1$ | $B_1$ | $G_1$ | $R_1$ | $G_1$ | $B_1$ | $G_1$ |
|---|---|---|---|---|---|---|---|
| $G_0$ | $B_0$ | $G_0$ | $R_0$ | $G_0$ | $B_0$ | $G_0$ | $R_0$ |
| $B_1$ | $G_1$ | $R_1$ | $G_1$ | $B_1$ | $G_1$ | $R_1$ | $G_1$ |
| $G_0$ | $R_0$ | $G_0$ | $B_0$ | $G_0$ | $R_0$ | $G_0$ | $B_0$ |
| $R_1$ | $G_1$ | $B_1$ | $G_1$ | $R_1$ | $G_1$ | $B_1$ | $G_1$ |
| $G_0$ | $B_0$ | $G_0$ | $R_0$ | $G_0$ | $B_0$ | $G_0$ | $R_0$ |
| $B_1$ | $G_1$ | $R_1$ | $G_1$ | $B_1$ | $G_1$ | $R_1$ | $G_1$ |
| $G_0$ | $R_0$ | $G_0$ | $B_0$ | $G_0$ | $R_0$ | $G_0$ | $B_0$ |

FIG. 6

| $R_1$ | $G_1$ | $R_0$ | $G_1$ | $R_1$ | $G_1$ | $R_0$ | $G_1$ |
|---|---|---|---|---|---|---|---|
| $G_0$ | $B_0$ | $G_0$ | $B_1$ | $G_0$ | $B_0$ | $G_0$ | $B_1$ |
| $R_0$ | $G_1$ | $R_1$ | $G_1$ | $R_0$ | $G_1$ | $R_1$ | $G_1$ |
| $G_0$ | $B_1$ | $G_0$ | $B_0$ | $G_0$ | $B_1$ | $G_0$ | $B_0$ |
| $R_1$ | $G_1$ | $R_0$ | $G_1$ | $R_1$ | $G_1$ | $R_0$ | $G_1$ |
| $G_0$ | $B_0$ | $G_0$ | $B_1$ | $G_0$ | $B_0$ | $G_0$ | $B_1$ |
| $R_0$ | $G_1$ | $R_1$ | $G_1$ | $R_0$ | $G_1$ | $R_1$ | $G_1$ |
| $G_0$ | $B_1$ | $G_0$ | $B_0$ | $G_0$ | $B_1$ | $G_0$ | $B_0$ |

FIG. 7

| $G_1$ | $B_0$ | $G_1$ | $R_0$ | $G_1$ | $B_0$ | $G_1$ | $R_0$ |
|---|---|---|---|---|---|---|---|
| $G_0$ | $R_1$ | $G_0$ | $B_1$ | $G_0$ | $R_1$ | $G_0$ | $B_1$ |
| $G_1$ | $R_0$ | $G_1$ | $B_0$ | $G_1$ | $R_0$ | $G_1$ | $B_0$ |
| $G_0$ | $B_1$ | $G_0$ | $R_1$ | $G_0$ | $B_1$ | $G_0$ | $R_1$ |
| $G_1$ | $B_0$ | $G_1$ | $R_0$ | $G_1$ | $B_0$ | $G_1$ | $R_0$ |
| $G_0$ | $R_1$ | $G_0$ | $B_1$ | $G_0$ | $R_1$ | $G_0$ | $B_1$ |
| $G_1$ | $R_0$ | $G_1$ | $B_0$ | $G_1$ | $R_0$ | $G_1$ | $B_0$ |
| $G_0$ | $B_1$ | $G_0$ | $R_1$ | $G_0$ | $B_1$ | $G_0$ | $R_1$ |

FIG. 8

| $G_1$ | $B_1$ | $G_1$ | $B_0$ | $G_1$ | $B_1$ | $G_1$ | $B_0$ |
|---|---|---|---|---|---|---|---|
| $G_0$ | $R_1$ | $G_0$ | $R_0$ | $G_0$ | $R_1$ | $G_0$ | $R_0$ |
| $G_1$ | $B_0$ | $G_1$ | $B_1$ | $G_1$ | $B_0$ | $G_1$ | $B_1$ |
| $G_0$ | $R_0$ | $G_0$ | $R_1$ | $G_0$ | $R_0$ | $G_0$ | $R_1$ |
| $G_1$ | $B_1$ | $G_1$ | $B_0$ | $G_1$ | $B_1$ | $G_1$ | $B_0$ |
| $G_0$ | $R_1$ | $G_0$ | $R_0$ | $G_0$ | $R_1$ | $G_0$ | $R_0$ |
| $G_1$ | $B_0$ | $G_1$ | $B_1$ | $G_1$ | $B_0$ | $G_1$ | $B_1$ |
| $G_0$ | $R_0$ | $G_0$ | $R_1$ | $G_0$ | $R_0$ | $G_0$ | $R_1$ |

FIG. 9

| $G_1$ | $B_1$ | $G_1$ | $R_1$ | $G_1$ | $B_1$ | $G_1$ | $R_1$ |
|---|---|---|---|---|---|---|---|
| $G_0$ | $B_0$ | $G_0$ | $R_0$ | $G_0$ | $B_0$ | $G_0$ | $R_0$ |
| $G_1$ | $R_1$ | $G_1$ | $B_1$ | $G_1$ | $R_1$ | $G_1$ | $B_1$ |
| $G_0$ | $R_0$ | $G_0$ | $B_0$ | $G_0$ | $R_0$ | $G_0$ | $B_0$ |
| $G_1$ | $B_1$ | $G_1$ | $R_1$ | $G_1$ | $B_1$ | $G_1$ | $R_1$ |
| $G_0$ | $B_0$ | $G_0$ | $R_0$ | $G_0$ | $B_0$ | $G_0$ | $R_0$ |
| $G_1$ | $R_1$ | $G_1$ | $B_1$ | $G_1$ | $R_1$ | $G_1$ | $B_1$ |
| $G_0$ | $R_0$ | $G_0$ | $B_0$ | $G_0$ | $R_0$ | $G_0$ | $B_0$ |

FIG. 10

| $M_1$ | $Y_1$ | $M_0$ | $Y_0$ | $M_1$ | $Y_1$ | $M_0$ | $Y_0$ |
|---|---|---|---|---|---|---|---|
| $G_1$ | $C_1$ | $G_0$ | $C_0$ | $G_1$ | $C_1$ | $G_0$ | $C_0$ |
| $M_0$ | $Y_0$ | $M_1$ | $Y_1$ | $M_0$ | $Y_0$ | $M_1$ | $Y_1$ |
| $G_0$ | $C_0$ | $G_1$ | $C_1$ | $G_0$ | $C_0$ | $G_1$ | $C_1$ |
| $M_1$ | $Y_1$ | $M_0$ | $Y_0$ | $M_1$ | $Y_1$ | $M_0$ | $Y_0$ |
| $G_1$ | $C_1$ | $G_0$ | $C_0$ | $G_1$ | $C_1$ | $G_0$ | $C_0$ |
| $M_0$ | $Y_0$ | $M_1$ | $Y_1$ | $M_0$ | $Y_0$ | $M_1$ | $Y_1$ |
| $G_0$ | $C_0$ | $G_1$ | $C_1$ | $G_0$ | $C_0$ | $G_1$ | $C_1$ |

FIG. 11

| $Y_1$ | $M_0$ | $G_1$ | $C_0$ | $Y_1$ | $M_0$ | $G_1$ | $C_0$ |
|---|---|---|---|---|---|---|---|
| $Y_0$ | $C_1$ | $G_0$ | $M_1$ | $Y_0$ | $C_1$ | $G_0$ | $M_1$ |
| $G_1$ | $C_0$ | $Y_1$ | $M_0$ | $G_1$ | $C_0$ | $Y_1$ | $M_0$ |
| $G_0$ | $M_1$ | $Y_0$ | $C_1$ | $G_0$ | $M_1$ | $Y_0$ | $C_1$ |
| $Y_1$ | $M_0$ | $G_1$ | $C_0$ | $Y_1$ | $M_0$ | $G_1$ | $C_0$ |
| $Y_0$ | $C_1$ | $G_0$ | $M_1$ | $Y_0$ | $C_1$ | $G_0$ | $M_1$ |
| $G_1$ | $C_0$ | $Y_1$ | $M_0$ | $G_1$ | $C_0$ | $Y_1$ | $M_0$ |
| $G_0$ | $M_1$ | $Y_0$ | $C_1$ | $G_0$ | $M_1$ | $Y_0$ | $C_1$ |

FIG. 12

| $G_2$ | $R_2$ | $B_2$ | $G_2$ | $R_2$ | $B_2$ |
|---|---|---|---|---|---|
| $G_1$ | $R_1$ | $B_1$ | $G_1$ | $R_1$ | $B_1$ |
| $G_0$ | $R_0$ | $B_0$ | $G_0$ | $R_0$ | $B_0$ |
| $G_2$ | $R_2$ | $B_2$ | $G_2$ | $R_2$ | $B_2$ |
| $G_1$ | $R_1$ | $B_1$ | $G_1$ | $R_1$ | $B_1$ |
| $G_0$ | $R_0$ | $B_0$ | $G_0$ | $R_0$ | $B_0$ |

FIG. 13

| $B_2$ | $R_0$ | $G_1$ | $B_2$ | $R_0$ | $G_1$ |
|---|---|---|---|---|---|
| $R_1$ | $G_2$ | $B_0$ | $R_1$ | $G_2$ | $B_0$ |
| $G_0$ | $B_1$ | $R_2$ | $G_0$ | $B_1$ | $R_2$ |
| $B_2$ | $R_0$ | $G_1$ | $B_2$ | $R_0$ | $G_1$ |
| $R_1$ | $G_2$ | $B_0$ | $R_1$ | $G_2$ | $B_0$ |
| $G_0$ | $B_1$ | $R_2$ | $G_0$ | $B_1$ | $R_2$ |

FIG. 14

| $B_3$ | $G_2$ | $B_0$ | $G_3$ | $B_3$ | $G_2$ | $B_0$ | $G_3$ |
|---|---|---|---|---|---|---|---|
| $G_1$ | $R_2$ | $G_0$ | $R_1$ | $G_1$ | $R_2$ | $G_0$ | $R_1$ |
| $B_1$ | $G_3$ | $B_2$ | $G_2$ | $B_1$ | $G_3$ | $B_2$ | $G_2$ |
| $G_0$ | $R_0$ | $G_1$ | $R_3$ | $G_0$ | $R_0$ | $G_1$ | $R_3$ |
| $B_3$ | $G_2$ | $B_0$ | $G_3$ | $B_3$ | $G_2$ | $B_0$ | $G_3$ |
| $G_1$ | $R_2$ | $G_0$ | $R_1$ | $G_1$ | $R_2$ | $G_0$ | $R_1$ |
| $B_1$ | $G_3$ | $B_2$ | $G_2$ | $B_1$ | $G_3$ | $B_2$ | $G_2$ |
| $G_0$ | $R_0$ | $G_1$ | $R_3$ | $G_0$ | $R_0$ | $G_1$ | $R_3$ |

FIG. 15

| B$_3$ | G$_1$ | B$_0$ | G$_2$ | B$_3$ | G$_1$ | B$_0$ | G$_2$ |
|---|---|---|---|---|---|---|---|
| G$_2$ | R$_2$ | G$_1$ | R$_1$ | G$_2$ | R$_2$ | G$_1$ | R$_1$ |
| B$_1$ | G$_3$ | B$_2$ | G$_0$ | B$_1$ | G$_3$ | B$_2$ | G$_0$ |
| G$_0$ | R$_0$ | G$_3$ | R$_3$ | G$_0$ | R$_0$ | G$_3$ | R$_3$ |
| B$_3$ | G$_1$ | B$_0$ | G$_2$ | B$_3$ | G$_1$ | B$_0$ | G$_2$ |
| G$_2$ | R$_2$ | G$_1$ | R$_1$ | G$_2$ | R$_2$ | G$_1$ | R$_1$ |
| B$_1$ | G$_3$ | B$_2$ | G$_0$ | B$_1$ | G$_3$ | B$_2$ | G$_0$ |
| G$_0$ | R$_0$ | G$_3$ | R$_3$ | G$_0$ | R$_0$ | G$_3$ | R$_3$ |

FIG. 16

| G$_3$ | G$_1$ | R$_3$ | B$_1$ | G$_3$ | G$_1$ | R$_3$ | B$_1$ |
|---|---|---|---|---|---|---|---|
| R$_0$ | B$_2$ | G$_0$ | G$_2$ | R$_0$ | B$_2$ | G$_0$ | G$_2$ |
| B$_3$ | R$_1$ | G$_3$ | G$_1$ | B$_3$ | R$_1$ | G$_3$ | G$_1$ |
| G$_0$ | G$_2$ | B$_0$ | R$_2$ | G$_0$ | G$_2$ | B$_0$ | R$_2$ |
| G$_3$ | G$_1$ | R$_3$ | B$_1$ | G$_3$ | G$_1$ | R$_3$ | B$_1$ |
| R$_0$ | B$_2$ | G$_0$ | G$_2$ | R$_0$ | B$_2$ | G$_0$ | G$_2$ |
| B$_3$ | R$_1$ | G$_3$ | G$_1$ | B$_3$ | R$_1$ | G$_3$ | G$_1$ |
| G$_0$ | G$_2$ | B$_0$ | R$_2$ | G$_0$ | G$_2$ | B$_0$ | R$_2$ |

FIG. 17

| $M_2$ | $Y_1$ | $M_3$ | $Y_0$ | $M_2$ | $Y_1$ | $M_3$ | $Y_0$ |
|---|---|---|---|---|---|---|---|
| $G_2$ | $C_1$ | $G_3$ | $C_0$ | $G_2$ | $C_1$ | $G_3$ | $C_0$ |
| $M_0$ | $Y_3$ | $M_1$ | $Y_2$ | $M_0$ | $Y_3$ | $M_1$ | $Y_2$ |
| $G_0$ | $C_3$ | $G_1$ | $C_2$ | $G_0$ | $C_3$ | $G_1$ | $C_2$ |
| $M_2$ | $Y_1$ | $M_3$ | $Y_0$ | $M_2$ | $Y_1$ | $M_3$ | $Y_0$ |
| $G_2$ | $C_1$ | $G_3$ | $C_0$ | $G_2$ | $C_1$ | $G_3$ | $C_0$ |
| $M_0$ | $Y_3$ | $M_1$ | $Y_2$ | $M_0$ | $Y_3$ | $M_1$ | $Y_2$ |
| $G_0$ | $C_3$ | $G_1$ | $C_2$ | $G_0$ | $C_3$ | $G_1$ | $C_2$ |

FIG. 18

| $C_2$ | $M_1$ | $G_2$ | $Y_1$ | $C_2$ | $M_1$ | $G_2$ | $Y_1$ |
|---|---|---|---|---|---|---|---|
| $M_0$ | $C_3$ | $Y_0$ | $G_3$ | $M_0$ | $C_3$ | $Y_0$ | $G_3$ |
| $Y_2$ | $G_1$ | $M_2$ | $C_1$ | $Y_2$ | $G_1$ | $M_2$ | $C_1$ |
| $G_0$ | $Y_3$ | $C_0$ | $M_3$ | $G_0$ | $Y_3$ | $C_0$ | $M_3$ |
| $C_2$ | $M_1$ | $G_2$ | $Y_1$ | $C_2$ | $M_1$ | $G_2$ | $Y_1$ |
| $M_0$ | $C_3$ | $Y_0$ | $G_3$ | $M_0$ | $C_3$ | $Y_0$ | $G_3$ |
| $Y_2$ | $G_1$ | $M_2$ | $C_1$ | $Y_2$ | $G_1$ | $M_2$ | $C_1$ |
| $G_0$ | $Y_3$ | $C_0$ | $M_3$ | $G_0$ | $Y_3$ | $C_0$ | $M_3$ |

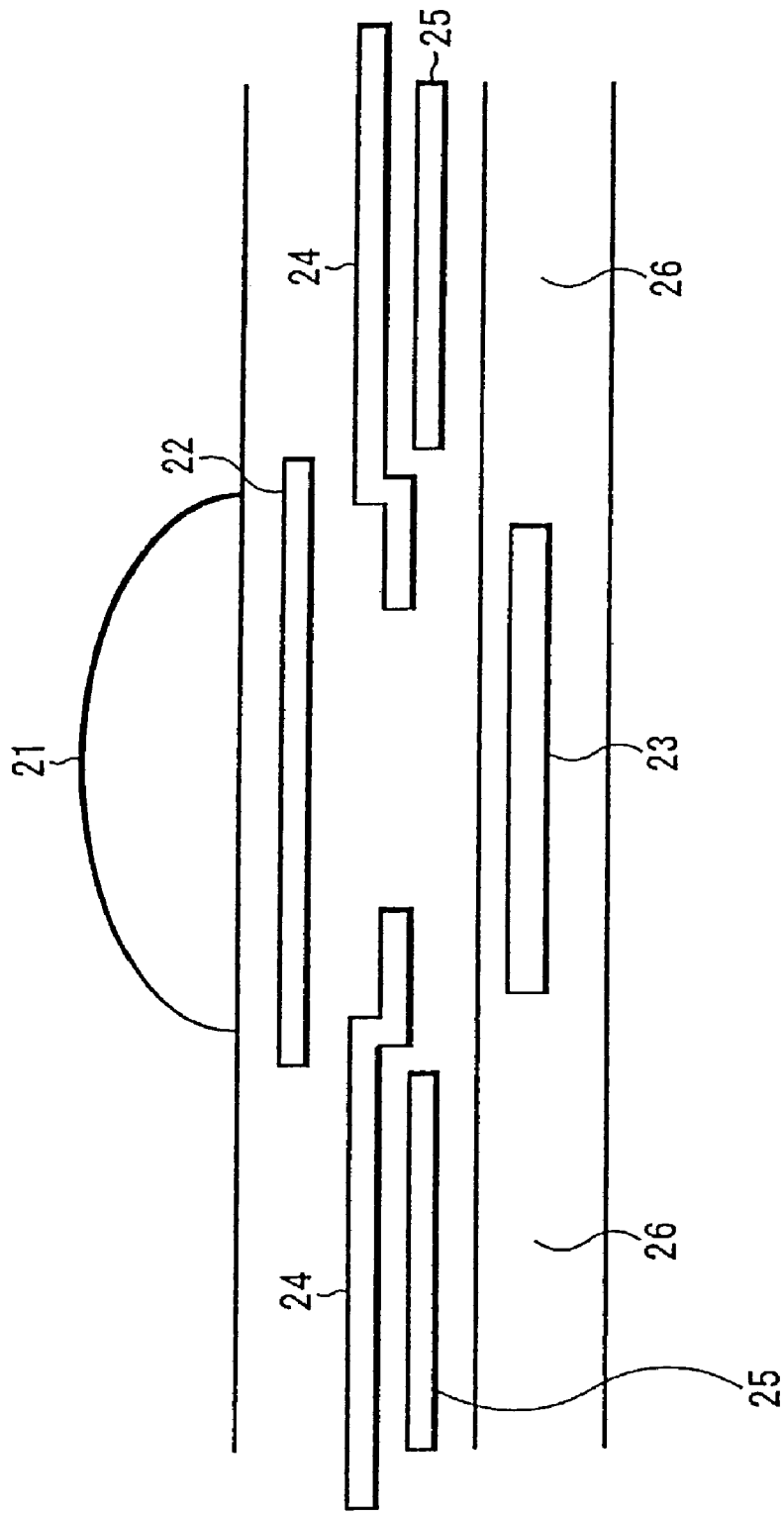

FIG. 28

| OR | OR | OR | OR | OR | OR | OR | OR |
|---|---|---|---|---|---|---|---|
| AND | AND | AND | AND | AND | AND | AND | AND |
| OR | OR | OR | OR | OR | OR | OR | OR |
| AND | AND | AND | AND | AND | AND | AND | AND |
| OR | OR | OR | OR | OR | OR | OR | OR |
| AND | AND | AND | AND | AND | AND | AND | AND |
| OR | OR | OR | OR | OR | OR | OR | OR |
| AND | AND | AND | AND | AND | AND | AND | AND |

FIG. 29

| OR | OR | AND | OR | OR | OR | AND | OR |
|---|---|---|---|---|---|---|---|
| AND | AND | AND | OR | AND | AND | AND | OR |
| AND | OR | OR | OR | AND | OR | OR | OR |
| AND | OR | AND | AND | AND | OR | AND | AND |
| OR | OR | AND | OR | OR | OR | AND | OR |
| AND | AND | AND | OR | AND | AND | AND | OR |
| AND | OR | OR | OR | AND | OR | OR | OR |
| AND | OR | AND | AND | AND | OR | AND | AND |

FIG. 30

| OR  | AND | OR  | AND | OR  | AND | OR  | AND |
|-----|-----|-----|-----|-----|-----|-----|-----|
| AND | OR  | AND | OR  | AND | OR  | AND | OR  |
| OR  | AND | OR  | AND | OR  | AND | OR  | AND |
| AND | OR  | AND | OR  | AND | OR  | AND | OR  |
| OR  | AND | OR  | AND | OR  | AND | OR  | AND |
| AND | OR  | AND | OR  | AND | OR  | AND | OR  |
| OR  | AND | OR  | AND | OR  | AND | OR  | AND |
| AND | OR  | AND | OR  | AND | OR  | AND | OR  |

FIG. 31

| OR  | OR  | OR  | AND | OR  | OR  | OR  | AND |
|-----|-----|-----|-----|-----|-----|-----|-----|
| AND | OR  | AND | AND | AND | OR  | AND | AND |
| OR  | AND | OR  | OR  | OR  | AND | OR  | OR  |
| AND | AND | AND | OR  | AND | AND | AND | OR  |
| OR  | OR  | OR  | AND | OR  | OR  | OR  | AND |
| AND | OR  | AND | AND | AND | OR  | AND | AND |
| OR  | AND | OR  | OR  | OR  | AND | OR  | OR  |
| AND | AND | AND | OR  | AND | AND | AND | OR  |

FIG. 32

| OR | OR | OR | OR | OR | OR | OR | OR |
|----|----|----|----|----|----|----|----|
| AND | AND | AND | AND | AND | AND | AND | AND |
| OR | OR | OR | OR | OR | OR | OR | OR |
| AND | AND | AND | AND | AND | AND | AND | AND |
| OR | OR | OR | OR | OR | OR | OR | OR |
| AND | AND | AND | AND | AND | AND | AND | AND |
| OR | OR | OR | OR | OR | OR | OR | OR |
| AND | AND | AND | AND | AND | AND | AND | AND |

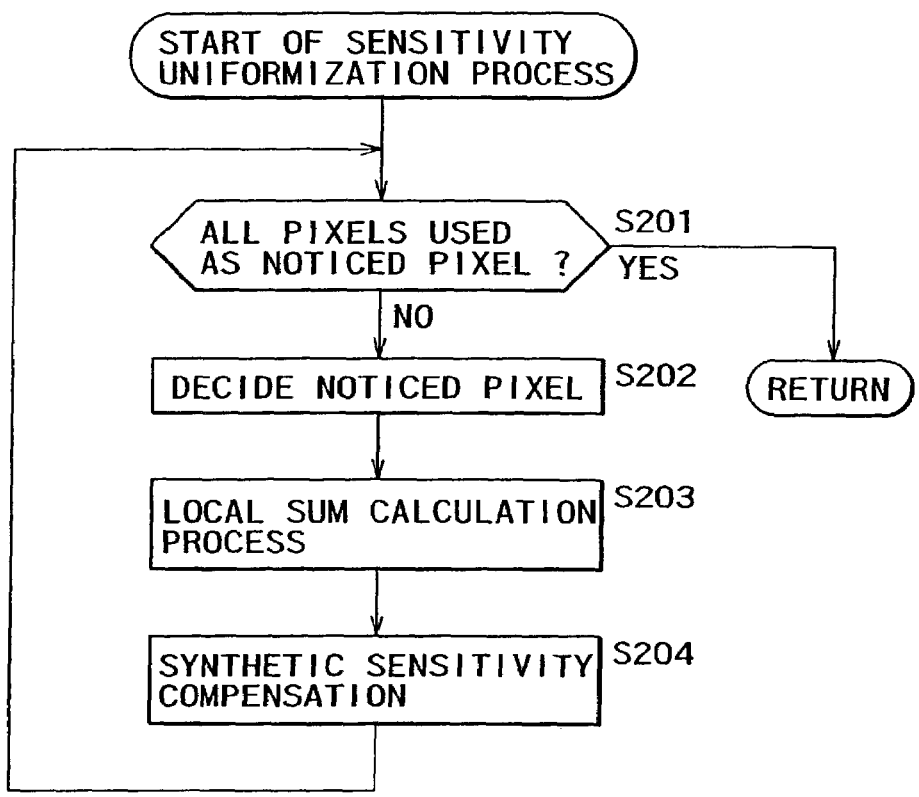

FIG. 88

| 0.000 | 0.000 | 0.000 | 0.000 | 0.000 | 0.000 | 0.000 | 0.001 | 0.000 | 0.000 | 0.000 | 0.000 | 0.000 | 0.000 | 0.000 |
|---|---|---|---|---|---|---|---|---|---|---|---|---|---|---|
| 0.000 | 0.000 | 0.000 | 0.000 | 0.000 | 0.000 | 0.002 | 0.004 | 0.002 | 0.000 | 0.000 | 0.000 | 0.000 | 0.000 | 0.000 |
| 0.000 | 0.000 | 0.000 | 0.000 | 0.000 | -0.005 | 0.000 | 0.005 | 0.000 | -0.005 | 0.000 | 0.000 | 0.000 | 0.000 | 0.000 |
| 0.000 | 0.000 | 0.000 | 0.000 | -0.020 | -0.035 | -0.016 | 0.000 | -0.016 | -0.035 | -0.020 | 0.000 | 0.000 | 0.000 | 0.000 |
| 0.000 | 0.000 | 0.000 | -0.020 | -0.063 | -0.061 | 0.000 | 0.051 | 0.000 | -0.061 | -0.063 | -0.020 | 0.000 | 0.000 | 0.000 |
| 0.000 | 0.000 | -0.005 | -0.035 | -0.061 | 0.000 | 0.196 | 0.316 | 0.196 | 0.000 | -0.061 | -0.035 | -0.005 | 0.000 | 0.000 |
| 0.000 | 0.000 | 0.000 | -0.016 | 0.000 | 0.196 | 0.563 | 0.752 | 0.563 | 0.196 | 0.000 | -0.016 | 0.000 | 0.000 | 0.000 |
| 0.001 | 0.004 | 0.005 | 0.000 | 0.051 | 0.316 | 0.752 | 0.000 | 0.752 | 0.316 | 0.051 | 0.000 | 0.005 | 0.004 | 0.001 |
| 0.000 | 0.000 | 0.000 | -0.016 | 0.000 | 0.196 | 0.563 | 0.752 | 0.563 | 0.196 | 0.000 | -0.016 | 0.000 | 0.000 | 0.000 |
| 0.000 | 0.000 | -0.005 | -0.035 | -0.061 | 0.000 | 0.196 | 0.316 | 0.196 | 0.000 | -0.061 | -0.035 | -0.005 | 0.000 | 0.000 |
| 0.000 | 0.000 | 0.000 | -0.020 | -0.063 | -0.061 | 0.000 | 0.051 | 0.000 | -0.061 | -0.063 | -0.020 | 0.000 | 0.000 | 0.000 |
| 0.000 | 0.000 | 0.000 | 0.000 | -0.020 | -0.035 | -0.016 | 0.000 | -0.016 | -0.035 | -0.020 | 0.000 | 0.000 | 0.000 | 0.000 |
| 0.000 | 0.000 | 0.000 | 0.000 | 0.000 | -0.005 | 0.000 | 0.005 | 0.000 | -0.005 | 0.000 | 0.000 | 0.000 | 0.000 | 0.000 |
| 0.000 | 0.000 | 0.000 | 0.000 | 0.000 | 0.000 | 0.002 | 0.004 | 0.002 | 0.000 | 0.000 | 0.000 | 0.000 | 0.000 | 0.000 |
| 0.000 | 0.000 | 0.000 | 0.000 | 0.000 | 0.000 | 0.000 | 0.001 | 0.000 | 0.000 | 0.000 | 0.000 | 0.000 | 0.000 | 0.000 |

FIG. 89

| 0.004 | 0.000 | −0.035 | −0.063 | −0.035 | 0.000 | 0.004 |
|---|---|---|---|---|---|---|
| 0.000 | 0.000 | 0.000 | 0.000 | 0.000 | 0.000 | 0.000 |
| 0.035 | 0.000 | 0.316 | 0.563 | 0.316 | 0.000 | −0.035 |
| 0.063 | 0.000 | 0.563 | 1.000 | 0.563 | 0.000 | −0.063 |
| 0.035 | 0.000 | 0.316 | 0.563 | 0.316 | 0.000 | −0.035 |
| 0.000 | 0.000 | 0.000 | 0.000 | 0.000 | 0.000 | 0.000 |
| 0.004 | 0.000 | −0.035 | −0.063 | −0.035 | 0.000 | 0.004 |

FIG. 97

| 0.000 | 0.003 | 0.010 | 0.014 | 0.010 | 0.003 | 0.000 |
|-------|-------|-------|-------|-------|-------|-------|
| 0.003 | 0.028 | 0.080 | 0.111 | 0.080 | 0.028 | 0.003 |
| 0.010 | 0.080 | 0.230 | 0.319 | 0.230 | 0.080 | 0.010 |
| 0.014 | 0.111 | 0.319 | 0.444 | 0.319 | 0.111 | 0.014 |
| 0.010 | 0.080 | 0.230 | 0.319 | 0.230 | 0.080 | 0.010 |
| 0.003 | 0.028 | 0.080 | 0.111 | 0.080 | 0.028 | 0.003 |
| 0.000 | 0.003 | 0.010 | 0.014 | 0.010 | 0.003 | 0.000 |

```
START OF ESTIMATED PIXEL VALUE
C0 INTERPOLATION PROCESS
```

IMAGE PROCESSING DEVICE SUPPRESSING COLOR MOIRE WHEN RESTORING AN IMAGE

BACKGROUND OF THE INVENTION

This invention relates to an image processing apparatus, and more particularly to an image processing apparatus suitable for use for production of a color image signal of a wide dynamic range from an image signal acquired, for example, using a CCD image sensor of the single plate type or the like.

A solid-state image pickup device such as a CCD (Charge Coupled Device) or a CMOS (Complementary Metal-Oxide Semiconductor) is widely utilized in an image pickup apparatus such as a video camera or a digital still camera, a part inspection apparatus in the field of Factory Automation and optical measuring instruments such as an electronic endoscope in the field of Medical Electronics.

Usually, since a solid-state image pickup device itself can have a single spectral sensitivity, if it is used to pick up an image, then only an image of a single spectral sensitivity, that is, only a monochromatic image is obtained. Therefore, in order to obtain a color image using a single solid-state image pickup device, a conventional method is used wherein an image is picked up with different spectral sensitivities for each pixel, that is, with different colors for each pixel.

As a method for changing the color for each pixel, color filters are used. For example, one of filters of three different colors of Red (R), Green (G), and Blue (B) is used to cover light receiving elements arranged on an image pickup plane of the solid-state image pickup device. Consequently, since the pixels of an image picked up have only one kind of color component, the picked up image is an image like a mosaic with regard to the color (such an image is hereinafter referred to as a color mosaic image).

A technique has conventionally been developed wherein a predetermined image process is applied to color mosaic images obtained in such a manner as described above to produce an image wherein all pixels have components of R, G and B.

It is to be noted that the combination of colors of filters for covering light receiving elements arranged on an image pickup plane of a solid-state image pickup device is not limited to the three colors of R, G and B, butcan include, for example, four colors of G, C (cyan), M (magenta) and Y (yellow).

In such an image process as described above, an influence on the picture quality can arise from the fact that the sampling frequency is different among different colors matters. For example, where a color mosaic arrangement is a Bayer arrangement, the sampling frequency for R or B is ½ the sampling frequency for G. It is to be noted that, although it is possible to make the sampling frequencies for the different colors equal to each other, it is impossible to synchronize the phases of them with each other.

Where the sampling frequencies for the different colors are different in this manner, phase differences appear among different color components restored by an image process and are observed as a color moire on an output image, and are therefore a significant cause of deterioration of the picture quality.

Conventionally, techniques of an image process for suppressing appearance of such a color moire as described above have been proposed. Such techniques are described below.

A first related-art technique includes a method of interpolating colors such that a local ratio of colors may be maintained. According to the method, it is assumed that, in a local region, the direction of an object color of a subject does not exhibit a great variation. The direction of an object color is described in a ratio of colors. For example, it is assumed that the ratios of R and G at a point x and at another point y neighboring each other are equal to each other. In other words, it is assumed that $R(x)/G(x)=R(y)/G(y)$. If $G(x)$ at the point x is known, then $R(x)$ can be calculated if the ratio $R(y)/G(y)$ of the colors at the neighboring point y is acquired. Where the ratio of colors does not exhibit a great variation within a local region, a known average value $(R/G)_L$ of the R/G ratio of the pixels in the local region can be used in place of the color ratio $R(y)/G(y)$ at the neighboring point y. In other words, $R(x)=G(x)\cdot(R/G)_L$. Such a first related-art technique as just described is disclosed in the official gazette of Japanese Patent Laid-Open No. Sho 61-501424.

A second related-art technique includes a method of interpolating colors such that a ratio of low frequency components of different colors may be maintained. According to the method, $(R/G)L$ calculated in the first related-art technique described above is approximated using the ratio $R_L/G_L$ of a low frequency component $R_L$ of R and a low frequency component $G_L$ of G. It is to be noted that, since the low frequency component $R_L$ of R and the low frequency component $G_L$ of G can be calculated independently of each other even if the same pixel does not have both components of R and G, it is not necessary to perform interpolation for G first in order to calculate the ratio $R_L/G_L$.

In the first and second related-art techniques described above, the arrangement of a color on pixels of a color mosaic image (the arrangement is hereinafter referred to as a color mosaic arrangement), and the first and second related-art techniques have a problem to be solved in that, for a color mosaic image of an arbitrary color mosaic arrangement, it is impossible to effectively suppress the appearance of a color moire.

SUMMARY OF THE INVENTION

An object of the present invention is, therefore, to make it possible to suppress the appearance of a color moire when a restoration image, wherein each pixel has all of a number of color components, is produced from a color mosaic image of an arbitrary color mosaic arrangement.

An image processing apparatus according to an embodiment of the present invention is includes a first color difference image production unit for producing a first color difference image corresponding to a color mosaic image based on color mosaic pattern information which indicates an arrangement of color components of the color mosaic image, a second color difference image production unit for producing a second color difference image corresponding to the color mosaic image based on the color mosaic pattern information, a luminance image production unit for producing a luminance image using the first and second color difference images and the color mosaic image, and a restoration unit for restoring all of the color components corresponding to each pixel using the first and second color difference images and the luminance image.

In one embodiment, the first and second color difference image production units may a include first smoothing unit for smoothing a first color component of the color mosaic image to produce a first smoothed image, a second smoothing unit for smoothing a color component other than the first color component of the color mosaic image to produce a second smoothed image, and a subtraction unit for subtracting color components of corresponding pixels of the first smoothed image and the second smoothed image to produce color difference components.

The first and second smoothing unit in an embodiment may use a direction selective smoothing process to produce the first or second smoothed image.

The luminance image production unit in an embodiment may include a luminance candidate image production unit for producing a luminance candidate image using the first and second color difference images and the color mosaic image, and a noise removal unit for removing noise components of the luminance candidate image to produce the luminance image.

In an embodiment, the noise removal unit may remove the noise components of the luminance candidate image using the direction selective smoothing process to produce the luminance image.

The image processing apparatus according to one embodiment of the present invention may further include a gradation conversion unit for performing a gradation conversion process for the color mosaic image and supplying the resulting image to the first and second color difference image production means and the luminance image production unit.

In an embodiment, the image processing apparatus may further include a gradation reverse conversion unit for performing a gradation reverse conversion process corresponding to the gradation conversion process for all of the color components corresponding to each pixel restored by the restoration unit.

An image processing method according to an embodiment of the present invention includes a first color difference image production step of producing a first color difference image corresponding to a color mosaic image based on color mosaic pattern information which indicates an arrangement of color components of the color mosaic image, a second color difference image production step of producing a second color difference image corresponding to the color mosaic image based on the color mosaic pattern information, a luminance image production step of producing a luminance image using the first and second color difference images and the color mosaic image, and a restoration step of restoring all of the color components corresponding to each pixel using the first and second color difference images and the luminance image.

In an embodiment, the first and second color difference image production steps may include a first smoothing step of smoothing a first color component of the color mosaic image to produce a first smoothed image, a second smoothing step of smoothing a color component other than the first color component of the color mosaic image to produce a second smoothed image, and a subtraction step of subtracting color components of corresponding pixels of the first smoothed image and the second smoothed image to produce color difference components.

In one embodiment, the processes of the first and second smoothing steps may use a direction selective smoothing process to produce the first or second smoothed image.

The luminance image production step in an embodiment may include a luminance candidate image production step of producing a luminance candidate image using the first and second color difference images and the color mosaic image, and a noise removal step of removing noise components of the luminance candidate image to produce the luminance image.

The process of the noise removal step in one embodiment may remove the noise components of the luminance candidate image using the direction selective smoothing process to produce the luminance image.

The image processing method according to an embodiment of the present invention may further include a gradation conversion step of performing a gradation conversion process for the color mosaic image and supplying the resulting image to the processes of the first and second color difference image production steps and the process of the luminance image production step.

The image processing method according to an embodiment of the present invention may further include a gradation reverse conversion step of performing a gradation reverse conversion step corresponding to the gradation conversion process for all of the color components corresponding to each pixel restored by the process of the restoration step.

A program of a recording medium according to one embodiment of the present invention includes a first color difference image production step of producing a first color difference image corresponding to the color mosaic image based on color mosaic pattern information which indicates an arrangement of the color components of the color mosaic image, a second color difference image production step of producing a second color difference image corresponding to the color mosaic image based on the color mosaic pattern information, a luminance image production step of producing a luminance image using the first and second color difference images and the color mosaic image, and a restoration step of restoring all of the color components corresponding to each pixel using the first and second color difference images and the luminance image.

The first and second color difference image production steps in an embodiment may include a first smoothing step of smoothing a first color component of the color mosaic image to produce a first smoothed image, a second smoothing step of smoothing a color component other than the first color component of the color mosaic image to produce a second smoothed image, and a subtraction step of subtracting color components of corresponding pixels of the first smoothed image and the second smoothed image to produce color difference components.

The processes of the first and second smoothing steps in one embodiment may use a direction selective smoothing process to produce the first or second smoothed image.

In an embodiment, the luminance image production step may include a luminance candidate image production step of producing a luminance candidate image using the first and second color difference images and the color mosaic image, and a noise removal step of removing noise components of the luminance candidate image to produce the luminance image.

The process of the noise removal step in an embodiment may remove the noise components of the luminance candidate image using the direction selective smoothing process to produce the luminance image.

The program of the recording medium according to one embodiment of the present invention may further include a gradation conversion step of performing a gradation conversion process for the color mosaic image and supplying the resulting image to the processes of the first and second color difference image production steps and the process of the luminance image production step.

The program of the recording medium according to an embodiment of the present invention may further include a gradation reverse conversion step of performing a gradation reverse conversion step corresponding to the gradation conversion process for all of the color components corresponding to each pixel restored by the process of the restoration step.

A program according to an embodiment of the present invention causes a computer to execute a first color difference image production step of producing a first color difference image corresponding to a color mosaic image based on color mosaic pattern information which indicates an arrangement of color components of the color mosaic image, a second color difference image production step of producing a second color difference image corresponding to the color mosaic image based on the color mosaic pattern information, a luminance image production step of producing a luminance image using the first and second color difference images and the color mosaic image, and a restoration step of restoring all of the color components corresponding to each pixel using the first and second color difference images and the luminance image.

The first and second color difference image production steps in an embodiment may include a first smoothing step of smoothing a first color component of the color mosaic image to produce a first smoothed image, a second smoothing step of smoothing a color component other than the first color component of the color mosaic image to produce a second smoothed image, and a subtraction step of subtracting color components of corresponding pixels of the first smoothed image and the second smoothed image to produce color difference components.

In one embodiment, the processes of the first and second smoothing steps may use a direction selective smoothing process to produce the first or second smoothed image.

The luminance image production step in one embodiment may include a luminance candidate image production step of producing a luminance candidate image using the first and second color difference images and the color mosaic image, and a noise removal step of removing noise components of the luminance candidate image to produce the luminance image.

In an embodiment, the process of the noise removal step may remove the noise components of the luminance candidate image using the direction selective smoothing process to produce the luminance image.

The program according to an embodiment of the present invention may further include a gradation conversion step of performing a gradation conversion process for the color mosaic image and supplying the resulting image to the processes of the first and second color difference image production steps and the process of the luminance image production step.

The program according to one embodiment of the present invention may further include a gradation reverse conversion step of performing a gradation reverse conversion step corresponding to the gradation conversion process for all of the color components corresponding to each pixel restored by the process of the restoration step.

With the image processing apparatus and method as well as the program according to various embodiment of the present invention, based on color mosaic pattern information indicative of an arrangement of color components of a color mosaic image, a first color difference image corresponding to the color mosaic image is produced, and based on the color mosaic pattern information, a second color difference image corresponding to the color mosaic image is produced. Then, a luminance image is produced using the first and second color difference images and the color mosaic image, and all color components corresponding to each pixel are restored using the first and second color difference images and the luminance image.

Additional features and advantages of the present invention are described in, and will be apparent from, the following Detailed Description of the Invention and the Figures.

BRIEF DESCRIPTION OF THE FIGURES

FIG. 5 is a view showing a color and sensitivity mosaic pattern P1.

FIG. 6 is a view showing a color and sensitivity mosaic pattern P2.

FIG. 7 is a view showing a color and sensitivity mosaic pattern P3.

FIG. 8 is a view showing a color and sensitivity mosaic pattern P4.

FIG. 9 is a view showing a color and sensitivity mosaic pattern P5,

FIG. 10 is a view showing a color and sensitivity mosaic pattern P6,

FIG. 11 is a view showing a color and sensitivity mosaic pattern P7.

FIG. 12 is a view showing a color and sensitivity mosaic pattern P8.

FIG. 13 is a view showing a color and sensitivity mosaic pattern P9.

FIG. 14 is a view showing a color and sensitivity mosaic pattern P10.

FIG. 15 is a view showing a color and sensitivity mosaic pattern P11.

FIG. 16 is a view showing a color and sensitivity mosaic pattern P12.

FIG. 17 is a view showing a color and sensitivity mosaic pattern P13.

FIG. 18 is a view showing a color and sensitivity mosaic pattern P14.

FIG. 19 is a view showing a cross section of a light receiving element of a CCD image sensor 4.

FIG. 28 is a view showing a combination of the OR-type electrode structure and the AND-type electrode structure for implementing the color and sensitivity mosaic pattern P1.

FIG. 29 is a view showing a combination of the OR-type electrode structure and the AND-type electrode structure for implementing the color and sensitivity mosaic pattern P2.

FIG. 30 is a view showing a combination of the OR-type electrode structure and the AND-type electrode structure for implementing the color and sensitivity mosaic pattern P3.

FIG. 31 is a view showing a combination of the OR-type electrode structure and the AND-type electrode structure for implementing the color and sensitivity mosaic pattern P4.

FIG. 32 is a view showing a combination of the OR-type electrode structure and the AND-type electrode structure for implementing the color and sensitivity mosaic pattern P5.

FIG. 80 is a flow chart illustrating a sensitivity uniformization process at step S182.

FIG. 81 is a view showing an embodiment of a filter coefficient used in a local sum calculation process at step S203.

FIG. 88 is a view showing an embodiment of interpolation filter coefficients for R/B components.

FIG. 89 is a view showing interpolation filter coefficients for a G component.

FIG. 97 is a view illustrating an embodiment of smoothing filter coefficients.

DETAILED DESCRIPTION OF THE INVENTION

Figure 1:
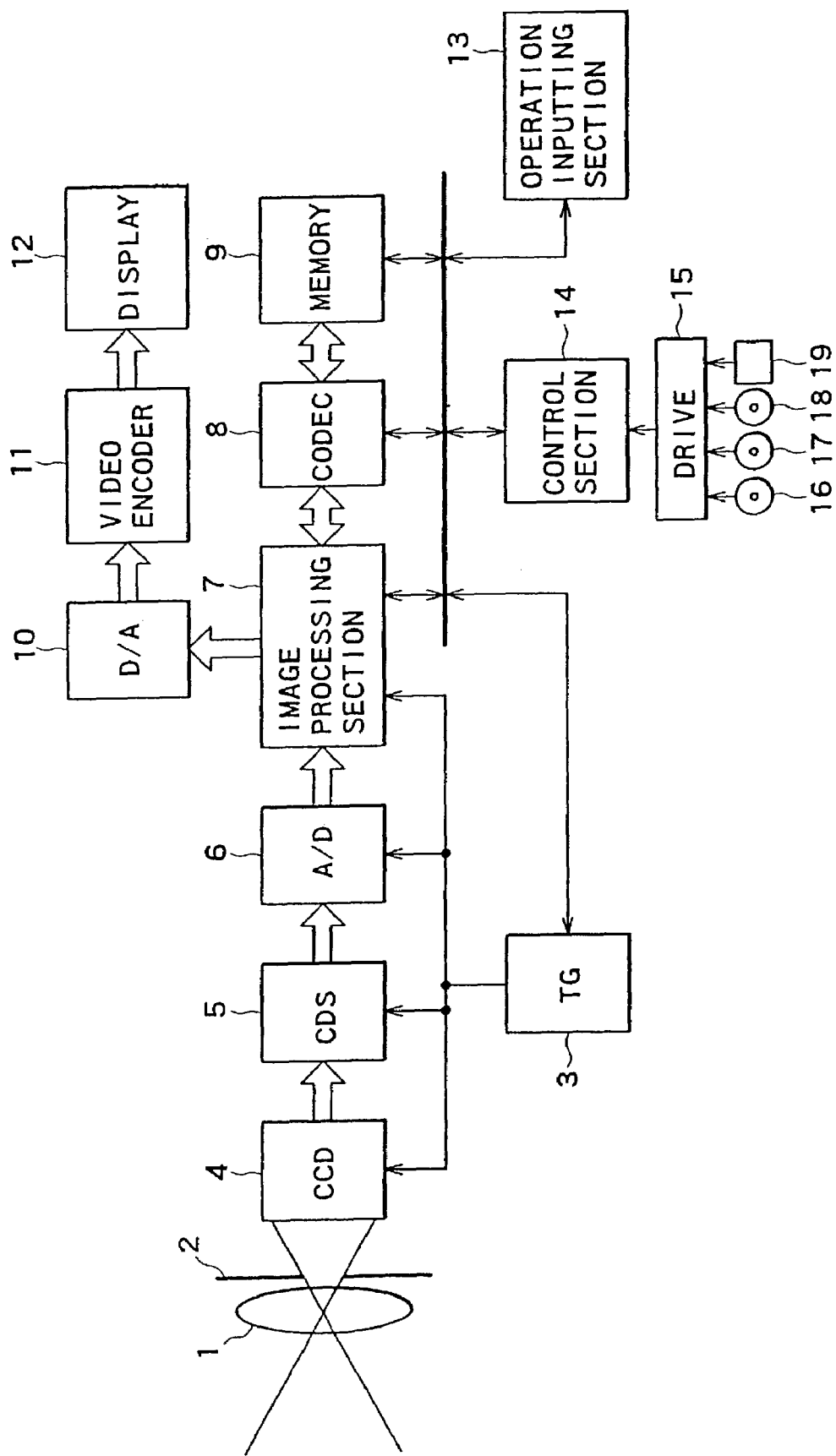
FIG. 1 is a block diagram showing an embodiment of a configuration of a digital still camera according to the present invention.

FIG. 1 shows a configuration of a digital still camera according to an embodiment of the present invention. The digital still camera generally includes an optical system, a signal processing system, a recording system, a display system and a control system.

The optical system includes a lens 1 for condensing an optical image of a subject, an iris 2 for adjusting the amount of light of the optical image, and a CCD image sensor 4 for photo-electrically converting the condensed optical image into an electric signal of a wide dynamic range.

The signal processing system includes a correlation double sampling circuit (CDS) 5 for sampling an electric signal from the CCD image sensor 4 to reduce noise of the electric signal, an A/D converter 6 for converting an analog signal outputted from the correlation double sampling circuit 5 into a digital signal, and an image processing section 7 for performing a predetermined image process for the digital signal inputted thereto from the A/D converter 6. It is to be noted that details of the process executed by the image processing section 7 are hereinafter described.

The recording system includes a CODEC (Compression/Decompression) 8 for coding and recording an image signal processed by the image processing section 7 into a memory 9 and reading out, decoding and supplying the image signal to the image processing section 7, and the memory 9 for storing an image signal.

The display system includes a D/A converter 10 for converting an image signal processed by the image processing section 7 into an analog signal, a video encoder 11 for encoding the analog image signal into a video signal of the format compatible with a display unit 12 in the following stage, and a display unit 12 formed from an LCD (Liquid Crystal Display) unit or the like for displaying an image corresponding to the video signal inputted thereto so that it functions as a viewfinder.

The control system includes a timing generator (TG) 3 for controlling operation timings of the components from the CCD image sensor 4 to the image processing section 7, an operation inputting section 13 for allowing the user to input a shutter timing and other commands, and a control section 14 including a CPU (Central Processing Unit) or the like for controlling a drive 15 to read a controlling program stored on a magnetic disc 16, an optical disc 17, a magneto-optical disc 18 or a semiconductor memory 19 and controlling the entire digital still camera based on the controlling program, a command from the user inputted from the operation inputting section 13 and the like.

In the digital still camera, an optical image (incoming light) of a subject is introduced into the CCD image sensor 4 through the lens 1 and the iris 2, and it is photo-electrically converted by the CCD image sensor 4. The resulting electric signal is subject to removal of noise by the correlation double sampling circuit 5 and is then converted into a digital signal by the A/D converter 6, whereafter it is temporarily stored into an image memory built in the image processing section 7.

It is to be noted that, in an ordinary state, an image signal is continually overwritten at a fixed frame rate into the image memory built in the image processing section 7 under the control of the timing generator 3 for the signal processing system. The image signal of the image memory built in the image processing section 7 is converted into an analog signal by the D/A converter 10 and further converted into a video signal by the video encoder 11, and a corresponding image is displayed on the display unit 12.

The display unit 12 further has a function as a viewfinder of the digital still camera. When the user depresses a shutter button included in the operation inputting section 13, the control section 14 controls the timing generator 3 so that the signal processing system fetches an image signal immediately after the shutter button is depressed and thereafter inhibits an image signal from being overwritten into the image memory of the image processing section 7. Thereafter, the image data written in the image memory of the image processing section 7 are coded by the CODEC 8 and recorded into the memory 9. Fetching of image data of one frame is completed by such operation of the digital still camera as described above.

Figure 2:
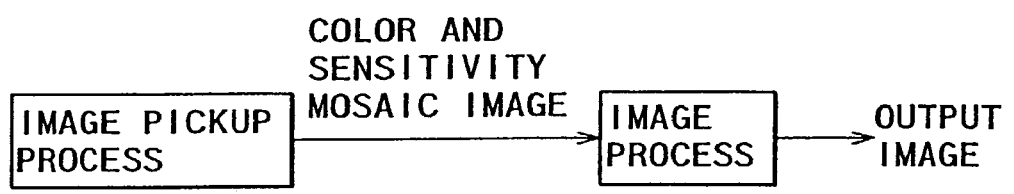
FIG. 2 is a view illustrating a general operation of the digital still camera shown in FIG. 1.

An outline of operation of the digital still camera is described with reference to FIG. 2. The digital still camera picks up an image of a subject with a color and a sensitivity, which are different for each pixel, through an image pickup process of the optical system including the CCD image sensor 4 as a principal component to obtain an image wherein colors and sensitivities are distributed like a mosaic (such an image as just described is hereinafter referred to as a color and sensitivity mosaic image, whose details are hereinafter described). Thereafter, the image obtained by the image pickup process is converted into an image wherein each pixel has all color components and the pixels have a uniform sensitivity by the signal processing system which includes the image processing section 7 as a principal component. In the following description, the process of the signal processing system including the image processing section 7 as a principal component for converting a color and sensitivity mosaic image into an image wherein each pixel has all color components and the pixels have a uniform sensitivity is referred to as a demosaic process.

Figure 3:
FIG. 3 is a view showing an embodiment of a subject.
Figure 4:
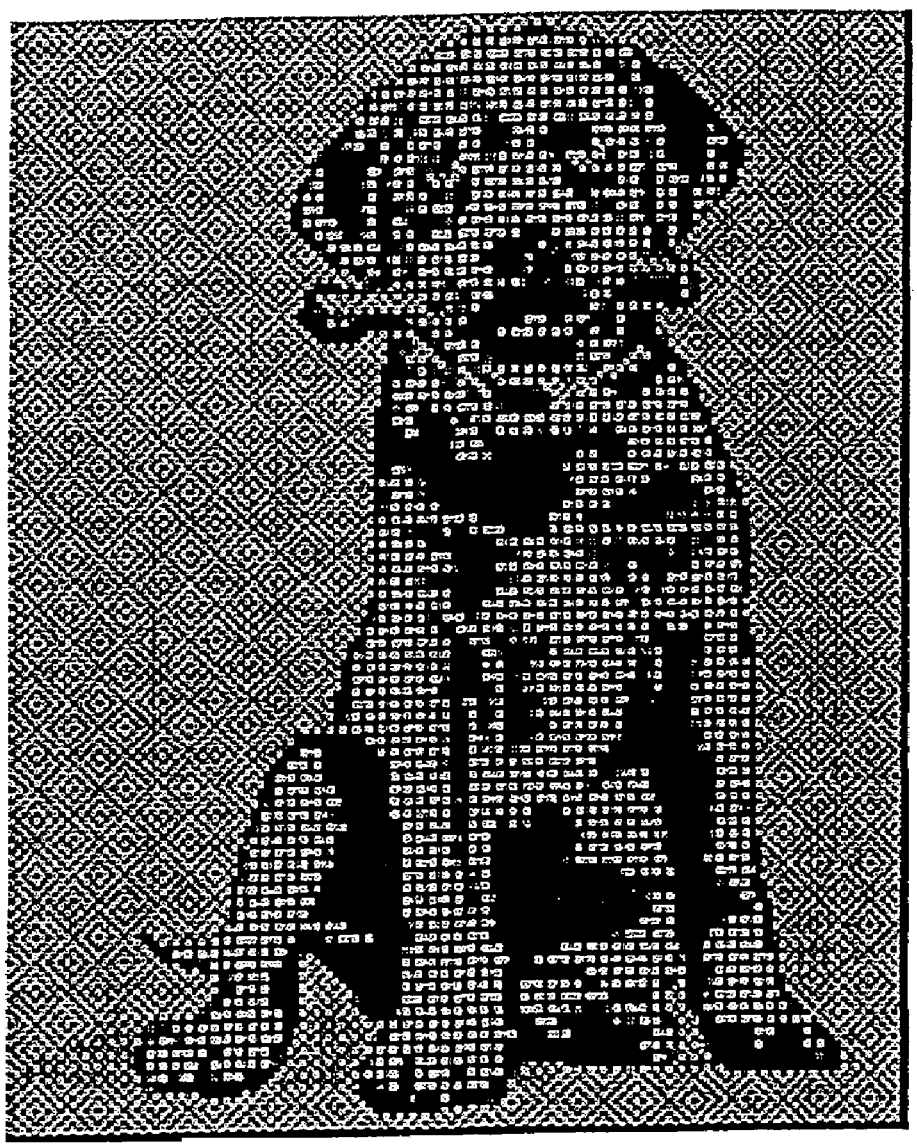
FIG. 4 is a view showing an embodiment of a color and sensitivity mosaic image corresponding to the embodiment of FIG. 3.

For example, if an image of such a subject as shown in FIG. 3 is picked up, then such a color and sensitivity mosaic image as shown in FIG. 4 is obtained through the image pickup process and is converted into an image wherein each pixel has all color components and the pixels have a uniform sensitivity through the image process. In particular, the original colors of the subject shown in FIG. 3 are restored from the color and sensitivity mosaic image shown in FIG. 4.

Arrangement patterns (hereinafter referred to as color and sensitivity mosaic patterns) P1 to P14 of color components and sensitivities of pixels which compose a color and sensitivity mosaic image are shown in FIGS. 5 to 18, respectively. It is to be noted that, as a combination of colors which form a color and sensitivity mosaic pattern, a combination of three colors of R (red), G (green) and B (blue) and another combination of four colors of Y (yellow), M (magenta), C (cyan) and G (green) are available. As stages of the sensitivity, two stages of S0 and S1, three stages which additionally include a sensitivity S2 and four stages which additionally include a further sensitivity S3 are available. It is to be noted that, in FIGS. 5 to 18, each square corresponds to one pixel, and an alphabetical letter represents the color of the pixel and a numeral as a subscript to the alphabetical letter represents the sensitivity of the pixel. For example, a pixel denoted by $G_0$ represents that the color thereof is G (green) and the sensitivity thereof is S0. Further, it is assumed that, regarding the sensitivity, the higher the value, the higher the sensitivity.

The color and sensitivity mosaic patterns P1 to P14 can be classified based on the first to fourth characteristics described below.

The first characteristic is that, where attention is paid to those pixels which have the same color and the same sensitivity, they are arranged like a lattice, and where attention is paid to those pixels which have the same color irrespective of the sensitivity, they are arranged like a lattice. The first characteristic is described with reference to the color and sensitivity mosaic pattern P1 shown in FIG. 5.

In the color and sensitivity mosaic pattern P1 of FIG. 5, where attention is paid to those pixels which have the color R irrespective of the sensitivity, as can be seen if the figure is viewed in a state rotated by 45 degrees in the clockwise direction, they are arranged like a lattice wherein they are spaced from each other by $2^{1/2}$ in the horizontal direction and by $2^{3/2}$ in the vertical direction. Further, where attention is paid to those pixels which have the color B irrespective of the sensitivity, they are also arranged like a lattice wherein they are spaced from each other by $2^{1/2}$ in the horizontal direction and by $2^{3/2}$ in the vertical direction. Further, where attention is paid to those pixels which have the color G irrespective of the sensitivity, they are also arranged like a lattice wherein they are spaced from each other by $2^{1/2}$ both in the horizontal direction and in the vertical direction.

In addition to the color and sensitivity mosaic pattern P1 shown in FIG. 5, the color and sensitivity mosaic patterns P2, P4, P6, P8, P9, P10, P11 and P13 have the first characteristic.

The second characteristic is that, where attention is paid to those pixels which have the same color and the same sensitivity, they are arranged like a lattice, and where attention is paid to those pixels which have the same sensitivity irrespective of the color, they are arranged like a lattice. Further, where attention is paid to an arbitrary pixel, all of colors included in the color and sensitivity mosaic pattern are included in colors which total five pixels including the arbitrary pixel and four pixels positioned upwardly, downwardly, leftwardly and rightwardly of the arbitrary pixel.

In addition to the color and sensitivity mosaic pattern P3 shown in FIG. 7, the color and sensitivity mosaic patterns P5, P7, P8, P9, P12 and P14 have the second characteristic.

The third characteristic is that the color and sensitivity mosaic pattern has the first characteristic and uses three different colors and the pixels of the colors are arranged in a Bayer arrangement. The third characteristic is described with reference to the color and sensitivity mosaic pattern P2 shown in FIG. 6.

Where attention is paid to those pixels of the color and sensitivity mosaic pattern P2 of FIG. 6 which have the color G irrespective of the sensitivity, they are arranged alternately in a checkered pattern. Where attention is paid to those pixels which have the color R irrespective of the sensitivity, they are arranged on every other line. Further, where attention is paid to those pixels whose color is B irrespective of the sensitivity, they are similarly arranged on every other line. Accordingly, the pattern P2 has a Bayer arrangement where attention is paid only to the colors of the pixels.

It is to be noted that, in addition to the color and sensitivity mosaic pattern P2 of FIG. 6, the color and sensitivity mosaic patterns P10 and P11 have the third characteristic.

The fourth characteristic is that the color and sensitivity mosaic pattern has the second characteristic and further, where attention is paid to those pixels which have the same sensitivity, the arrangement of them is a Bayer arrangement. The fourth characteristic is described with reference to the color and sensitivity mosaic pattern P3 shown in FIG. 7.

Where attention is paid only to those pixels in the color and sensitivity mosaic pattern P3 shown in FIG. 7 which have the sensitivity S0, as can be seen if the figure is viewed obliquely in a state inclined by 45 degrees, they are arranged in a spaced relationship by a distance of $2^{1/2}$ and in a Bayer arrangement. Also where attention is paid to those pixels which have the sensitivity S1, they are similarly arranged in a Bayer arrangement.

It is to be noted that, in addition to the color and sensitivity mosaic pattern P3 of FIG. 7, the color and sensitivity mosaic patterns P5 and P12 have the fourth characteristic.

Incidentally, an arrangement of any of the color and sensitivity mosaic patterns P1 to P14 shown in FIGS. 5 to 18 is hereinafter referred to as a "color mosaic arrangement" where attention is paid only to the colors of the pixels irrespective of the sensitivity, but is hereinafter referred to as a "sensitivity mosaic arrangement" where attention is paid only to the sensitivities irrespective of the color.

A method of implementing the color and sensitivity mosaic patterns described above on the CCD image sensor 4 will be described below.

Of the color and sensitivity mosaic patterns, the color mosaic arrangements are implemented by disposing an on-chip color filter, which passes only light of a different color for each pixel, on an upper face of a light receiving element of the CCD image sensor 4.

Of the color and sensitivity mosaic patterns, the sensitivity mosaic arrangements are implemented by an optical method or an electronic method.

A method of optically implementing a sensitivity mosaic arrangement is described. FIG. 19 shows a cross section of a light receiving element of the CCD image sensor 4. An on-chip lens 21 is formed on an upper surface of the light receiving element. The on-chip lens 21 is disposed such that it condenses incoming light from an upper portion of the figure on a photo-diode (PD) 23. An on-chip color filter 22 limits a wavelength band of the incoming light (passes only a particular wavelength band therethrough). The photo-diode 23 is formed in a wafer at a lower portion of the light receiving element. The photo-diode 23 produces electric charge in response to the amount of light inputted thereto. A vertical register 26 is formed on the opposite sides of the photo-diode 23. A pair of vertical register driving electrodes 25 for driving the vertical register 26 are wired above the vertical register 26.

Since the vertical register 26 is a region for transferring electric charge produced by the photo-diode 23, the vertical register 26 and the vertical register driving electrodes 25 are shielded from light by a shield 24 such that no electric charge may be produced in the vertical register 26. The shield 24 is open only above the photo-diode 23 such that the incoming light may pass the opening portion until it reaches the photo-diode 23.

The sensitivity of each light receiving element can be varied (the amount of incoming light to the photo-diode 23 can be varied) making use of the CCD image sensor 4 configured in such a manner as described above.

Figure 20:
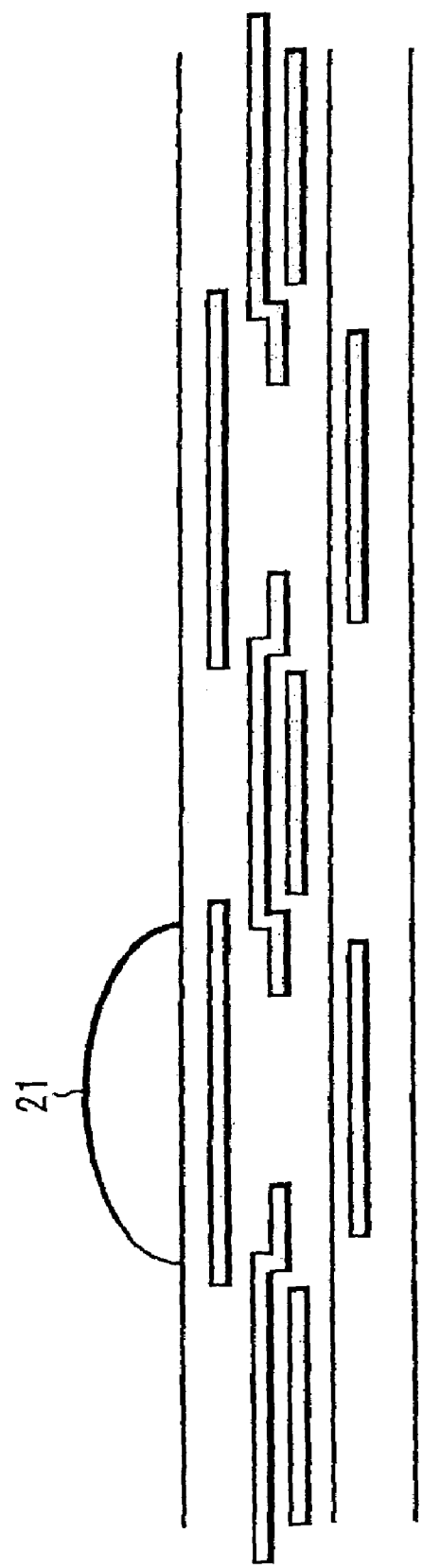
FIG. 20 is a view illustrating a method for optically implementing a mosaic arrangement of sensitivity.
Figure 21:
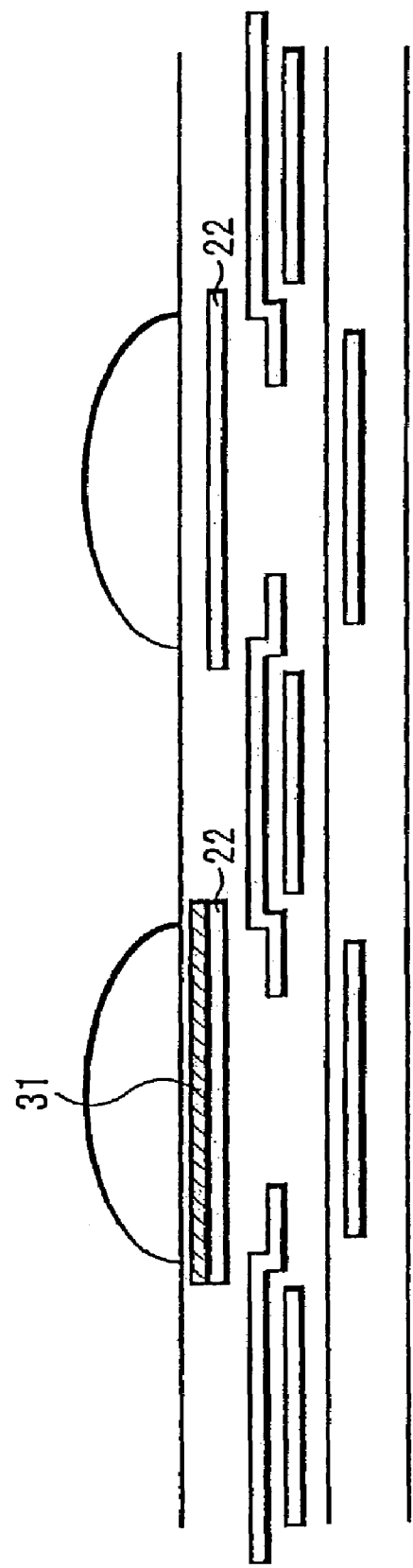
FIG. 21 is a view illustrating another method for optically implementing a mosaic arrangement of sensitivity.
Figure 22:
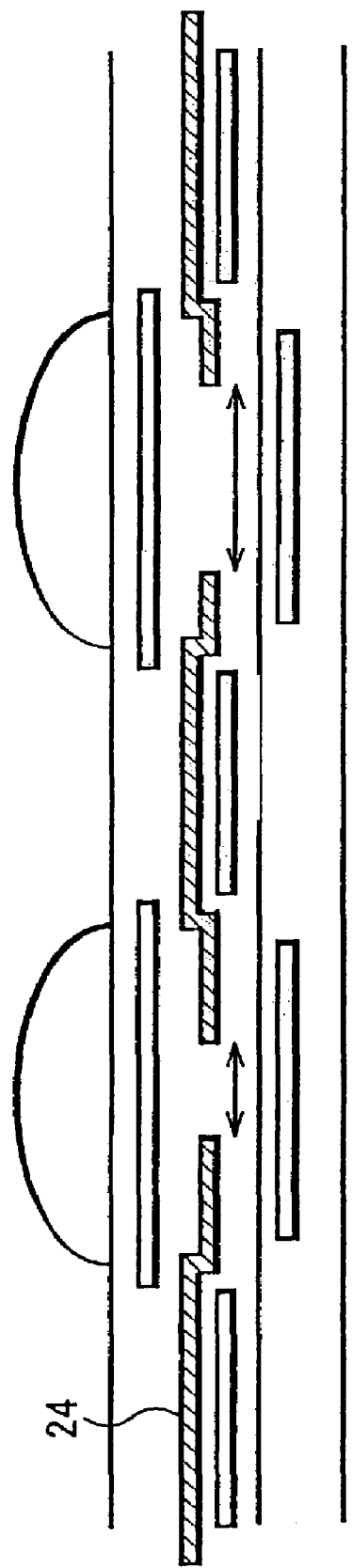
FIG. 22 is a view illustrating a further method for optically implementing a mosaic pattern of sensitivity.

For example, the amount of condensed light can be varied depending upon whether or not the on-chip lens 21 is disposed as shown in FIG. 20. Meanwhile, the light transmission factor can be varied, for example, by disposing a neutral density filter 31 above (or below) the on-chip color filter 22 as shown in FIG. 21. Further, the incoming light amount to the photo-diode 23 can be varied, for example, by varying the area of the opening portion of the shield 24 as shown in FIG. 22.

Two different methods for electronically implementing a mosaic arrangement of sensitivity will be described below.

For example, a first method of setting two adjacent light receiving elements (first and second light receiving elements) to different sensitivities by changing the timing of control is described with reference to FIG. 23.

Figure 23:
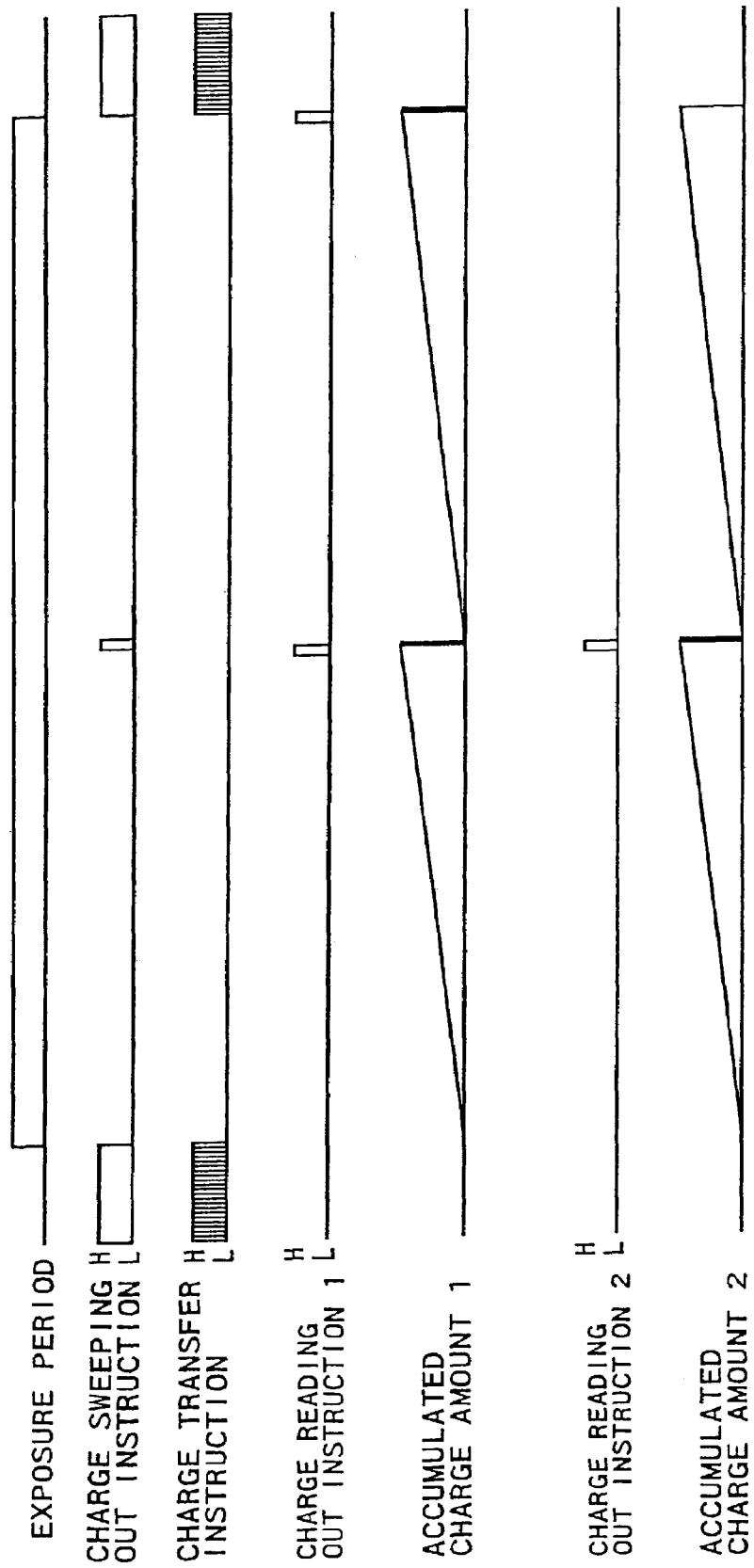
FIG. 23 is a view illustrating a first method for electronically implementing a mosaic pattern of sensitivity.

The first stage of FIG. 23 shows an exposure period of the CCD image sensor 4. The second stage of FIG. 23 shows a timing of a pulse voltage for instruction of sweeping out of electric charge. The third stage of FIG. 23 shows a timing at which a control voltage for instruction of charge transfer is applied. The fourth stage of FIG. 23 shows a timing of a pulse voltage for instructing a first light receiving element to read out electric charge. The fifth stage of FIG. 23 shows a variation of the electric charge amount accumulated in the first light receiving element in response to application of the charge sweeping out pulse voltage and the charge reading out pulse voltage. The sixth stage of FIG. 23 shows a timing of a pulse voltage for instructing a second light receiving element to read out electric charge. The seventh stage of FIG. 23 shows a variation of the electric charge amount accumulated in the second light receiving element in response to application of the charge sweeping out pulse voltage and the charge reading out pulse voltage.

In the first method of electronically implementing a sensitivity mosaic arrangement, the charge sweeping out pulse voltage is supplied commonly to the first and second light receiving elements such that, except within an exposure period, electric charge is swept out (reset) from the photo-diode 23, but within an exposure period, electric charge is reset only once at a predetermined timing.

The charge transfer voltage is supplied, except within an exposure period, as a waveform voltage for transferring electric charge to the vertical register 26 commonly to the first and second light receiving elements, but is not supplied, within an exposure period, such that transfer of electric charge from the vertical register 26 may be stopped.

The charge reading out pulse voltage is supplied at different timings to the light receiving elements. To the first light receiving element, the charge reading out pulse voltage for the first time is supplied immediately before the supplying timing of the charge sweeping out voltage within an exposure period (second stage of FIG. 23), but the charge reading out pulse voltage for the second time is supplied immediately before the end of the exposure period.

As a result, from the first light receiving element, the accumulated charge amount of the first light receiving element is read out into the vertical register 26 at the supplying timings of the charge reading out pulse voltage for the first and second times. It is to be noted that, since transfer of electric charge of the vertical register 26 stops within an exposure period, the electric charge amounts read out twice are added in the vertical register 26 and transferred as data of the same frame from the vertical register 26 after the end of the exposure period.

Meanwhile, to the second light receiving element, the charge reading out pulse voltage is supplied only once immediately before the supplying timing of the charge sweeping out pulse voltage within an exposure period. As a result, from the second light receiving element, the accumulated electric charge amount of the second light receiving element at the only one supplying timing of the charge reading out pulse voltage is read out into the vertical register 26. It is to be noted that, since transfer of electric charge of the vertical register 26 stops within an exposure period, the accumulated electric charge read out from the second light receiving element is transferred as data of the same frame as that of the accumulated electric charge read out from the first light receiving element from the vertical register 26 after the end of the exposure period.

By making the control timings for the first light receiving element and the second light receiving element different from each other in this manner, it is possible to insure that the accumulated electric charge amount read out from the first light receiving element and the accumulated electric charge amount read out from the second light receiving element within the same exposure period(i.e., the sensitivities) can be different from each other.

Incidentally, the first method of electronically implementing a sensitivity mosaic arrangement has a problem in that, depending upon a light receiving element, information of a subject cannot be measured over an overall region within an exposure period.

Figure 24:
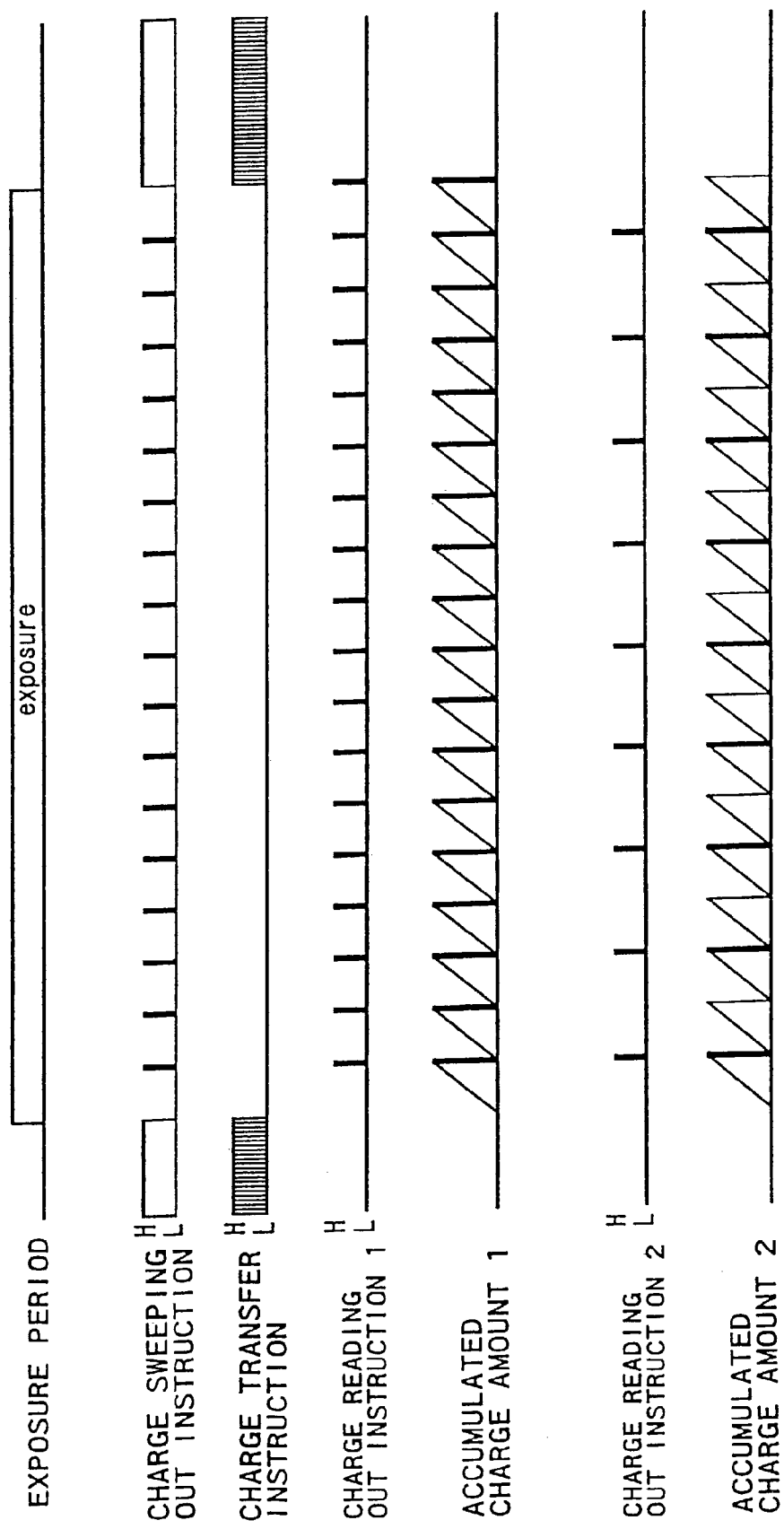
FIG. 24 is a view illustrating a second method for electronically implementing a mosaic pattern of sensitivity.

Now, a second method of electronically implementing a sensitivity mosaic arrangement is described with reference to FIG. 24. The first to seventh stages of FIG. 24 show, similarly to the first to seventh stages of FIG. 23, an exposure period of the CCD image sensor 4, a timing of a pulse voltage for instruction of sweeping out of electric charge, a timing at which a control voltage for instruction of charge transfer is applied, a timing of a pulse voltage for instructing the first light receiving element to read out electric charge, a variation of the electric charge amount accumulated in the first light receiving element in response to application of the charge sweeping out pulse voltage and the charge reading out pulse voltage, a timing of a pulse voltage for instructing the second light receiving element to read out electric charge, and a variation of the electric charge amount accumulated in the second light receiving element in response to application of the charge sweeping out pulse voltage and the charge reading out pulse voltage.

In the second method of electronically implementing a sensitivity mosaic arrangement, the charge sweeping out pulse voltage and the charge reading out pulse voltage are supplied repetitively, a number of times, within an exposure period.

In particular, regarding the charge sweeping out pulse voltage, a set of the charge sweeping out pulse voltage for the first time and the charge sweeping out pulse voltage for the second time are supplied a number of times commonly to the first and second light receiving elements within an exposure period. Regarding the charge reading out pulse voltage, to the first light receiving element, the charge reading out pulse voltage for the first time is supplied, for each set of the charge sweeping out pulse voltages for the first and second times, immediately before the charge sweeping out pulse voltage for the first time, and the charge reading out pulse voltage for the second time is supplied immediately before the charge sweeping out pulse voltage for the second time. Meanwhile, to the second light receiving element, for each set of the charge sweeping out pulse voltages, the charge reading out pulse voltage is supplied only once immediately before the charge sweeping out pulse voltage for the first time.

As a result, for each set of the charge sweeping out pulse voltages for the first and second times, the accumulated charge amount of the first light receiving element at the supplying timing of the charge reading out pulse voltage for the first time and the accumulated charge amount of the first light receiving element at the supplying timing of the charge reading out pulse voltage for the second time are read out from the first light receiving element. It is to be noted that, within an exposure period, since transfer of charge of the vertical register 26 stops, the charge amounts read out twice for each set are added by the vertical register 26. From the second light receiving element, the accumulated charge amount of the second light receiving element at the supplying timing of the charge reading out pulse voltage which is supplied only once for each set of the charge sweeping out pulse voltage for the first and second times is read out. The charge amount read out once for each set is added by the vertical register 26.

In such a second method for electronically implementing a sensitivity mosaic arrangement as described above, since reading out of charge is repeated a number of times within an exposure period, information of the subject over an overall region of the exposure period can be measured.

It is to be noted that, in connection with the first and second methods for electronically implementing a sensitivity mosaic arrangement described above, reading out control of the CCD image sensor 4 is usually applied to the vertical register driving electrodes 25 wired for each horizontal line. For example, in order to implement a sensitivity mosaic arrangement wherein the sensitivity changes for each horizontal line as in the color and sensitivity mosaic pattern P1 shown in FIG. 5, the electrode structure may be utilized, and therefore, some improvements which allow application of different reading out pulse voltages to different lines should be made. Further, in a CCD image sensor of the progressive scanning type having a 3-phase driven vertical register, an arbitrary mosaic arrangement with two different sensitivity stages can be implemented electronically by devising the electrode structure.

Figure 25:
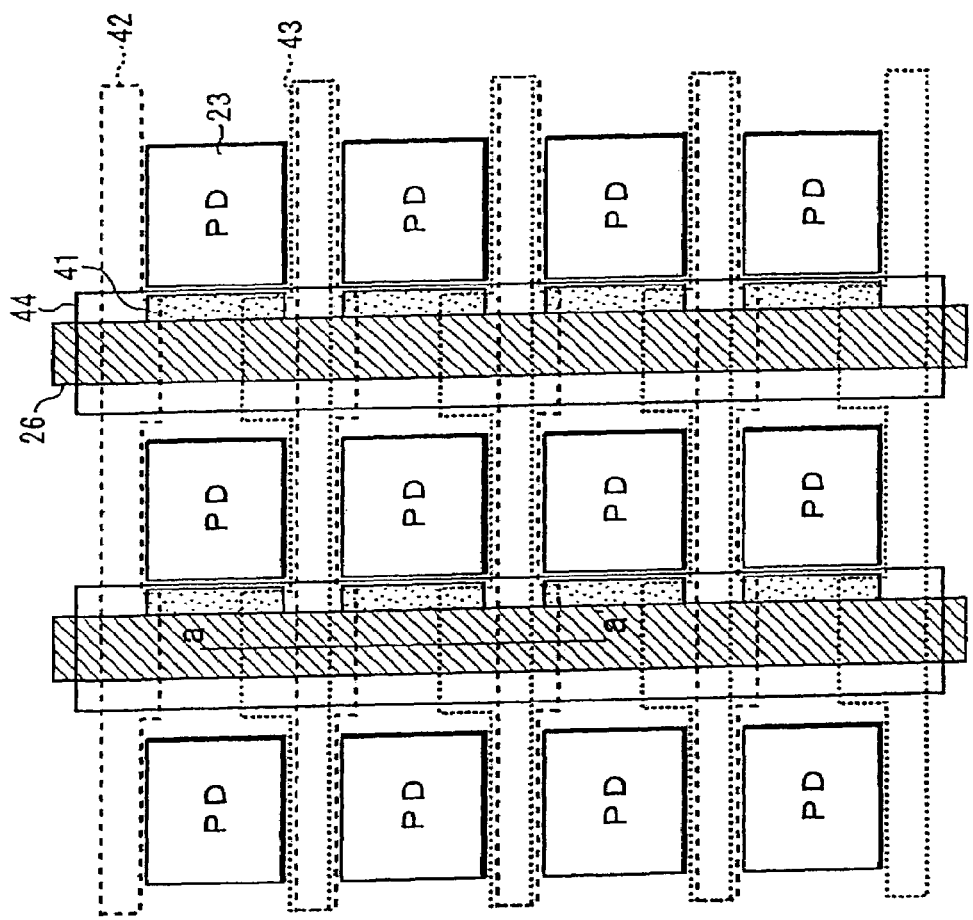
FIG. 25 is a schematic view showing an OR-type electrode structure.
Figure 26:
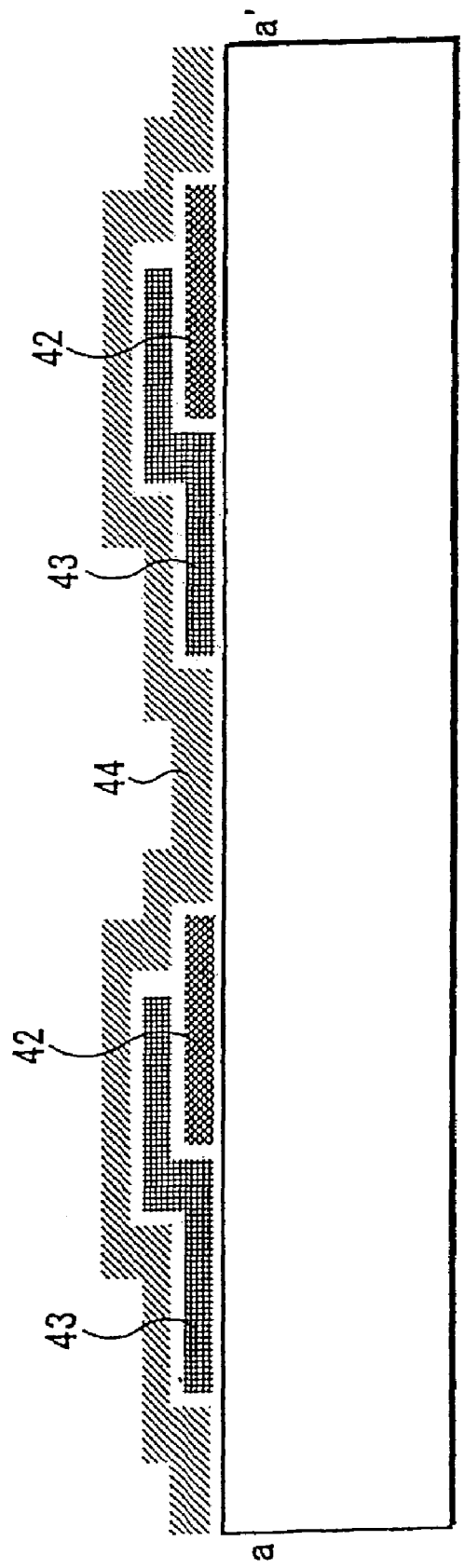
FIG. 26 is a sectional view showing a cross section of the OR-type electrode structure.

FIG. 25 shows a first electrode structure of a poly-silicon electrode for vertical transfer by an electrode wiring line used to implement a sensitivity mosaic arrangement having two stages of sensitivity. FIG. 26 shows a cross sectional view of the CCD image sensor taken along line a-a' of FIG. 25. Each of a first phase vertical register driving electrode 42 and a second phase vertical register driving electrode 43 is connected to electrodes of adjacent pixels on the same horizontal line, and therefore, the electrodes on the same horizontal line are driven in synchronism. Meanwhile, a third phase vertical register driving electrode 44 is connected to electrodes of adjacent pixels on the same vertical line, and therefore, the electrodes on the same vertical line are driven in synchronism. Further, the second phase vertical register driving electrode 43 and the third phase vertical register driving electrode 44 overlie a reading out gate 41 adjacent the corresponding photo-diode 23.

Accordingly, when a reading out pulse is applied to the second phase vertical register driving electrode 43 or the third phase vertical register driving electrode 44, the barrier of the reading out gate 41 can be temporarily removed to allow charge accumulated in the corresponding photo-diode 23 to be transferred to the vertical register 26. In the following description, the electrode structure shown in FIGS. 25 and 26 is referred to as an OR type electrode structure.

Figure 27:
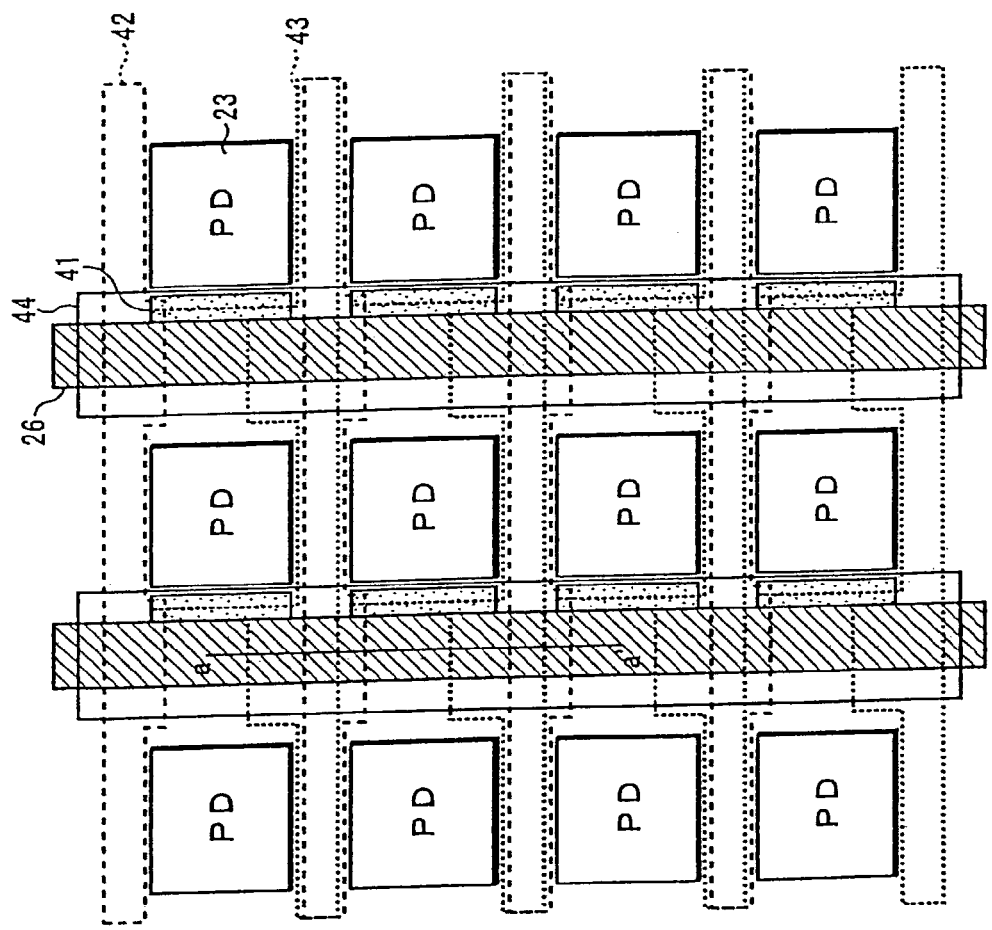
FIG. 27 is a schematic view showing an AND-type electrode structure.

FIG. 27 shows a second electrode structure of a poly-silicon electrode for vertical transfer by electrode wiring lines used to implement a sensitivity mosaic arrangement having two stages of sensitivity. The cross section of the CCD image sensor taken along line a-a' of FIG. 27 is similar to that of the cross sectional view shown in FIG. 26. In particular, in the second electrode structure, similarly to the first electrode structure, each of the first phase vertical register driving electrode 42 and the second phase vertical register driving electrode 43 are connected to electrodes of adjacent pixels on the same horizontal line, and therefore, the electrodes on the same horizontal line are driven in synchronism. Since the third phase vertical register driving electrode 44 is connected to electrodes of adjacent pixels on the same vertical line in the same manner as the first electrode structure, the electrodes on the same vertical line are driven in synchronism.

However, the second electrode structure is different from the first electrode structure in that the third phase vertical register driving electrode 44 is disposed along an edge portion of the corresponding photo-diode 23 on the reading out gate 41 adjacent the photo-diode 23 and a portion of the second phase vertical register driving electrode 43 which is formed in an elongated shape so as to be adjacent to the edge portion of the photo-diode 23 overlies the reading out gate 41.

Accordingly, when a reading out pulse is applied to only one of the second phase vertical register driving electrode 43 and the third phase vertical register driving electrode 44, the barrier of the reading out gate 41 cannot be removed. In order to remove the barrier of the reading out gate 41 to allow charge accumulated in the photo-diode 23 to be transferred to the vertical register 26, it is necessary to apply a reading out pulse to the second phase vertical register driving electrode 43 and the third phase vertical register driving electrode 44 simultaneously. In the following description, the electrode structure shown in FIG. 27 is referred to as an AND type electrode structure.

An arbitrary mosaic arrangement with two stages of sensitivity can be produced by using the OR type electrode structure and the AND type electrode structure described above in combination in one CCD image sensor. For example, in order to implement a sensitivity mosaic arrangement of the color and sensitivity mosaic pattern P1 shown in FIG. 5, the OR type electrode structure and the AND type electrode structure should be used in such a combination as shown in FIG. 28.

As can be seen apparently from comparison between FIGS. 5 and 28, the AND type electrode structure is adopted for pixels having the low sensitivity S0 from between the two sensitivity stages S0 and S1 while the OR type electrode structure is adopted for pixels of the high sensitivity S1. If the reading out pulse voltage is applied to the second phase vertical register driving electrodes 43 of the CCD image sensor 4 formed from such a combination of the OR and AND type electrode structures as just described, then charge reading out is performed only with the OR type pixels, but if the reading out pulse voltage is applied to the second phase vertical register driving electrode 43 and the third phase vertical register driving electrode 44 simultaneously, then charge reading out is performed with both of the OR and AND type pixels, that is, all pixels.

It is to be noted that, if the supplying timings of the pulse voltage to the second phase vertical register driving electrode 43 and the third phase vertical register driving electrode 44 are such that both of the second phase and the third phase are driven at the supplying timing of the charge reading out pulse voltage for the first time in (D) of FIG. 23 (or FIG. 24) from among the control timings shown in FIG. 23 (or FIG. 24) and the supplying timing of the charge reading out pulse voltage of (F) of FIG. 23 (or FIG. 24) whereas only the second phase is driven at the supplying timing of the charge reading out pulse voltage for the second time of (D) of FIG. 23 (or FIG. 24), then the pixels of the OR type electrode structure have the high sensitivity S1 while the pixels of the AND type electrode structure have the low sensitivity S0.

By a similar method, the other sensitivity mosaic arrangements having two stages of sensitivity can be produced. For example, in order to implement the sensitivity mosaic pattern of the color and sensitivity mosaic pattern P2 shown in FIG. 6, the OR type and the AND type are used in such a combination as shown in FIG. 29. In order to implement the sensitivity mosaic pattern of the color and sensitivity mosaic pattern P3 shown in FIG. 7, the OR type and the AND type are used in such a combination as shown in FIG. 30. In order to implement the sensitivity mosaic pattern of the color and sensitivity mosaic pattern P4 shown in FIG. 8, the OR type and the AND type are used in such a combination as shown in FIG. 31. In order to implement the sensitivity mosaic pattern of the color and sensitivity mosaic pattern P5 shown in FIG. 9, the OR type and the AND type are used in such a combination as shown in FIG. 32.

Now, a demosaic process of the image processing system including the image processing section 7 as a principal component is described. However, prior to the description of the demosaic process, a definition of position coordinates of a pixel which is used in the following description is provided with reference to FIG. 33.

Figure 33:
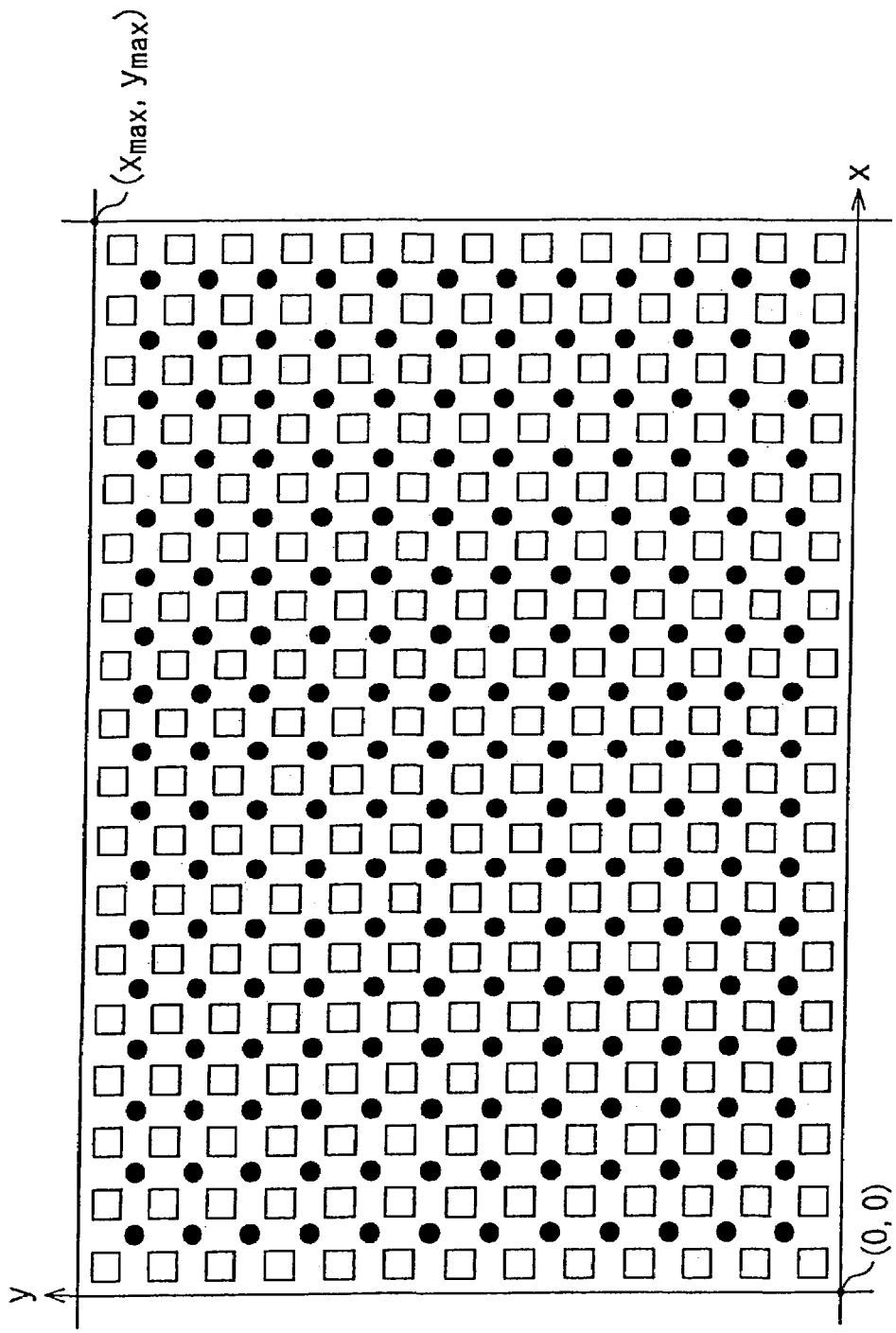
FIG. 33 is a view illustrating a definition of position coordinates of a pixel.

FIG. 33 shows a coordinate system (x,y) indicating a position of a pixel on an image. In particular, the left lower end of the image is represented by (0,0) and the right upper end of the image is represented by ($x_{max}$, $y_{max}$). Pixels represented by □ in FIG. 33 have a horizontal dimension and a vertical dimension of a length 1 and are arranged on a lattice. Accordingly, for example, the coordinates of the center of the pixel at the left lower end are (0.5, 0.5), and the coordinates of the center of the pixel at the right upper end are ($x_{max}$-0.5, $y_{max}$-0.5). Further, image data whose phase is displaced vertically and horizontally by a half pixel from the pixels represented by □ (pixel data at a position represented by ● in FIG. 33) is sometimes used, and, for example, the coordinates of image data whose phase is displaced vertically and horizontally by a half pixel from the pixel at the left lower end are (1, 1).

Figure 34:
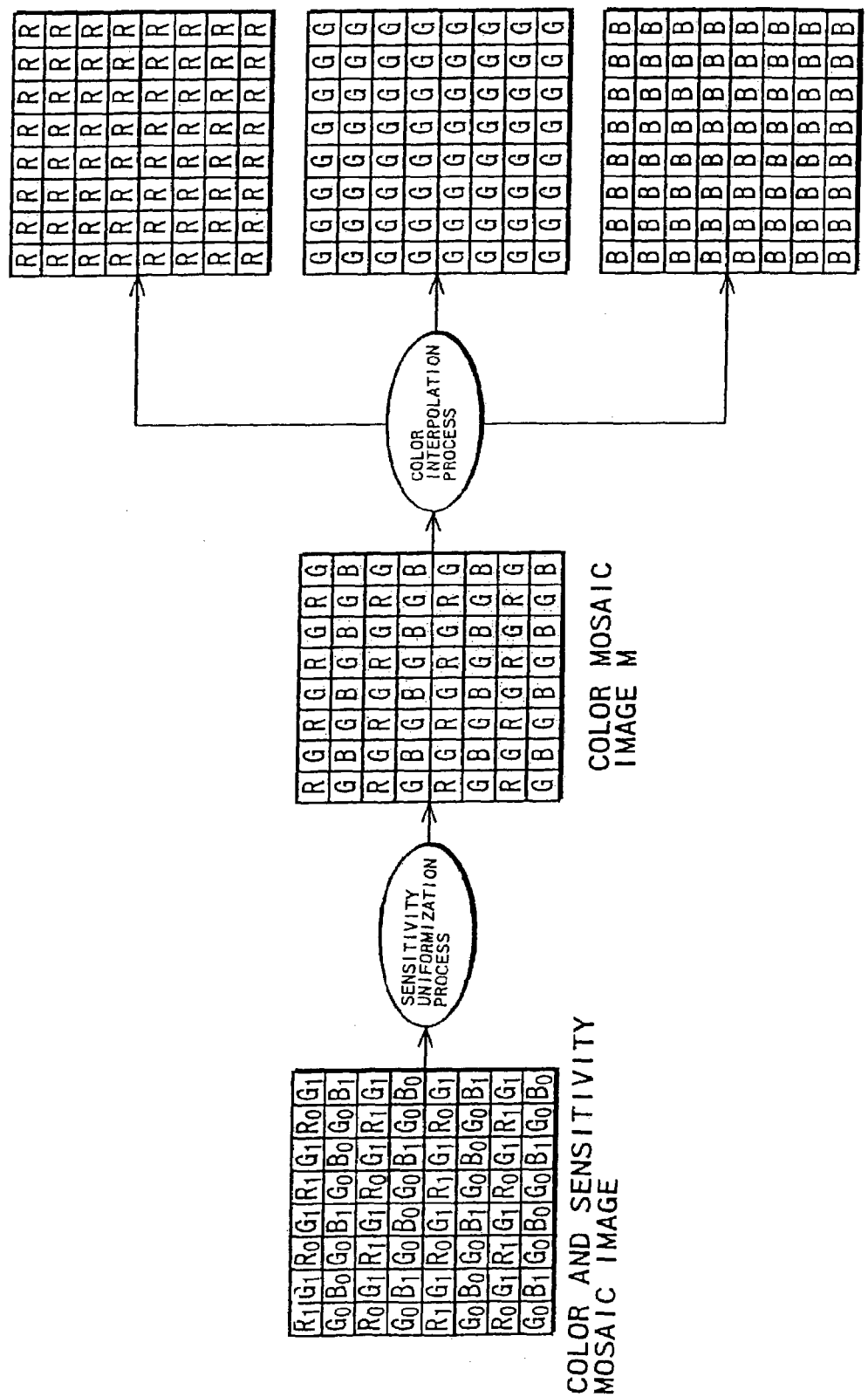
FIG. 34 is a view illustrating an outline of a first demosaic process.

FIG. 34 illustrates an outline of a first demosaic process of the image processing system including the image processing section 7 as a principal component.

The first demosaic process includes, as shown in FIG. 34, a sensitivity uniformization process for uniformizing the sensitivities of pixels of a color and sensitivity mosaic image obtained by processing of the image pickup system without changing the colors of the pixels to produce a color mosaic image, and a color correction process for restoring RGB components of the pixels of a color and sensitivity mosaic image M.

Figure 35:
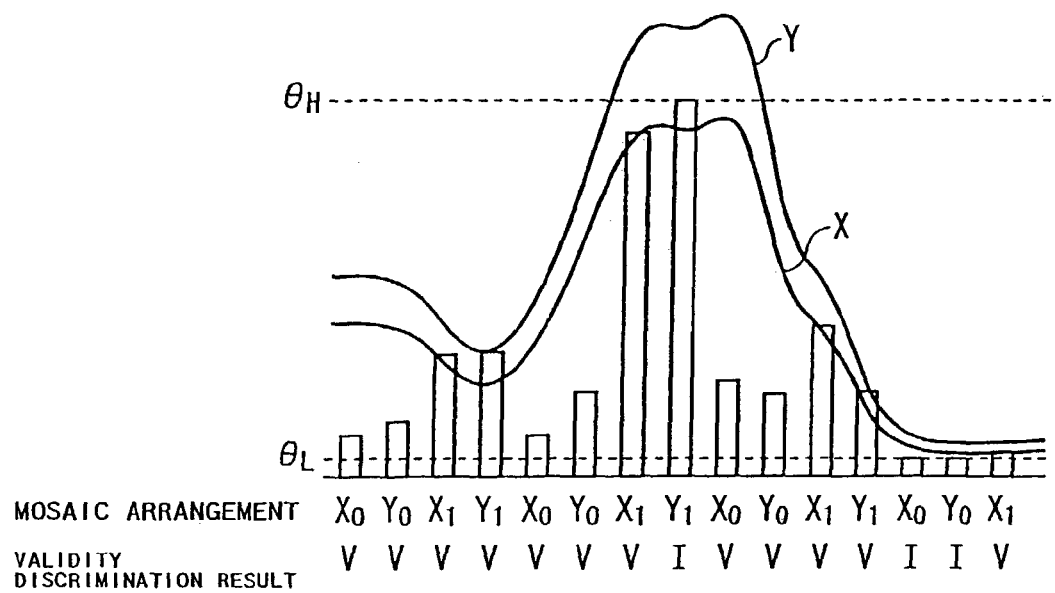
FIG. 35 is a graph illustrating an outline of a first sensitivity uniformization process in the first demosaic process.
Figure 36:
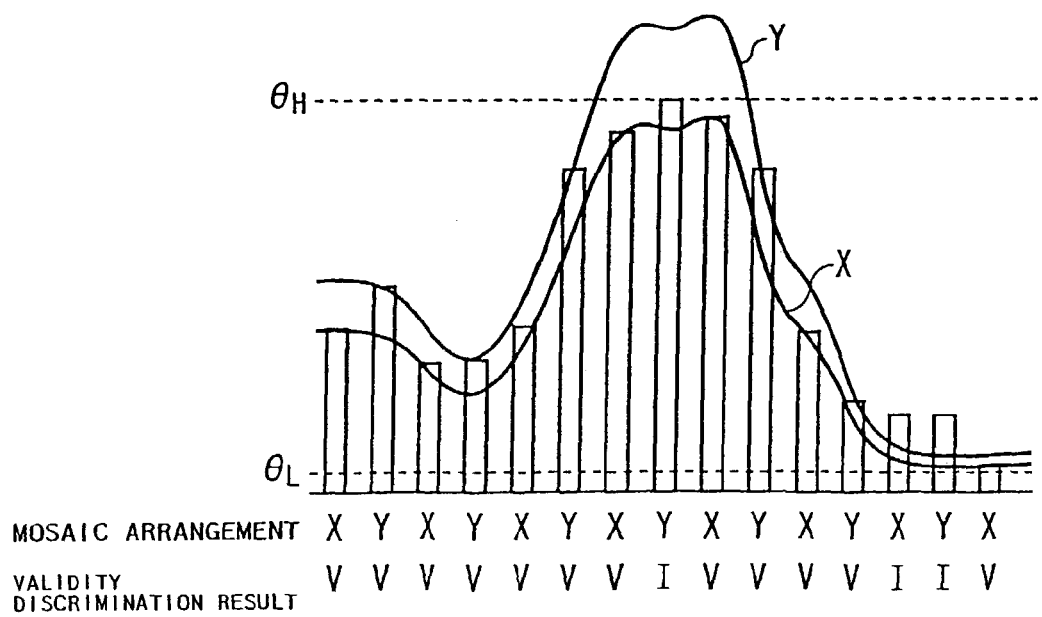
FIG. 36 is a graph illustrating an outline of the first sensitivity uniformization process in the first demosaic process.
Figure 37:
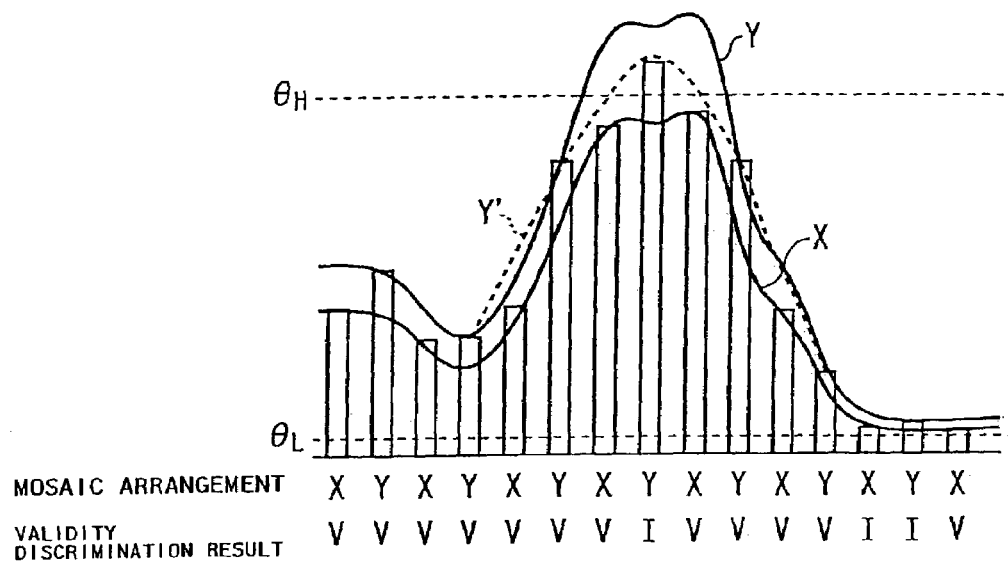
FIG. 37 is a graph illustrating an outline of the first sensitivity uniformization process in the first demosaic process.

An outline of the first sensitivity uniformization process in the first demosaic process is described with reference to FIGS. 35 to 37. FIGS. 35 to 37 illustrate a pixel arrangement of a predetermined one line of an image to be processed. X0 represents that the color component is X (for example, R (red)) and the sensitivity is S0 from between the two stages of S0 and S1; X1 represents that the color component is X and the sensitivity is S1 from between the two stages of S0 and S1; Y0 represents that the color component is Y (for example, G (green)) and the sensitivity is S0 from between the two stages of S0 and S1; and Y1 represents that the color component is Y and the sensitivity is S1 from between the two stages of S0 and S1. Each pixel of the sensitivity S0 measures the intensity of incoming light attenuated at a predetermined ratio while each pixel of the sensitivity S1 measures the intensity of incoming light without any attenuation. Further, in FIGS. 35 to 37, the axis of abscissa indicates the position of a pixel on a line, and the length of a vertical bar indicates the pixel value of a corresponding pixel.

The first sensitivity uniformization process in the first demosaic process can be divided into processes of two different stages. FIG. 35 shows pixel values of pixels in a predetermined one line of a color and sensitivity mosaic image before the first sensitivity uniformization process is performed. It is to be noted that a curve X indicates an intensity distribution of the color X of the incoming light, and another curve Y indicates an intensity distribution of the color Y.

A threshold value $\theta_H$ indicates a saturation level of the CCD image sensor 4, and when the intensity of the incoming light exceeds the threshold value $\theta_H$, the intensity cannot be measured accurately and the measurement value then is equal to the threshold value $\theta_H$. Another threshold value $\theta_L$ indicates a noise level of the CCD image sensor 4, and also when the intensity of the incoming light is lower than the threshold value $\theta_L$, the intensity cannot be measured accurately and the measurement value then is equal to the threshold value $\theta_L$.

A validity discrimination result is information representative of whether or not each pixel has successfully measured the intensity of the incoming light, that is, information representative of whether the pixel value of each pixel measured is valid (V) or invalid (I).

Through the first stage process of the first sensitivity uniformization process, the pixel values of the pixels of the sensitivity S0 are scaled using the relative ratio of the sensitivity S0 to the sensitivity S1. The pixel values of the pixels of the sensitivity S1 are not scaled. FIG. 36 shows a result of application of the first stage process of the first sensitivity uniformization process. In the state after the first stage process is performed, as seen in FIG. 36, the pixels whose validity discrimination result is valid have an original light intensity restored by the scaling, but the pixels whose validity discrimination result is invalid do not have an original restored light intensity.

Therefore, in the second stage process of the first sensitivity uniformization process, the pixel value of each of those pixels which are invalid is interpolated using the pixel values of those valid pixels of the same color which neighbor with the pixel. FIG. 37 illustrates a result of application of the second stage process of the first sensitivity uniformization process. For example, the pixel of the color Y which is at the center of FIG. 37 and is invalid is interpolated in accordance with an interpolation curve Y' produced using the pixel values of those pixels of the color Y which neighbor with the pixel and are valid.

Subsequently, an outline of the second sensitivity uniformization process of the first demosaic process is described with reference to FIGS. 35, 38 and 39. Also the second sensitivity uniformization process can be divided into two stages of processes. The pixel values of pixels in a predetermined one line of a color and sensitivity mosaic image before the second sensitivity uniformization process is performed are similar to those in FIG. 35.

By the first stage process of the second sensitivity uniformization process, pixel values with regard to the sensitivity S0 and pixel values with regard to the sensitivity S1 are estimated without changing the color of each pixel. For example, for a pixel of the sensitivity S0 of the color X, the pixel value with regard to the sensitivity S0 is used at it is, and an estimated value with regard to the sensitivity S1 is interpolated using the pixel values of those pixels of the sensitivity S1 and the color X which are present in the neighborhood of the pixel. FIG. 38 shows a result of application of the first stage process of the second sensitivity uniformization process. As shown in FIG. 38, after the first stage process is performed, each pixel has a pixel value of sensitivity S0 or a pixel value of the sensitivity S1 of the original color.

By the second stage process of the second sensitivity uniformization process, for each pixel, the pixel values of the sensitivity S0 and the pixel values of the sensitivity S1 are synthesized to create a uniform sensitivity. FIG. 39 shows a result of application of the second stage process of the second sensitivity uniformization process.

Figure 40:
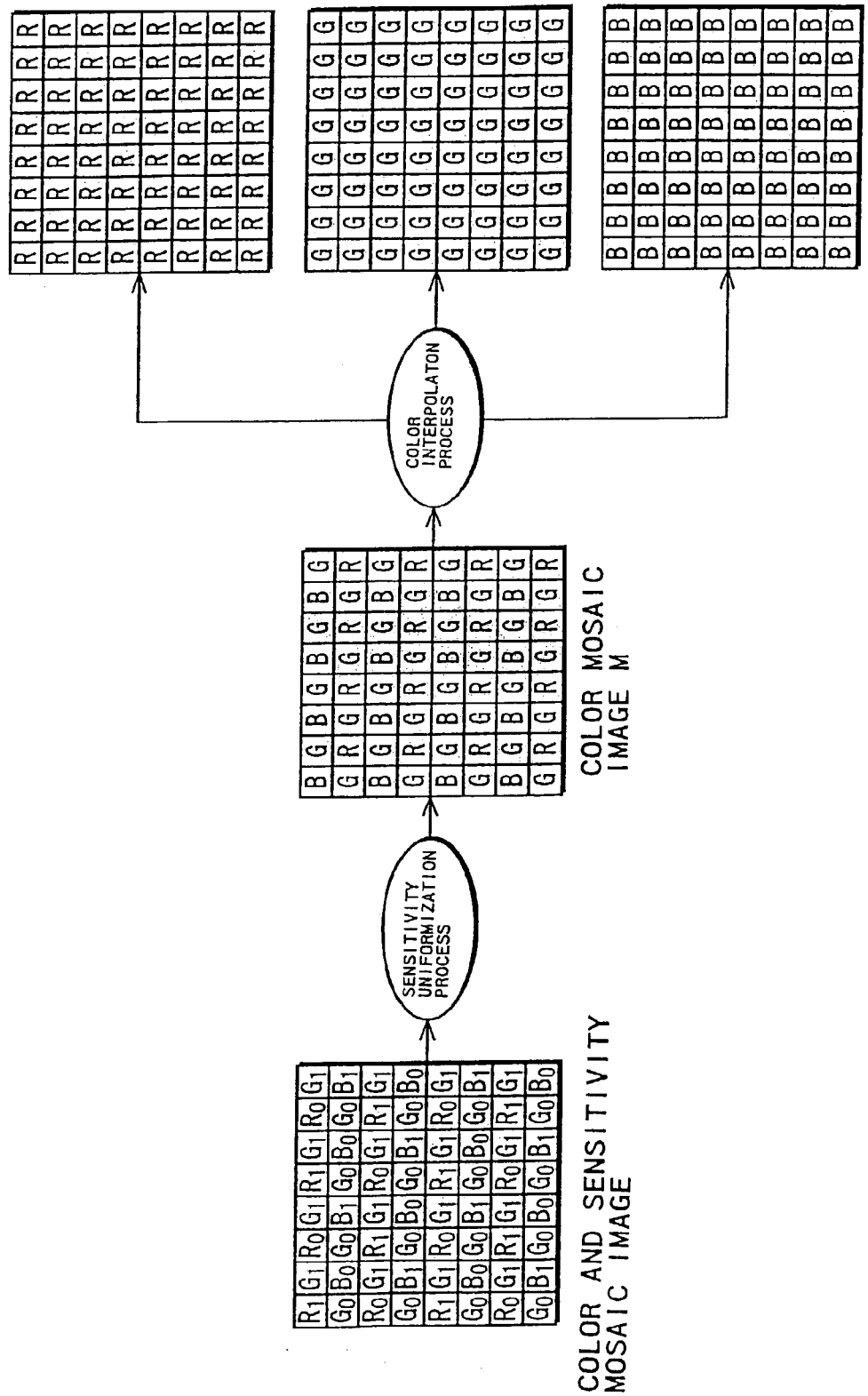
FIG. 40 is a view illustrating an outline of a second demosaic process.

FIG. 40 shows an outline of the second demosaic process of the image processing system which includes the image processing section 7 as a principal component.

The second demosaic process includes, as shown in FIG. 40, a sensitivity uniformization process wherein the colors of pixels of a color and sensitivity mosaic image obtained by the process of the image pickup system are changed to colors optimum for sensitivity uniformization and the sensitivities are uniformized to produce a color mosaic image, and a color correction process for restoring RGB components of pixels of the color and sensitivity mosaic image M.

Figure 41:
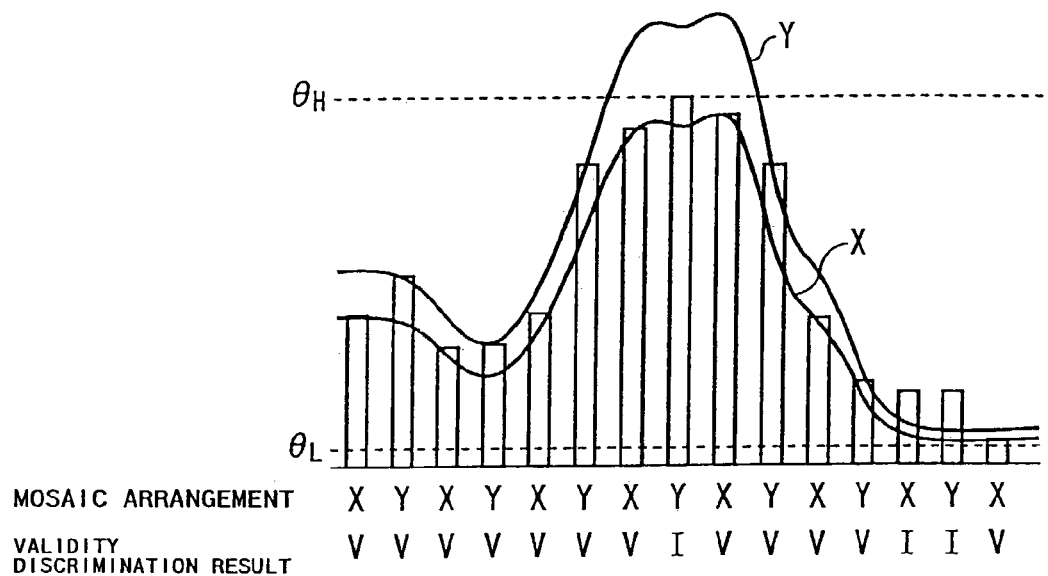
FIG. 41 is a graph illustrating an outline of a first sensitivity uniformization process in the second demosaic process.
Figure 42:
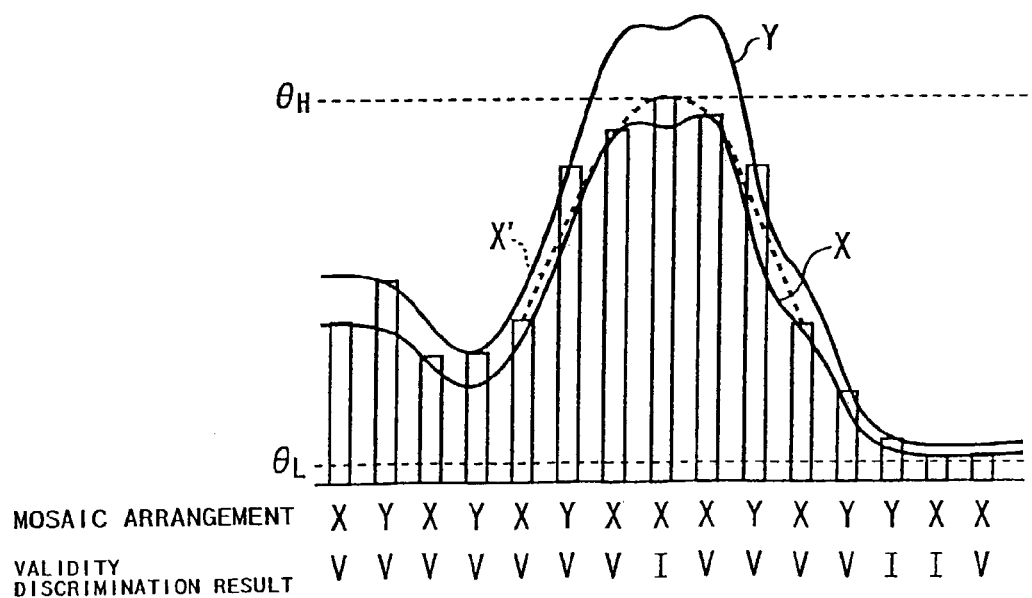
FIG. 42 is a graph illustrating an outline of the first sensitivity uniformization process in the second demosaic process.

An outline of the first sensitivity uniformization process of the second demosaic process is described with reference to FIGS. 35, 41 and 42.

Also, the first sensitivity uniformization process of the second demosaic process can be divided into two stages of processes. It is assumed that the pixel values of pixels in a predetermined one line of a color and sensitivity mosaic image before the first sensitivity uniformization process is performed are similar to those in FIG. 35.

Through the first stage process of the first sensitivity uniformization process of the second demosaic process, the pixel values of the pixels of the sensitivity S0 are scaled using the relative ratio of the sensitivity S0 to the sensitivity S1. The pixel values of the pixels of the sensitivity S1 are not scaled. FIG. 41 shows a result of application of the first stage process of the first sensitivity uniformization process. In the state after the first stage process is performed, as seen in FIG. 41, the pixels whose validity discrimination result is valid (V) have an original light intensity restored by the scaling, but the pixels whose validity discrimination result is invalid (I) do not have an original restored light intensity.

Therefore, in the second stage process of the first sensitivity uniformization process of the second demosaic process, the pixel value of each of those pixels which are invalid is interpolated using the pixel values of those valid pixels, regardless of the colors thereof, which neighbor the pixel. FIG. 42 illustrates a result of application of the second stage process of the first sensitivity uniformization process. For example, the pixel value of the pixel of the color Y which is at the center of FIG. 41 and is invalid is interpolated in accordance with an interpolation curve X' produced using the pixel values of pixels of the color X which neighbor with the pixel and are valid.

Figure 43:
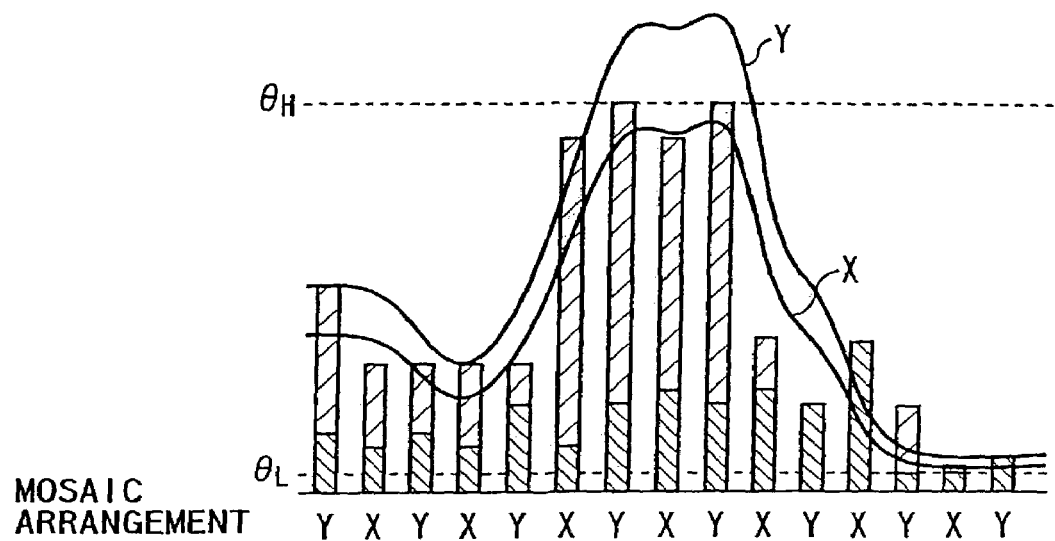
FIG. 43 is a graph illustrating an outline of a second sensitivity uniformization process in the second demosaic process.
Figure 44:
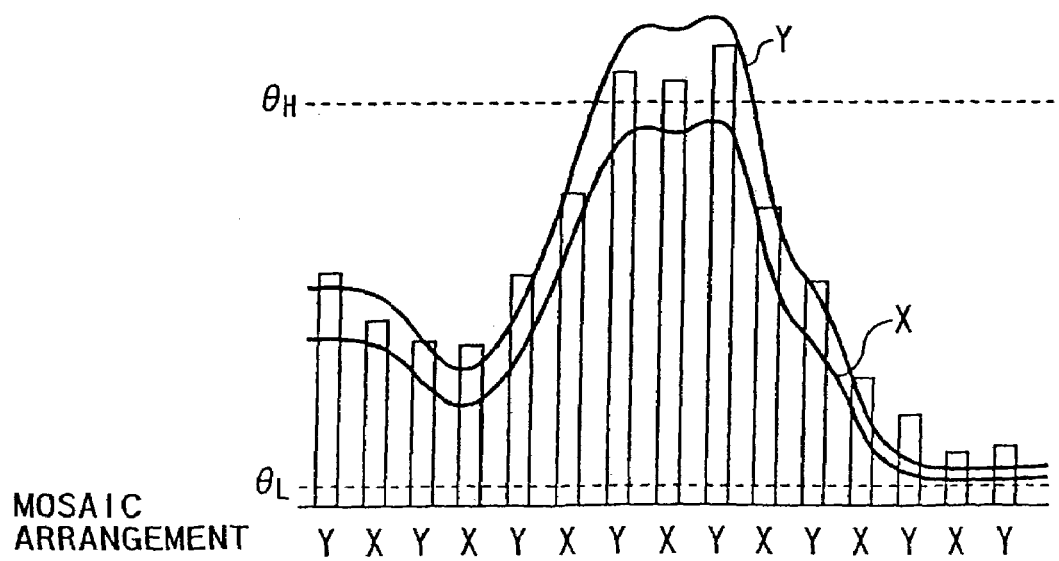
FIG. 44 is a graph illustrating an outline of the second sensitivity uniformization process in the second demosaic process.

Now, an outline of the second sensitivity uniformization process of the second demosaic process is described with reference to FIGS. 35, 43 and 44. Also, the second sensitivity uniformization process of the second demosaic process can be divided into two stages of processes. It is assumed that the pixel values of pixels on a predetermined one line of a color and sensitivity mosaic image before the second sensitivity uniformization process is performed are similar to those in FIG. 35.

In the first stage process of the second sensitivity uniformization process of the second demosaic process, for each pixel, the pixel values of neighboring pixels which are positioned comparatively near to the pixel irrespective of the color are used to estimate the pixel value with regard to the sensitivity S0 and the pixel value with regard to the sensitivity S1. For example, as an estimated value of a pixel of the color X, where a pixel neighboring the pixel has the color Y, an estimated value with regard to the sensitivity S1 of the color Y and the pixel value with regard to the sensitivity S1 are interpolated. FIG. 43 illustrates a result of application of the first stage process of the second sensitivity uniformization process. As shown in FIG. 43, after the first stage process is performed, each pixel has the pixel value with regard to the sensitivity S0 and the pixel value with regard to the sensitivity S1 of the original color because the color thereof has been changed to the color of the neighboring pixel irrespective of the original color.

In the second stage process of the second sensitivity uniformization process of the second demosaic process, for each pixel, the pixel value with regard to the sensitivity S0 and the pixel value with regard to the sensitivity S1 are synthesized to create a uniform sensitivity. FIG. 44 shows a result of application of the second stage process of the second sensitivity uniformization process.

Now, a first example of a configuration of the image processing section 7 which principally executes the first demosaic process is described with reference to FIG. 45. It is assumed that, in the following description, unless otherwise specified, the color and sensitivity mosaic image has the color and sensitivity mosaic pattern P2 of FIG. 6, that is, in the color and sensitivity mosaic image, the color of each pixel is one of the three primary colors of R, G and B and the sensitivity is one of S0 and S1. However, the configuration and the operation described below can be applied to another color and sensitivity mosaic image which includes three colors other than R, G and B or a further color and sensitivity mosaic image which includes four colors.

In the first example of a configuration of the image processing section 7, a color and sensitivity mosaic image from the image pickup system is supplied to a sensitivity uniformization section 51. Color mosaic pattern information representative of a color mosaic arrangement of the color and sensitivity mosaic image is supplied to the sensitivity uniformization section 51 and a color interpolation section 52. Sensitivity mosaic pattern information representative of a sensitivity mosaic arrangement of the color and sensitivity mosaic image is supplied to the sensitivity uniformization section 51.

The sensitivity uniformization section 51 performs a sensitivity uniformization process for the color and sensitivity mosaic image based on the color mosaic pattern information and the sensitivity mosaic pattern information to produce a color mosaic image M wherein the sensitivities of the pixels are uniformized while the colors of the pixels are not changed, and outputs the color mosaic image M to the color interpolation section 52.

The color interpolation section 52 performs a color interpolation process, in which the color mosaic pattern information is used, for the color mosaic image M from the sensitivity uniformization section 51 to produce output images R, G and B.

It is to be noted that the color mosaic pattern information is information representative of the types of the colors (in the present embodiment, the colors of R, G and B) of the pixels of the color and sensitivity mosaic image, and information of a color component of each of the pixels can be acquired using the position of the pixel as an index.

The sensitivity mosaic pattern information is information representative of the types of the sensitivities (in the present case, S0 and S1) of the pixels of the color and sensitivity mosaic image, and information of the sensitivity of each of the pixels can be acquired using the position of the pixel as an index.

Figure 46:
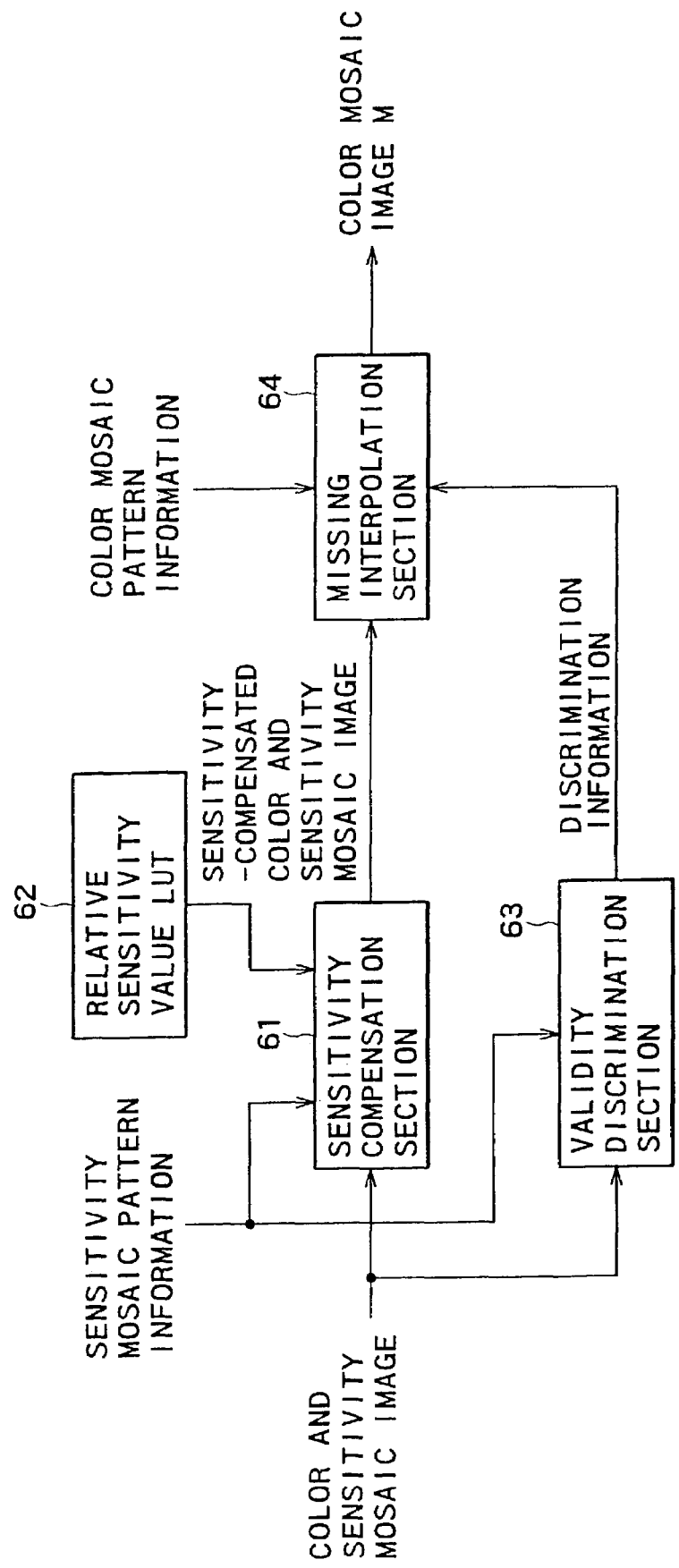
FIG. 46 is a block diagram showing a first embodiment of a configuration of a sensitivity uniformization section 51.

FIG. 46 shows a first example of the configuration of the sensitivity uniformization section 51. The first example of a configuration is an example of a configuration of the sensitivity uniformization section 51 which executes the first sensitivity uniformization process described with reference to FIGS. 35 to 37.

In the first example of the configuration of the sensitivity uniformization section 51, a color and sensitivity mosaic image from the image pickup system is supplied to a sensitivity compensation section 61 and a validity discrimination section 63. Color mosaic pattern information is supplied to a missing interpolation section 64. Sensitivity mosaic pattern information is supplied to the sensitivity compensation section 61 and the validity discrimination section 63.

The sensitivity compensation section 61 performs sensitivity compensation for the color and sensitivity mosaic image based a relative sensitivity value S obtained from a relative sensitivity value LUT 62 and outputs a resulting color and sensitivity mosaic image to the missing interpolation section 64. The relative sensitivity value LUT 62 is a lookup table which outputs a relative sensitivity value S using the sensitivity of a pixel as an index.

The validity discrimination section 63 compares the pixel value of each of the pixels of the color and sensitivity mosaic image with the threshold value $\theta_H$ of the saturation level and the threshold value $\theta_L$ of the noise level to discriminate the validity of the pixel value and supplies a result of the discrimination as discrimination information to the missing interpolation section 64. In the discrimination information, information representative of "valid" or "invalid" regarding the pixel value of each pixel is described.

The missing interpolation section 64 performs a missing interpolation process for the sensitivity-compensated color and sensitivity mosaic image based on the discrimination information from the validity discrimination section 63 to produce a color mosaic image M and outputs the color mosaic image M to the color interpolation section 52 in the next stage.

Figure 47:
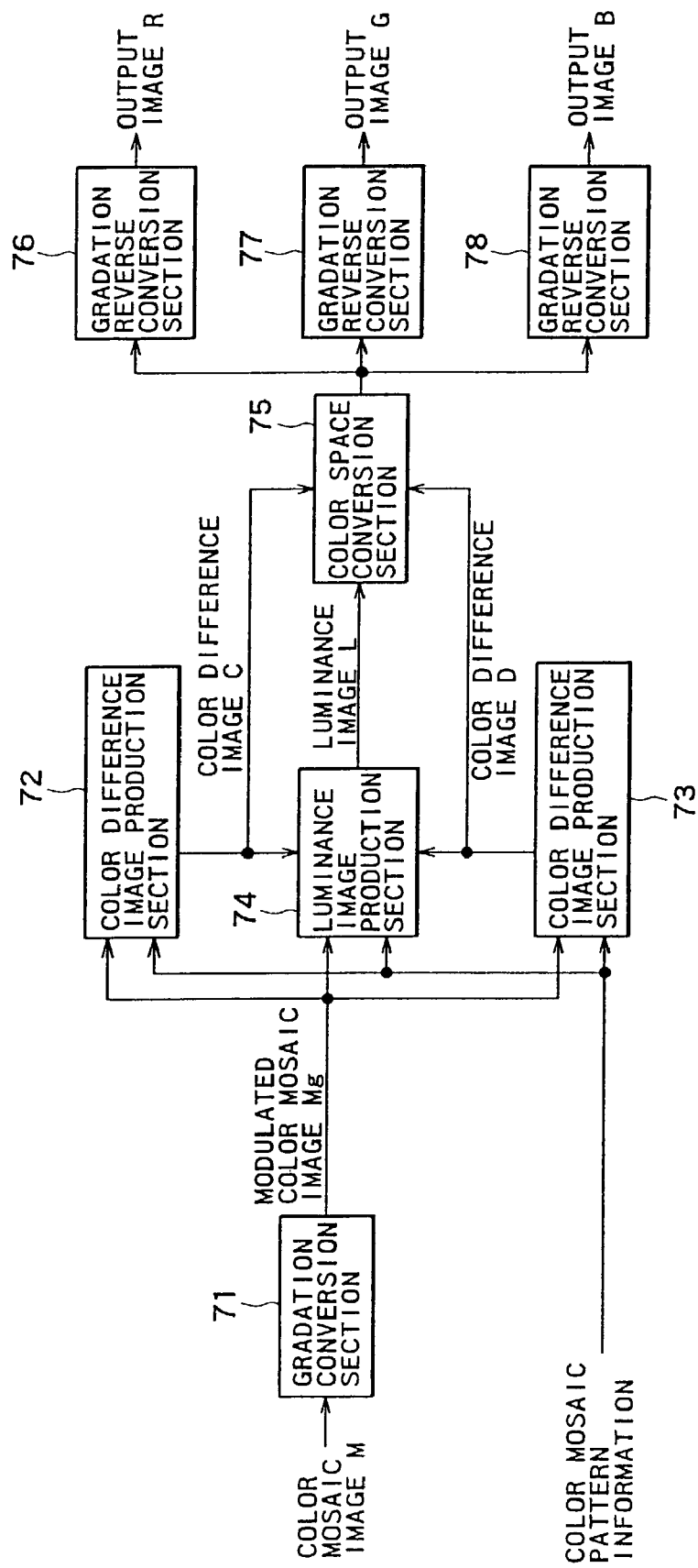
FIG. 47 is a block diagram showing an embodiment of a configuration of a color interpolation section 52.

FIG. 47 shows an example of a configuration of the color interpolation section 52. In the color interpolation section 52, the color mosaic image M from the sensitivity uniformization section 51 is supplied to a gradation conversion section 71. The color mosaic pattern information is supplied to color difference image production sections 72 and 73 and a luminance image production section 74.

The gradation conversion section 71 performs a gradation conversion process for the color mosaic image M and supplies a resulting modulated color mosaic image Mg to the color difference image production sections 72 and 73 and the luminance image production section 74. Conversion based on a power function of the power γ or the like is used for the gradation conversion process.

The color difference image production section 72 uses the modulated color mosaic image Mg to produce a color difference image C wherein all pixels have a color difference C (=R−G) component and supplies the color difference image C to the luminance image production section 74 and a color space conversion section 75. The color difference image production section 73 produces a color difference image D wherein all pixels have a color difference D (=B−G) component and supplies the color difference image D to the luminance image production section 74 and the color space conversion section 75. The luminance image production section 74 uses the modulated mosaic image Mg and the color difference images C and D to produce a luminance image L and supplies the luminance image L to the color space conversion section 75.

The color space conversion section 75 performs a color space conversion process for the color difference images C and D and the luminance image L and supplies resulting modulated images (images in each of which the pixels have an R, G or B component) to gradation reverse conversion sections 76 to 78.

The gradation reverse conversion section 76 raises the pixel values of the R components from the color space conversion section 75 to the (1/γ)th power to perform reverse conversion to the gradation conversion by the gradation conversion section 71 to obtain an output image R. The gradation reverse conversion section 77 raises the pixel values of the G components from the color space conversion section 75 to the (1/γ)th power to perform reverse conversion to the gradation conversion by the gradation conversion section 71 to obtain an output image G. The gradation reverse conversion section 78 raises the pixel values of the B components from the color space conversion section 75 to the (1/γ)th power to perform reverse conversion to the gradation conversion by the gradation conversion section 71 to obtain an output image B.

It is to be noted that, where the color mosaic image M supplied from the sensitivity uniformization section 51 has a Bayer arrangement, the color interpolation section 52 may execute a conventional color interpolation process, for example, using the related-art method disclosed in the official gazette of Japanese Patent Laid-Open No. Sho 61-501424 and the like.

Figure 48:
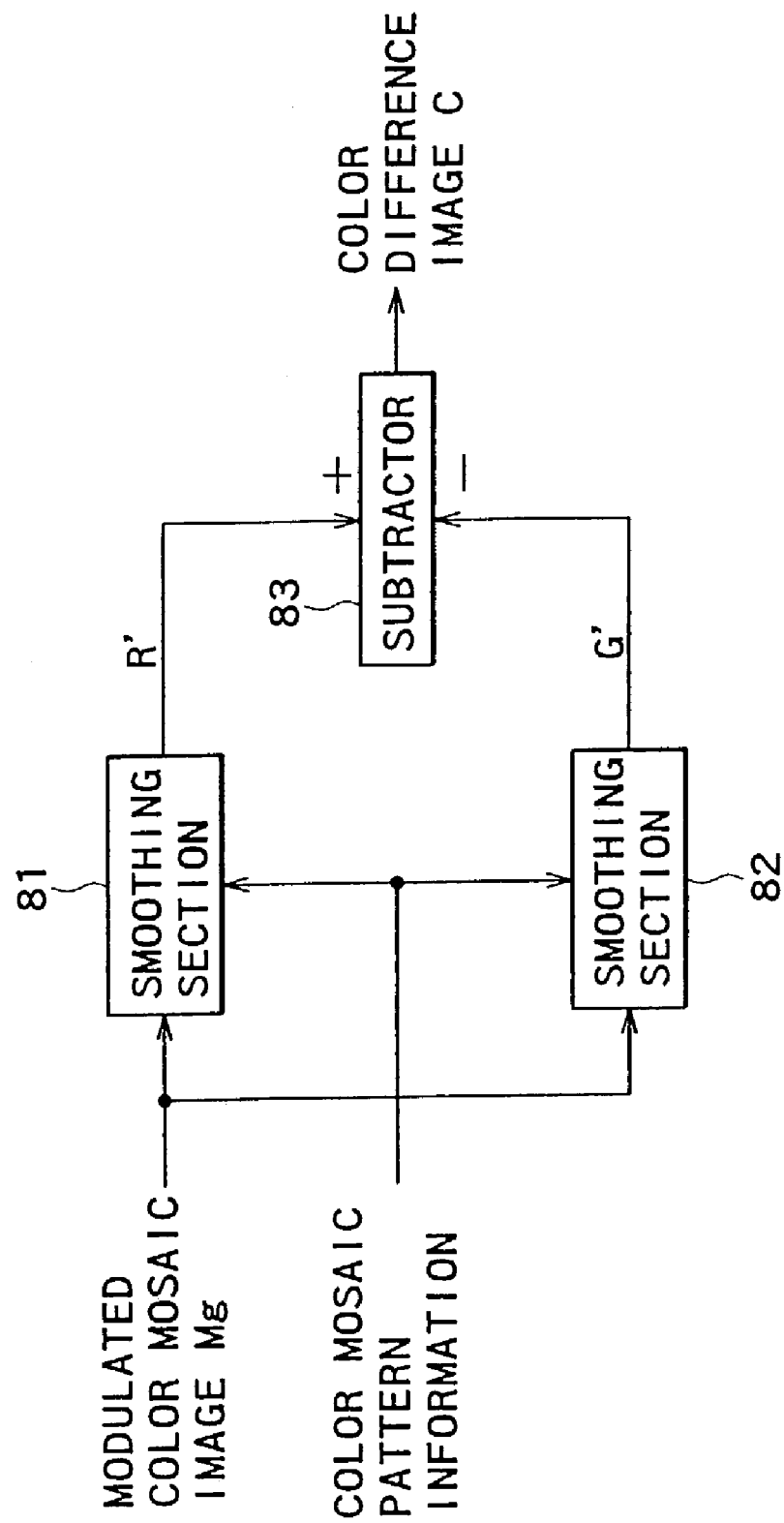
FIG. 48 is a block diagram showing an embodiment of a configuration of a color difference image production section 72.

FIG. 48 shows an example of a configuration of the color difference image production section 72. In the color difference image production section 72, the modulated color mosaic image Mg from the gradation conversion section 71 is supplied to smoothing sections 81 and 82. Also, the color mosaic pattern information is supplied to the smoothing sections 81 and 82.

The smoothing section 81 uses, for each pixel, the pixel values of neighboring pixels having an R component to interpolate the R component of the pixel to produce a smoothed image R' of the R component and supplies the image R' to a subtractor 83. The smoothing section 82 uses, for each pixel, the pixel values of neighboring pixels having a G component to interpolate the G component of the pixel to produce a smoothed image G' of the G component and supplies the image G' to the subtractor 83.

The subtractor 83 subtracts the pixel values of the pixels of the smoothed image G' of the G component from the smoothing section 82 from the pixel values of the corresponding pixels of the smoothed image R' of the R component from the smoothing section 81 to produce a color difference image C and supplies the color difference image C to the color space conversion section 75.

It is to be noted that the color difference image production section 73 has a similar configuration.

Figure 49:
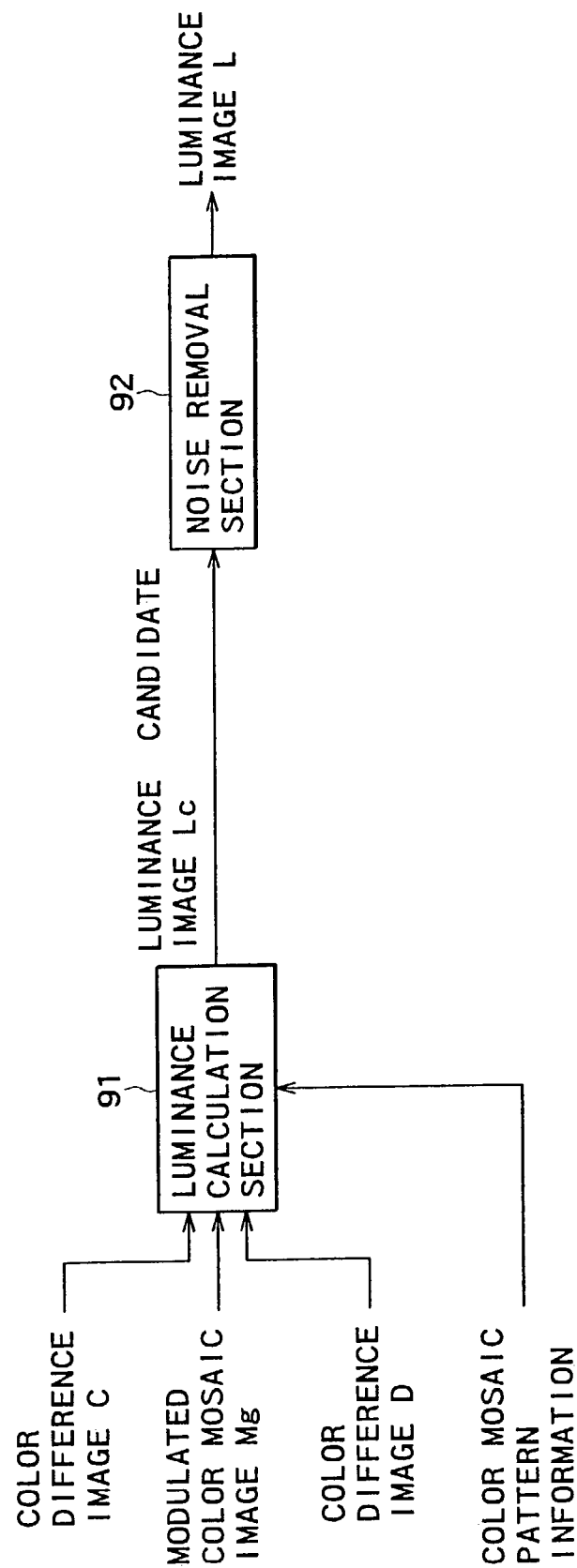
FIG. 49 is a block diagram showing an embodiment of a configuration of a luminance image production section 74.

FIG. 49 shows an example of a configuration of the luminance image production section 74. A luminance calculation section 91 which composes the luminance image production section 74 calculates a luminance candidate value of each pixel based on the modulated color mosaic image Mg from the gradation conversion section 71, the color difference image C from the color difference image production section 72, the color difference image D from the color difference image production section 73 and the color mosaic pattern information and outputs a luminance candidate value image Lc formed from luminance pixel values of the pixels to a noise removal section 92.

The noise removal section 92 synthesizes a smoothing component (hereinafter described) with each of the pixel values (luminance candidate values) of the luminance candidate value image Lc to remove noise from the luminance candidate value image Lc and outputs a resulting luminance image L to the color space conversion section 75.

Figure 50:
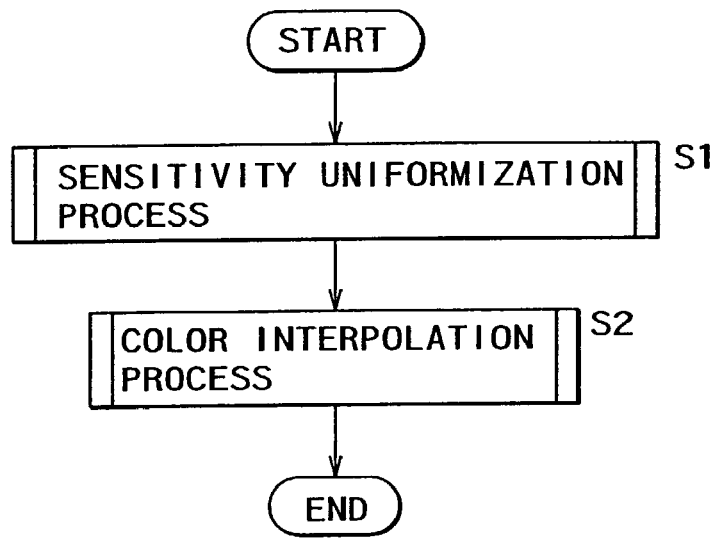
FIG. 50 is a flow chart illustrating the first demosaic process by the first embodiment of the configuration of the image processing section 7.

The first demosaic process by the first example of the configuration of the image processing section 7 shown in FIG. 45 will be described below with reference to a flow chart of FIG. 50.

At step S1, the sensitivity uniformization section 51 performs a sensitivity uniformization process for the color and sensitivity mosaic image based on the color mosaic pattern information and the sensitivity mosaic pattern information and outputs a resulting color mosaic image M to the color interpolation section 52.

Figure 51:
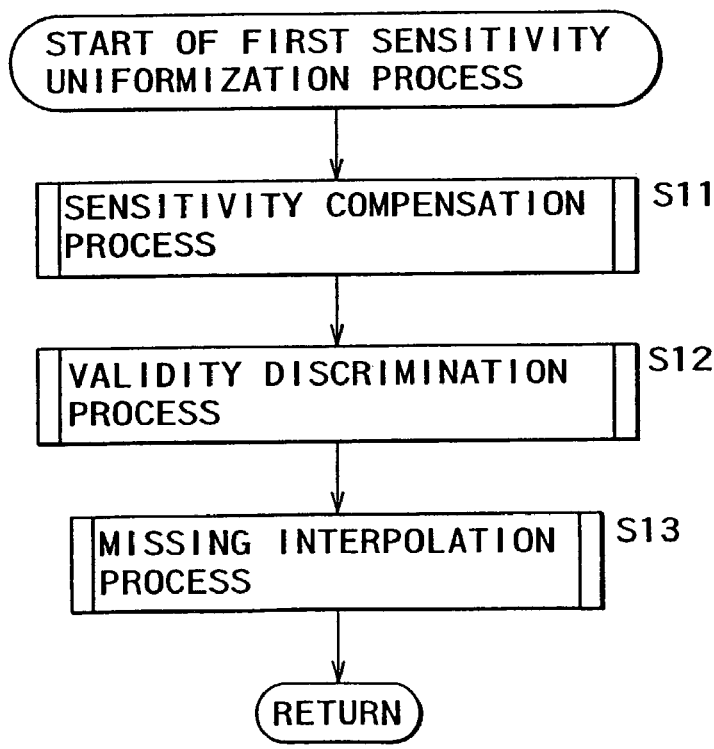
FIG. 51 is a flow chart illustrating the first sensitivity uniformization process by the first embodiment of the configuration of the sensitivity uniformization section 51.

Details of the first sensitivity uniformization process by the first example of the configuration of the sensitivity uniformization section 51 shown in FIG. 46 are described with reference to a flow chart of FIG. 51.

At step S11, the sensitivity compensation section 61 performs a sensitivity compensation process for the color and sensitivity mosaic image inputted thereto and supplies the sensitivity-compensated color and sensitivity mosaic image to the missing interpolation section 64.

Figure 52:
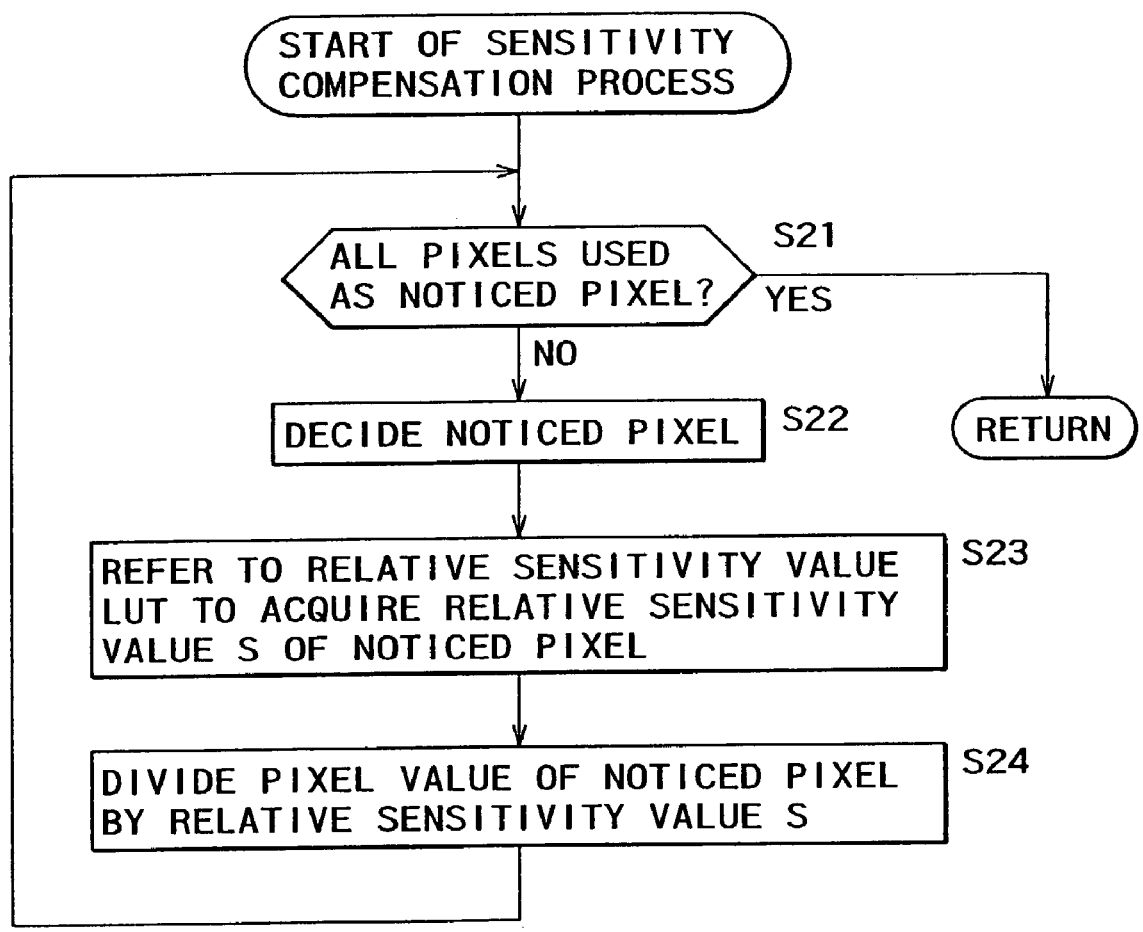
FIG. 52 is a flow chart illustrating a sensitivity compensation process at step S11.

Details of the sensitivity compensation process are described with reference to a flow chart of FIG. 52. At step S21, the sensitivity compensation section 61 determines whether or not all pixels of the color and sensitivity mosaic image have been used as a noticed pixel. If the sensitivity compensation section 61 determines that all pixels have not been used as a noticed pixel, then the processing advances to step S22. At step S22, the sensitivity compensation section 61 determines one by one pixel as a noticed pixel beginning with the left lowermost pixel and ending with the right uppermost pixel of the color and sensitivity mosaic image.

At step S23, the sensitivity compensation section 61 refers to the sensitivity mosaic pattern information to acquire the sensitivity (S0 or S1) of the noticed pixel and further refers to the relative sensitivity value LUT 62 to acquire the relative sensitivity value S corresponding to the pixel of the noticed pixel.

At step S24, the sensitivity compensation section 61 divides the pixel value of the noticed pixel of the color and sensitivity mosaic image by the relative sensitivity value S to compensate for the sensitivity of the pixel value. The sensitivity-compensated pixel value is a pixel value of a sensitivity-compensated color and sensitivity mosaic image.

The processing returns to step S21 so that the processing at steps S21 to S24 is repeated until it is discriminated or determined at step S21 that all pixels have been used as a noticed pixel. When it is discriminated at step S21 that all pixels have been used as a noticed pixel, the processing returns to step S12 of FIG. 51.

At step S12, the validity discrimination section 63 performs a validity discrimination process for the color and sensitivity mosaic image to produce discrimination information representative of the validity of the pixel value of each pixel and supplies the discrimination information to the missing interpolation section 64. It is to be noted that the validity discrimination process at step S12 may be executed in parallel to the sensitivity compensation process at step S61.

Figure 53:
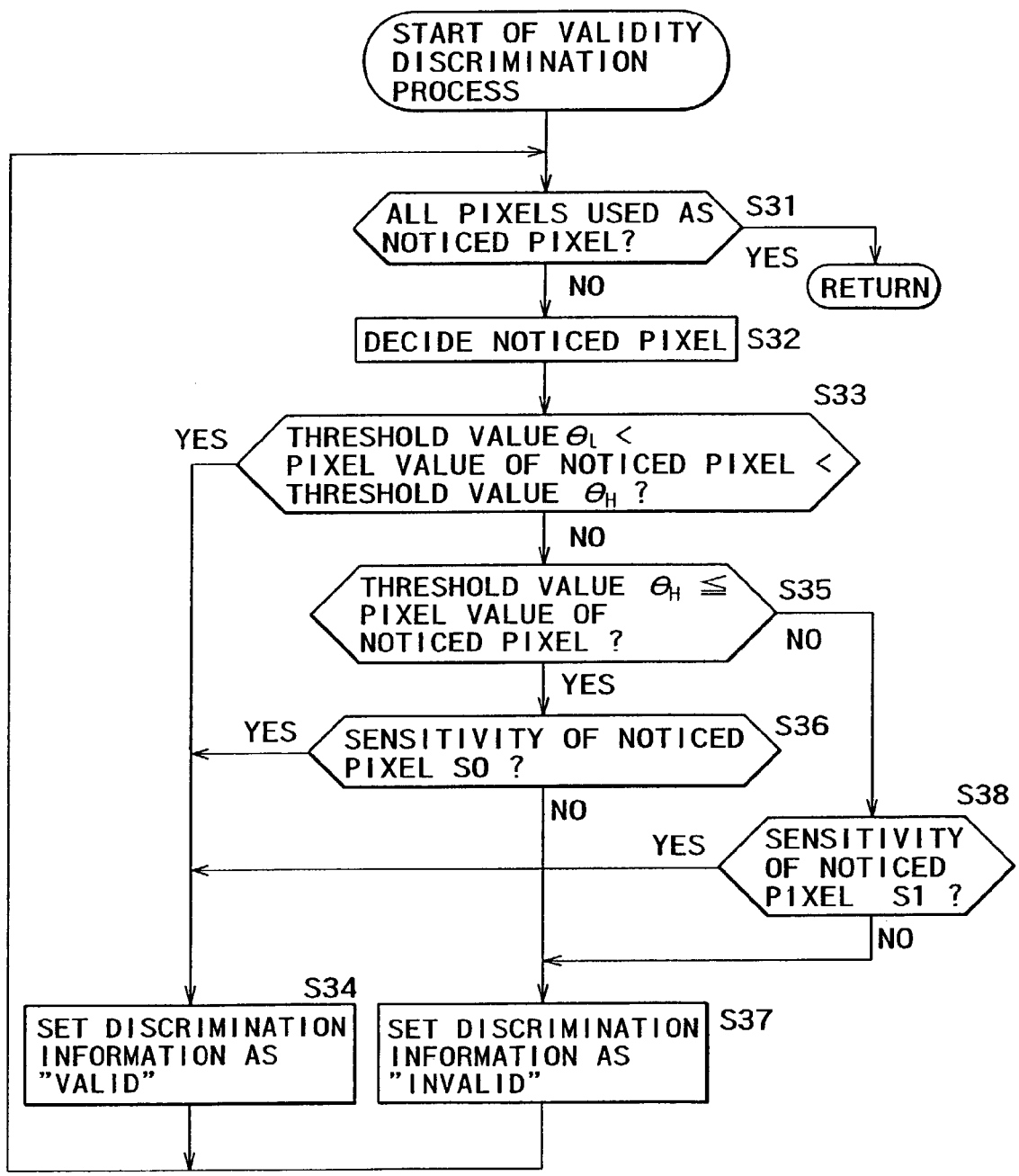
FIG. 53 is a flow chart illustrating a validity discrimination process at step S12.

Details of the validity discrimination process are described with reference to a flow chart of FIG. 53. At step S31, the validity discrimination section 63 discriminates or determines whether or not all pixels of the color and sensitivity mosaic image have been used as a noticed pixel. If it is discriminated that all pixels have not been used as a noticed pixel, then the processing advances to step S32. At step S32, the validity discrimination section 63 determines one by one pixel as a noticed pixel beginning with the left lowermost pixel and ending with the right uppermost pixel of the color and sensitivity mosaic image.

At step S33, the validity discrimination section 63 discriminates whether or not the pixel value of the noticed pixel of the color and sensitivity mosaic image is within the range between the threshold value $\theta_L$ of the noise level and the threshold value $\theta_H$ of the saturation level. If the validity discrimination section 63 discriminates that the pixel value is within the range between the threshold values, then the processing advances to step S34.

At step S34, the validity discrimination section 63 sets the discrimination information of the noticed pixel as valid. The processing then returns to step S31.

If it is discriminated at step S33 that the pixel value of the noticed pixel of the color and sensitivity mosaic image is not within the range between the threshold values, then the processing advances to step S35. At step S35, the validity discrimination section 63 discriminates whether or not the pixel value of the noticed pixel of the color and sensitivity mosaic image is equal to or higher than the threshold level $\theta_H$ of the saturation level. If the validity discrimination section 63 discriminates that the pixel value is higher than the threshold value $\theta_H$ of the saturation level, then the processing advances to step S36.

At step S36, the validity discrimination section 63 refers to the sensitivity mosaic pattern information to discriminate whether or not the noticed pixel has the sensitivity S0. If the validity discrimination section 63 discriminates that the noticed pixel has the sensitivity S0, then the processing advances to step S34. If the validity discrimination section 63 discriminates that the noticed pixel does not have the sensitivity S0, then the processing advances to step S37.

At step S37, the validity discrimination section 63 sets the discrimination information of the noticed pixel as invalid. The processing then returns to step S31.

If it is discriminated at step S35 that the pixel value of the noticed pixel of the color and sensitivity mosaic image is not equal to or higher than the threshold value $\theta_H$ of the saturation level, then the processing advances to step S38. At step S38, the validity discrimination section 63 refers to the sensitivity mosaic pattern information to discriminate whether or not the noticed pixel has the sensitivity S1. If the validity discrimination section 63 discriminates that the noticed pixel has the sensitivity S1, then the processing advances to step S34. However, if the validity discrimination section 63 discriminates that the noticed pixel does not have the sensitivity S1, then the processing advances to step S37.

Thereafter, the processing at steps S31 to S38 is repeated until it is discriminated at step S31 that all pixels have been used as a noticed pixel. When it is discriminated or determined at step S31 that all pixels have been used as a noticed pixel, the processing then returns to step S13 of FIG. 51.

At step S13, the missing interpolation section 64 performs a missing interpolation process for the sensitivity-compensated color and sensitivity mosaic image based on the discrimination information from the validity discrimination section 63 and supplies a resulting color image M to the color interpolation section 52.

Figure 54:
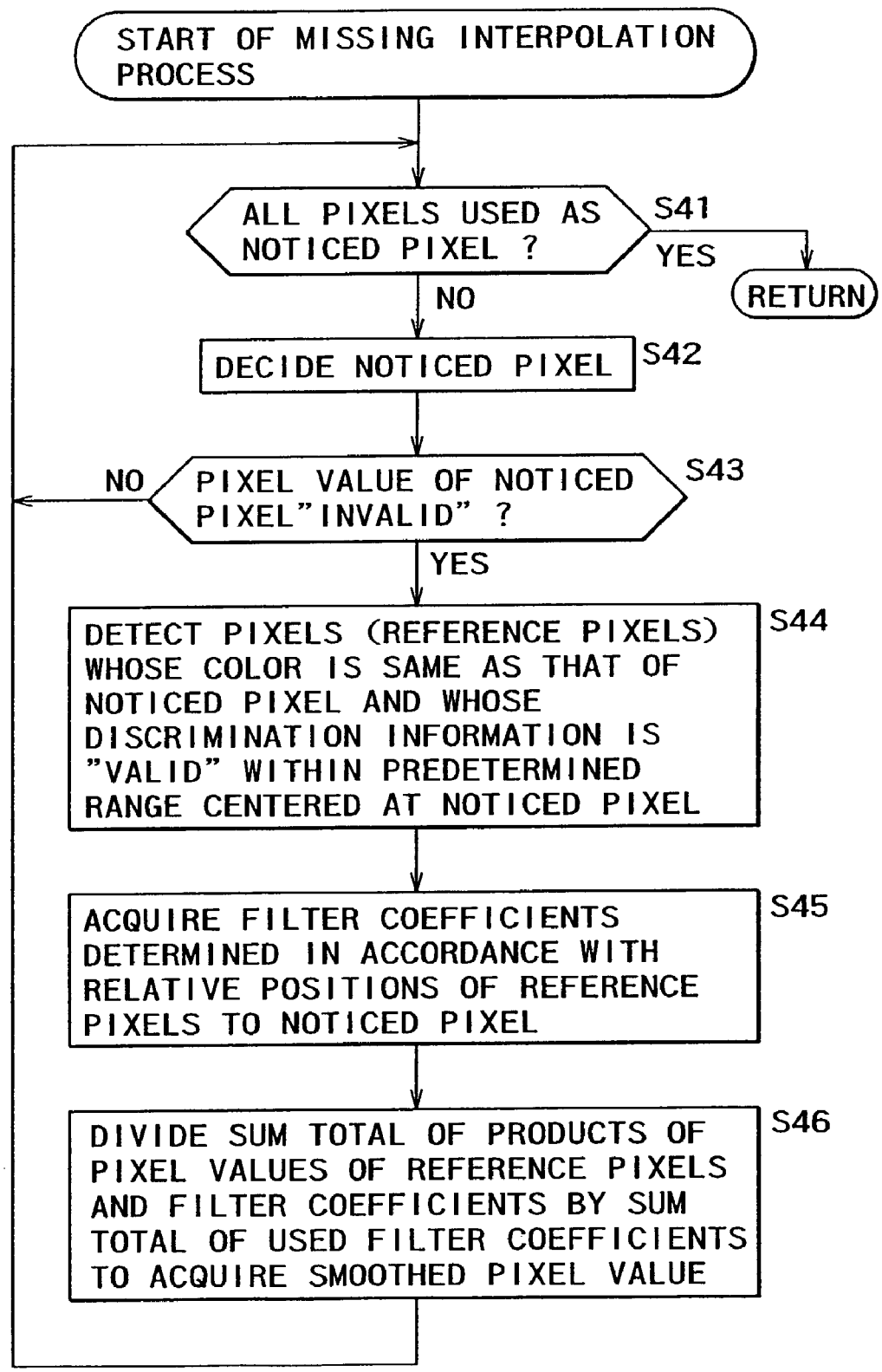
FIG. 54 is a flow chart illustrating a missing interpolation process at step S13.

Details of the missing interpolation process are described with reference to a flow chart of FIG. 54. At step S41, the missing interpolation section 64 discriminates whether or not all pixels of the sensitivity-compensated color and sensitivity mosaic image have been used as a noticed pixel. If the missing interpolation section 64 discriminates that all pixels have not been used as a noticed pixel, then the processing advances to step S42. At step S42, the missing interpolation section 64 determines one by one pixel as a noticed pixel beginning with the left lowermost pixel and ending with the right uppermost pixel of the sensitivity-compensated color and sensitivity mosaic image.

At step S43, the missing interpolation section 64 discriminates whether or not the discrimination information of the noticed pixel is invalid. If the missing interpolation section 64 discriminates that the discrimination information is invalid, then the processing advances to step S44.

At step S44, the missing interpolation section 64 refers to the color mosaic pattern information to discriminate or determine the type of the color of the noticed pixel (in the present embodiment, one of the colors of R, G and B), detect, from among neighboring pixels with the noticed pixel (for example, in the present embodiment, 5×5 pixels centered at the noticed pixel), those pixels which have the same color and whose discrimination information is valid, and extracts the pixel values of the detected pixels (hereinafter referred to as reference pixels).

At step S45, the missing interpolation section 64 acquires a number of filter coefficients set in advance and corresponding to relative positions of the reference pixels to the noticed pixel, the number being equal to the number of the reference pixels. At step S46, the missing interpolation section 64 multiplies the pixel values of the reference pixels by the corresponding filter coefficients and arithmetically operates the sum total of the products. Further, the missing interpolation section 64 divides the sum total of the products by the sum total of the used filter coefficients and determines the quotient as a pixel value of the noticed pixel of the color mosaic image M.

The processing returns to step S41 so that the processing at steps S41 to 46 is repeated until it is discriminated at step S41 that all pixels have been used as a noticed pixel. When it is discriminated at step S41 that all pixels have been used as a noticed pixel, the processing returns to step S2 of FIG. 50.

At step S2, the color interpolation section 52 performs a color interpolation process for the color mosaic image M obtained by the sensitivity uniformization process at step S1 described above based on the color mosaic pattern information to produce output images R, G and B.

Figure 55:
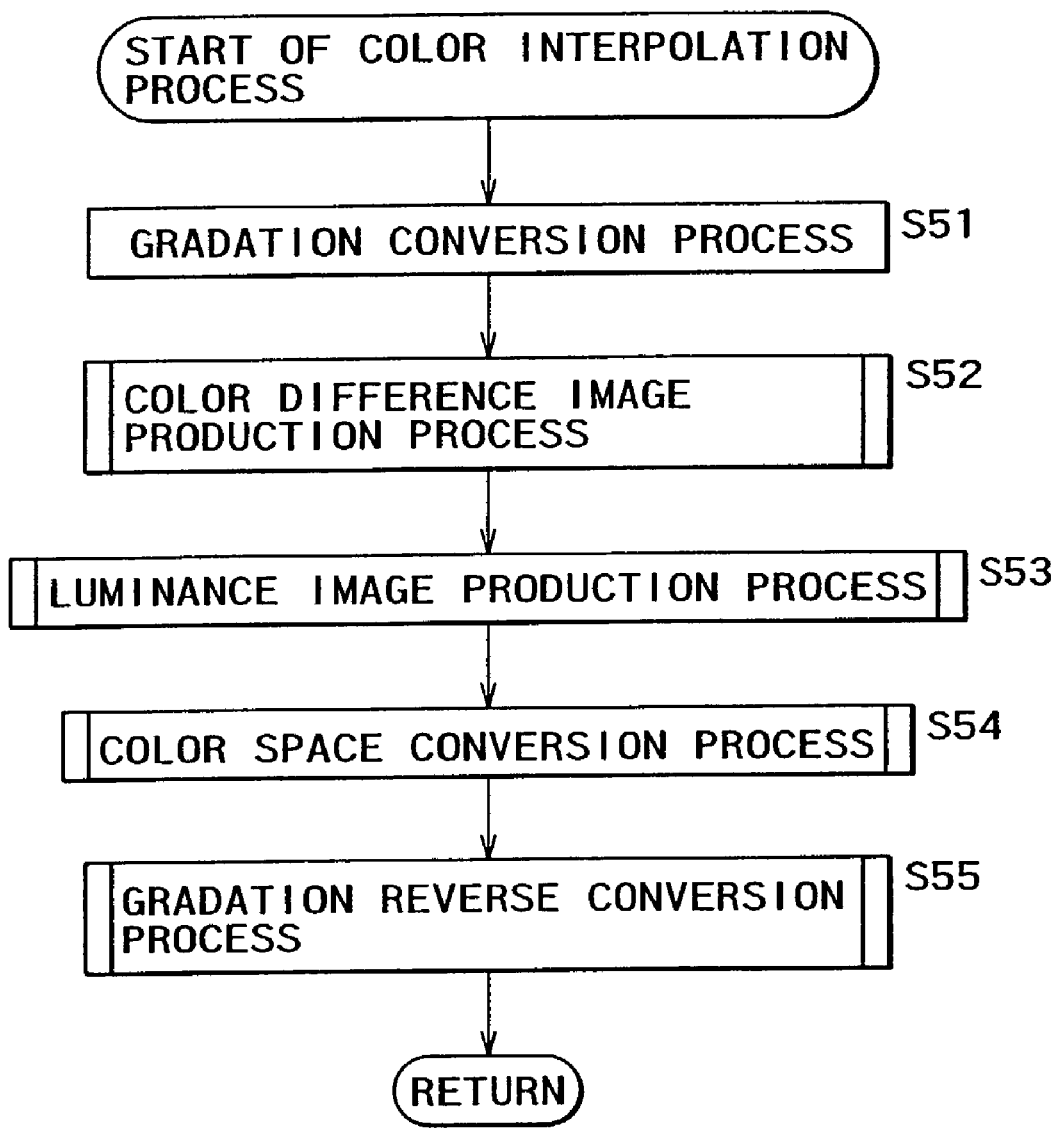
FIG. 55 is a flow chart illustrating a color interpolation process at step S2.

Details of the color interpolation process are described with reference to a flow chart of FIG. 55. At step S51, the gradation conversion section 71 performs a gradation conversion process for the color mosaic image M (more particularly, raises the pixel values of the modulated color mosaic image Mg to the γth power) to produce a modulated color mosaic image Mg and supplies the modulated color mosaic image Mg to the color difference image production sections 72 and 73 and the luminance image production section 74.

At step S52, the color difference image production section 72 uses the modulated color mosaic image Mg from the gradation conversion section 71 to produce a color difference image C and supplies the color difference image C to the luminance image production section 74 and the color space conversion section 75. Meanwhile, the color difference image production section 73 uses the modulated color mosaic image Mg from the gradation conversion section 71 to produce a color difference image D and supplies the color difference image D to the luminance image production section 74 and the color space conversion section 75.

Figure 56:
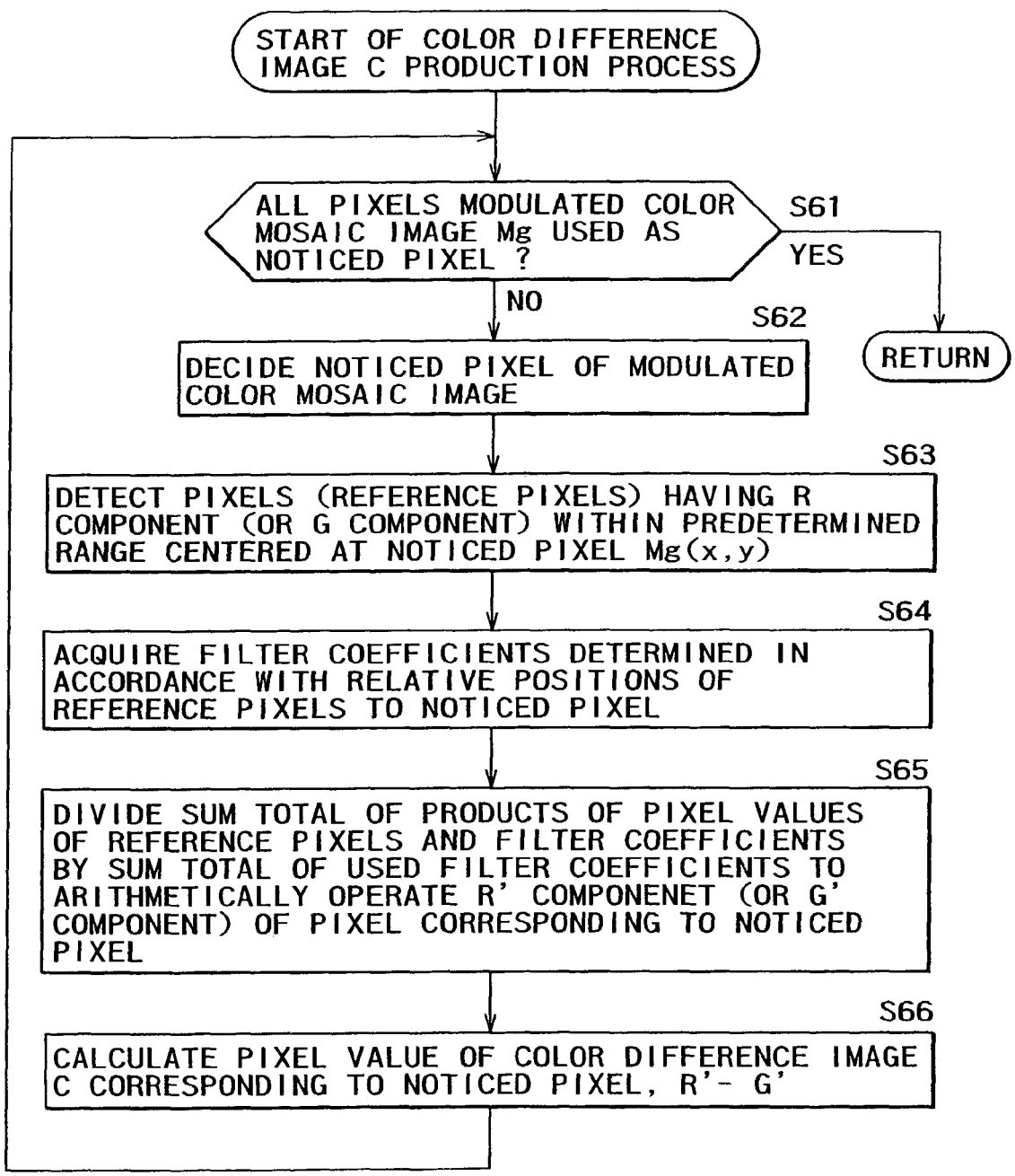
FIG. 56 is a flow chart illustrating a first color difference image production process at step S52.

The first process of the color difference image production section 72 producing a color difference image C is described with reference to a flow chart of FIG. 56. At step S61, the smoothing sections 81 and 82 discriminate whether or not all pixels of the modulated color mosaic image Mg have been used as a noticed pixel. If the smoothing sections 81 and 82 discriminate that all pixels have not been used as a noticed pixel, then the processing advances to step S62. At step S62, the smoothing sections 81 and 82 determine one by one pixel as a noticed pixel beginning with the left lowermost pixel and ending with the right uppermost pixel of the modulated color mosaic image Mg.

At step S63, the smoothing section 81 refers to the color mosaic pattern information to detect, from among pixels neighboring the noticed pixel (for example, 5×5 pixels centered at the noticed pixel), those pixels which have an R component, and extracts the pixel values of the detected pixels (hereinafter referred to as reference pixels). Meanwhile, the smoothing section 82 similarly refers to the color mosaic pattern information to detect, from among pixels neighboring the noticed pixel, those pixels which have a G component, and extracts the pixel values of the detected pixels.

At step S64, the smoothing section 81 acquires a number of filter coefficients set in advance and corresponding to relative positions of the reference pixels having an R component to the noticed pixel, the number being equal to the number of the reference pixels. Meanwhile, the smoothing section 82 similarly acquires a number of filter coefficients set in advance and corresponding to relative positions of the reference pixels having a G component to the noticed pixel, the number being equal to the number of the reference pixels.

At step S65, the smoothing section 81 multiplies the pixel values of the reference pixels having an R component by the corresponding filter coefficients and arithmetically operates the sum total of the products. Further, the smoothing section 81 divides the sum total of the products by the sum total of the used filter coefficients and determines the quotient as a pixel value corresponding to the noticed pixel of an image R' which includes only smoothed R components. Meanwhile, the smoothing section 82 similarly multiplies the pixel values of the reference pixels having a G component by the corresponding filter coefficients and arithmetically operates the sum total of the products. Further, the smoothing section 82 divides the sum total of the products by the sum total of the used filter coefficients and determines the quotient as a pixel value corresponding to the noticed pixel of an image G' which includes only smoothed G components.

At step S66, the subtractor 83 subtracts the pixel value corresponding to the noticed pixel of the image R' which includes only smoothed R components from the smoothing section 81 from the pixel value corresponding to the noticed pixel of the image G' which includes only smoothed G components from the smoothing section 82 and determines the difference as a pixel value corresponding to the noticed pixel of a color difference image C.

The processing returns to step S61 so that the processing at steps S61 to S66 is repeated until it is discriminated at step S61 that all pixels have been used as a noticed pixel. When it is discriminated at step S61 that all pixels have been used as a noticed pixel, the processing returns to step S53 of FIG. 55.

It is to be noted that, since the processing of the color difference image production section 73 when it produces a color difference image D is similar to the first process of the color difference image production section 72 when it produces the color difference image C described above, description of the processing is omitted.

At step S53, the luminance image production section 74 produces a luminance image L using the modulated color mosaic image Mg and the color difference signals C and D and supplies the luminance image L to the color space conversion section 75.

Figure 57:
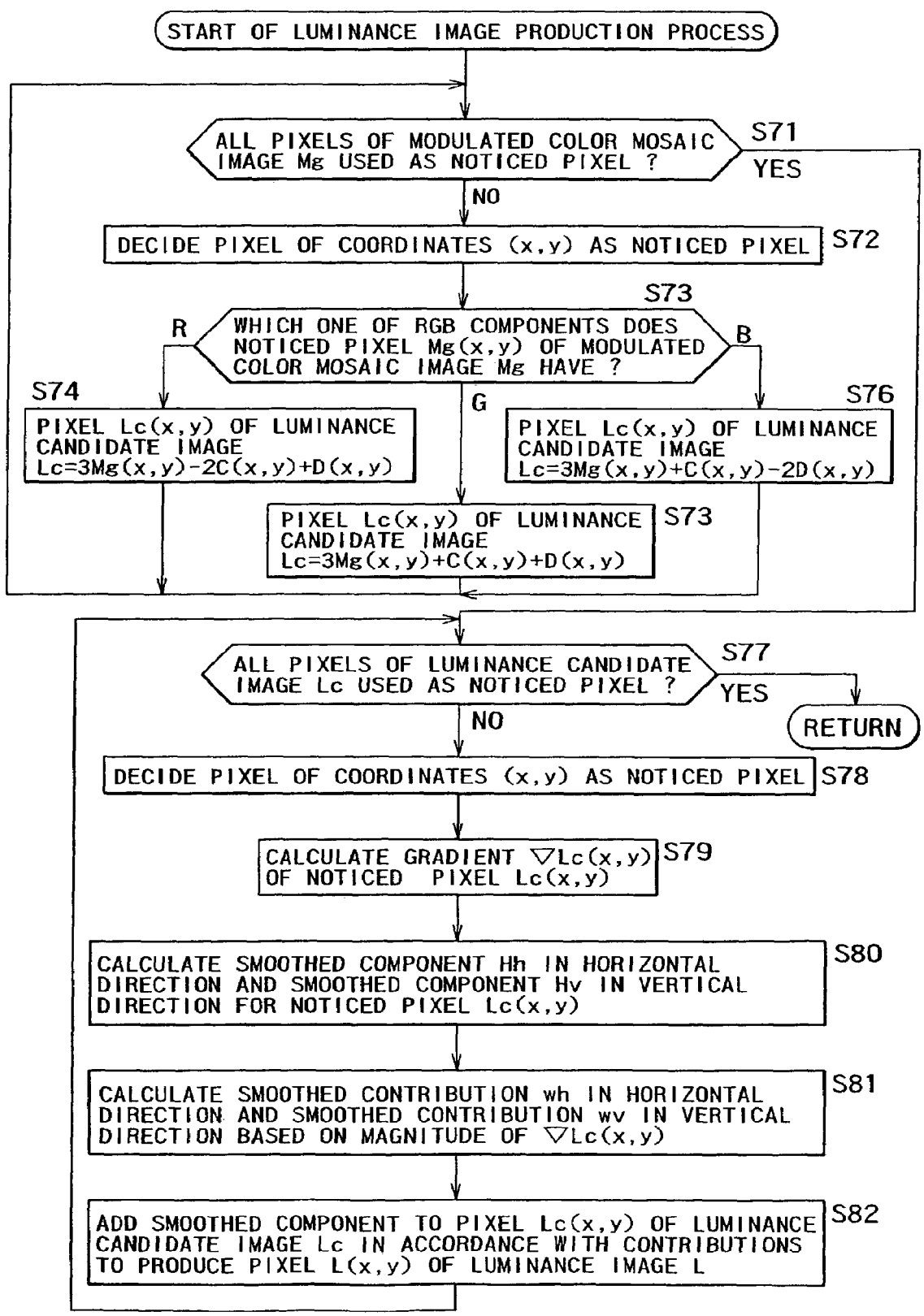
FIG. 57 is flow chart illustrating a luminance image production process at step S53.

Details of the luminance image production process of the luminance image production section 74 are described with reference to a flow chart of FIG. 57. At step S71, the luminance calculation section 91 discriminates whether or not all pixels of the modulated color mosaic image Mg have been used as a noticed pixel. If the luminance calculation section 91 discriminates that all pixels have not been used as a noticed pixel, then the processing advances to step S72. At step S72, the luminance calculation section 91 determines one by one pixel as a noticed pixel beginning with the left lowermost pixel and ending with the right uppermost pixel of the modulated color mosaic image Mg.

At step S73, the luminance calculation section 91 refers to the color mosaic pattern information to discriminate the type of the color of the noticed pixel (in the present embodiment, one of the colors of R, G and B).

If it is discriminated at step S73 that the type of the color of the noticed pixel is R, then the processing advances to step S74. At step S74, the luminance calculation section 91 applies the modulated color mosaic image Mg and the pixel values of the color difference signals C and D corresponding to the noticed pixel to the following expression (1) to calculate the pixel value of a luminance candidate image Lc corresponding to the noticed pixel:

$$Lc = 3Mg - 2C + D \quad (1)$$

If it is discriminated at step S73 that the type of the color of the noticed pixel is G, then the processing advances to step S75. At step S75, the luminance calculation section 91 applies the modulated color mosaic image Mg and the pixel values of the color difference signals C and D corresponding to the noticed pixel to the following expression (2) to calculate the pixel value of the luminance candidate image Lc corresponding to the noticed pixel:

$$Lc = 3Mg + C + D \quad (2)$$

If it is discriminated at step S73 that the type of the color of the noticed pixel is B, then the processing advances to step S76. At step S76, the luminance calculation section 91 applies the modulated color mosaic image Mg and the pixel values of the color difference signals C and D corresponding to the noticed pixel to the following expression (3) to calculate the pixel value of the luminance candidate image Lc corresponding to the noticed pixel:

$$Lc = 3Mg + C - 2D \quad (3)$$

It is to be noted that, in the expressions (1) to (3), Lc, Mg, C and D represent the pixel values of the luminance candidate image Lc, modulated color mosaic image Mg, color difference signal C and color difference image D corresponding to the noticed pixel, respectively.

The processing returns to step S71 so that the processing at steps S71 to S76 is repeated until it is discriminated at step S71 that all pixels have been used as a noticed pixel. When it is discriminated at step S71 that all pixels have been used as a noticed pixel, the processing advances to step S77.

The luminance candidate image Lc produced by the processing at steps S71 to S76 described above is supplied to the noise removal section 92.

At step S77, the noise removal section 92 discriminates whether or not all pixels of the modulated color mosaic image Mg have been used as a noticed pixel. If the noise removal section 92 discriminates that all pixels have not been used as a noticed pixel, then the processing advances to step S78. At step S78, the noise removal section 92 determines one by one pixel as a noticed pixel beginning with the left lowermost pixel and ending with the right uppermost pixel of the modulated color mosaic image Mg.

At step S79, the noise removal section 92 applies the pixel values (luminance candidate values) of the pixels positioned upwardly, downwardly, leftwardly and rightwardly of the noticed pixel to the following expression (4) to calculate a gradient ∇ corresponding to the noticed pixel. It is to be noted that the gradient ∇ is a vector whose factors are linear differential coefficients in the horizontal direction and the vertical direction of the image. Further, the pixel values (luminance candidate values) of the pixels positioned upwardly, downwardly, leftwardly and rightwardly of the noticed pixel are represented by Lc(U), Lc(D), Lc(L) and Lc(R), respectively.

$$\text{gradient } \nabla = (Lc(R) - Lc(L), Lc(U) - Lc(D)) \quad (4)$$

At step S80, the noise removal section 92 applies the pixel values (luminance candidate values) of the pixels positioned leftwardly, rightwardly, upwardly and downwardly of the noticed pixel to the following expressions (5) and (6) to calculate a smoothed component Hh in the horizontal direction and a smoothed component Hv in the vertical direction corresponding to the noticed pixel:

$$Hh = (Lc(L) + Lc(R))/2 \quad (5)$$

$$Hv = (Lc(U) + Lc(D))/2 \quad (6)$$

At step S81, the noise removal section 92 calculates a smoothing contribution wh in the horizontal direction and a smoothing contribution wv in the vertical direction corresponding to the absolute value ‖∇‖ of the gradient corresponding to the noticed pixel calculated at step S79.

More particularly, where the absolute value of the gradient ∇ is higher than 0, the absolute value of the inner product of the normalized gradient ∇/‖∇‖ and the vector (1,0) is subtracted from 1 as given by the following expression (7) to obtain the smoothing contribution wh in the horizontal direction. Further, as given by the following expression (8), the absolute value of the inner product of the normalized gradient ∇/‖∇‖ and the vector (0, 1) is subtracted from 1 to obtain the smoothing contribution wv in the vertical direction:

$$wh=1-|(\nabla/\|\nabla\|,(1,0))| \qquad (7)$$

$$wv=1-|(\nabla/\|\nabla\|,(0,1))| \qquad (8)$$

Where the absolute value of the gradient ∇ is 0, the smoothing contribution wh in the horizontal direction and the smoothing contribution wv in the vertical direction are both set to 0.5.

At step S82, the noise removal section 92 uses the following expression (9) to calculate the pixel value (luminance value) of the luminance image L corresponding to the noticed pixel:

$$L=Lc+(wh\cdot Hh+wv\cdot Hv)/(wh+wv) \qquad (9)$$

It is to be noted that Lc and L in the expression (9) represent the pixel values of the luminance candidate image Lc and the luminance image L corresponding to the noticed pixel.

The processing returns to step S77 so that the processing at steps S77 to S82 is repeated until it is discriminated at step S77 that all pixels have been used as a noticed pixel. When it is discriminated at step S77 that all pixels have been used as a noticed pixel, the processing returns to step S54 of FIG. 55.

At step S54, the color space conversion section 75 performs a color space conversion process for the color difference images C and D and the luminance image L to produce modulated images in each of which each pixel has an R, G or B component and supplies the modulated images to the gradation reverse conversion sections 76 to 78, respectively.

Figure 58:
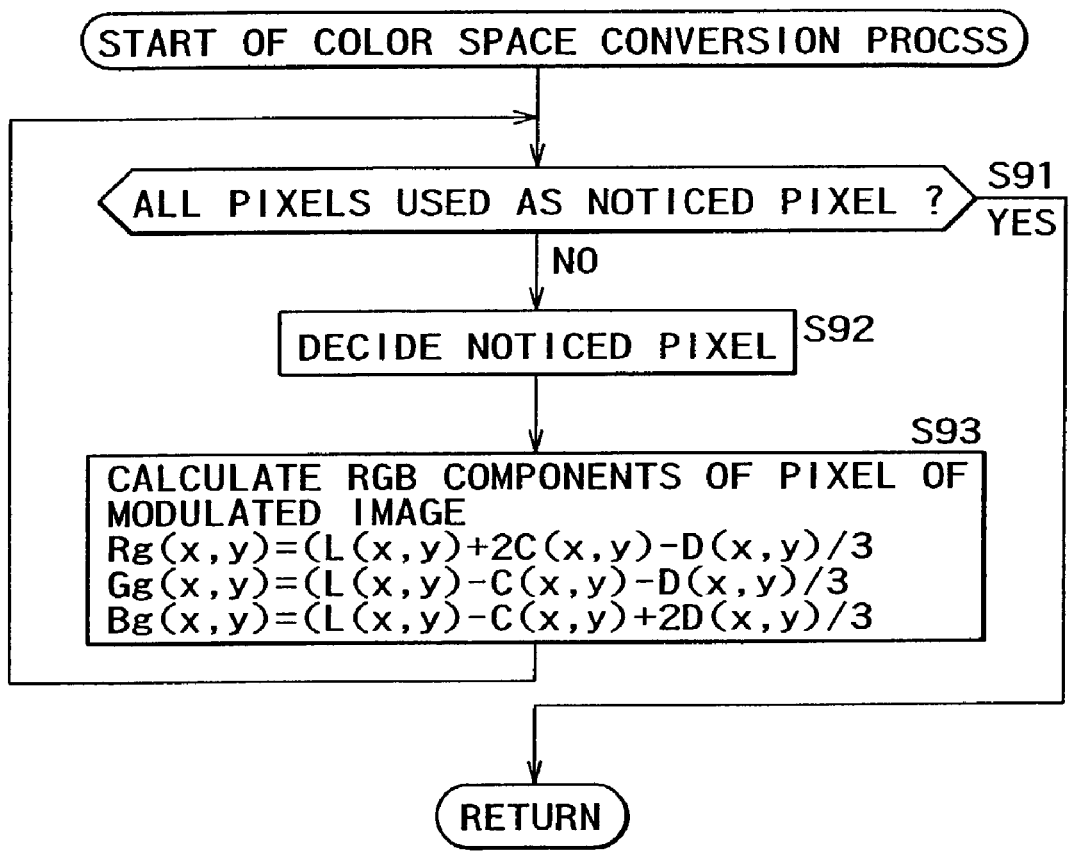
FIG. 58 is a flow chart illustrating a color space conversion process at step S54.

Details of the color space conversion process are described with reference to a flow chart of FIG. 58. At step S91, the color space conversion section 75 discriminates whether or not all pixels of the luminance image L (which may alternatively be the color difference image C or the color difference image D) have been used as a noticed pixel. If the color space conversion section 75 discriminates that all pixels have not been used as a noticed pixel, then the processing advances to step S92. At step S92, the color space conversion section 75 determines one by one pixel as a noticed pixel beginning with the left lowermost pixel and ending with the right uppermost pixel of the color and sensitivity mosaic image.

At step S93, the color space conversion section 75 applies the pixel values of the luminance image L, color difference image C and color difference image D corresponding to the noticed pixel to the following expressions (10), (11) and (12) to calculate the value Rg of the R component, the value Gg of the G component and the value Bg of the B component of the modulated images corresponding to the noticed pixel:

$$Rg=(L+2C-D)/3 \qquad (10)$$

$$Gg=(L-C-D)/3 \qquad (11)$$

$$Bg=(L-C+2D)/3 \qquad (12)$$

It is to be noted that, in the expressions (10) to (12), L, C and D are the pixel values of the luminance image L, color difference signal C and color difference image D corresponding to the noticed pixel, respectively.

The processing returns to step S91 so that the processing at steps S91 to S93 is repeated until it is discriminated at step S91 that all pixels have been used as a noticed pixel. When it is discriminated at step S91 that all pixels have been used as a noticed pixel, the processing returns to step S55 of FIG. 55.

At step S55, the gradation reverse conversion section 76 performs a gradation reverse conversion process corresponding to the gradation conversion process at step S51 (more particularly, to raise pixel values to the 1/γth power) for the R component of each pixel of the modulated image supplied from the color space conversion section 75 to produce an output image R. Similarly, the gradation reverse conversion section 77 performs a gradation reverse conversion process corresponding to the gradation conversion process at step S51 for the G component of each pixel of the modulated image supplied from the color space conversion section 75 to produce an output image G. The gradation reverse conversion section 78 performs a gradation reverse conversion process corresponding to the gradation conversion process at step S51 for the B component of each pixel of the modulated image supplied from the color space conversion section 75 to produce an output image B. Through such a color interpolation process as described above, the output images R, G and B are produced.

Now, a second example of the configuration of the sensitivity uniformization section 51 which can be used in place of the first example of the configuration of the sensitivity uniformization section 51 shown in FIG. 46 is described with reference to FIG. 59.

Figure 38:
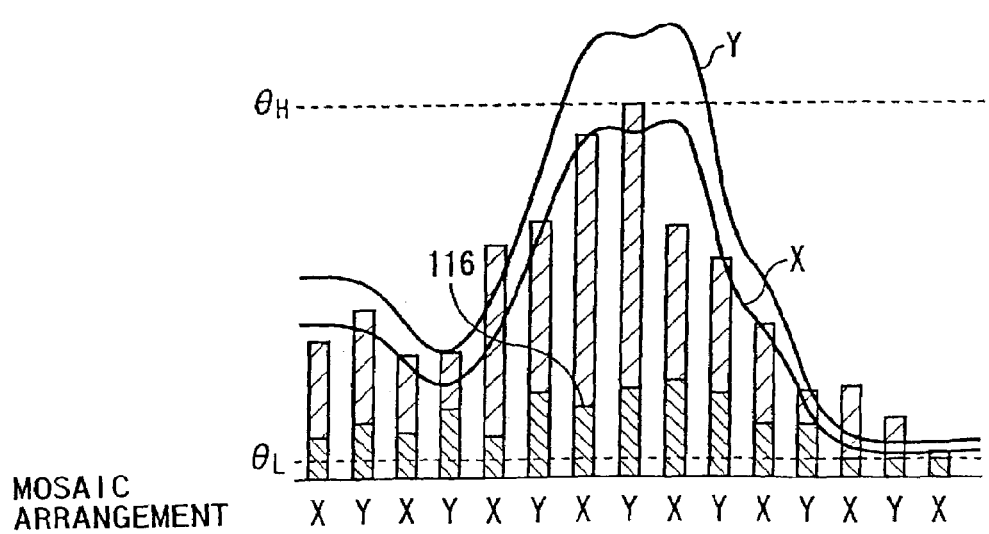
FIG. 38 is a graph illustrating an outline of a second sensitivity uniformization process in the first demosaic process
Figure 39:
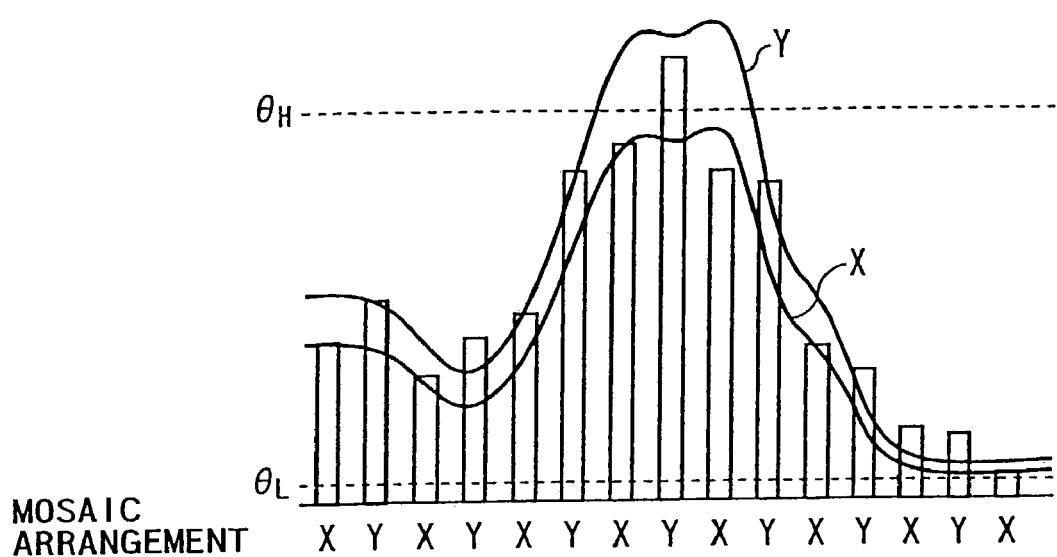
FIG. 39 is a graph illustrating an outline of the second sensitivity uniformization process in the first demosaic process.

The second example of the configuration is an example of the configuration wherein the second sensitivity uniformization process in the first demosaic process described with reference to FIGS. 35, 38 and 39 is executed by the sensitivity uniformization section 51.

It is assumed that, in the color and sensitivity mosaic image described below, the color of each pixel is one of the three primary colors of R, G and B and the sensitivity is one of four stages S0, S1, S2 and S3 as in the color and sensitivity mosaic pattern P10 of FIG. 14 or the color and sensitivity mosaic pattern P11 of FIG. 15. However, the configuration and the operation described below can, in alternative embodiments, be applied also to another color and sensitivity mosaic image which includes three colors other than R, G and B or a further color and sensitivity mosaic image which includes four colors. Further, they can also be applied to a color and sensitivity mosaic pattern wherein the sensitivity has two stages or three stages.

In the second example of the configuration of the sensitivity uniformization section 51, a color and sensitivity mosaic image from the image pickup system, color mosaic pattern information and sensitivity mosaic pattern information are supplied to interpolation sections 101-1 to 101-4.

The interpolation section 101-1 performs an interpolation process of the sensitivity S0 without changing the color of each pixel of the color and sensitivity mosaic image and outputs an interpolation value corresponding to the resulting sensitivity S0 to an adder 102. The interpolation section 101-2 performs an interpolation process of the sensitivity S1 without changing the color of each pixel of the color and sensitivity mosaic image and outputs an interpolation value corresponding to the resulting sensitivity S1 to the adder 102. The interpolation section 101-3 performs an interpolation process of the sensitivity S2 without changing the color of each pixel of the color and sensitivity mosaic image and outputs an interpolation value corresponding to the resulting sensitivity S2 to the adder 102. The interpolation section 101-4 performs an interpolation process of the sensitivity S3 without changing the color of each pixel of the color and sensitivity mosaic image and outputs an interpolation value corresponding to the resulting sensitivity S3 to the adder 102.

The adder 102 adds, for each pixel, the sensitivities S0 to S3 inputted thereto from the interpolation sections 101-1 to 101-4 and supplies the sum as a pixel value of a color mosaic candidate image to a synthetic sensitivity compensation section 103.

The synthetic sensitivity compensation section 103 collates the pixel value of the color mosaic candidate image supplied thereto from the adder 102 with a synthetic sensitivity compensation LUT 104 to produce a color mosaic image M wherein the resulting value is used as a pixel value and supplies the color mosaic image M to the color interpolation section 52. The synthetic sensitivity compensation LUT 104 is configured so as to acquire a pixel value of the color mosaic image M using a pixel value of the color mosaic candidate image as an index.

Figure 59:
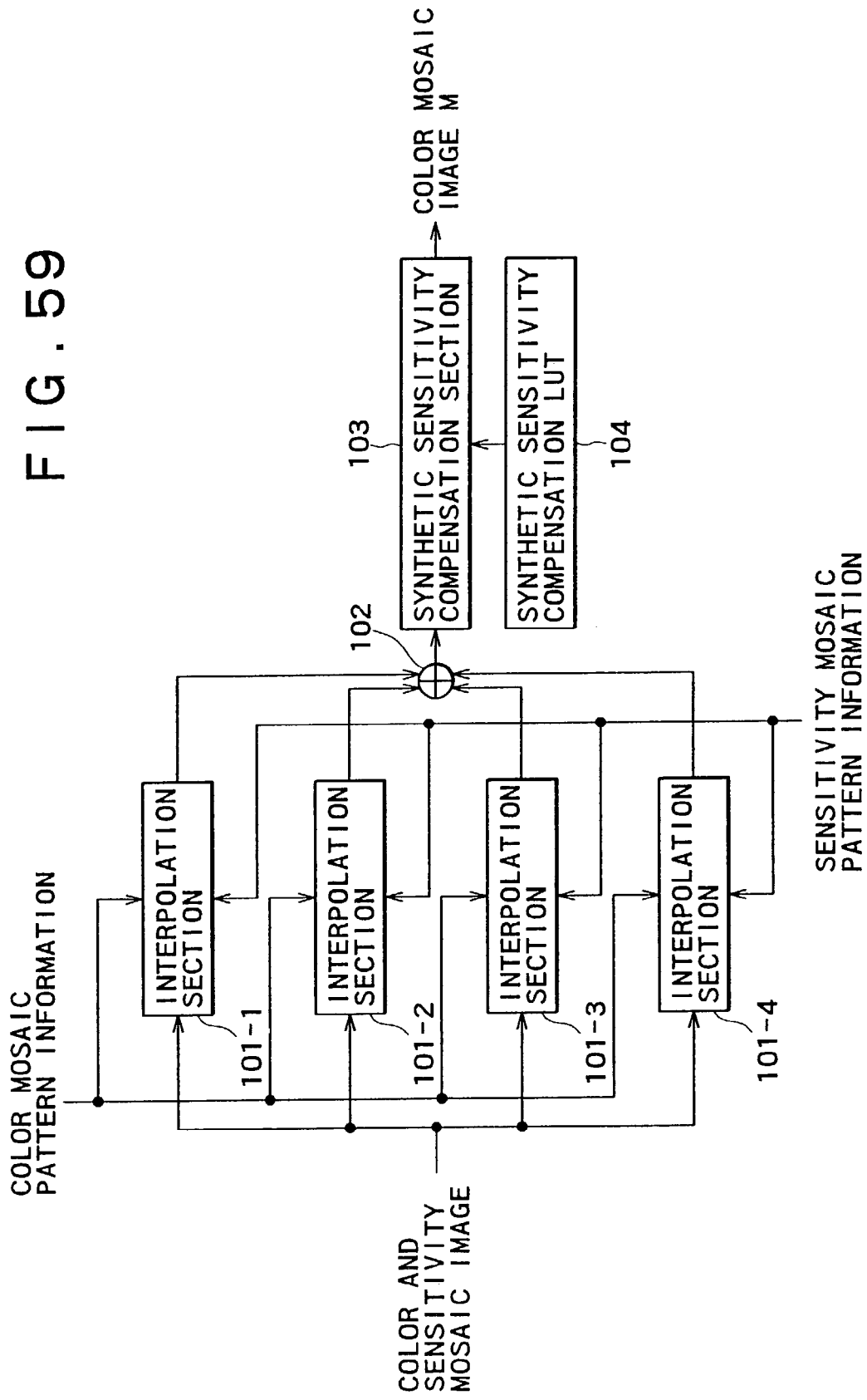
FIG. 59 is a block diagram showing a second embodiment of a configuration of the sensitivity uniformization section 51.
Figure 60:
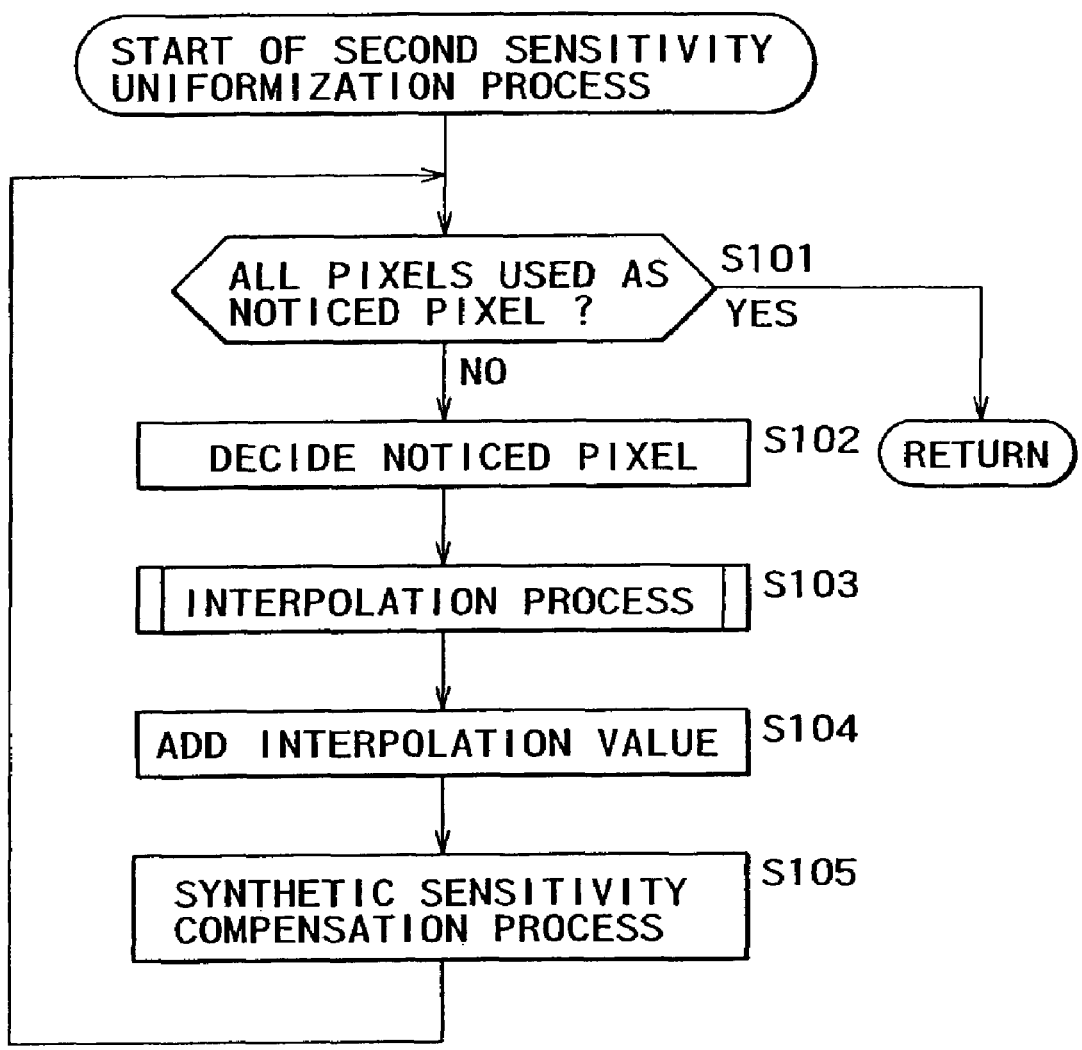
FIG. 60 is a flow chart illustrating a second sensitivity uniformization process by the second embodiment of the configuration of the sensitivity uniformization section 51.

The second sensitivity uniformization process in the first demosaic process by the second example of the configuration of the sensitivity uniformization section 51 shown in FIG. 59 is described with reference to a flow chart of FIG. 60.

At step S101, the interpolation sections 101-1 to 101-4 discriminate or determine whether or not all pixels of the color and sensitivity mosaic image have been used as a noticed pixel. If the interpolation sections 101-1 to 101-4 discriminate that all pixels have not been used as a noticed pixel, then the processing advances to step S102. At step S102, the interpolation sections 101-1 to 101-4 determine one by one a pixel as a noticed pixel beginning with the left lowermost pixel and ending with the right uppermost pixel of the color and sensitivity mosaic image.

At step S103, the interpolation sections 101-1 to 101-4 perform an interpolation process without changing the color of each pixel of the color and sensitivity mosaic image to produce interpolation values corresponding to the sensitivities S0, S1, S2 and the sensitivity S3, respectively, and output the interpolation values to the adder 102.

Figure 61:
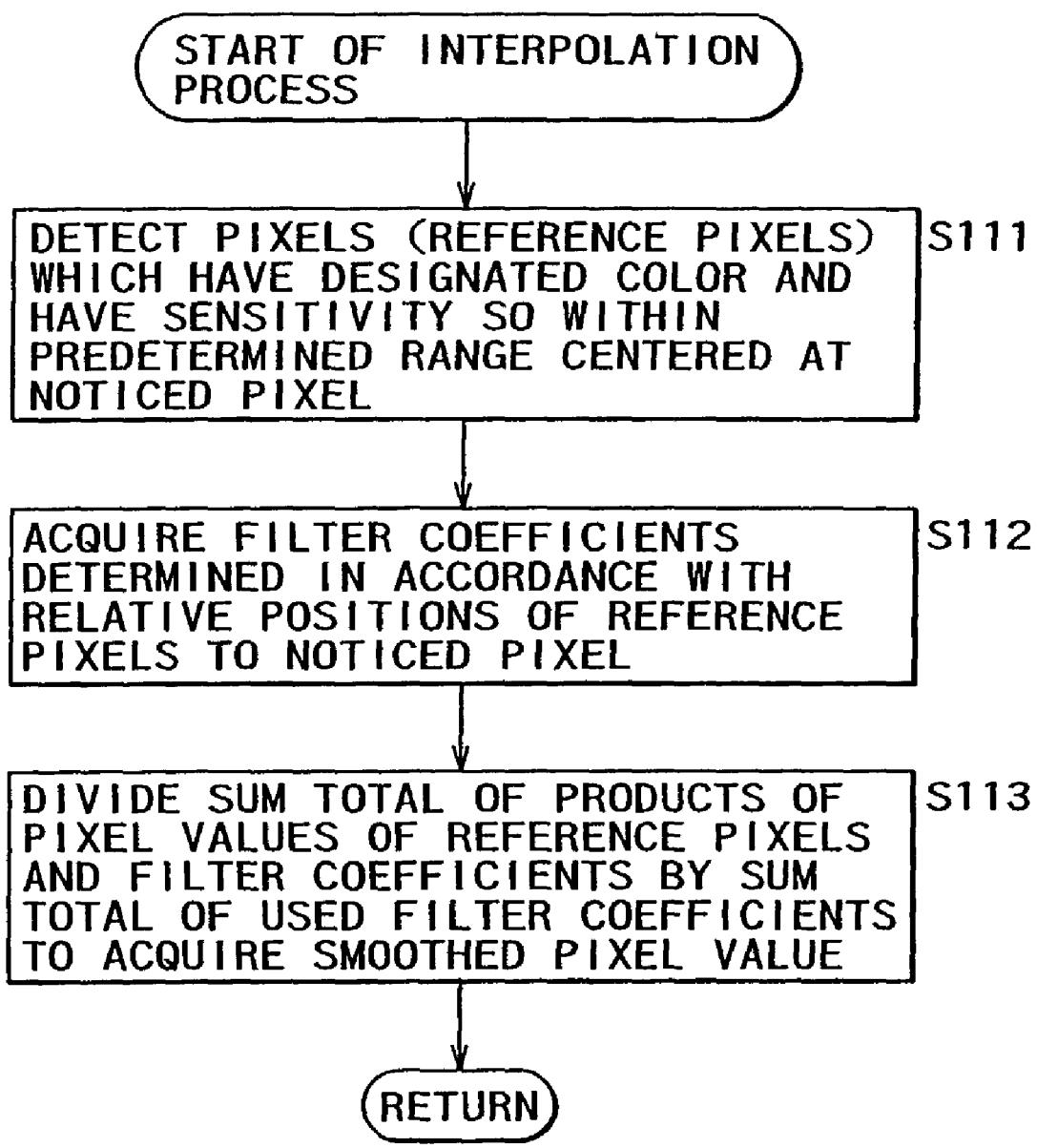
FIG. 61 is a flow chart illustrating an interpolation process at step S103.

The interpolation process for the sensitivity S0 by the interpolation section 101-1 is described with reference to a flow chart of FIG. 61. At step 111, the interpolation section 101-1 detects those of pixels positioned in the neighborhood of the noticed pixel of the color and sensitivity mosaic image (for example, 5×5 pixels centered at the noticed pixel) which have a color similar to that of the noticed pixel and have the sensitivity S0, and extracts the pixel values of the detected pixels (hereinafter referred to as reference pixels). At step S112, the interpolation section 101-1 acquires a number of filter coefficients set in advance and corresponding to relative positions of the detected reference pixels to the noticed pixel, the number being equal to the number of the reference pixels. At step S113, the interpolation section 101-1 multiplies the pixel values of the reference pixels and the corresponding filter coefficients and arithmetically operates the sum total of the products. Further, the interpolation section 101-1 divides the sum total of the products by the sum total of the used filter coefficients and determines the quotient as an interpolation value corresponding to the sensitivity S0 of the noticed pixel. The processing returns to step S104 of FIG. 60.

It is to be noted that, since the interpolation processes for the sensitivities S1 to S3 by the interpolation sections 101-2 and 101-3 are similar to the interpolation process for the sensitivity S0 by the interpolation section 101-1 described above, description of the interpolation processes is omitted.

At step S104, the adder 102 adds the interpolation values for the sensitivities S0 to S3 corresponding to the noticed pixel inputted from the interpolation sections 101-1 to 101-4 and supplies the sum as a pixel value of a color mosaic candidate image corresponding to the noticed pixel to the synthetic sensitivity compensation section 103.

At step S105, the synthetic sensitivity compensation section 103 collates the pixel value of the color mosaic candidate image supplied thereto from the adder 102 with the synthetic sensitivity compensation LUT 104 and determines a detected value as a pixel value of a color mosaic image M corresponding to the noticed pixel.

The processing returns to step S101 so that the processing at steps S101 to S105 is repeated until it is discriminated at step S101 that all pixels have been used as a noticed pixel. When it is discriminated at step S101 that all pixels have been used as a noticed pixel, the second sensitivity uniformization process of the first demosaic process is ended.

It is to be noted that, after the second sensitivity uniformization process, the color interpolation process described above with reference to the flow chart of FIG. 55 is executed.

Figure 62:
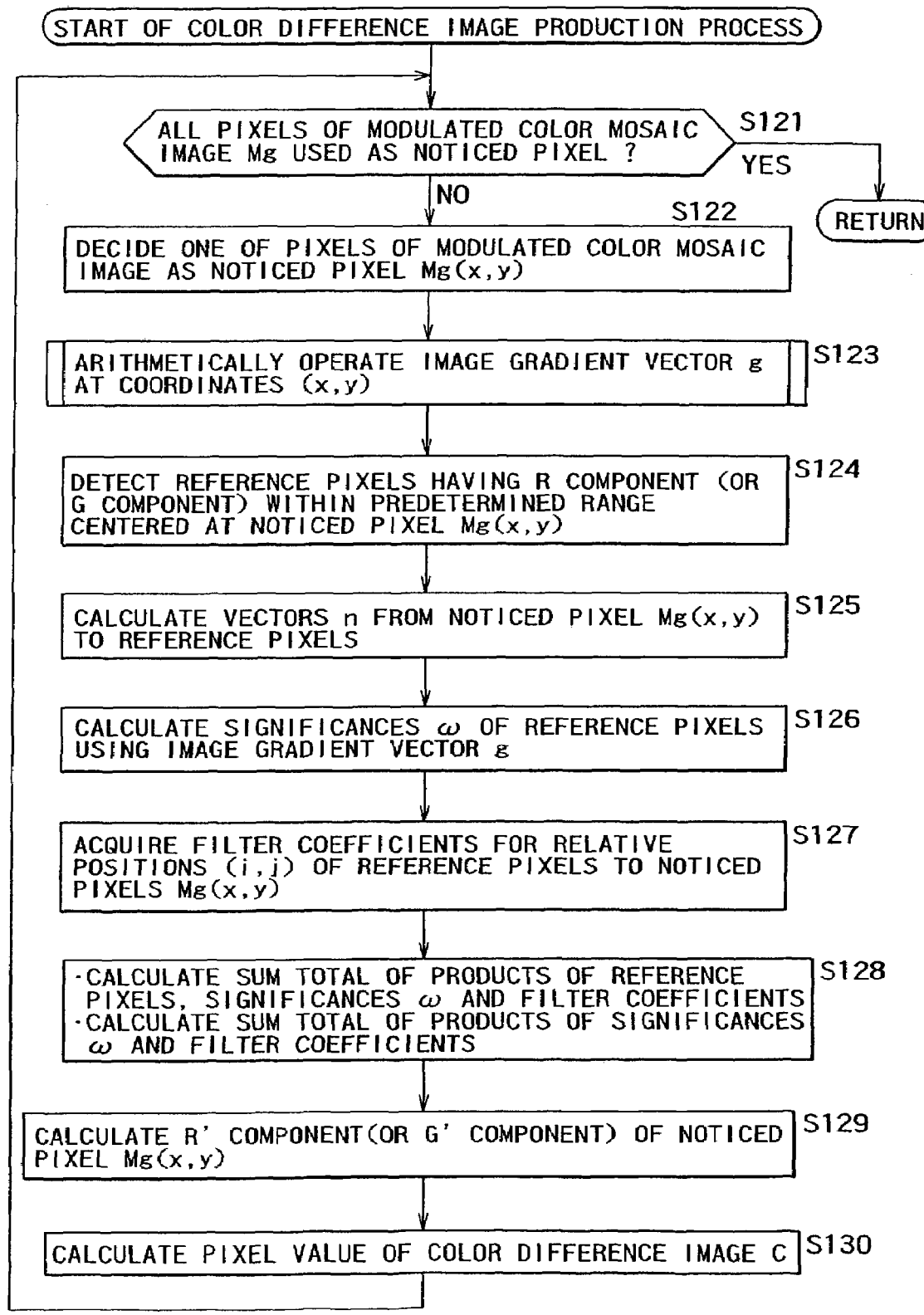
FIG. 62 is a flow chart illustrating a second color difference image production process.

Now, a second process for producing a color difference image C which can be executed by the color difference image production section 72 in place of the first process (FIG. 56) for producing a color difference image C described above is described with reference to a flow chart of FIG. 62.

At step S121, the smoothing sections 81 and 82 discriminate whether or not all pixels of the modulated color mosaic image Mg have been used as a noticed pixel. If the smoothing sections 81 and 82 discriminate that all pixels have not been used as a noticed pixel, then the processing advances to step S122. At step S122, the smoothing sections 81 and 82 determine one by one a pixel as a noticed pixel beginning with the left lowermost pixel and ending with the right uppermost pixel of the modulated color mosaic image Mg.

At step S123, the smoothing section 81 arithmetically operates an image gradient vector g corresponding to the noticed pixel.

Figure 63:
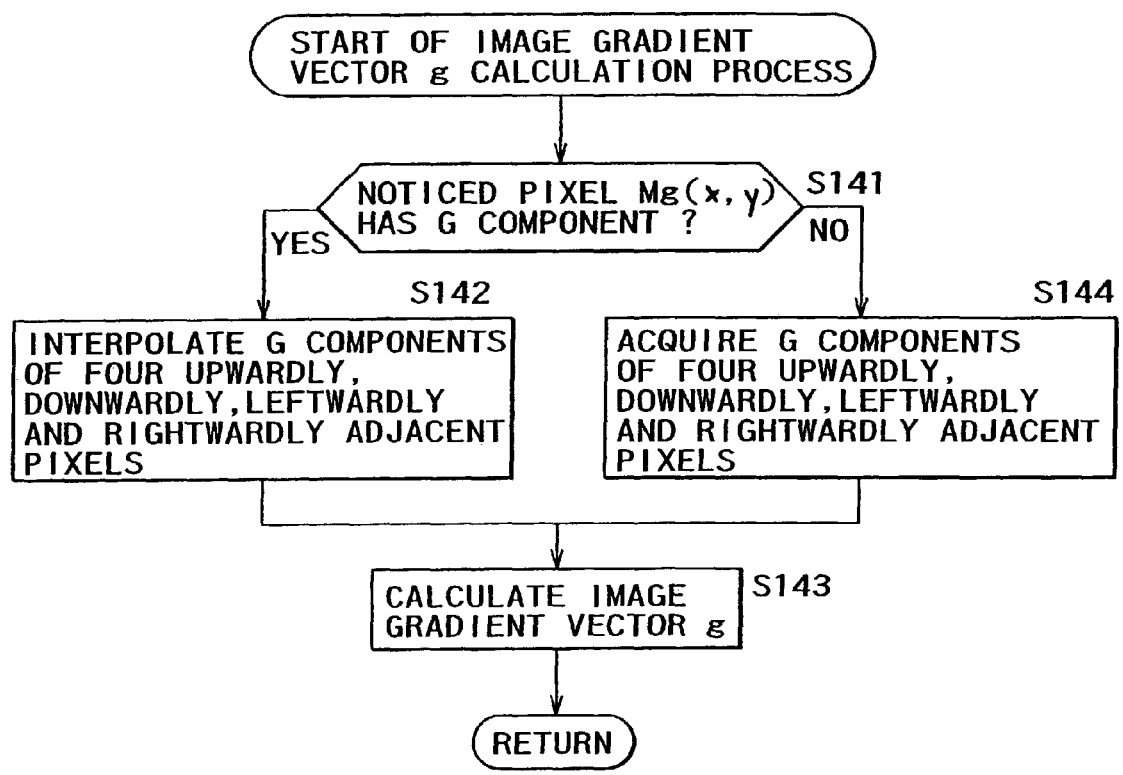
FIG. 63 is a flow chart illustrating an image gradient vector arithmetic operation process at step S123.

Details of the image gradient vector arithmetic operation process are described with reference to a flow chart of FIG. 63. In the image gradient vector arithmetic operation process, only those of all pixels of the modulate color mosaic image Mg which have a single type of a color are used to arithmetically operate the image gradient vector g.

It is to be noted that, although a predetermined single type of a color may be selected arbitrarily, for example, where the color mosaic pattern of the modulated color mosaic image Mg has a Bayer arrangement, since the number of pixels having a G component is equal to twice that of pixels having an R component or pixels having a B component, the single type of a color is reasonably set to G. Accordingly, the following description of this embodiment proceeds on the assumption that the color mosaic pattern of the color mosaic image Mg has a Bayer arrangement and that G is selected as the predetermined single type of a color.

At step S141, the smoothing section 81 discriminates whether or not the color of the noticed pixel is G. If the smoothing section 81 discriminates that the color of the noticed pixel is G, then the processing advances to step S142. In this instance, the colors of the four pixels positioned upwardly, downwardly, leftwardly and rightwardly of the noticed pixel are not G, and the colors of the four pixels positioned in the oblique directions from the noticed pixel are G.

At step S142, the smoothing section 81 interpolates the values G(U), G(D), G(L) and G(R) of G components corresponding to the four pixels positioned upwardly, downwardly, leftwardly and rightwardly of the noticed pixel, respectively, by applying the pixel value G(LU) of the pixel neighboring leftwardly upwards of the noticed pixel and having a G component, the pixel value G(LD) of the pixel neighboring leftwardly downwards of the noticed pixel and having a G component, the pixel value G(RU) of the pixel neighboring rightwardly upwards of the noticed pixel and having a G component and the pixel value G(RD) of the pixel neighboring rightwardly downwards of the noticed pixel and having a G component according to the following expressions (13) to (16):

$$G(U)=(G(LU)+G(RU))/2 \quad (13)$$

$$G(D)=(G(LD)+G(RD))/2 \quad (14)$$

$$G(L)=(G(LU)+G(LD))/2 \quad (15)$$

$$G(R)=(G(RU)+G(RD))/2 \quad (16)$$

At step S143, the smoothing section 81 applies the values G(U), G(D), G(L) and G(R) of the G components corresponding to the four pixels positioned upwardly, downwardly, leftwardly and rightwardly of the noticed pixel according to the following expressions (17) to (19) in order to calculate a vector g' and normalize the vector g' in accordance with the following expression (20) to calculate a gradient vector g:

$$gh=G(R)-G(L) \quad (17)$$

$$gv=G(U)-G(D) \quad (18)$$

$$g'=(gh,gv) \quad (19)$$

$$g=G'/\|g'\| \quad (20)$$

It is to be noted that, if it is discriminated at step S141 that the color of the noticed pixel is not G, then the processing advances to step S144. In this instance, the colors of the four pixels positioned upwardly, downwardly, leftwardly and rightwardly of the noticed pixel are G.

At step S144, the smoothing section 81 acquires the pixel values of the four pixels positioned upwardly, downwardly, leftwardly and rightwardly of the noticed pixel and substitutes them into the values G(U), G(D), G(L) and G(R), respectively.

The image gradient vector g corresponding to the noticed pixel is arithmetically operated in such a manner as described above. It is to be noted that, where the color mosaic pattern of the modulated color mosaic image Mg does not have a Bayer arrangement, a similar process can be applied to arithmetically operate the image gradient vector g. The processing then returns to step S124 of FIG. 62.

At step S124, the smoothing section 81 refers to the color mosaic pattern information to detect those of pixels neighboring with the noticed pixel (for example, 5×5 pixels centered at the noticed pixel) which have an R component, and extracts the pixel values of the detected pixels (hereinafter referred to as reference pixels). Meanwhile, the smoothing section 82 similarly refers to the color mosaic pattern information to detect those of pixels neighboring with the noticed pixel which have a G component, and extracts the pixel values of the detected pixels.

At step S125, the smoothing section 81 calculates the position vectors n from the noticed pixel to the reference pixels which have an R component and normalizes them. Meanwhile, the smoothing section 82 similarly calculates the position vectors n from the noticed pixel to the reference pixels which have a G component and normalizes them.

At step S126, as shown in the following expression (21), the smoothing section 81 subtracts, for each of the reference pixels having an R component, the absolute value of an inner product of the gradient vector g of the noticed pixel and the position vector n from 1 and arithmetically operates the difference to the pth power to calculate a significance ω of the reference pixel. Meanwhile, the smoothing section 82 similarly calculates a significance ω for each of the reference pixels having a G component. Here, ρ is a constant for adjusting the sharpness of direction selection and is set in advance.

$$\omega=(1-|(n,g)|)^\rho \quad (21)$$

At step S127, the smoothing section 81 acquires a number of filter coefficients set in advance and corresponding to relative positions of the reference pixels having an R component to the noticed pixel, the number being equal to the number of the reference pixels. Meanwhile, the smoothing section 82 similarly acquires a number of filter coefficients set in advance and corresponding to relative positions of the reference pixels having a G component to the noticed pixel, the number being equal to the number of the reference pixels.

At step S128, the smoothing section 81 multiplies the pixel values of the reference pixels having an R component by the corresponding filter coefficients and significances ω and arithmetically operates the sum total of the products. Further, the smoothing section 81 multiplies the filter coefficients and the significances (o corresponding to the reference pixels and arithmetically operates the sum total of the products. Meanwhile, the smoothing section 82 similarly multiplies the pixel values of the reference pixels having a G component by the corresponding filter coefficients and significances ω and arithmetically operates the sum total of the products. Further, the smoothing section 82 multiplies the filter coefficients and the significances ω corresponding to the reference pixels and arithmetically operates the sum total of the products.

At step S129, the smoothing section 81 divides the sum total of the products of the pixel values of the reference pixels having an R component and the corresponding filter coefficients and significances ω by the sum total of the products of the filter coefficients and the significances ω corresponding to the reference pixels calculated at step S128 and determines the quotient as a pixel value corresponding to the noticed pixel of the image R' which includes only smoothed R components. Meanwhile, the smoothing section 82 divides the sum total of the products of the pixel values of the reference pixels having a G component and the corresponding filter coefficients and significances ω by the sum total of the products of the filter coefficients and the significances ω corresponding to the reference pixels calculated at step S128 and determines the quotient as a pixel value corresponding to the noticed pixel of the image G' which includes only smoothed G components.

At step S130, the subtractor 83 subtracts the pixel value corresponding to the noticed pixel of the image G', which only includes smoothed G components, from the smoothing section 82 from the pixel value corresponding to the noticed pixel of the image R', which only includes smoothed R components, from the smoothing section 81, and determines the difference as a pixel value of the noticed pixel of the color difference image C.

The processing returns to step S121 so that the processing at steps S121 to 130 is repeated until it is discriminated at step S121 that all pixels have been used as a noticed pixel. When it is discriminated at step S121 that all pixels have been used as a noticed pixel, the color difference image production process is ended and the processing returns to step S53 of FIG. 55.

It is to be noted that, since the process of the color difference image production section 73 when it produces a color difference image D is similar to the second process of the color difference image production section 72 when it produces the color difference image C described above, a description of the process omitted.

In the second process for producing a color difference image C, since a contour of an object in an image is detected and smoothing is executed in parallel to the contour, occurrence of a color moire effect can be suppressed when compared with that in the first process for producing the color difference image C.

Subsequently, a second example of a configuration of the image processing section 7 which principally executes the second demosaic process is described with reference to FIG. 64. In the second example of the configuration of the image processing section 7, a color and sensitivity mosaic image from the image pickup system, color mosaic pattern information representative of a color mosaic arrangement of the color and sensitivity mosaic image and sensitivity mosaic pattern information representative of a sensitivity mosaic arrangement of the color and sensitivity mosaic image are supplied to a sensitivity uniformization section 111.

The sensitivity uniformization section 111 performs a sensitivity uniformization process for the color and sensitivity mosaic image based on the color mosaic pattern information and the sensitivity mosaic information and outputs a resulting color mosaic image M having a uniformized sensitivity to the color interpolation section 112. It is to be noted, however, that, since the color mosaic arrangement of the resulting color mosaic image M is not necessarily the same as the color mosaic arrangement of the original color and sensitivity mosaic image, the sensitivity uniformization section 111 updates the color mosaic pattern information and supplies it to a color interpolation section 112.

Figure 45:
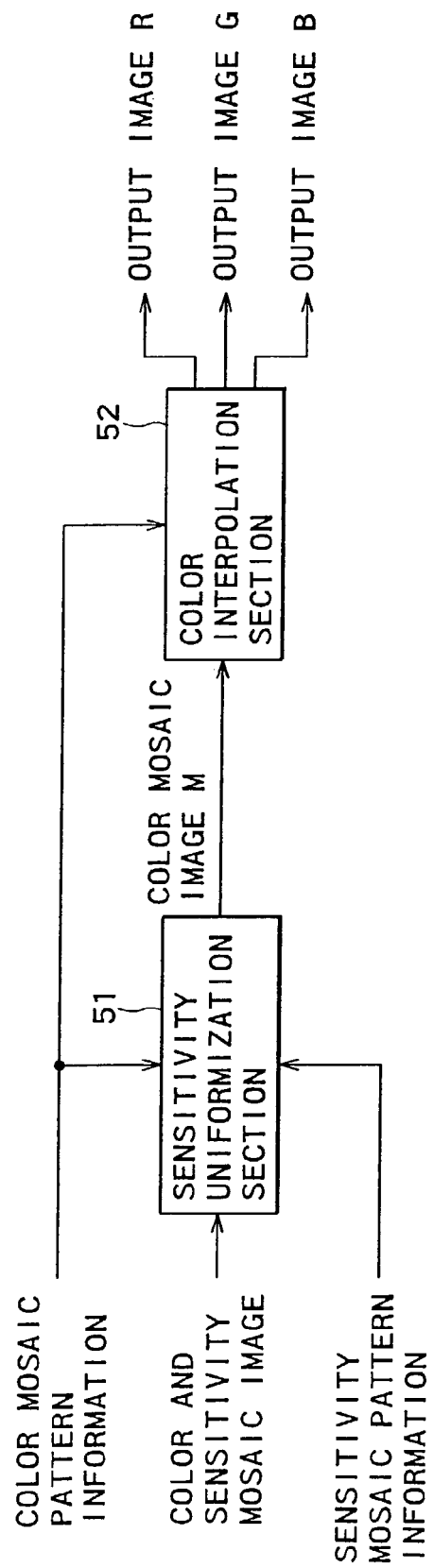
FIG. 45 is a block diagram showing a first embodiment of a configuration of an image processing section 7.

The color interpolation section 112 performs, similarly to the color interpolation section 52 of FIG. 45, a color interpolation process, in which the color mosaic pattern information is used, for the color mosaic image M from the sensitivity uniformization section 111 to produce output images R, G and B.

Figure 65:
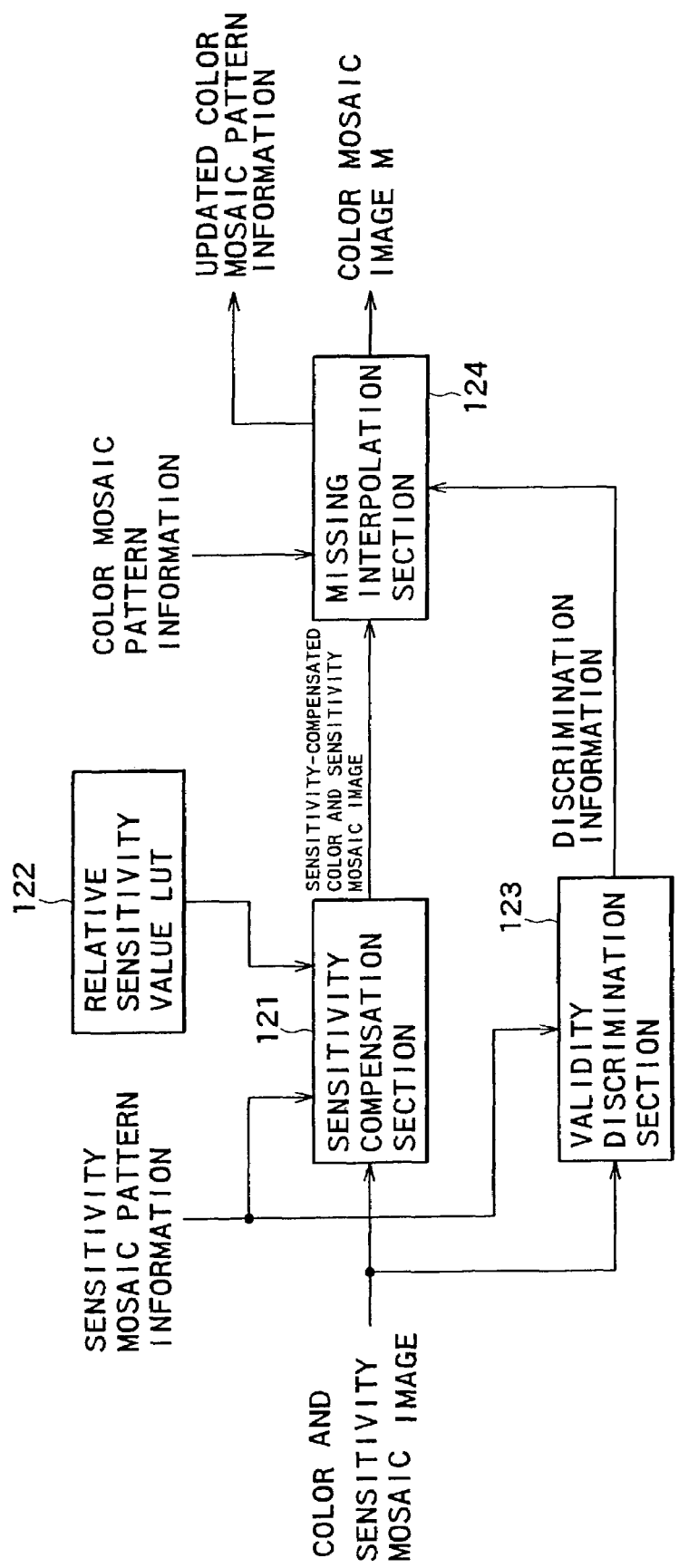
FIG. 65 is a block diagram showing a first embodiment of a configuration of a sensitivity uniformization section 111.

FIG. 65 shows a first example of a configuration of the sensitivity uniformization section 111. The first example of the configuration is an example of a configuration of the sensitivity uniformization section 111 which executes the first sensitivity uniformization process in the second demosaic process described above hereinabove with reference to FIGS. 35, 41 and 42.

In the first example of the configuration of the sensitivity uniformization section 111, a color and sensitivity mosaic image from the image pickup system is supplied to a sensitivity compensation section 121 and a validity discrimination section 123. Color mosaic pattern information is supplied to a missing interpolation section 124. Sensitivity mosaic pattern information is supplied to the sensitivity compensation section 121 and the validity discrimination section 123.

The sensitivity compensation section 121 performs sensitivity compensation for the color and sensitivity mosaic image based on a relative sensitivity value S obtained from a relative sensitivity value LUT 122 and outputs the resulting color and sensitivity mosaic image to the missing interpolation section 124. The relative sensitivity value LUT 122 is a lookup table which outputs a relative sensitivity value S using a sensitivity of a pixel as an index.

The validity discrimination section 123 compares the pixel value of each of the pixels of the color and sensitivity mosaic image with the threshold value $\theta_H$ of the saturation level and the threshold value $\theta_L$ of the noise level to discriminate the validity of the pixel value and supplies a result of the discrimination as discrimination information to the missing interpolation section 124. In the discrimination information, information representative of "valid" or "invalid" regarding the pixel value of each pixel is described.

The missing interpolation section 124 uses, based on the discrimination information from the validity discrimination section 123, the pixel values of those pixels from among all pixels of the sensitivity-compensated color and sensitivity mosaic image whose discrimination information is valid as they are, but uses, for each of those pixels whose discrimination information is invalid, the pixel values of those pixels having a color which is included most in the sensitivity-compensated color and sensitivity mosaic image to interpolate the pixel value of the color component. Use of the pixel values of those pixels having a color which is included most, in this manner, facilitates restoration of a high frequency component. Further, the missing interpolation section 124 updates the color mosaic pattern information corresponding to the color mosaic arrangement of the produced color mosaic image M and outputs the updated color mosaic pattern information to the color interpolation section 112.

Figure 64:
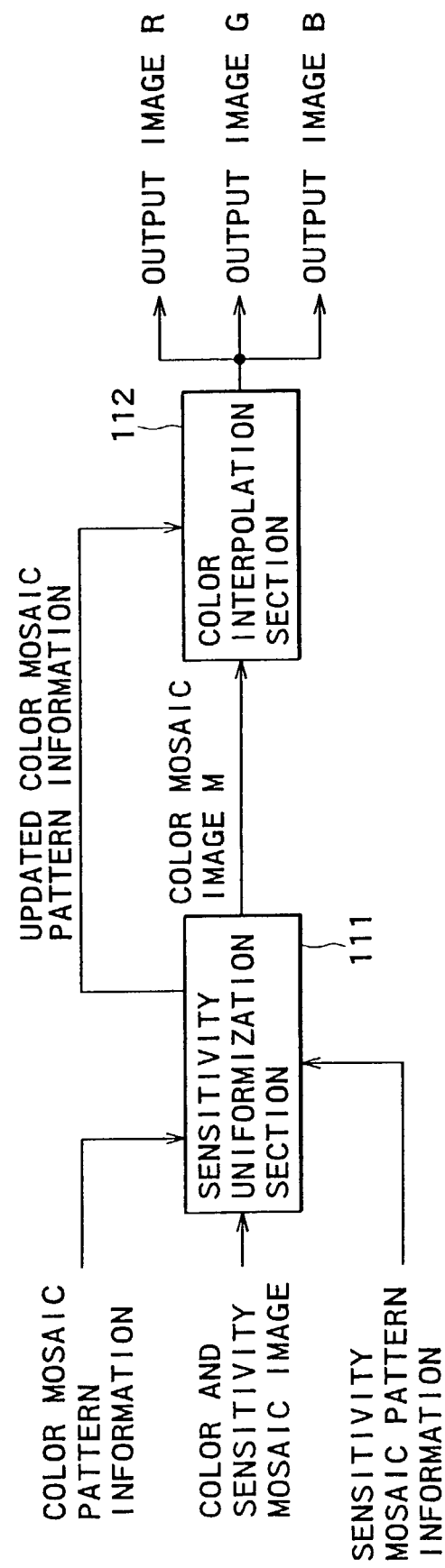
FIG. 64 is a block diagram showing a second embodiment of a configuration of the image processing section 7.
Figure 66:
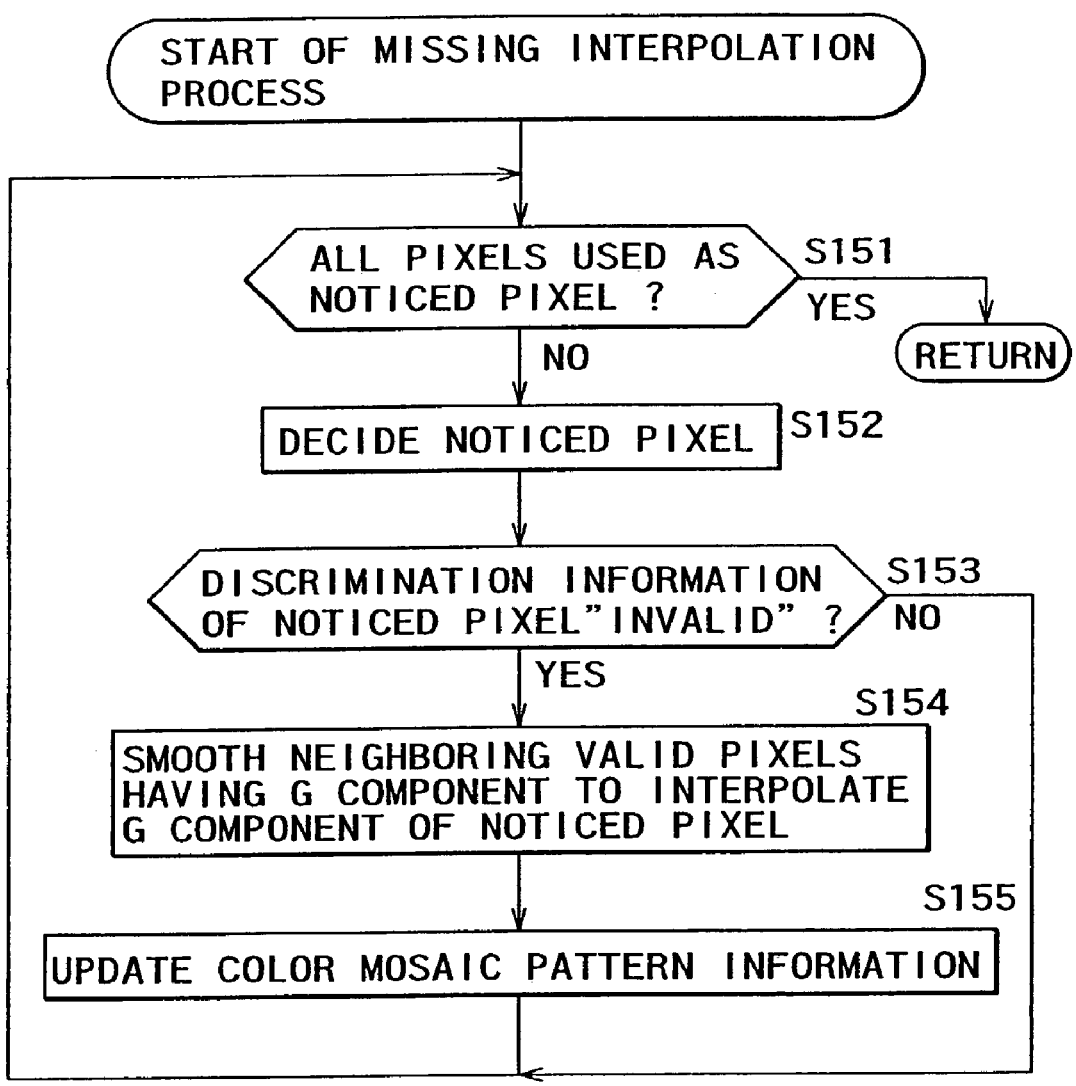
FIG. 66 is a flow chart illustrating a missing interpolation process by a missing interpolation section 124.

A second demosaic process executed principally by the second example of the configuration of the image processing section 7 shown in FIG. 64 is described below. However, most of the second demosaic process is similar to that of the first demosaic process described above. Therefore, a process different from that of the first demosaic process described above, that is, a missing interpolation process of the missing interpolation section 124 which composes the sensitivity uniformization section 111 is described with reference to a flow chart of FIG. 66. In the following description, it is assumed that the number of pixels having a G component is greatest in the color and sensitivity mosaic image. However, a similar process can be applied where the number of pixels having any other color component is greatest.

At step S151, the missing interpolation section 124 discriminates whether or not all pixels of the sensitivity-compensated color and sensitivity mosaic image have been used as a noticed pixel. If the missing interpolation section 124 discriminates that all pixels have not been used as a noticed pixel, then the processing advances to step S152. At step S152, the missing interpolation section 124 determines one by one a pixel as a noticed pixel beginning with the left lowermost pixel and ending with the right uppermost pixel of the sensitivity-compensated color and sensitivity mosaic image.

At step S153, the missing interpolation section 124 discriminates whether or not the discrimination information of the noticed pixel is invalid. If the missing interpolation section 124 discriminates that the discrimination information is invalid, then the processing advances to step S154.

At step S154, the missing interpolation section 124 refers to the color mosaic pattern information to detect those pixels neighboring with the noticed pixel (for example, 5×5 pixels centered at the noticed pixel) which have a G component and whose discrimination information is valid, and extracts the pixel values of the detected pixels (hereinafter referred to as reference pixels). Further, the missing interpolation section 124 acquires a number of filter coefficients set in advance and corresponding to relative positions of the reference pixels to the noticed pixel, the number being equal to the number of the reference pixels. Furthermore, the missing interpolation section 124 multiplies the pixel values of the reference pixels and the corresponding filter coefficients and arithmetically operates the sum total of the products. Further, the missing interpolation section 124 divides the sum total of the products by the sum total of the used filter coefficients and determines the quotient as a pixel value of the noticed pixel of the color mosaic image M.

At step S155, the missing interpolation section 124 updates the color of the noticed pixel in the color mosaic pattern information to G.

It is to be noted that, if it is discriminated at step S153 that the discrimination information of the noticed pixel is not invalid, then the processes at steps S154 and S155 are skipped.

The processing returns to step S151 so that the processing at steps S151 to 155 is repeated until it is discriminated at step S151 that all pixels have been used as a noticed pixel. When it is discriminated or determined at step S151 that all pixels have been used as a noticed pixel, the missing interpolation process is ended and the color mosaic image M obtained and the updated color mosaic pattern information are supplied to the color interpolation section 112 in the following stage.

A second example of a configuration of the sensitivity uniformization section 111 which can be used in place of the first example of the configuration of the sensitivity uniformization section 111 shown in FIG. 65 is described below with reference to FIG. 67.

The second example of the configuration is an example of a configuration for allowing the sensitivity uniformization section 111 to execute the second sensitivity uniformization process of the second demosaic process described hereinabove with reference to FIGS. 35, 43 and 44.

The following description proceeds on the assumption that, in the color and sensitivity mosaic image, the color of each pixel is one of the three primary colors of R, G and B as in the color and sensitivity mosaic pattern P10 of FIG. 14 or the color and sensitivity mosaic pattern P11 of FIG. 15 and the sensitivity is one of sensitivities of four stages of S0, S1, S2 and S3. However, the configuration and the operation described below can also be applied in alternative embodiments to another color and sensitivity mosaic image which includes three colors other than R, G and B or a further color and sensitivity mosaic image which includes four colors. Furthermore, they can also be applied to a color and sensitivity mosaic pattern wherein the number of stages of sensitivity is two or three.

In the second example of the configuration of the sensitivity uniformization section 111, a color and sensitivity mosaic image from the image pickup system, color mosaic pattern information and sensitivity mosaic pattern information are supplied to interpolation sections 132-1 to 132-4. The color mosaic pattern information is also supplied to an interpolation color determination section 131.

The interpolation color determination section 131 designates the color (interpolation color) of interpolation values to be interpolated by the interpolation sections 132-1 to 132-3 based on the color mosaic pattern information. Further, the interpolation color determination section 131 updates the color mosaic pattern information in accordance with a determination of the interpolation colors.

The interpolation section 132-1 performs an interpolation process of the sensitivity S0 for the color and sensitivity mosaic image in accordance with the designation of an interpolation color from the interpolation color determination section 131 and outputs a resulting interpolation value corresponding to the sensitivity S0 to an adder 133. The interpolation section 132-2 performs an interpolation process of the sensitivity S1 for the color and sensitivity mosaic image in accordance with the designation of the interpolation color from the interpolation color determination section 131 and outputs a resulting interpolation value corresponding to the sensitivity S1 to the adder 133. The interpolation section 132-3 performs an interpolation process of the sensitivity S2 for the color and sensitivity mosaic image in accordance with the designation of the interpolation color from the interpolation color determination section 131 and outputs a resulting interpolation value corresponding to the sensitivity S2 to the adder 133. The interpolation section 132-4 performs an interpolation process of the sensitivity S3 for the color and sensitivity mosaic image in accordance with the designation of the interpolation color from the interpolation color determination section 131 and outputs a resulting interpolation value corresponding to the sensitivity S3 to the adder 133.

The adder 133 adds the interpolation values of the sensitivities S0 to S3 inputted thereto from the interpolation sections 132-1 to 132-4 for each pixel and supplies the sum as a pixel value of a color mosaic candidate image to a synthetic sensitivity compensation section 134.

The synthetic sensitivity compensation section 134 collates the pixel value of the color mosaic candidate image supplied thereto from the adder 133 with a synthetic sensitivity compensation LUT 135 and produces and supplies a color mosaic image wherein the resulting value is used as a pixel value to the color interpolation section 112. The synthetic sensitivity compensation LUT 135 allows a pixel value of the color and sensitivity mosaic image M using a pixel value of the color mosaic candidate image as an index.

Figure 67:
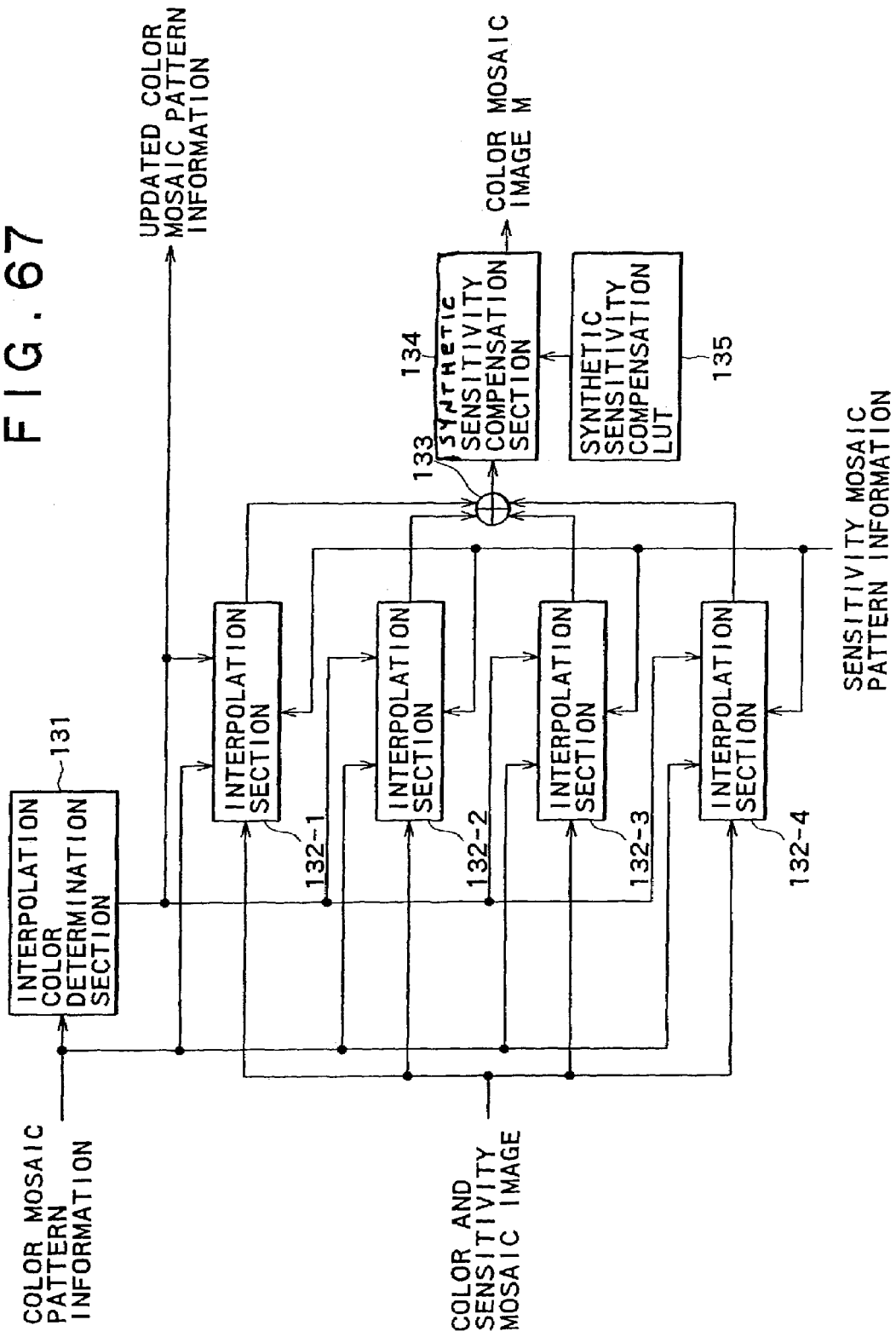
FIG. 67 is a block diagram showing a second embodiment of a configuration of the sensitivity uniformization section 111.

A second sensitivity uniformization process in the second demosaic process by the second example of the configuration of the sensitivity uniformization section 111 shown in FIG. 67 is described below with reference to a flow chart of FIG. 68.

At step S161, the interpolation sections 132-1 to 132-4 discriminate whether or not all pixels of the color and sensitivity mosaic image have been used as a noticed pixel. If the interpolation sections 132-1 to 132-4 discriminate that all pixels have not been used as a noticed pixel, then the processing advances to step S162. At step S162, the interpolation sections 132-1 to 132-4 determine one by one a pixel as a noticed pixel beginning with the left lowermost pixel and ending with the right uppermost pixel of the color and sensitivity mosaic image.

At step S163, the interpolation color determination section 131 executes an interpolation color determination process based on the color mosaic pattern information and issues a notification of a resulting interpolation color of the noticed pixel to the interpolation sections 132-1 to 132-4.

Figure 69:
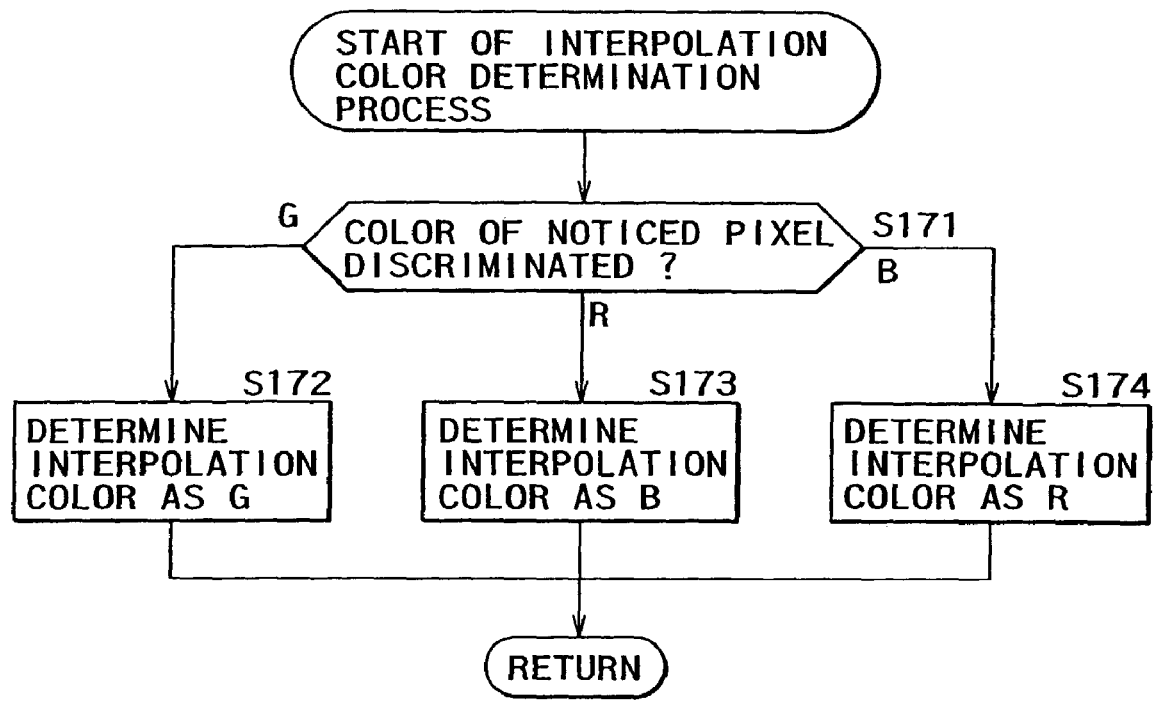
FIG. 69 is a flow chart illustrating an interpolation color determination process at step S163.

Details of the interpolation color determination process of the interpolation color determination section 131 are described with reference to a flow chart of FIG. 69. It is to be noted that the object of the interpolation color determination process is to interpolate the pixel value of the noticed pixel using pixels comparatively neighboring the noticed pixel and it is assumed that the color mosaic arrangement of the color and sensitivity mosaic image has a Bayer arrangement.

At step S171, the interpolation color determination section 131 refers to the color mosaic pattern information to discriminate the color of the noticed pixel.

If it is discriminated at step S171 that the color of the noticed pixel is G, then the processing advances to step S172. In this instance, the colors of the four pixels neighboring in the oblique directions with the noticed pixel are also G. At step S172, the interpolation color determination section 131 determines the interpolation color of the noticed pixel as G and issues a notification of this to the interpolation sections 132-1 to 132-4. Further, the interpolation color determination section 131 updates the color mosaic pattern information corresponding to the noticed pixel to G.

If it is discriminated at step S171 that the color of the noticed pixel is R, then the processing advances to step S173. In this instance, the colors of the four pixels neighboring in the oblique directions with the noticed pixel are B. At step S173, the interpolation color determination section 131 determines the interpolation color of the noticed pixel as B and issues a notification of this to the interpolation sections 132-1 to 132-4. Further, the interpolation color determination section 131 updates the color mosaic pattern information corresponding to the noticed pixel to G.

If it is discriminated at step S171 that the color of the noticed pixel is B, then the processing advances to step S174. In this instance, the colors of the four pixels neighboring in the oblique directions with the noticed pixel are R. At step S174, the interpolation color determination section 131 determines the interpolation color of the noticed pixel as R and issues a notification of this to the interpolation sections 132-1 to 132-4. Further, the interpolation color determination section 131 updates the color mosaic pattern information corresponding to the noticed pixel to R.

With the interpolation color determination process described above, the interpolation color of the noticed pixel is designated so that R and B of the color and sensitivity mosaic image whose color mosaic arrangement is a Bayer arrangement are exchanged for each other. Therefore, the updated color mosaic pattern information maintains the Bayer arrangement.

Figure 68:
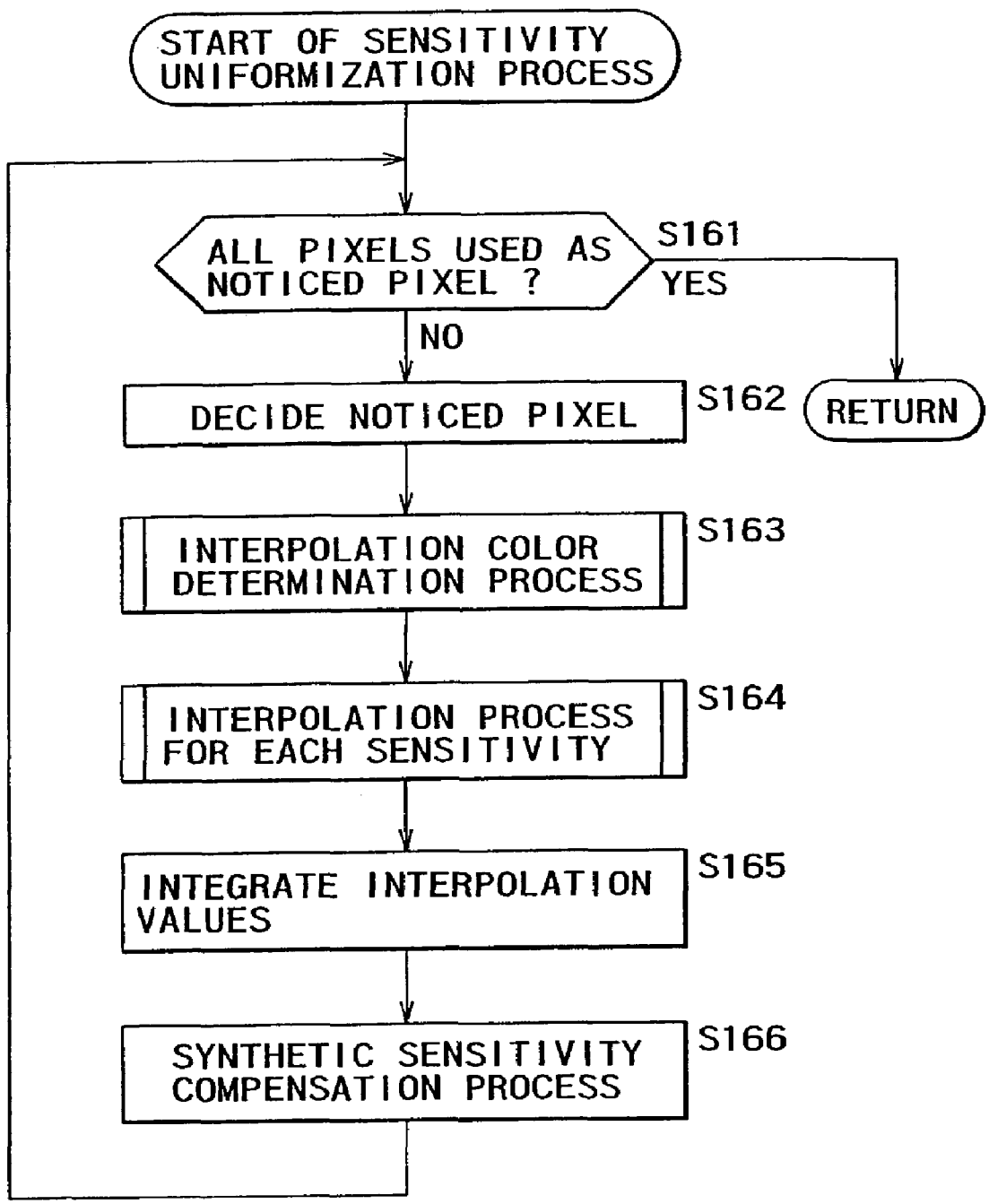
FIG. 68 is a flow chart illustrating the second sensitivity uniformization process in the second demosaic process by the second embodiment of the configuration of the sensitivity uniformization section 111.

The processing returns to step S164 of FIG. 68. At step S164, the interpolation sections 132-1 to 132-4 individually perform an interpolation process for the color and sensitivity mosaic image in accordance with the designation of the interpolation color from the interpolation color determination section 131 to produce an interpolation value corresponding to the sensitivity S0, S1, S2 or S3 and outputs the interpolation value to the adder 133.

More particularly, for example, the interpolation section 132-1 detects, from among pixels positioned in the neighborhood of the noticed pixel of the color and sensitivity mosaic image (for example, from among 5×5 pixels centered at the noticed pixel), those pixels which have the color designated from the interpolation color determination section 131 and whose sensitivity is S0, and extracts the pixel values of the detected pixels (hereinafter referred to as reference pixels). Further, the interpolation section 132-1 acquires a number of filter coefficients set in advance and corresponding to relative positions of the detected reference pixels to the noticed pixel, the number being equal to the number of the reference pixels. Furthermore, the interpolation section 132-1 multiplies the pixel values of the reference pixels and the corresponding filter coefficients and arithmetically operates the sum total of the products. Further, the interpolation section 132-1 divides the sum total of the products by the sum total of the used filter coefficients and determines the quotient as an interpolation value corresponding to the sensitivity S0 of the noticed pixel.

It is to be noted that the interpolation processes for the sensitivities S1 to S3 by the interpolation sections 132-2 to 132-4 are similar to the interpolation process for the sensitivity S0 by the interpolation section 132-1, and therefore, a description of the process is omitted.

At step S165, the adder 133 adds the interpolation values for the sensitivities S0 to S3 corresponding to the noticed pixel inputted therefrom from the interpolation sections 132-1 to 132-4 and supplies the sum as a pixel value of the color mosaic candidate image corresponding to the noticed pixel to the synthetic sensitivity compensation section 134.

At step S166, the synthetic sensitivity compensation section 134 collates the pixel value of the color mosaic candidate image supplied thereto from the adder 133 with the synthetic sensitivity compensation LUT 135 and determines a resulting value as a pixel value of the color mosaic image M corresponding to the noticed pixel.

The processing then returns to step S161 so that the processing at steps S161 to 166 is repeated until it is discriminated at step S161 that all pixels have been used as a noticed pixel. When it is discriminated at step S161 that all pixels have been used as a noticed pixel, the second sensitivity uniformization process in the second demosaic process is ended.

It is to be noted that, although a color interpolation process is performed by the color interpolation section 112 for the color mosaic image M obtained by the second sensitivity uniformization process of the second demosaic process, since the process is similar to the color interpolation process described above with reference to the flow chart of FIG. 55, a description of the process is omitted.

Figure 70:
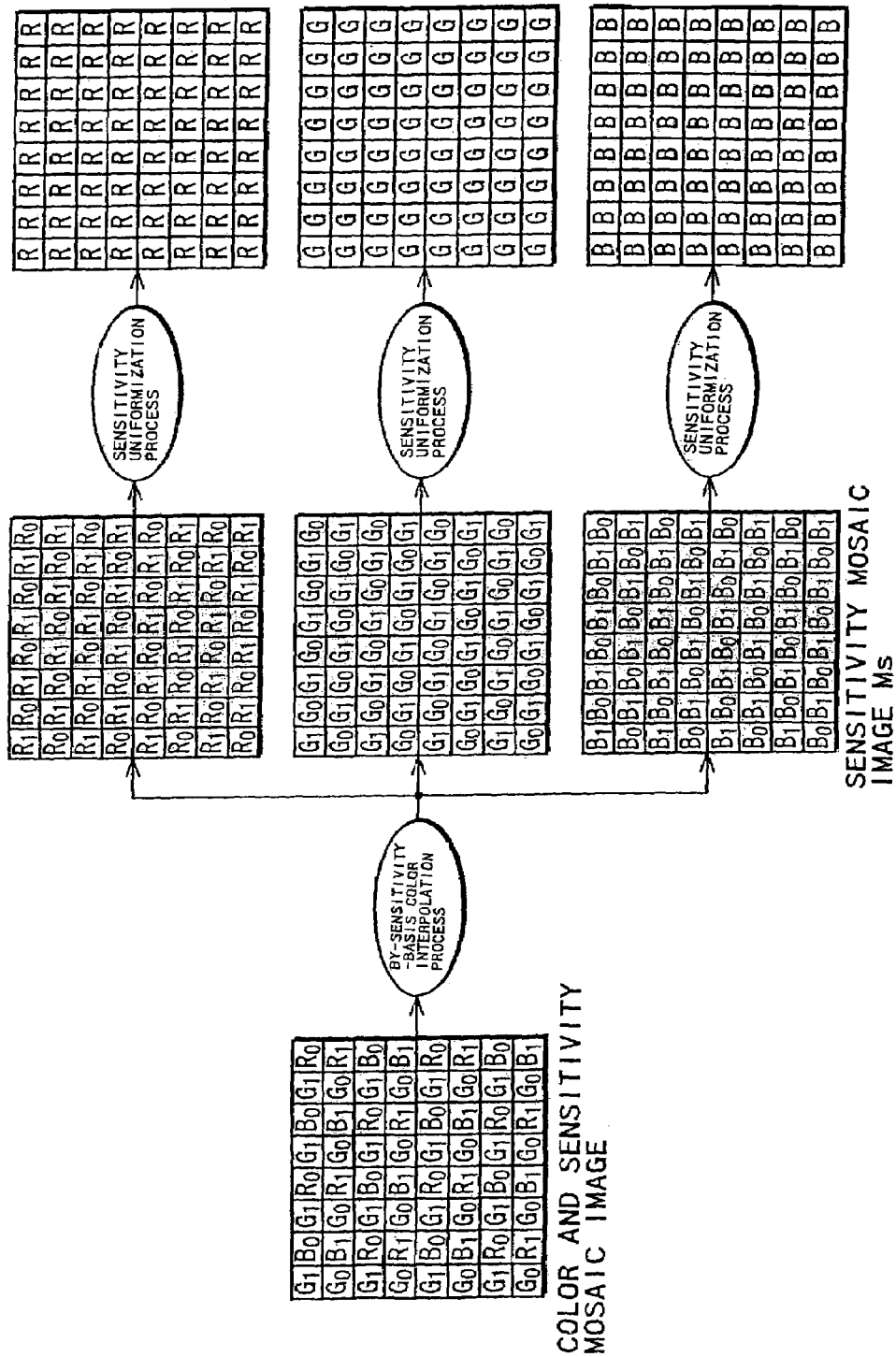
FIG. 70 is a view illustrating an outline of a third demosaic process.
Figure 71:
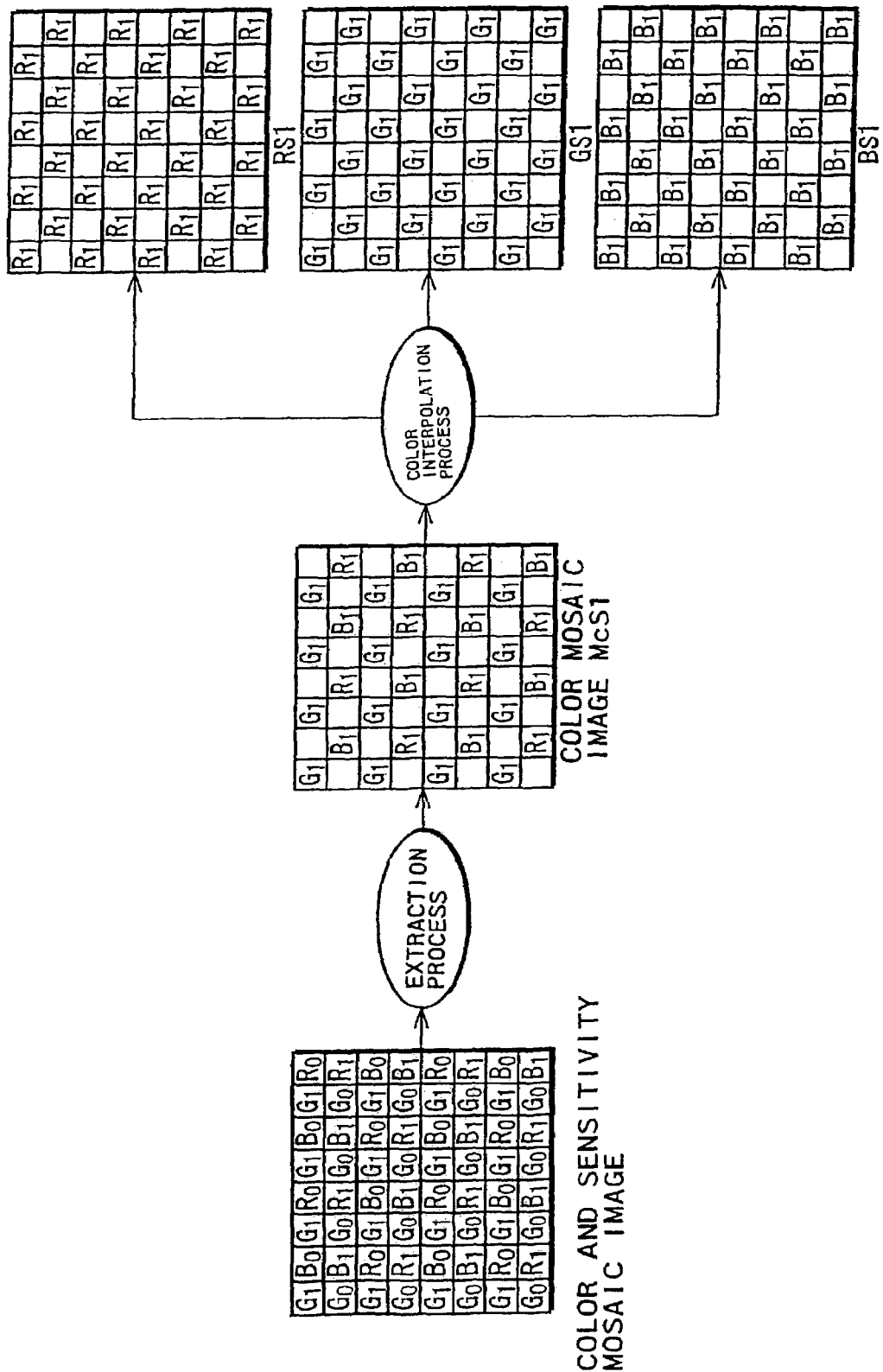
FIG. 71 is a view illustrating an outline of a by-sensitivity-basis color interpolation process in the third demosaic process.
Figure 72:
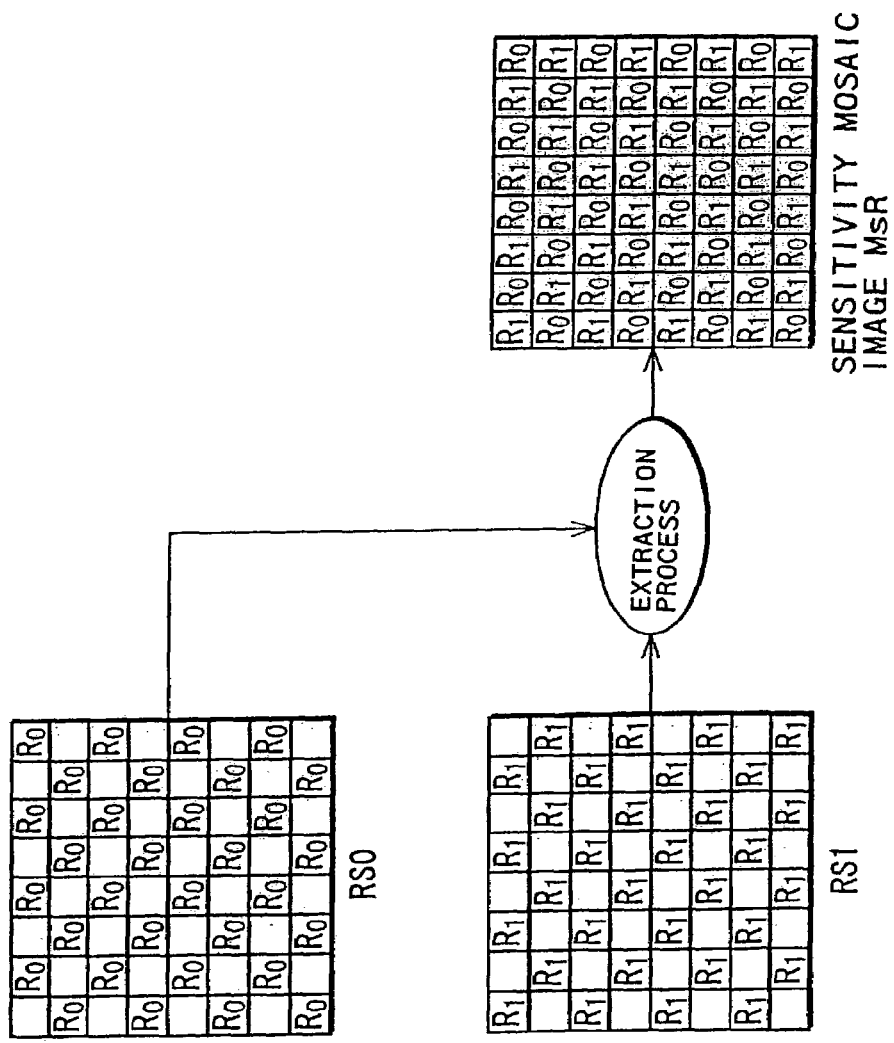
FIG. 72 is a view illustrating an outline of the by-sensitivity-basis color interpolation process in the third demosaic process.

FIG. 70 illustrates an outline of a third demosaic process of the image processing system which includes the image processing section 7 as a principal component.

The third demosaic process includes, as shown in FIG. 70, a by-sensitivity-basis color interpolation process wherein RGB components of pixels of a color and sensitivity mosaic image obtained by processing of the image pickup section are interpolated without changing the sensitivities of the pixels to produce a sensitivity mosaic image MsR for an R component, a sensitivity mosaic image MsG for a G component and a sensitivity mosaic image MsB for a B component, and a sensitivity uniformization process for uniformizing the sensitivities of the sensitivity mosaic image for an R component, the sensitivity mosaic image for a G component and the sensitivity mosaic image for a B component to produce output images R, G and B, respectively.

The by-sensitivity-basis color interpolation process of the third demosaic process includes an extraction process for extracting only those pixels which have the same sensitivity from the color and sensitivity mosaic image, a color interpolation process for interpolating the pixel values of the RGB components of the pixels extracted by the extraction process, and an insertion process for synthesizing the pixel values interpolated by the color interpolation process for each of the RGB components to produce sensitivity mosaic images.

For example, in the extraction process, only the pixels which have the sensitivity S1 are extracted from the color and sensitivity mosaic image to produce a color mosaic image McS1 wherein the pixels are disposed in a checkered manner. In the color interpolation process, an image Rs1 wherein the pixels which have the sensitivity S1 and have an R component are disposed in a checkered manner, another image Gs1 wherein the pixels which have the sensitivity S1 and have a G component are disposed in a checkered manner and a further image Bs1 wherein the pixels which have the sensitivity S1 and have a B component are disposed in a checkered manner are produced from the color mosaic image McS1.

For example, in the insertion process, an image RS0 and another image RS1 produced by the color interpolation process are combined to produce a sensitivity mosaic image MsR.

Subsequently, a third example of a configuration of the image processing section 7 which principally executes the third demosaic process is described with reference to FIG. 73.

In the third example of the configuration of the image processing section 7, a color and sensitivity mosaic image from the image pickup system is supplied to a by-sensitivity-basis color interpolation section 151. Color mosaic pattern information representative of a color mosaic arrangement of the color and sensitivity mosaic image is supplied to the by-sensitivity-basis color interpolation section 151. Sensitivity mosaic pattern information representative of a sensitivity mosaic arrangement of the color and sensitivity mosaic image is supplied to the by-sensitivity-basis color interpolation section 151 and sensitivity uniformization sections 152 to 154.

It is to be noted that, in the following description, unless otherwise specified, the color and sensitivity mosaic image has the color and sensitivity mosaic pattern P3 of FIG. 7. In particular, each pixel in this embodiment has a color which is one of the three primary colors of R, G and B and has a sensitivity of one of S0 and S1. Further, where attention is paid to only the pixels of the sensitivity S0 irrespective of the color, they are arranged in a checkered manner. Similarly, the pixels of the sensitivity S1 are arranged in a checkered manner.

However, in the alternative embodiments, the configuration and the operation described below can be applied to another color and sensitivity mosaic image having three colors other than R, G and B or a further color and sensitivity mosaic image which has four colors.

The by-sensitivity-basis color interpolation section 151 performs a by-sensitivity-basis color interpolation process for the color and sensitivity mosaic image and supplies resulting sensitivity mosaic image MsR for an R component, sensitivity mosaic image MsG for a G component and sensitivity mosaic image MsB for a B component to corresponding ones of the sensitivity uniformization sections 152 to 154, respectively.

The sensitivity uniformization section 152 performs a sensitivity uniformization process for the sensitivity mosaic image MsR for an R component to produce an output image R. The sensitivity uniformization section 153 performs a sensitivity uniformization process for the sensitivity mosaic image MsG for a G component to produce an output image G. The sensitivity uniformization section 154 performs a sensitivity uniformization process for the sensitivity mosaic image MsB for a B component to produce an output image B.

Figure 74:
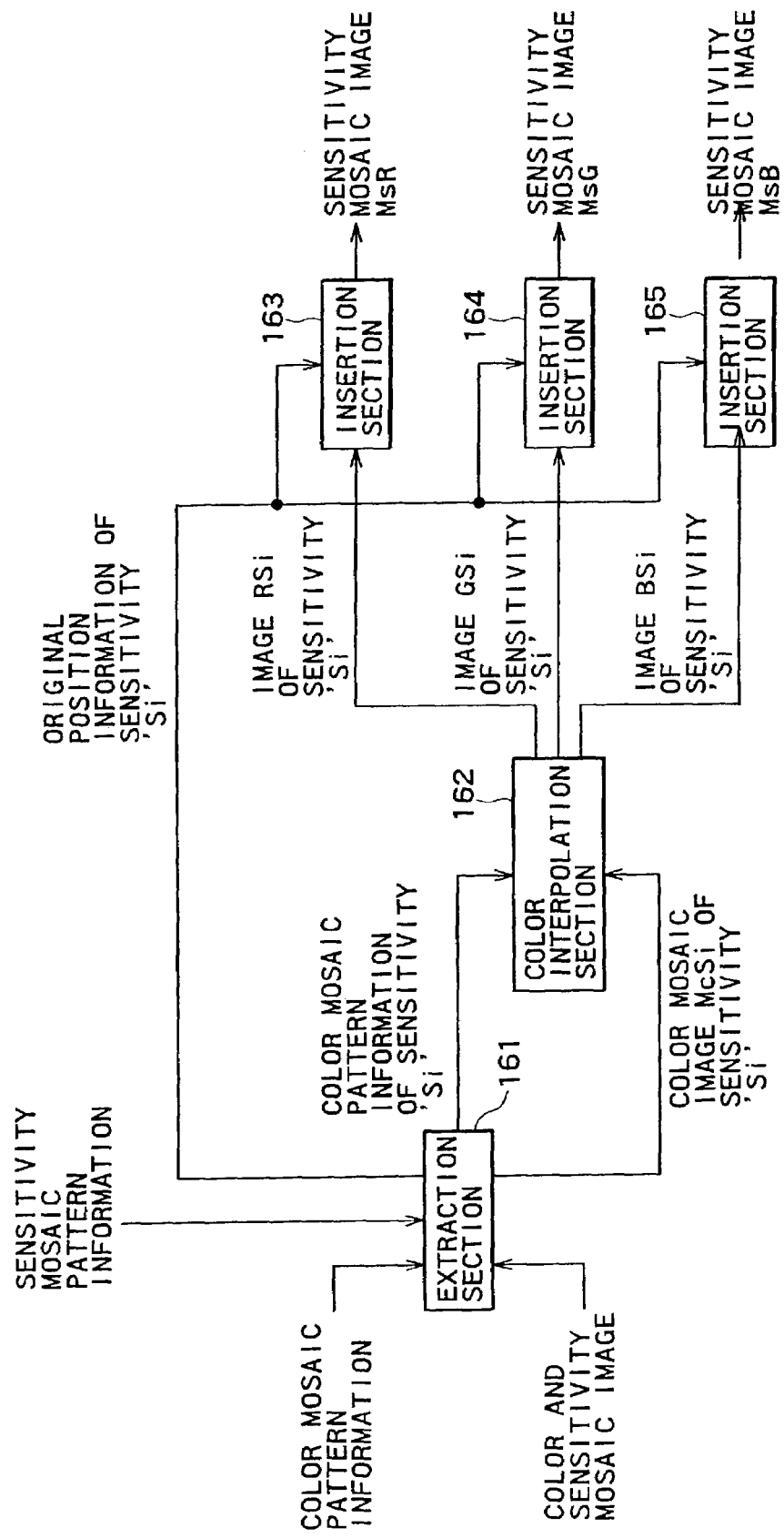
FIG. 74 is a block diagram showing an embodiment of a configuration of a by-sensitivity-basis color interpolation section 151.

FIG. 74 shows an example of a configuration of the by-sensitivity-basis color interpolation section 151. In the by-sensitivity-basis color interpolation section 151, the color and sensitivity mosaic image, color mosaic pattern information and sensitivity mosaic pattern information are supplied to an extraction section 161.

The extraction section 161 performs an extraction process of the sensitivity Si (in the present case, i=0 or 1) for the color and sensitivity mosaic image and supplies a resulting color mosaic image McSi which includes pixels of the sensitivity Si to a color interpolation section 162. It is to be noted that the color mosaic image McSi is an image represented using an st coordinate system different from the xy coordinate system of the original color and sensitivity mosaic image (details are hereinafter described with reference to FIGS. 78 and 79). Further, the extraction section 161 produces color mosaic pattern information of the sensitivity Si representative of a color mosaic arrangement of the color mosaic image McSi and supplies the color mosaic pattern information to the color interpolation section 162. Furthermore, the extraction section 161 produces original position information of the sensitivity Si which has a positional relationship between the color mosaic image McSi and the original color and sensitivity mosaic image and supplies the original position information of the sensitivity Si to insertion sections 163 to 165.

The color interpolation section 162 interpolates RGB components of all pixels of the color mosaic image McSi from the extraction section 161 and supplies resulting images Rsi, Gsi and Bsi to the corresponding insertion sections 163 to 165, respectively. The image Rsi is an image composed of pixel values of R components corresponding to the pixels of the color mosaic image McSi. The image Gsi is an image composed of pixel values of G components corresponding to the pixels of the color mosaic image McSi. The image Bsi is an image composed of pixel values of B components corresponding to the pixels of the color mosaic image McSi. Further, the images Rsi, Gsi and Bsi are represented using a coordinate system same as that of the color mosaic image McSi. It is to be noted that the color interpolation section 162 is configured in a similar manner as in the example of the configuration of the color interpolation section 52 shown in FIG. 47.

The insertion section 163 combines a number of images Rsi of an R component equal to the number of kinds of sensitivities supplied from the color interpolation section 162 based on the original position information of the sensitivity Si supplied from the extraction section 161 to produce a sensitivity mosaic image MsR, and supplies the sensitivity mosaic image MsR to the sensitivity uniformization section 152. The insertion section 164 combines a number of images Gsi of a G component equal to the number of kinds of sensitivities supplied from the color interpolation section 162 based on the original position information of the sensitivity Si supplied from the extraction section 161 to produce a sensitivity mosaic image MsG, and supplies the sensitivity mosaic image MsG to the sensitivity uniformization section 153. The insertion section 165 combines a number of images Bsi of a B component equal to the number of kinds of sensitivities supplied from the color interpolation section 162 based on the original position information of the sensitivity Si supplied from the extraction section 161 to produce a sensitivity mosaic image MsB, and supplies the sensitivity mosaic image MsB to the sensitivity uniformization section 154.

Figure 75:
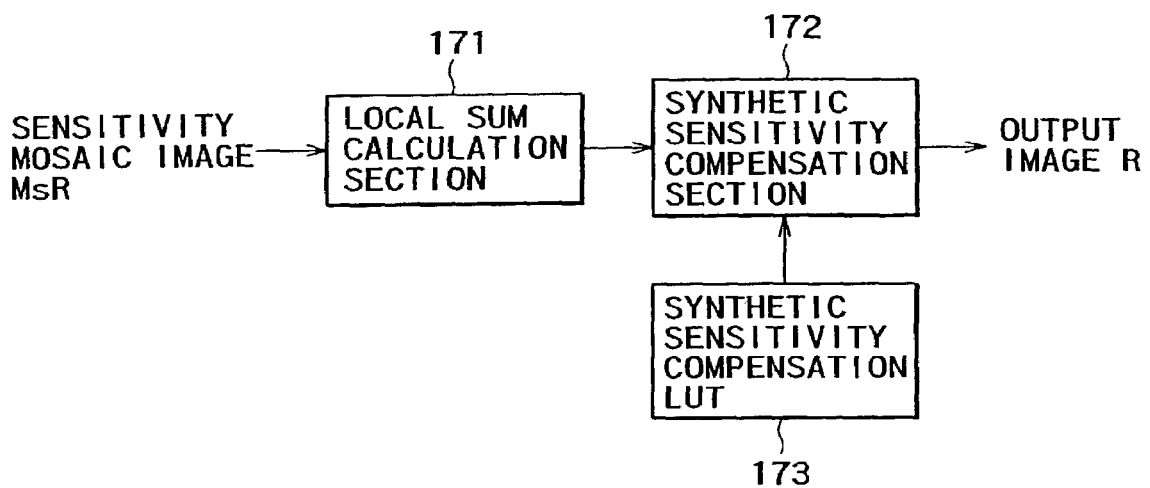
FIG. 75 is a block diagram showing an embodiment of a configuration of a sensitivity uniformization section 152.

FIG. 75 shows an example of a configuration of the sensitivity uniformization section 152. In the sensitivity uniformization section 152, the sensitivity mosaic image MsR supplied from the insertion section 163 of the by-sensitivity-basis color interpolation section 151 is supplied to a local sum calculation section 171. The local sum calculation section 171 performs, for each pixel of the sensitivity mosaic image MsR, a local sum calculation process using pixels neighboring the pixel and supplies the resulting local sum corresponding to each of the pixels to a synthetic sensitivity compensation section 172. The synthetic sensitivity compensation section 172 collates the local sums with a synthetic sensitivity compensation LUT 173 to acquire corresponding compensation values and produces an output image R using the compensation values as pixel values. The synthetic sensitivity compensation LUT 173 can supply a corresponding compensation value when a local sum is inputted as an index thereto.

It is to be noted that examples of configurations of the sensitivity uniformization sections 153 and 154 are similar to the example of the configuration of the sensitivity uniformization section 152 shown in FIG. 75, and therefore, a description is omitted.

Figure 73:
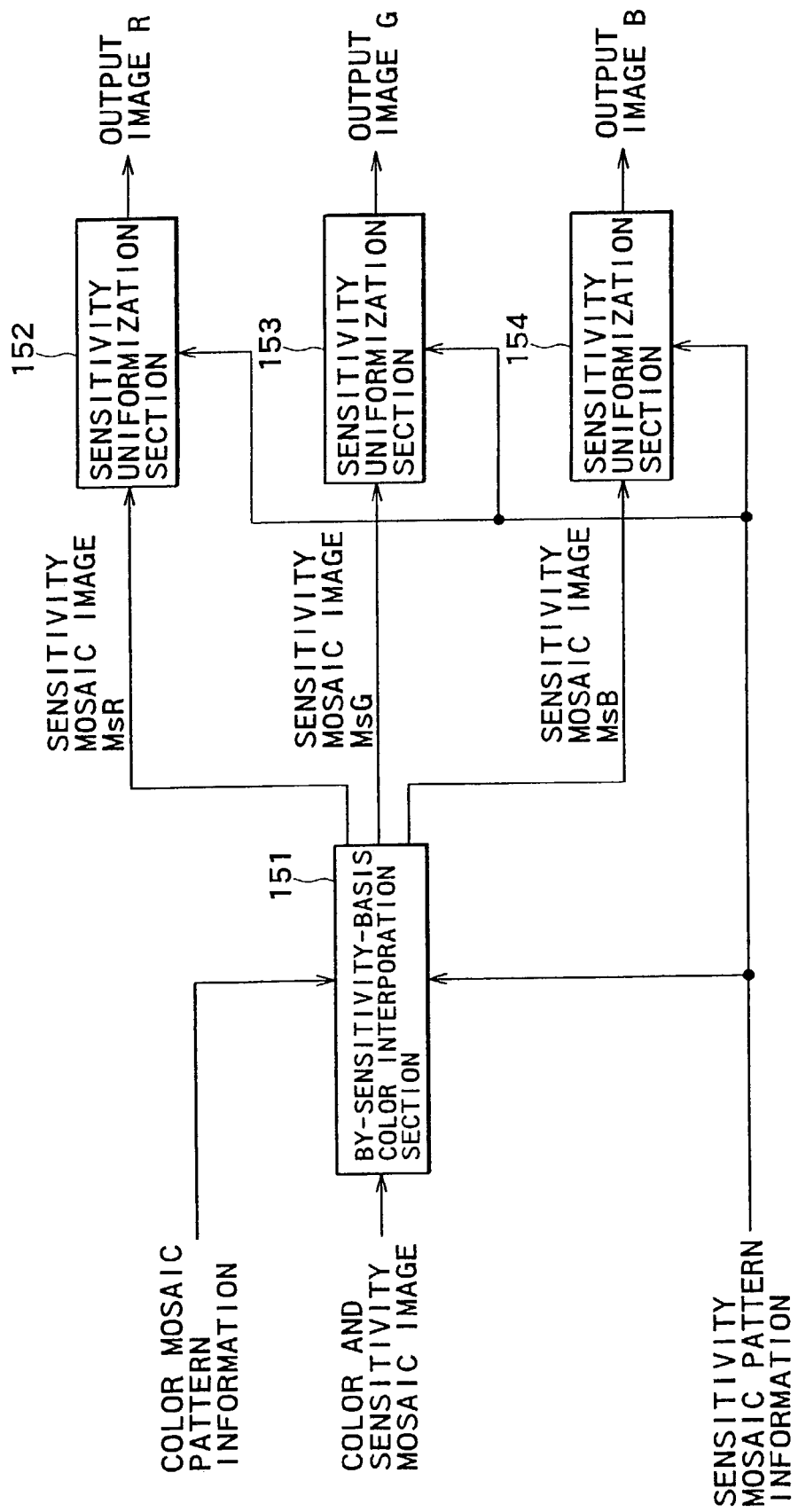
FIG. 73 is a block diagram showing a third embodiment of a configuration of the image processing section 7.

Subsequently, a third demosaic process by the third example of the configuration of the image processing section 7 shown in FIG. 73 is described with reference to a flow chart of FIG. 76.

At step 181, the by-sensitivity-basis color interpolation section 151 performs a by-sensitivity-basis color interpolation process for the color and sensitivity mosaic image to produce an R component sensitivity mosaic image MsR, a G component sensitivity mosaic image MsG and a B component sensitivity mosaic image MsB and supplies them to the sensitivity uniformization sections 152 to 154, respectively.

Figure 77:
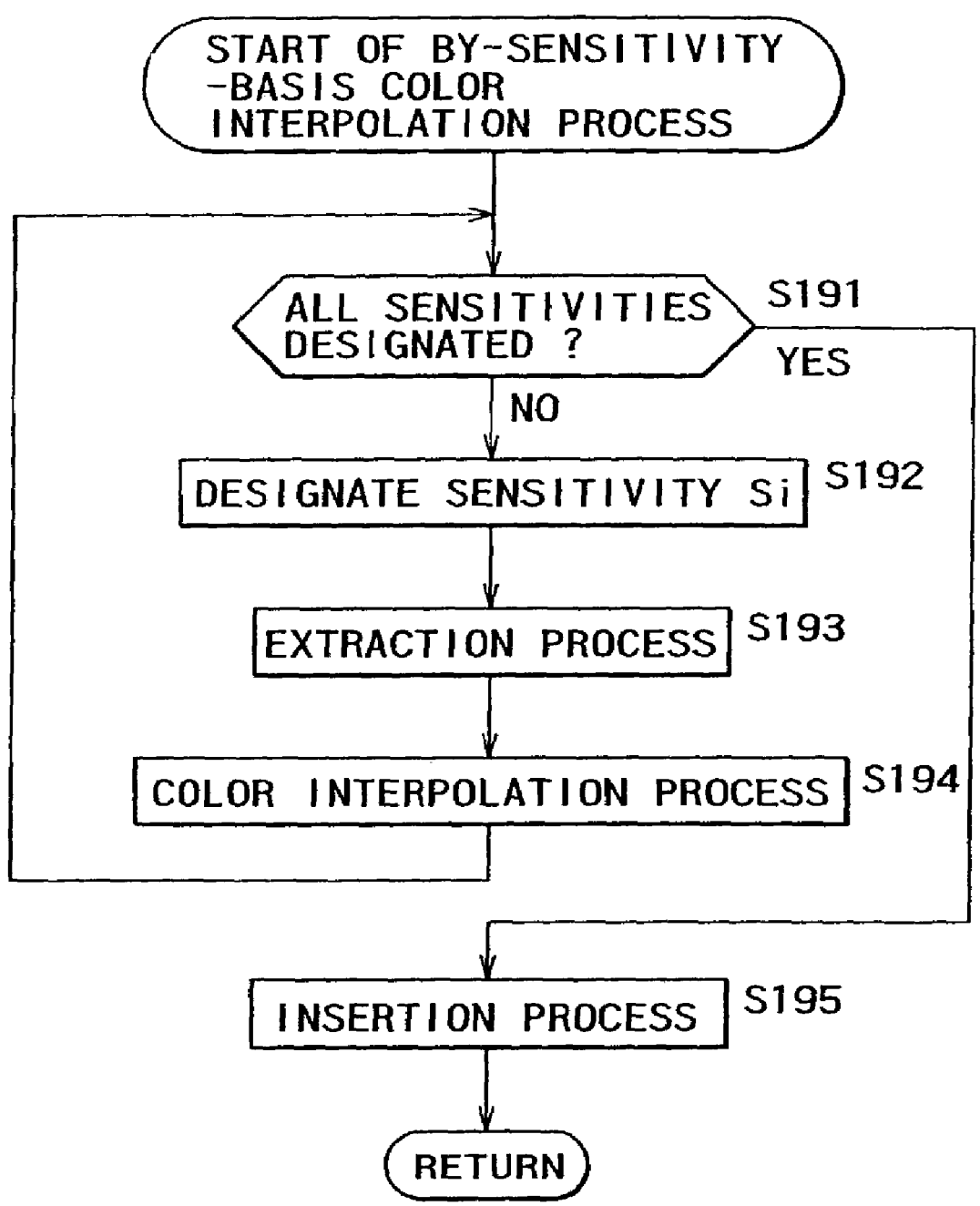
FIG. 77 is a flow chart illustrating the by-sensitivity-basis color interpolation process at step S181.

Details of the by-sensitivity-basis color interpolation process of the by-sensitivity-basis color interpolation section 151 are described with reference to a flow chart of FIG. 77. At step S191, the extraction section 161 discriminates whether or not all sensitivities (in the present case, S0 and S1) included in the sensitivity mosaic pattern information have been designated. If the extraction section 161 discriminates that all sensitivities have not been designated, then the processing advances to step S192.

At step S192, the extraction section 161 determines one of all kinds of sensitivities included in the sensitivity mosaic pattern information. The designated sensitivity is represented by Si.

At step S193, the extraction section 161 extracts only pixels of the sensitivity Si from among all pixels of the color and sensitivity mosaic image to produce a color mosaic image McSi of the sensitivity Si and supplies the color mosaic image McSi to the color interpolation section 162. Further, the extraction section 161 produces original position information of the sensitivity Si which keeps a positional relationship between the color mosaic image McSi and the original color and sensitivity mosaic image and supplies the original position information to the insertion sections 163 to 165. Further, the extraction section 161 produces color mosaic pattern information of the sensitivity Si representative of a color mosaic arrangement of the color mosaic image McSi and supplies the color mosaic pattern information to the color interpolation section 162.

Details of the process at step S193 are described with reference to FIGS. 78 and 79.

Since pixels of the sensitivity Si extracted do not have a pixel distance of the original color and sensitivity mosaic image, the color mosaic image McSi of the sensitivity Si produced is formed in a lattice wherein the pixel distance, the original and the direction are different from those of the original color and sensitivity mosaic image. Therefore, the extraction section 161 produces, simultaneously with production of the color mosaic image McSi, original position information which allows, for each pixel, information of the original position to be referred to based on a corresponding relationship between the coordinate system of the original color and sensitivity mosaic image and the coordinate system of the color mosaic image McSi.

Figure 78:
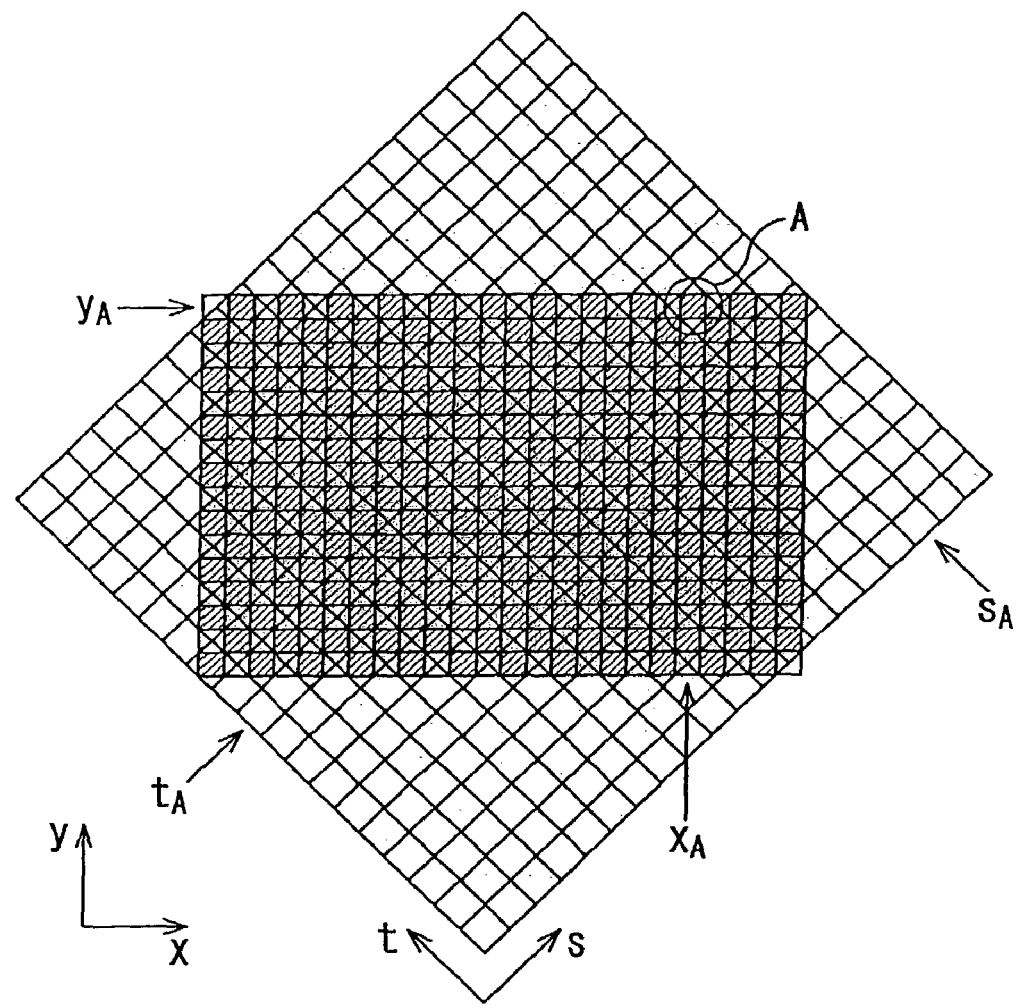
FIG. 78 is a view illustrating an extraction process at step S193.
Figure 79:
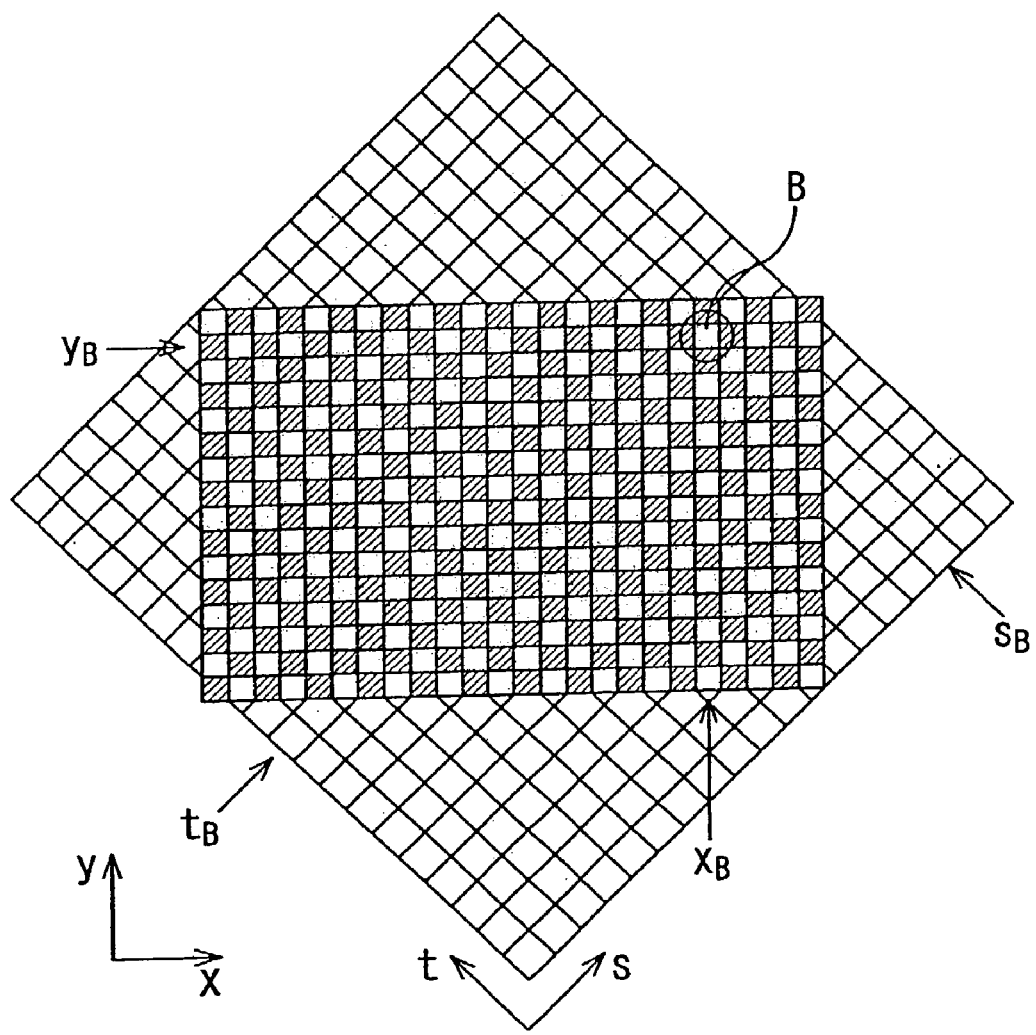
FIG. 79 is a view illustrating the extraction process at step S193.

The corresponding relationship between the coordinate systems of the original color and sensitivity mosaic image and the color mosaic image McSi to be produced is illustrated in FIG. 78 or 79. Referring to FIGS. 78 and 79, the original color and sensitivity mosaic image is indicated on the xy coordinate system while the color mosaic image McSi is indicated on the st coordinate system. Further, ■ of the color and sensitivity mosaic image represents a pixel of the sensitivity S0, and □ of the color and sensitivity mosaic image represents a pixel of the sensitivity S0. By using the st coordinate system set obliquely with respect to the xy coordinate system in this manner, pixels of the sensitivity Si disposed in a checkered manner on the original color and sensitivity mosaic image can be extracted as a pixel arrangement of an equal distance grating.

Extraction of pixels of the sensitivity S0 represented by ■ of the color and sensitivity mosaic image is described with reference to FIG. 78. For example, a pixel A in FIG. 78 is represented as $(x_A, y_A)$ on the xy coordinate system which represents the original color and sensitivity mosaic image but is represented as $(s_A, t_A)$ on the st coordinate system which represents the color mosaic image McSi to be produced. $(s_A, t_A)$ and $(x_A, y_A)$ have such relationships as represented by the following expression (22):

$$s_A = \{(x_A - 1) + y_A\}/2$$

$$t_A = \{(x_{max} - 1 - x_A) + y_A\}/2 \tag{22}$$

The extraction section 161 applies the coordinates $(x_A, y_A)$ of the pixel of the sensitivity S0 of the original color and sensitivity mosaic image to the expression (22) to calculate the coordinates $(s_A, t_A)$ on the color mosaic image McSi and uses the value of the pixel for the coordinates to produce a color mosaic image McSi. Simultaneously, the extraction section 161 places the coordinates $(x_A, y_A)$ in a corresponding relationship to the coordinates $(s_A, t_A)$ into the original position information of the sensitivity S0.

Extraction of a pixel of the sensitivity S1 represented by □ of the color and sensitivity mosaic image is described with reference to FIG. 79. For example, a pixel B in FIG. 79 is represented as $(x_B, y_B)$ on the xy coordinate system which represents the original color and sensitivity mosaic image but is represented as $(s_B, t_B)$ on the st coordinate system which represents the color mosaic image McSi to be produced. $(s_B, t_B)$ and $(x_B, y_B)$ have such a relationship as represented by the following expression (23):

$$s_B = (x_B + y_B)/2$$

$$t_B = \{(x_{max} - 1 - x_B) + y_B\}/2 \tag{23}$$

The extraction section 161 applies the coordinates $(x_B, y_B)$ of the pixel of the sensitivity S1 of the original color and sensitivity mosaic image to the expression (23) to calculate the coordinates $(s_B, t_B)$ on the color mosaic image McSi and uses the value of the pixel for the coordinates to produce a color mosaic image McSi. Simultaneously, the extraction section 161 places the coordinates $(x_B, y_B)$ in a corresponding relationship to the coordinates $(s_B, t_B)$ into the original position information of the sensitivity S1.

Referring back to FIG. 77, the color interpolation section 162 interpolates RGB components of all pixels of the color mosaic image McSi from the extraction section 161 to produce images Rsi, Gsi and Bsi and supplies the images Rsi, Gsi and Bsi to the corresponding insertion sections 163 to 165, respectively. It is to be noted that details of processing of the color interpolation section 162 are similar to those of the color interpolation process of the color interpolation section 52 described above with reference to FIG. 55, and therefore, a description is omitted.

The processing returns to step S191 so that the processing at steps S191 to S194 is repeated until it is discriminated at step S191 that all sensitivities included in the sensitivity mosaic pattern information have been designated. When it is discriminated at step S191 that all sensitivities included in the sensitivity mosaic pattern information have been designated, the processing advances to step S195.

At step S195, the insertion section 163 combines a number of images Rsi of an R component (in the present embodiment, the images Rs0 and images Rs1) equal to the number of kinds of sensitivities supplied from the color interpolation section 162 based on all of the original position information supplied from the extraction section 161 to produce a sensitivity mosaic image MsR, and supplies the sensitivity mosaic image MsR to the sensitivity uniformization section 152. Similarly, the insertion section 164 produces and supplies a sensitivity mosaic image MsG to the sensitivity uniformization section 153, and the insertion section 165 produces and supplies a sensitivity mosaic image MsB to the sensitivity uniformization section 154.

Figure 76:
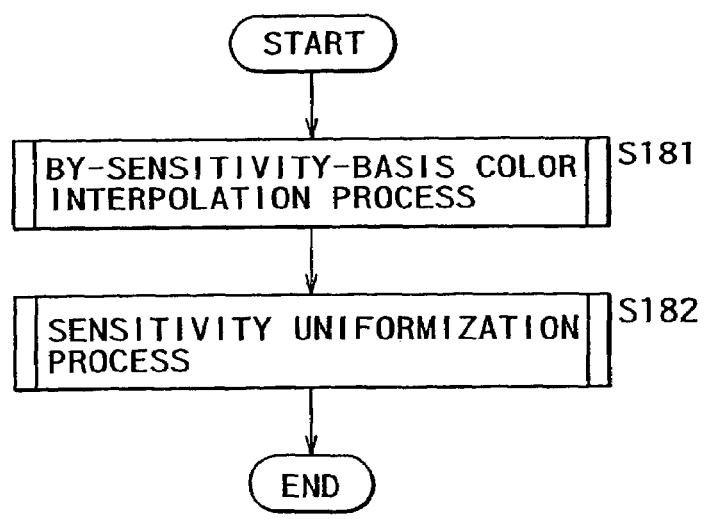
FIG. 76 is a flow chart illustrating the third demosaic process by the third embodiment of the configuration of the image processing section 7.

The processing returns to step S182 of FIG. 76. At step S182, the sensitivity uniformization section 152 performs a sensitivity uniformization process for the R component sensitivity mosaic image MsR to produce an output image R. The sensitivity uniformization section 153 performs a sensitivity uniformization process for the G component sensitivity mosaic image MsG to produce an output image G. The sensitivity uniformization section 154 performs a sensitivity uniformization for the B component sensitivity mosaic image MsB to produce an output image B.

The sensitivity uniformization process of the sensitivity uniformization section 152 is described with reference to a flow chart of FIG. 80. At step S201, the local sum calculation section 171 discriminates whether or not all pixels of the R component sensitivity mosaic image MsR have been used as a noticed pixel. If the local sum calculation section 171 discriminates that all pixels have not been used as a noticed pixel, then the processing advances to step S202. At step S202, the local sum calculation section 171 determines one by one a pixel as a noticed pixel beginning with the left lowermost pixel and ending with the right uppermost pixel of the sensitivity mosaic image MsR.

At step S203, the local sum calculation section 171 calculates a local sum corresponding to the noticed pixel and supplies it to the synthetic sensitivity compensation section 172. More particularly, the pixel values of 5×5 pixels (hereinafter referred to as reference pixels) centered at the noticed pixel are extracted, and the pixel values are multiplied by such filter coefficients set in advance and corresponding to relative positions of the reference pixels to the noticed pixel as seen in FIG. 81, whereafter the sum total of the products is arithmetically operated. Further, the sum total of the products is divided by the sum total of the 25 filter coefficients, and the quotient is determined as a local sum corresponding to the noticed pixel.

At step S204, the synthetic sensitivity compensation section 172 collates the local sum with the synthetic sensitivity compensation LUT 173 to acquire a corresponding compensation value and determines the compensation value as a pixel value of the output image R corresponding to the noticed pixels.

The processing then returns to step S201 so that the processing at steps S201 to S204 is repeated until it is discriminated at step S201 that all pixels have been used as a noticed pixel. When it is discriminated at step S201 that all pixels have been used as a noticed pixel, the sensitivity uniformization process is ended, and the processing returns to FIG. 76.

It is to be noted that since the sensitivity uniformization sections 153 and 154 execute a similar sensitivity uniformization process in parallel to the sensitivity uniformization process of the sensitivity uniformization section 152, a detailed description is therefore omitted.

An outline of a fourth demosaic process of the image processing system including the image processing section 7 as a principal component is described below.

The fourth demosaic process includes a luminance image production process for producing a luminance image from a color and sensitivity mosaic image obtained by processing of the image pickup system, and a monochromatic image process for producing output images R, G and B using the color and sensitivity mosaic image and the luminance image.

Figure 82:
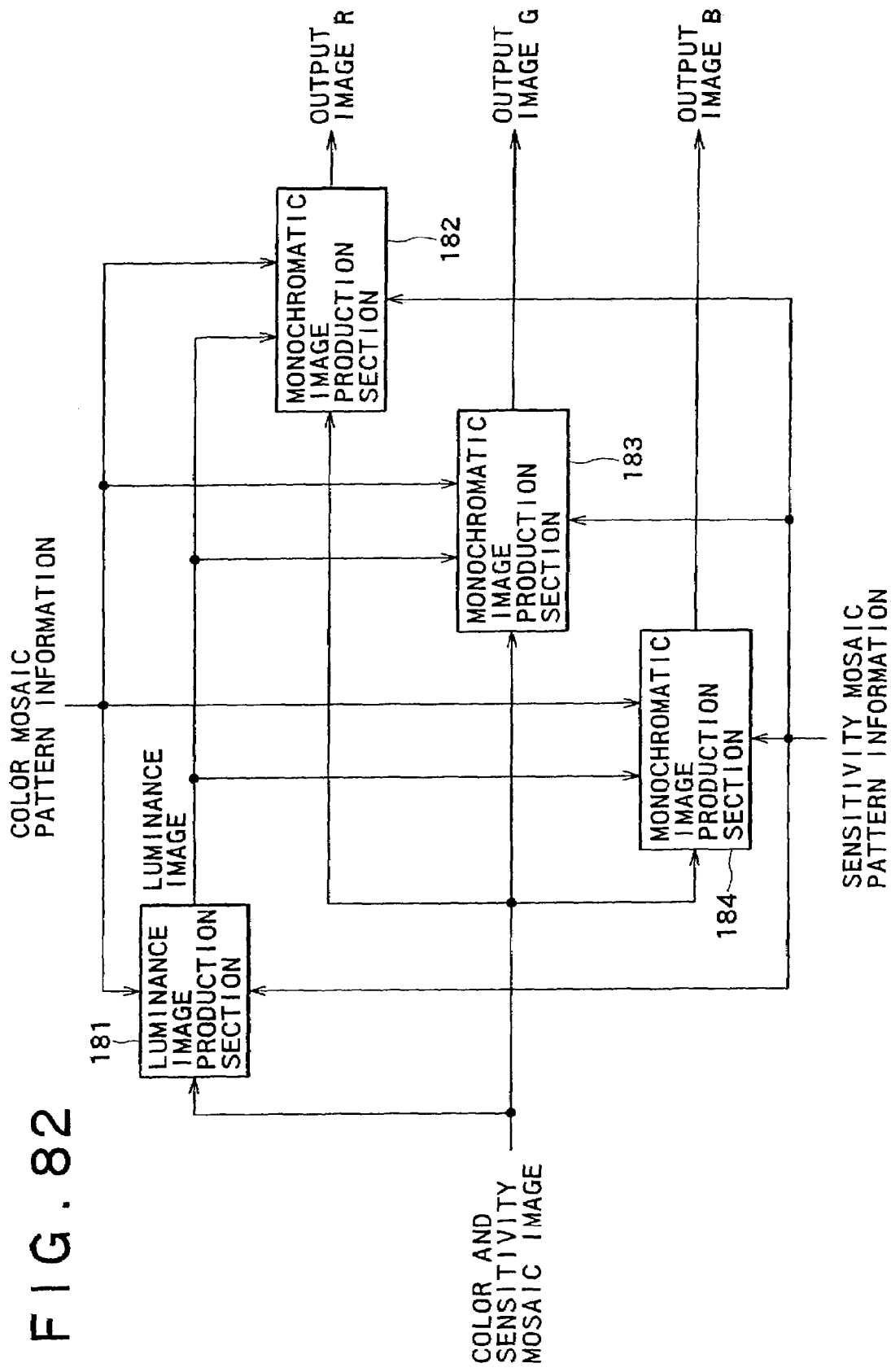
FIG. 82 is a block diagram showing a fourth embodiment of a configuration of the image processing section 7.

FIG. 82 shows a fourth example of a configuration of the image processing section 7 which principally executes the fourth demosaic process.

In the fourth example of the configuration of the image processing section 7, a color and sensitivity mosaic image from the image pickup system, color mosaic pattern information which indicates a color mosaic arrangement of the color and sensitivity mosaic image and sensitivity mosaic pattern information which indicates a sensitivity mosaic arrangement of the color and sensitivity mosaic image are supplied to a luminance image production section 181 and monochromatic image production sections 182 to 184.

It is to be noted that, in the following description, unless otherwise specified, the color and sensitivity mosaic image has the color and sensitivity mosaic pattern P2 of FIG. 6. In particular, in this embodiment each pixel has a color which is one of the three primary colors of R, G and B and has a sensitivity of one of S0 and S1, and further, where attention is paid only to the color irrespective of the sensitivity, the pixels of the color are arranged in a Bayer arrangement.

However, in alternative embodiments, the configuration and the operation described below can be applied to another color and sensitivity mosaic image which includes three colors other than R, G and B or a further color and sensitivity mosaic image which includes four colors.

The luminance image production section 181 performs a luminance image production process for the color and sensitivity mosaic image supplied thereto and supplies a resulting luminance image to the monochromatic image production sections 182 to 184.

The monochromatic image production section 182 produces an output image R using the color and sensitivity mosaic image and the luminance image supplied thereto. The monochromatic image production section 183 produces an output image G using the color and sensitivity mosaic image and the luminance image supplied thereto. The monochromatic image production section 184 produces an output image B using the color and sensitivity mosaic image and luminance image supplied thereto.

Figure 83:
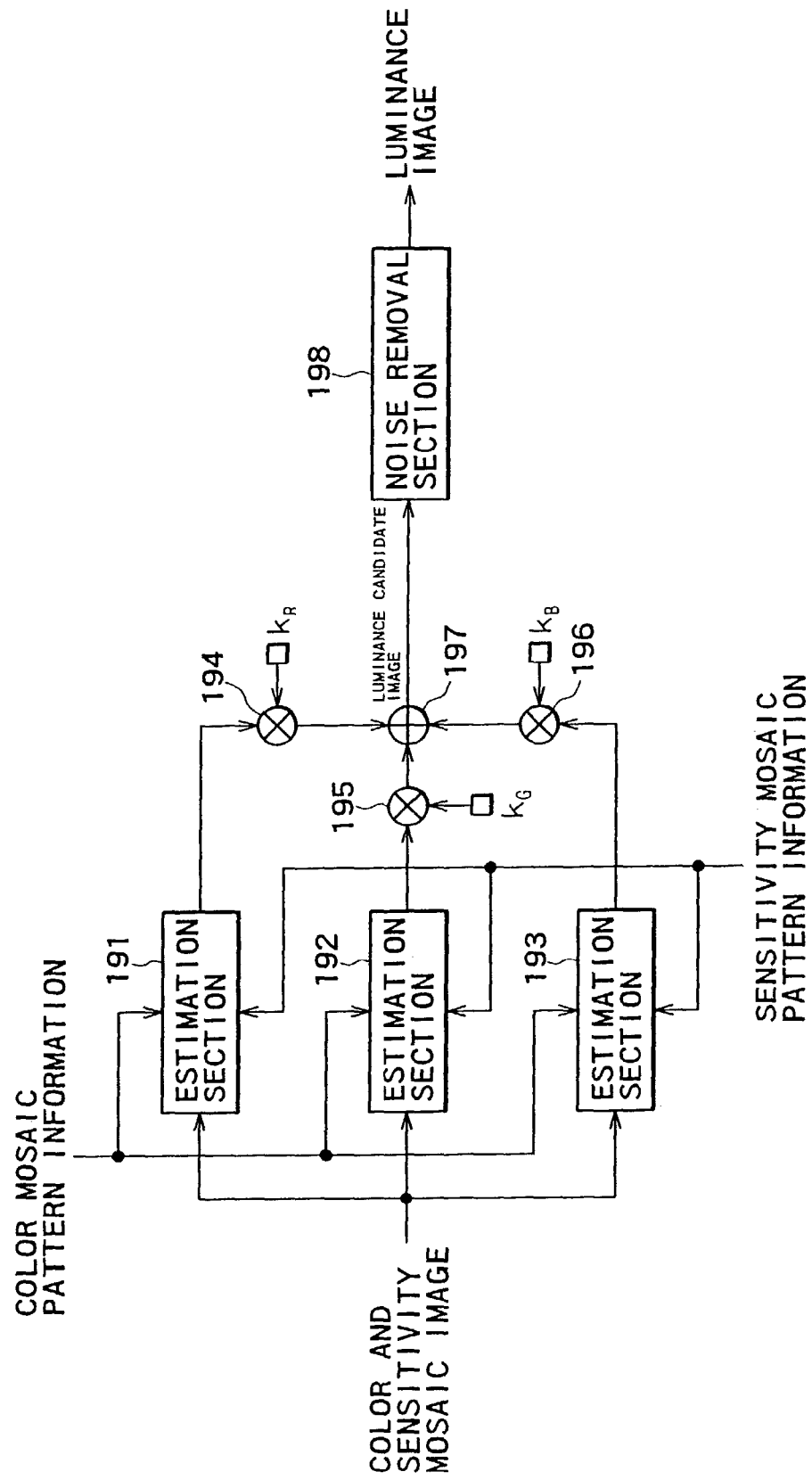
FIG. 83 is a block diagram showing a first embodiment of a configuration of a luminance image production section 181.

FIG. 83 shows a first example of a configuration of the luminance image production section 181. In the first example of the configuration of the luminance image production section 181, a color and sensitivity mosaic image, color mosaic pattern information and sensitivity mosaic pattern information are supplied to estimation sections 191 to 193.

The estimation section 191 performs an R component estimation process for the color and sensitivity mosaic image and supplies an estimation value R' of an R component for each pixel obtained by the process to a multiplier 194. The estimation section 192 performs a G component estimation process for the color and sensitivity mosaic image and supplies an estimation value G' of a G component for each pixel obtained by the process to another multiplier 195. The estimation section 193 performs a B component estimation process for the color and sensitivity mosaic image and supplies an estimation value B' of a B component for each pixel obtained by the process to a further multiplier 196.

The multiplier 194 multiplies the estimation value R' supplied from the estimation section 191 by a color balance coefficient $K_R$ and outputs the product to an adder 197. The multiplier 195 multiplies the estimation value G' supplied from the estimation section 192 by a color balance coefficient $K_G$ and outputs the product to the adder 197. The multiplier 196 multiplies the estimation value B' supplied from the estimation section 193 by a color balance coefficient $K_B$ and outputs the product to the adder 197.

The adder 197 adds the product $R' \cdot k_R$ inputted from the multiplier 194, the product $G' \cdot k_G$ inputted from the multiplier 195 and the product $B' \cdot k_B$ inputted from the multiplier 196, and produces a luminance candidate image wherein the resulting sum is used as a pixel value and supplies the luminance candidate image to a noise removal section 198.

Here, the color balance coefficients $k_R$, $k_G$ and $k_B$ are values set in advance and, for example, $k_R=0.3$, $k_G=0.6$ and $k_B=0.1$. It is to be noted that, basically, the color balance coefficients $k_R$, $k_G$ and $k_B$ may have any suitable values that can be used to calculate, as a luminance candidate value, a value having a correlation to a luminance variation. Accordingly, for example, the color balance coefficients may be $k_R=k_G=k_B$.

The noise removal section 198 performs a noise removal process for the luminance candidate image supplied from the adder 197 and supplies the resulting luminance image to monochromatic image production sections 182 to 184.

Figure 84:
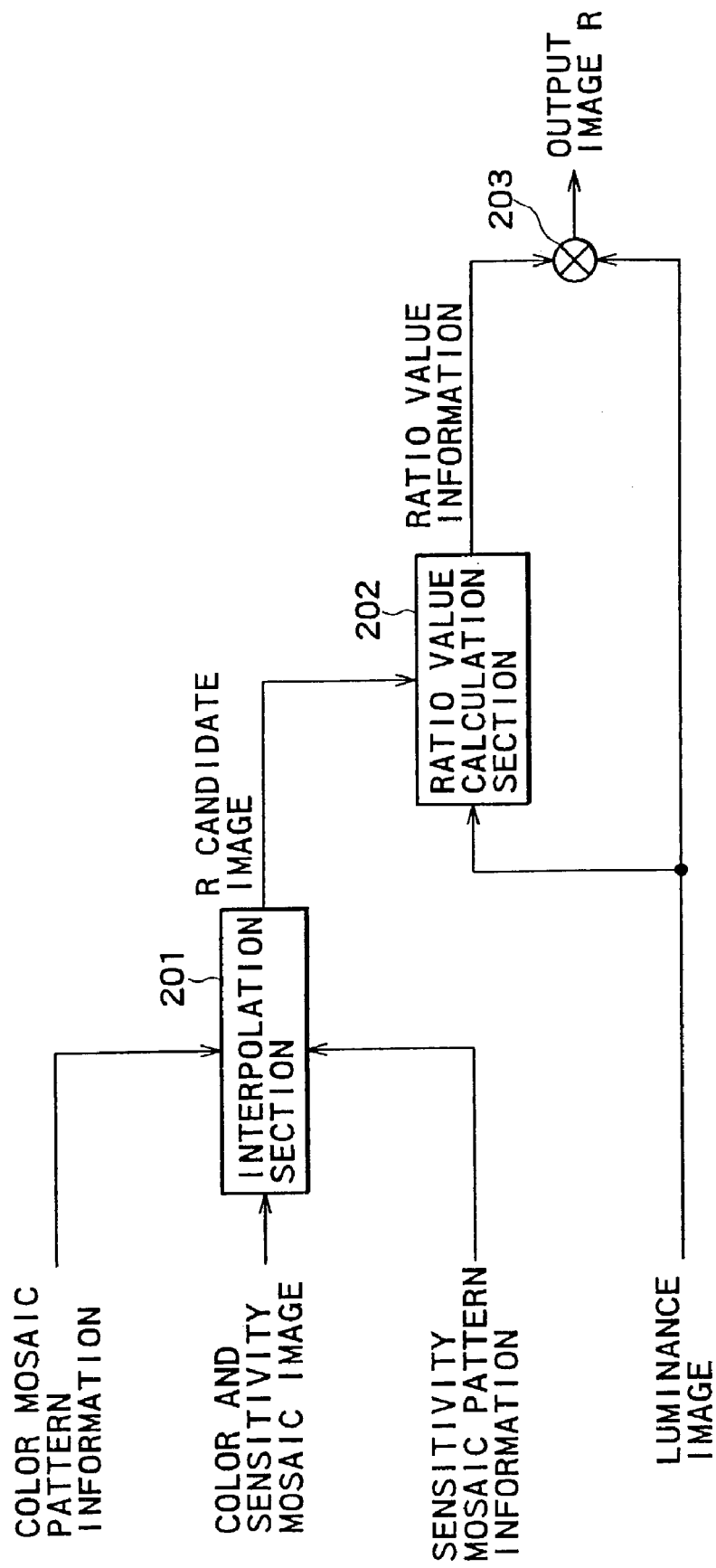
FIG. 84 is a block diagram showing an embodiment of a configuration of a monochromatic image production section 182.

FIG. 84 shows an example of a configuration of the monochromatic image production section 182. In the monochromatic image production section 182, the color and sensitivity mosaic image, the color mosaic pattern information and the sensitivity mosaic pattern information are supplied to an interpolation section 201. The luminance image is supplied to a ratio value calculation section 202 and a multiplier 203.

The interpolation section 201 performs an interpolation process for the color and sensitivity mosaic image and outputs an R candidate image wherein all resulting pixels have pixel values of an R component to the ratio value calculation section 202. The ratio value calculation section 202 calculates a low-frequency component of an intensity ratio (the low-frequency component is hereinafter referred to merely as an intensity ratio) between corresponding pixels of the R candidate image and the luminance image and produces ratio value information which represents an intensity ratio corresponding to each pixel, and supplies the ratio value information to the multiplier 203.

The multiplier 203 multiplies the pixel value of each pixel of the luminance image by the corresponding intensity ratio and produces an output image R having the product as a pixel value.

It is to be noted that, since examples of a configuration of the monochromatic image production sections 183 and 184 are similar to the example of the configuration of the monochromatic image production section 182, a description is therefore omitted.

Figure 85:
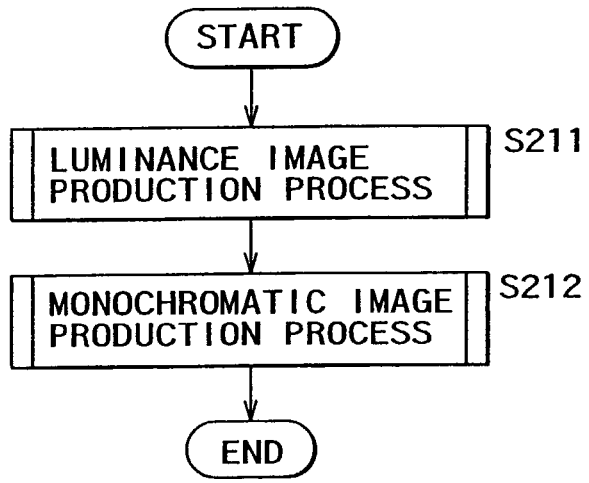
FIG. 85 is a flow chart illustrating a fourth demosaic process by the fourth embodiment of the configuration of the image processing section 7.

Now, the fourth demosaic process by the fourth example of the configuration of the image processing section 7 is described below with reference to a flow chart of FIG. 85.

At step S211, the luminance image production section 181 performs a luminance image production process for the color and sensitivity mosaic image to produce a luminance image and supplies the luminance image to the monochromatic image production sections 182 to 184.

Figure 86:
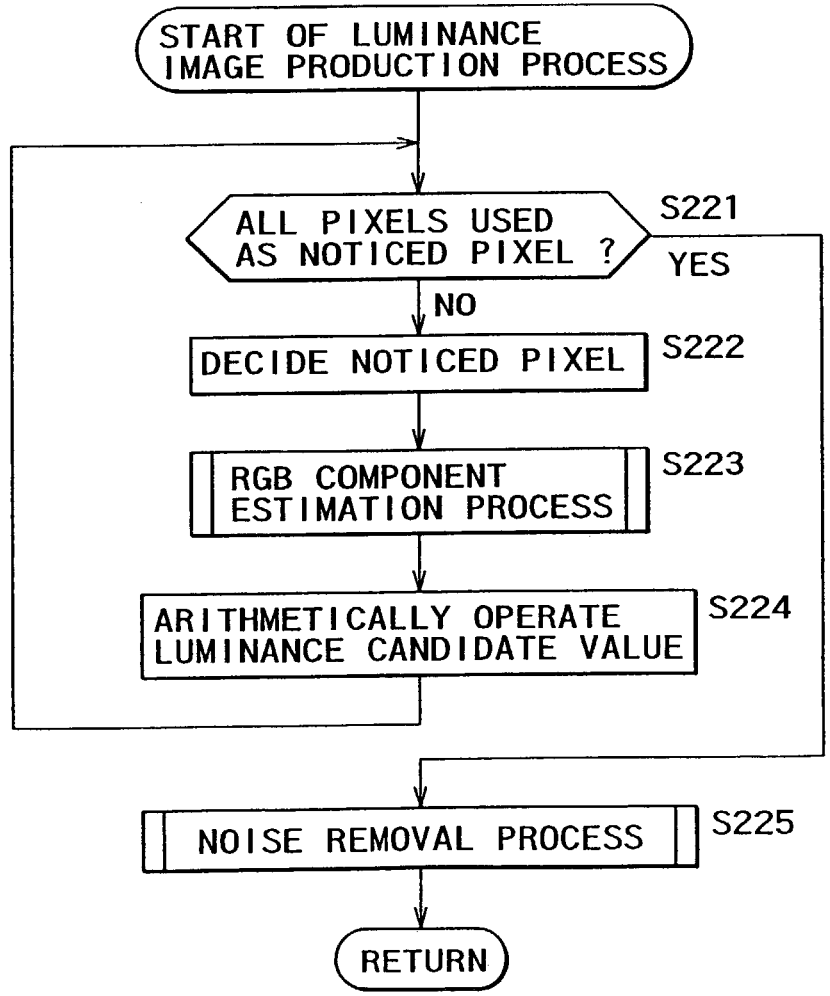
FIG. 86 is a flow chart illustrating a luminance image production process by the luminance image production section 181.

The luminance image production process of the luminance image production section 181 is described with reference to a flow chart of FIG. 86.

At step S221, the estimation sections 191 to 193 discriminate whether or not all pixels of the color and sensitivity mosaic image have been used as a noticed pixel. If the estimation sections 191 to 193 discriminate that all pixels have not been used as a noticed pixel, then the processing advances to step S222. At step S222, the estimation sections 191 to 193 determine one by one a pixel as a noticed pixel beginning with the left lowermost pixel and ending with the right uppermost pixel of the color and sensitivity mosaic image.

At step S223, the estimation section 191 performs an R component estimation process for the color and sensitivity mosaic image to estimate an estimation value R' corresponding to the noticed pixel and supplies the estimation value R' to the multiplier 194. The estimation section 192 performs a G component estimation process for the color and sensitivity mosaic image to estimate an estimation value G' corresponding to the noticed pixel and supplies the estimation value G' to the multiplier 194. The estimation section 193 performs a B component estimation process for the color and sensitivity mosaic image to estimate an estimation value B' corresponding to the noticed pixel and supplies the estimation value B' to the multiplier 194.

Figure 87:
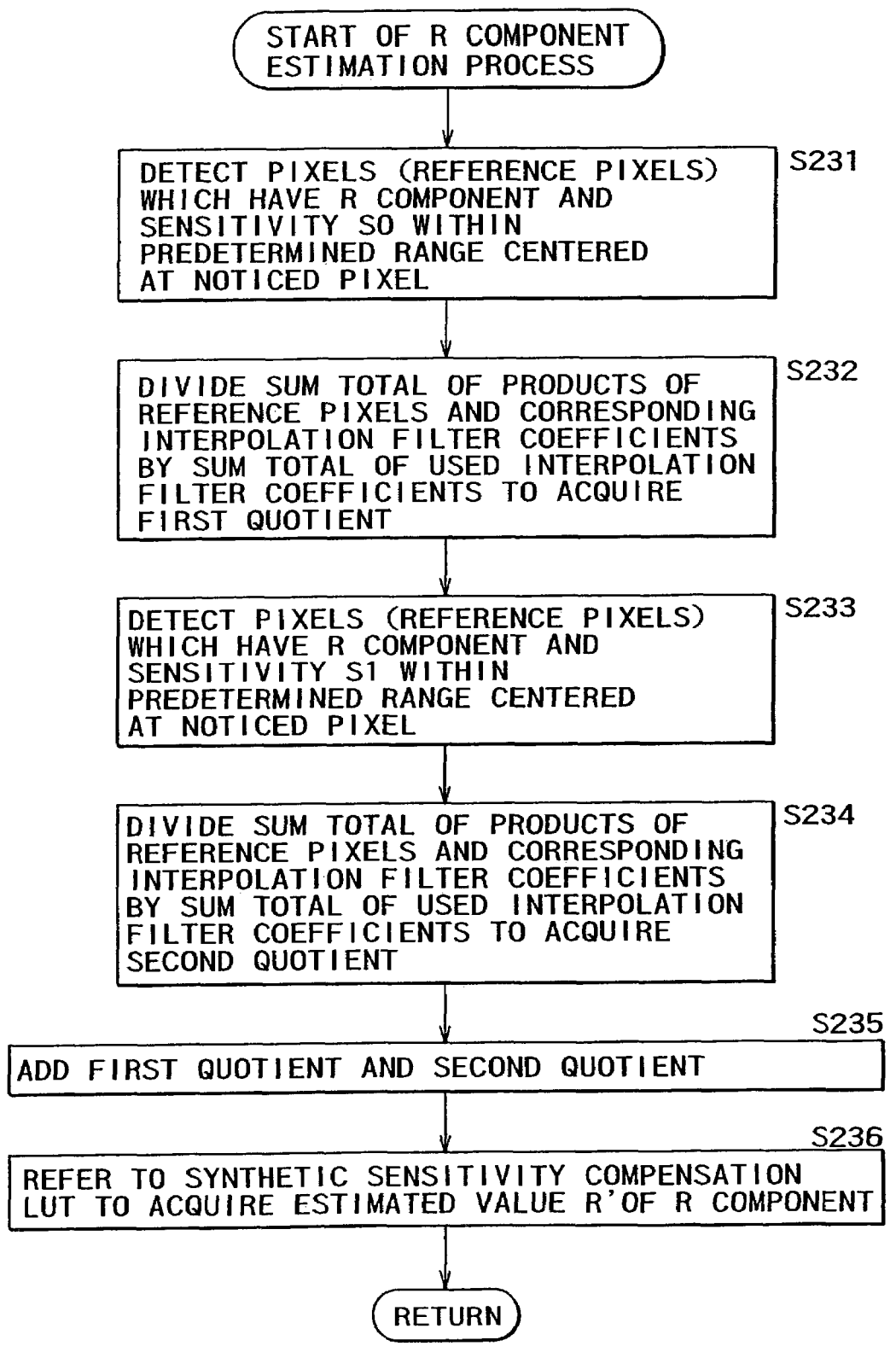
FIG. 87 is a flow chart illustrating an R component estimation process by an estimation section 191.

The R component estimation process of the estimation section 191 is described with reference to a flow chart of FIG. 87. At step S231, the estimation section 191 refers to the color mosaic pattern information and the sensitivity mosaic pattern information to detect those pixels neighboring the noticed pixel (for example, 15×15 pixels centered at the noticed pixel) which have an R component and have the sensitivity S0, and extracts the pixel values of the detected pixels (hereinafter referred to as reference pixels).

At step S232, the estimation section 191 acquires a number of such R component interpolation filter coefficients set in advance and corresponding to relative positions of the reference pixels to the noticed pixel as shown in FIG. 88, the number being equal to the number of the reference pixels. Further, the estimation section 191 multiplies the pixel values of the reference pixels and the corresponding filter coefficients and arithmetically operates the sum total of the products. Furthermore, the estimation section 191 divides the sum total of the products by the sum total of the used R component interpolation filter coefficients to acquire a first quotient.

At step S233, the estimation section 191 refers to the color mosaic pattern information and the sensitivity mosaic pattern information to detect those pixels neighboring the noticed pixel (for example, 15×15 pixels centered at the noticed pixel) which have an R component and have the sensitivity S1, and extracts the pixel values of the detected pixels (hereinafter referred to as reference pixels).

At step S234, the estimation section 191 acquires a number of R component interpolation filter coefficients corresponding to relative positions of the reference pixels to the noticed pixel, the number being equal to the number of the reference pixels. Further, the estimation section 191 multiplies the pixel values of the reference pixels and the corresponding filter coefficients and arithmetically operates the sum total of the products. Furthermore, the estimation section 191 divides the sum total of the products by the sum total of the used interpolation filter coefficients to acquire a second quotient.

At step S235, the estimation section 191 adds the first quotient acquired at step S232 and the second quotient acquired at step S234. At step S235, the estimation section 191 collates the sum of the first quotient and the second quotient arithmetically operated at step S235 with a synthetic sensitivity compensation LUT (hereinafter described) built therein to acquire a compensation value of a compensated sensitivity characteristic. The acquired compensation value is determined as an estimation value R' corresponding to the noticed pixel. The processing then returns to step S224 of FIG. 86.

It is to be noted that, since the G component interpolation processes of the estimation section 192 and the B component interpolation processes of the estimation section 193 are similar to the R component interpolation process of the estimation section 191, a description of these processes is therefore omitted. It is to be noted, however, in the G component estimation process of the estimation section 192, reference pixels are detected from among 7×7 pixels centered at the noticed pixel, and further, the G component interpolation filter coefficients illustrated in FIG. 89 are used in the process.

Figure 90:
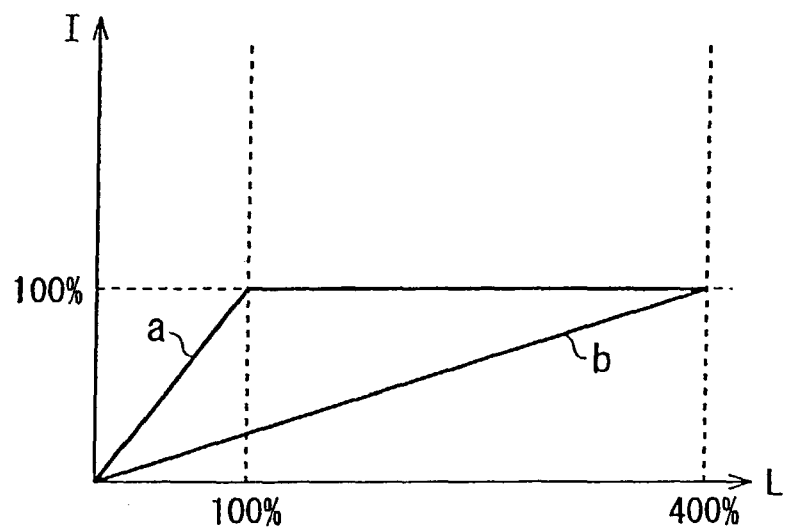
FIG. 90 is a view illustrating a synthetic sensitivity compensation LUT.
Figure 91:
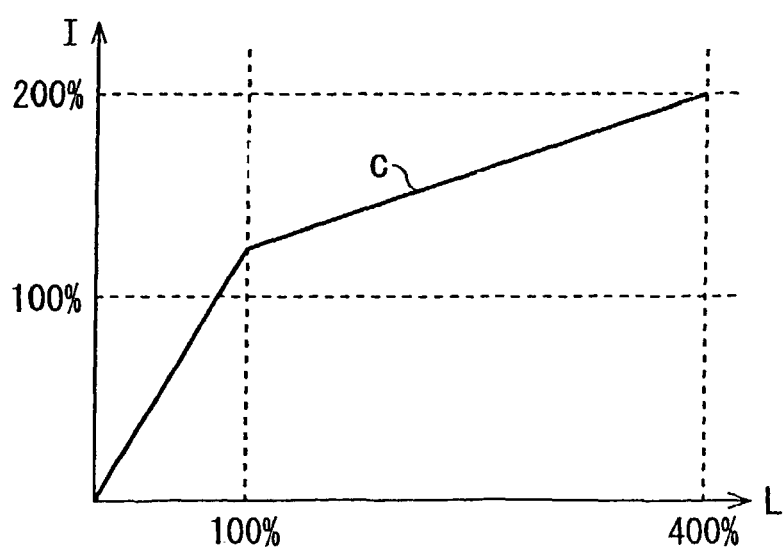
FIG. 91 is a view illustrating another synthetic sensitivity compensation LUT.

Here, the synthetic sensitivity compensation LUT used by the estimation section 191 is described with reference to FIGS. 90 to 92. FIG. 90 shows a characteristic curve b of pixels of the sensitivity S0 and another characteristic curve a of pixels of the sensitivity S1, and the axis of abscissa indicates the intensity of incoming light and the axis of ordinate indicates the pixel value. In FIG. 90, the sensitivity S1 of the high sensitivity has a sensitivity as high as four times that of the sensitivity S0 of the low sensitivity.

In the estimation process, a first quotient calculated from a pixel of the sensitivity S0 measured with such a characteristic as indicated by the characteristic curve b of FIG. 90 and a second quotient calculated using a pixel of the sensitivity S1 measured with such a characteristic as indicated by the characteristic curve a of FIG. 90 are added. Accordingly, the sum of the first quotient and the second quotient has such a characteristic synthesized from the characteristics of the sensitivity S0 and the sensitivity S1 as indicated by a characteristic curve c of FIG. 91.

While the synthesized characteristic curve c exhibits a characteristic of a wide dynamic range from a low luminance to a high luminance, since it has a shape of a polygonal line, an original linear characteristic is restored using a characteristic curve reverse to the sensitivity characteristic curve c. More particularly, the sum of the first product and the second product is applied to a reverse characteristic curve d to the sensitivity characteristic curve c of FIG. 91 as shown in FIG. 92 to compensate for the non-linearity.

Figure 92:
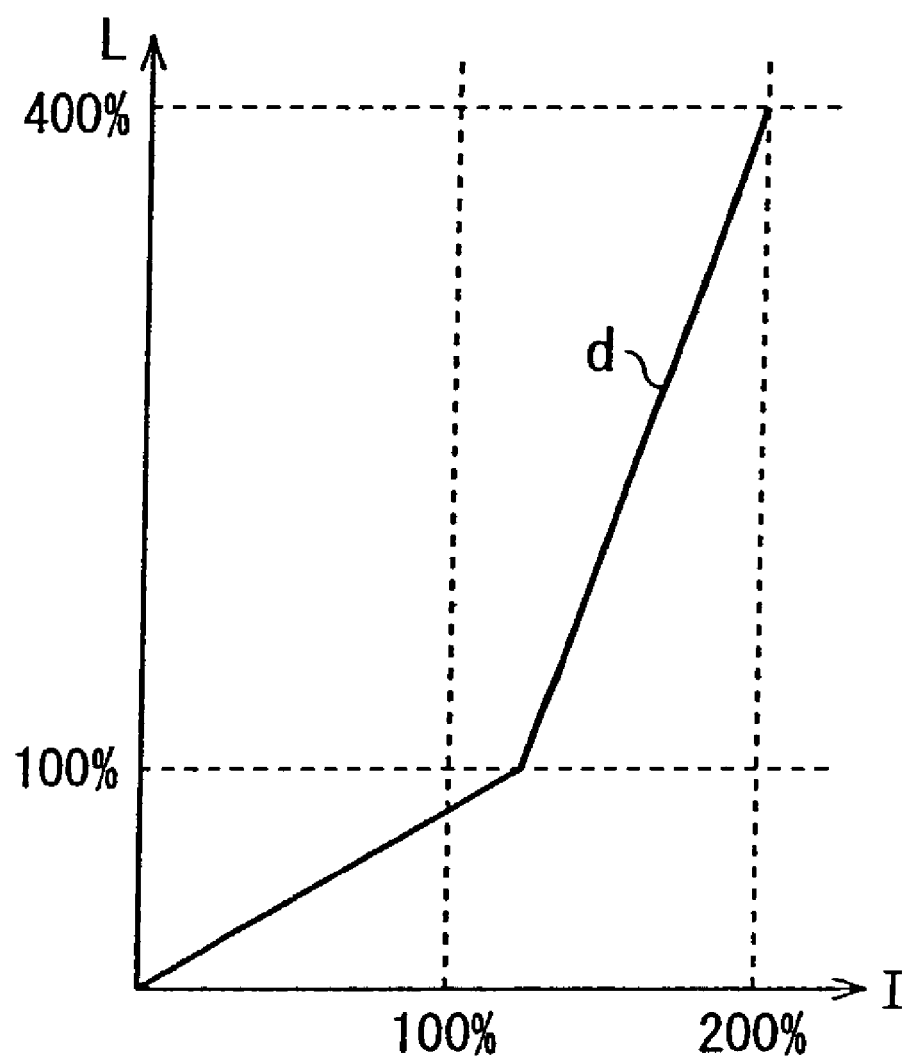
FIG. 92 is a view illustrating a further synthetic sensitivity compensation LUT.

In particular, the synthetic sensitivity compensation LUT is obtained by converting the reverse characteristic curve d of FIG. 92 into a lookup table.

Description is given with reference back to FIG. 86. At step S224, the multiplier 194 multiplies the estimation value R' supplied from the estimation section 191 by a color balance coefficient $k_R$ and outputs the product to the adder 197. The multiplier 195 multiplies the estimation value G' supplied from the estimation section 192 by a color balance coefficient $k_G$ and outputs the product to the adder 197. The multiplier 196 multiplies the estimation value B' supplied from the estimation section 193 by a color balance coefficient $k_B$ and outputs the product to the adder 197. The adder 197 adds the product R'·$k_R$ inputted from the multiplier 194, the product G'·$k_G$ inputted from the multiplier 195 and the product B'·$k_B$ inputted from the multiplier 196, and determines the sum as a pixel value (luminance candidate value) of a luminance candidate image corresponding to the noticed pixel.

The processing then returns to step S221 so that the processing at steps S221 to S224 is repeated until it is discriminated at step S221 that all pixels have been used as a noticed pixel. When it is discriminated at step S221 that all pixels have been used as a noticed pixel, the processing advances to step S225. It is to be noted that the luminance candidate image produced by the processes at steps S221 to 224 is supplied to the noise removal section 198.

At step S225, the noise removal section 198 performs a noise removal process for the luminance candidate image supplied thereto from the adder 197 to produce a luminance image and supplies the luminance image to the monochromatic image production sections 182 to 184.

The noise removal process of the noise removal section 198 is described with reference to a flow chart of FIG. 93. At step S241, the noise removal section 198 discriminates whether or not all pixels of the luminance candidate image have been used as a noticed pixel. If the noise removal section 198 discriminates that all pixels have not been used as a noticed pixel, then the processing advances to step S242. At step S242, the noise removal section 198 determines one by one a pixel as a noticed pixel beginning with the left lowermost pixel and ending with the right uppermost pixel of the luminance candidate image.

At step S243, the noise removal section 198 acquires the pixel values (luminance candidate values) of the pixels positioned upwardly, downwardly, leftwardly and rightwardly of the noticed pixel and substitutes the acquired luminance candidate values of the pixels positioned upwardly, downwardly, leftwardly and rightwardly of the noticed pixel into variables a3, a0, a1 and a2, respectively.

At step S244, the noise removal section 198 executes a direction selective smoothing process to acquire a smoothed value corresponding to the noticed pixel.

Figure 94:
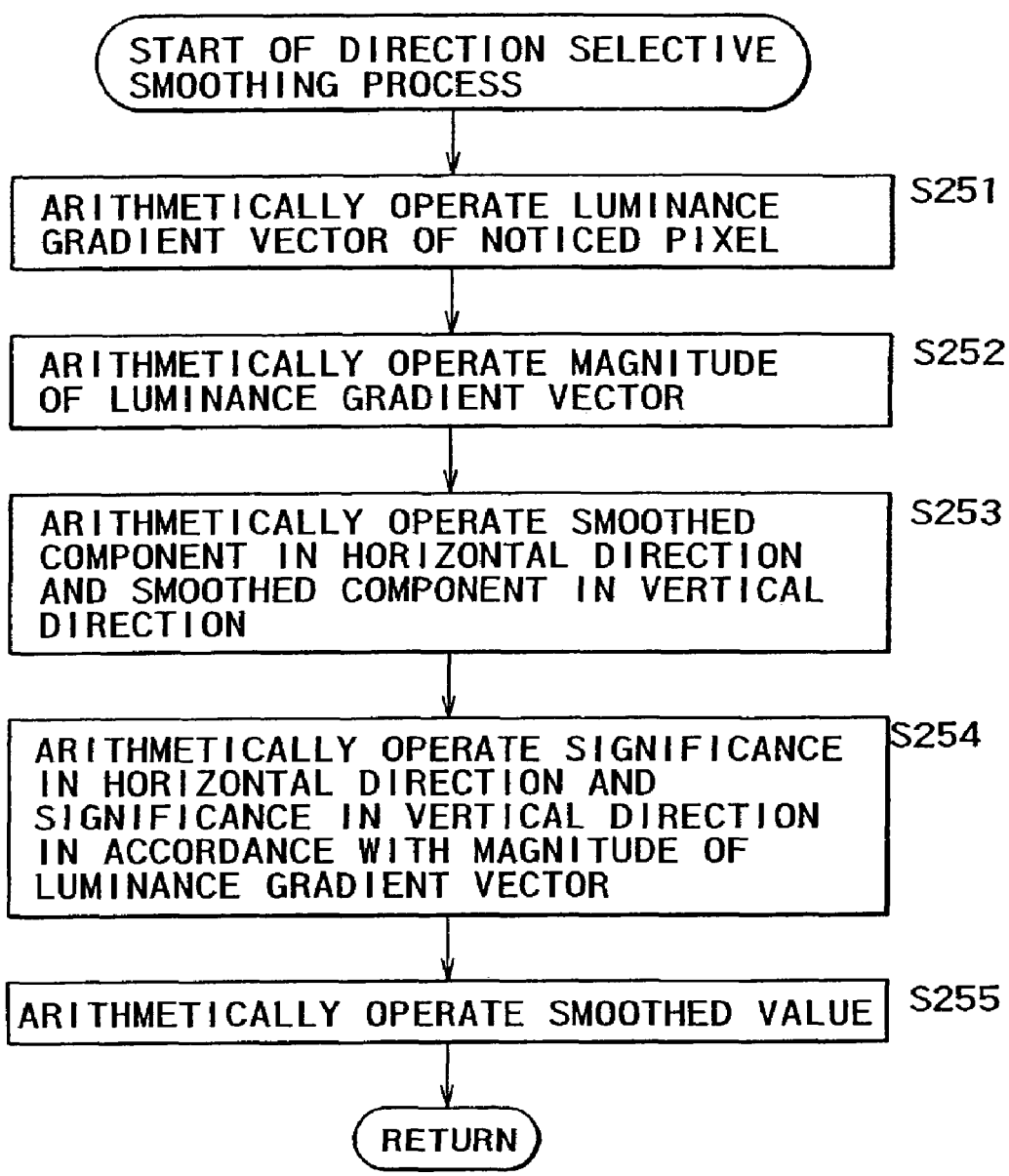
FIG. 94 is a flow chart illustrating a direction selective smoothing process by the noise removal section 198.

The direction selective smoothing process of the noise removal section 198 is described with reference to a flow chart of FIG. 94. At step S251, the noise removal section 198 applies the variables a3, a0, a1, a2 to the following expression (24) to calculate a luminance gradient vector g corresponding to the noticed pixel:

$$\text{luminance gradient vector } g = (a2 - a1, a3 - a0) \qquad (24)$$

At step S252, the noise removal section 198 arithmetically operates the magnitude (absolute value) $\|\nabla\|$ of the luminance gradient vector g.

At step S253, the noise removal section 198 applies the variables a0 to a3 to the following expressions (25) and (26) to calculate a smoothed component Hh in the horizontal direction and a smoothed component Hv in the vertical direction corresponding to the noticed pixel:

$$Hh=(a1+a2)/2 \qquad (25)$$

$$Hv=(a3+a0)/2 \qquad (26)$$

At step S254, the noise removal section 198 arithmetically operates a significance wh in the horizontal direction and a significance wv in the vertical direction corresponding to the absolute value $\|g\|$ of the luminance gradient vector g.

More particularly, where the absolute value $\|g\|$ of the luminance gradient vector g is higher than 0, the absolute value of the inner product of the normalized luminance gradient vector g/$\|g\|$ and the vector (1,0) is subtracted from 1 to obtain the significance wh in the horizontal direction as given by the following expression (27). Further, the absolute value of the inner product of the normalized luminance gradient vector g/$\|g\|$ and the vector (0, 1) is subtracted from 1 to obtain the significance wv in the vertical direction as given by the following expression (28).

$$wh=1-|(g/\|g\|,(1,0))| \qquad (27)$$

$$wv=1-|(g/\|g\|,(0,1))| \qquad (28)$$

Where the absolute value $\|g\|$ of the luminance gradient vector g is 0, the significance wh in the horizontal direction and the significance wv in the vertical direction are both set to 0.5.

At step S255, the noise removal section 198 arithmetically operates a smoothed value α corresponding to the noticed pixel using the following expression (29):

$$\alpha=(wh\cdot Hh+wv\cdot Hv)/(wh+wv) \qquad (29)$$

Figure 93:
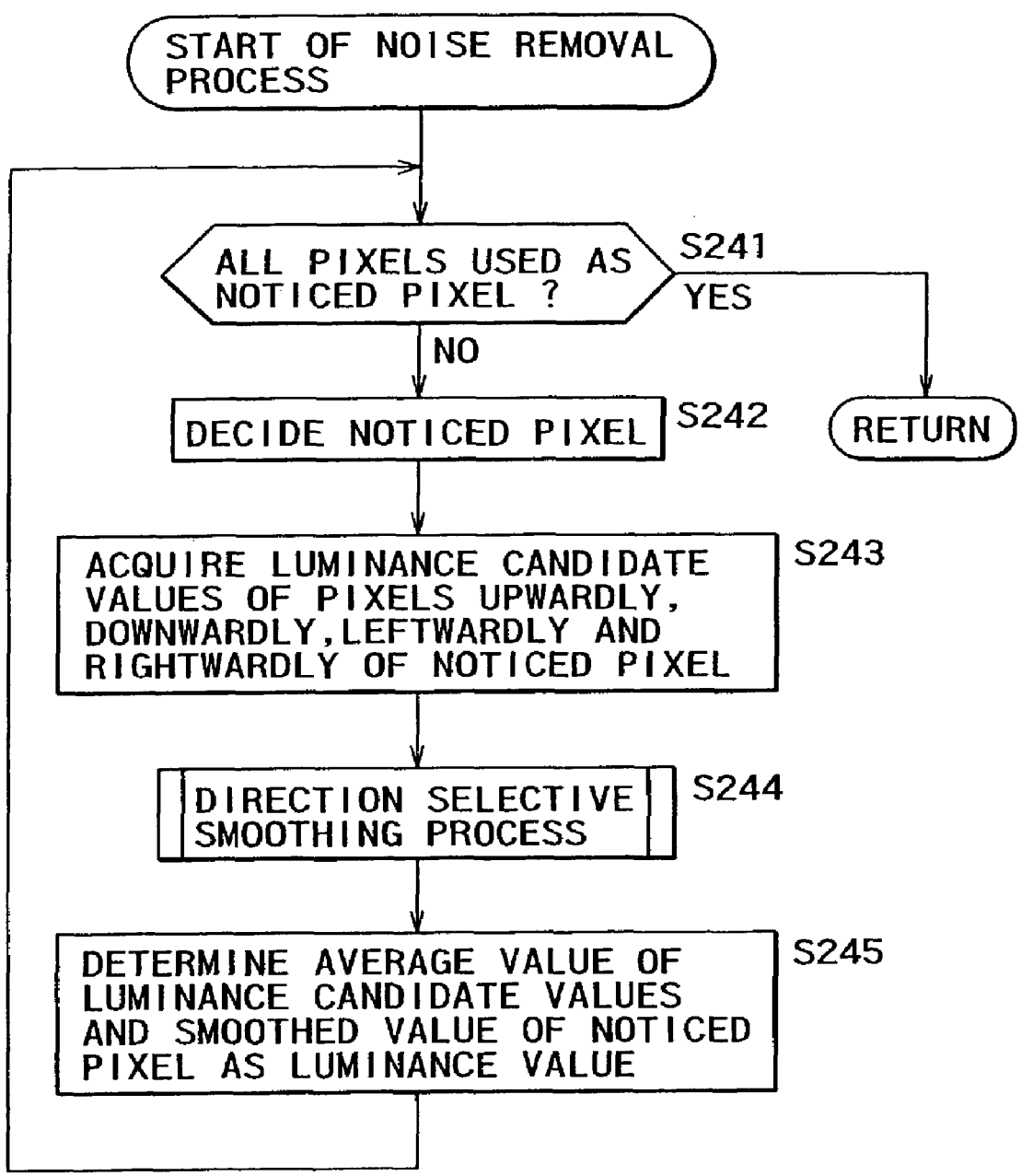
FIG. 93 is a flow chart illustrating a noise removal process by a noise removal section 198.

The processing then returns to step S245 of FIG. 93. At step S245, the noise removal section 198 arithmetically operates an average value between the pixel value (luminance candidate value) of the noticed pixel and the smoothed value α corresponding to the noticed pixel calculated at step S244 and determines the average value as a pixel value (luminance value) of the luminance image corresponding to the noticed pixel.

The processing then returns to step S241 so that the processing at steps S241 to S245 is repeated until it is discriminated at step S241 that all pixels have been used as a noticed pixel. When it is discriminated at step S241 that all pixels have been used as a noticed pixel, the noise removal process is ended and also the luminance image production process is ended, and the processing returns to step S212 of FIG. 85.

At step S212, the monochromatic image production sections 182 to 184 produce the output images R, G, and B, respectively by using the supplied color and sensitivity mosaic image and the luminance image.

Figure 95:
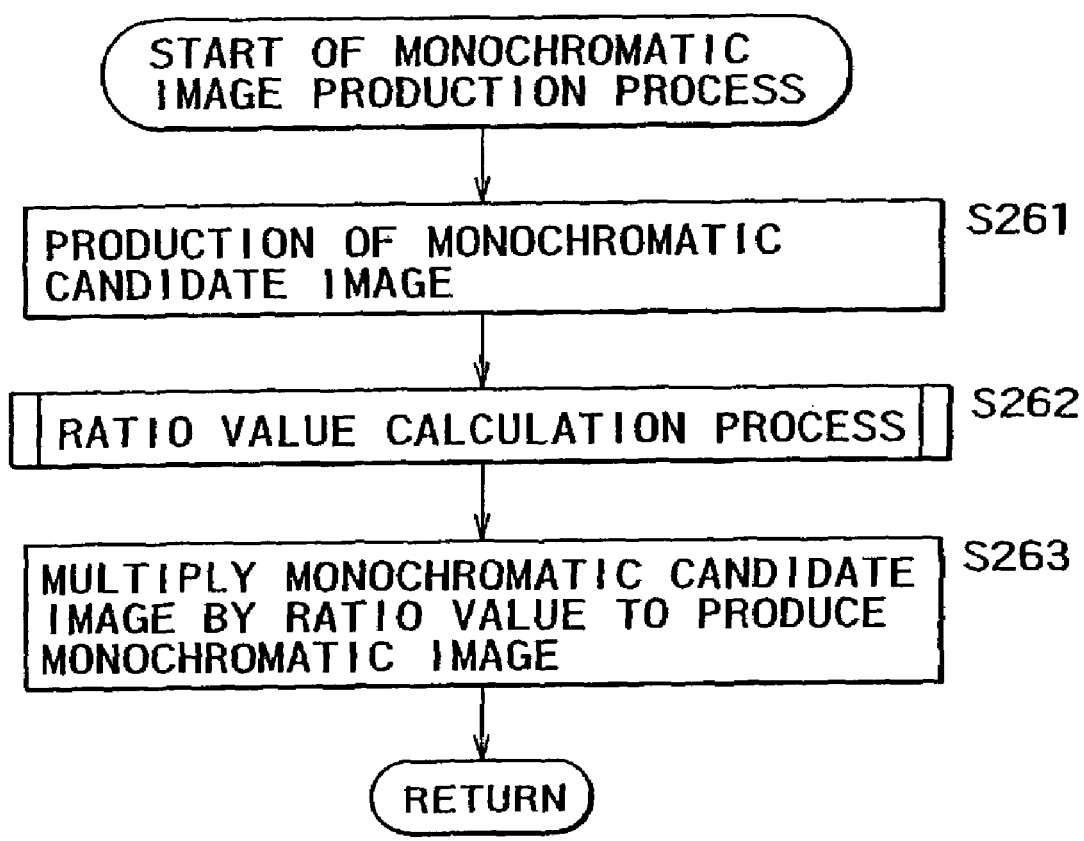
FIG. 95 is a flow chart illustrating a monochromatic image production process by the monochromatic image production section 182.

A first monochromatic image production process of the monochromatic image production section 182 is described with reference to a flow chart of FIG. 95.

At step S261, the interpolation section 201 performs an interpolation process for the color and sensitivity mosaic image to produce an R candidate image wherein all pixels have pixel values of an R component and outputs the R candidate image to the ratio value calculation section 202.

It is to be noted that the interpolation process of the interpolation section 201 is similar to the R component estimation process of the estimation section 191 which composes the luminance image production section 181 described above with reference to the flow chart of FIG. 87, and therefore, a description is omitted.

At step S262, the ratio value calculation section 202 performs a ratio value calculation process to calculate an intensity ratio and further produces ratio value information representative of the intensity ratio corresponding to each pixel, and supplies the intensity ratio and the ratio value information to the multiplier 203.

Figure 96:
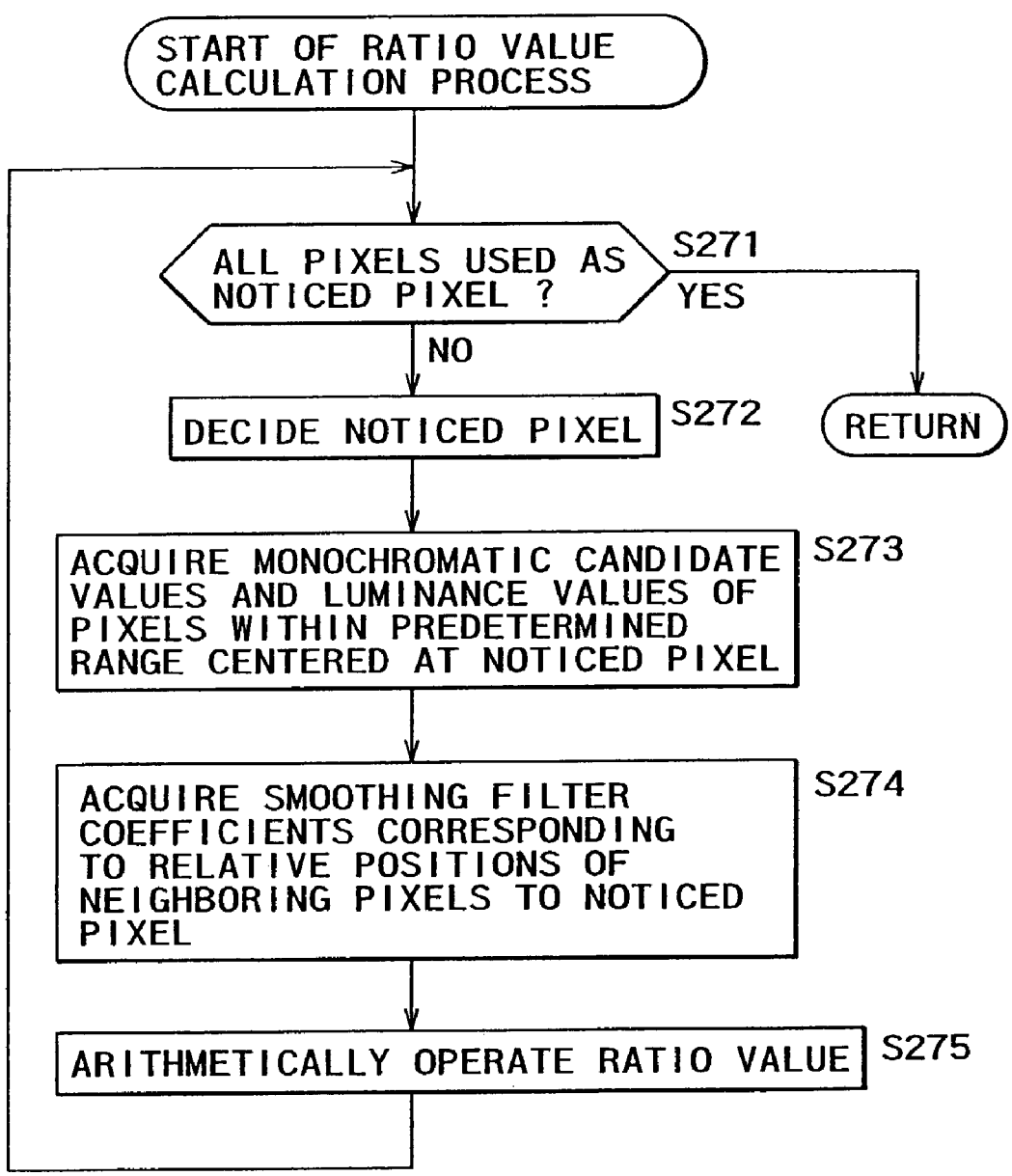
FIG. 96 is a flow chart illustrating a ratio value calculation process by a ratio value calculation section 202.

The ratio value calculation process of the ratio value calculation section 202 is described with reference to a flow chart of FIG. 96. At step S271, the ratio value calculation section 202 discriminates whether or not all pixels of the R candidate image have been used as a noticed pixel. If the ratio value calculation section 202 discriminates that all pixels have not been used as a noticed pixel, then the processing advances to step S272. At step S272, the ratio value calculation section 202 determines one by one a pixel as a noticed pixel beginning with the left lowermost pixel and ending with the right uppermost pixel of the R candidate image.

At step S273, the ratio value calculation section 202 refers to those pixels which are positioned in the neighborhood of the noticed pixel (for example, 7×7 pixels centered at the noticed pixel) to acquire the pixel values (monochromatic candidate values of R components) of the pixels. Further, the ratio value calculation section 202 extracts the pixel values (luminance values) of the pixels of the luminance image which are positioned at the same coordinates as those of the reference pixels.

At step S274, the ratio value calculation section 202 acquires a number of smoothing filter coefficients set in advance as shown in FIG. 97 and corresponding to relative positions of the reference pixels to the noticed pixel, the number being equal to the number of the reference pixels.

At step S275, the ratio value calculation section 202 multiplies the monochromatic candidate values for an R component of the reference pixels and the corresponding filter coefficients, divides the products by the corresponding luminance values and arithmetically operates the sum total of the quotients. Further, the ratio value calculation section 202 divides the sum total of the quotients by the sum total of the used smoothing filter coefficients and determines the quotient as an intensity ratio corresponding to the noticed pixel to produce ratio value information.

The processing returns to step S271 so that the processing at steps S271 to S275 is repeated until it is discriminated at step S271 that all pixels of the R candidate image have been used as a noticed pixel. When it is discriminated at step S271 that all pixels of the R candidate image have been used as a noticed pixel, the ratio value information produced is supplied to the multiplier 203, and the processing returns to step S263 of FIG. 95.

At step S263, the multiplier 203 multiplies the pixel values of the pixels of the luminance image by the corresponding intensity ratios to produce an output image R wherein the products are used as pixel values.

It is to be noted that, simultaneously with the first monochromatic image production process of the monochromatic image production section 182, the monochromatic image production sections 183 and 184 also execute similar processes.

Figure 98:
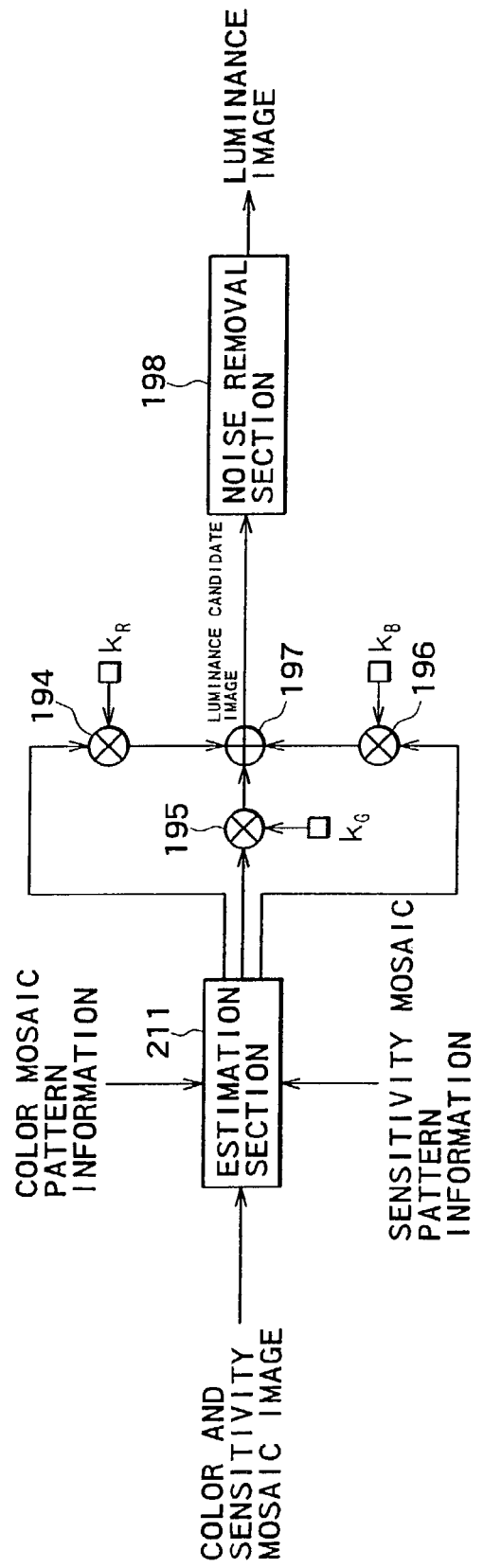
FIG. 98 is a block diagram showing a second embodiment of a configuration of the luminance image production section 181.

FIG. 98 shows a second example of a configuration of the luminance image production section 181. The second example of the configuration of the luminance image production section 181 replaces the estimation sections 191 to 193 of the first example of the configuration of the luminance image production section 181 shown in FIG. 83 with an estimation section 211.

In the second example of the configuration of the luminance image production section 181, a color and sensitivity mosaic image, color mosaic pattern information and sensitivity mosaic pattern information are supplied to the estimation section 211.

The estimation section 211 performs a component estimation process for the color and sensitivity mosaic image and supplies an estimation value R' of an R component, a estimation value G' of a G component and an estimation value B' of a B component for each pixel obtained by the component estimation process to the corresponding multipliers 194 to 196, respectively.

It is to be noted that the elements from the multiplier 194 to the noise removal section 198 included in the second example of the configuration of the luminance image production section 181 are similar to the elements from the multiplier 194 to the noise removal section 198 included in the first example of the configuration of the luminance image production section 181 shown in FIG. 83 in which like reference numerals are applied, and therefore, a description of them is omitted.

Figure 99:
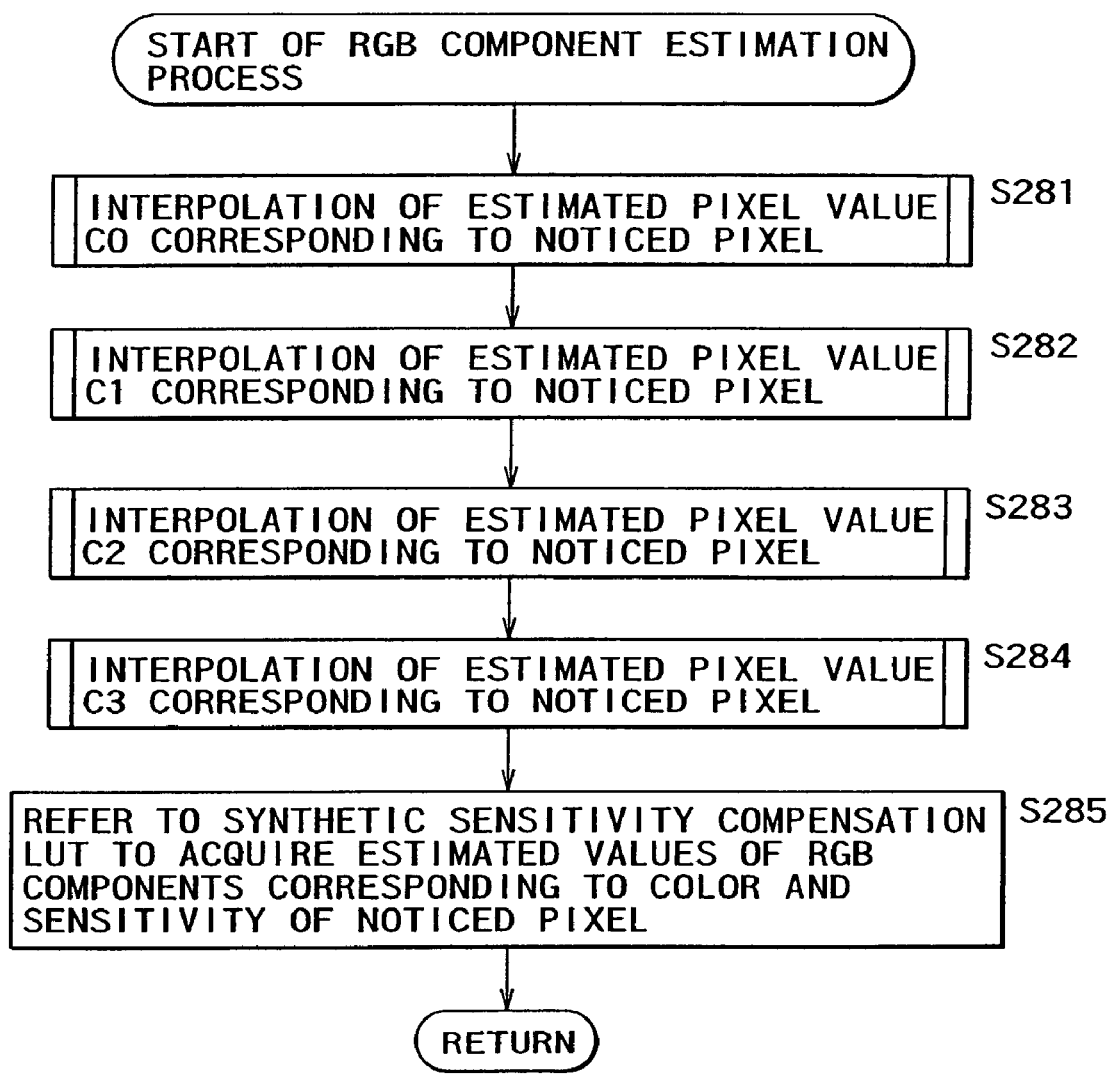
FIG. 99 is a flow chart illustrating an estimation process of RGB components by an estimation section 211.

Now, the estimation process for RGB components by the estimation section 211 is described with reference to a flow chart of FIG. 99. It is to be noted that the estimation process for RGB components is a process which can be executed in place of the R component estimation process described above with reference to FIG. 87 as a process at step S223 of FIG. 86. Accordingly, the processing at steps S281 et seq. is described assuming that a noticed pixel of a color and sensitivity mosaic image has already been determined by the estimation section 211.

Figure 100:
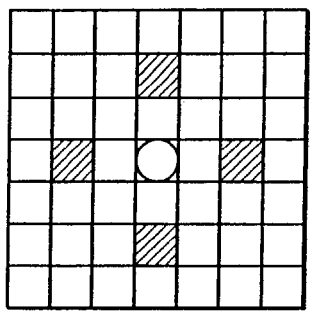
FIG. 100 is a view showing an arrangement of pixels used in an estimation pixel value C0 interpolation process.
Figure 101:
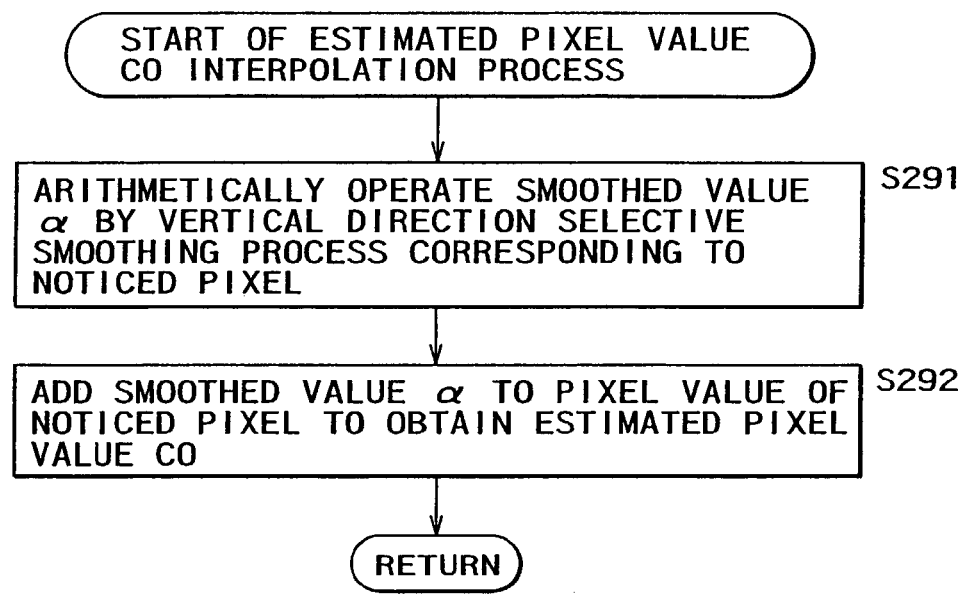
FIG. 101 is a flow chart illustrating the estimation pixel value C0 interpolation process.

At step S281, the estimation section 211 calculates an estimated pixel value C0 corresponding to the noticed pixel through an estimated pixel value C0 interpolation process wherein the pixel values of such four pixels centered at the noticed pixel as shown in FIG. 100 are used. The estimated pixel value C0 interpolation process is described with reference to a flow chart of FIG. 101.

At step S291, the estimation section 211 substitutes the pixel values of the four pixels positioned upwardly, downwardly, leftwardly and rightwardly of the noticed pixel indicated by ○ each with a space of one pixel left therebetween into variables a3, a0, a1 and a2 and applies a direction selective smoothing process described above with reference to FIG. 94 to arithmetically operate a smoothed value α.

The process of substituting the pixel values of four pixels positioned upwardly, downwardly, leftwardly and rightwardly of a designated pixel into the variables a3, a0, a1 and a2 and applying the direction selective smoothing process described hereinabove with reference to FIG. 94 to arithmetically operate a smoothed value α in this manner is hereinafter defined as a vertical direction selective smoothing process corresponding to the designated pixel.

At step S292, the estimation section 211 adds the smoothed value α obtained at step S291 to the pixel value of the noticed pixel and determines the sum as the estimated pixel value C0 of the noticed pixel. The processing then returns to step S282 of FIG. 99.

Figure 102:
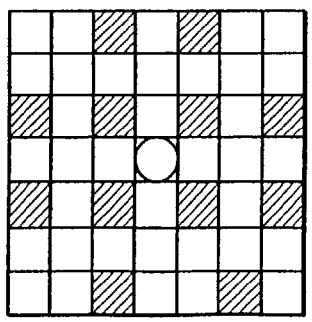
FIG. 102 is a view showing an arrangement of pixels used in an estimation pixel value C1 interpolation process.
Figure 103:
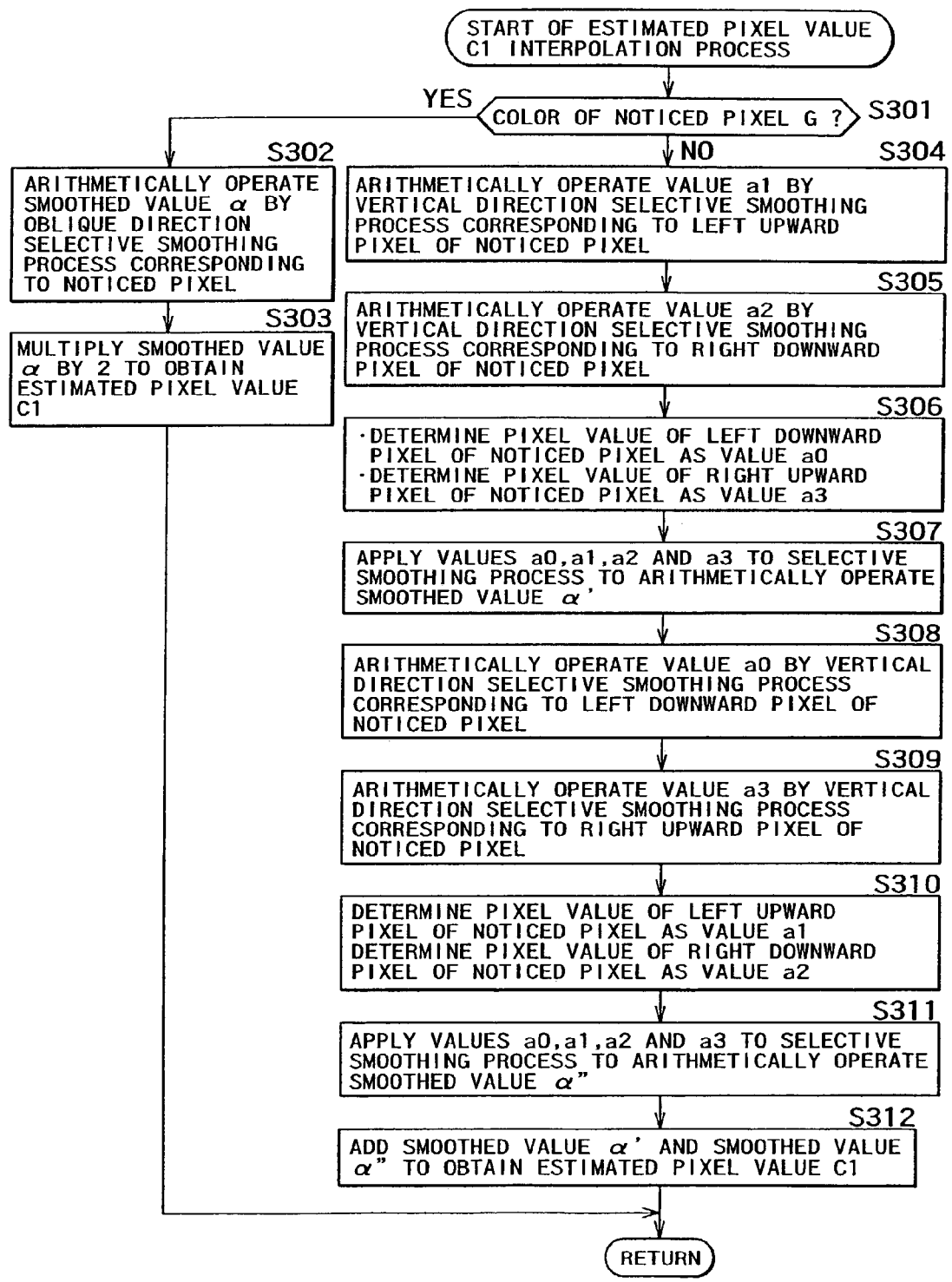
FIG. 103 is a flow chart illustrating the estimation pixel value C1 interpolation process.

At step S282, the estimation section 211 calculates an estimated pixel value C1 corresponding to the noticed pixel through an estimated pixel value C1 interpolation process wherein such twelve pixels centered at the noticed pixel as shown in FIG. 102 are used. The estimated pixel value C1 interpolation process is described with reference to a flow chart of FIG. 103.

At step S301, the estimation section 211 discriminates whether or not the color of the noticed pixel is G. If the estimation section 211 discriminates that the color of the noticed pixel is G, then the processing advances to step S302. At step S302, the estimation section 211 substitutes the pixel values of four pixels positioned leftwardly downwards, leftwardly upwards, rightwardly downwards and rightwardly upwards in the neighborhood of the noticed pixel represented by ○ as shown in FIG. 102 into the variables a0, a1, a2 and a3, respectively, and applies the direction selective smoothing process described above with reference to FIG. 94 to arithmetically operate a smoothed value α.

The process of substituting the pixel values of four pixels positioned leftwardly downwards, leftwardly upwards, rightwardly downwards and rightwardly upwards in the neighborhood of a designated pixel into the variables a0, a1, a2 and a3, respectively, and applying the direction selective smoothing process described hereinabove with reference to FIG. 94 to arithmetically operate a smoothed value α is hereinafter defined as an oblique direction selective smoothing process corresponding to the designated pixel.

At step S303, the estimation section 211 multiplies the smoothed value α obtained at step S302 by 2 and determines the product as an estimated pixel value C1 of the noticed pixel. The processing then returns to step S283 of FIG. 99.

It is to be noted that, if it is discriminated at step S301 that the color of the noticed pixel is not G, then the processing advances to step S304.

At step S304, the estimation section 211 executes the vertical direction selective smoothing process using four pixels positioned with a space of one pixel left from the pixel neighboring leftwardly upwards of the noticed pixel to calculate a smoothed value α and substitutes the smoothed value α into the variable a1. At step S305, the estimation section 211 executes the vertical direction selective smoothing process using four pixels positioned with a space of one pixel left from the pixel neighboring rightwardly downwards of the noticed pixel to calculate a smoothed value α and substitutes the smoothed value α into the variable a2. At step S306, the estimation section 211 substitutes the pixel value of the pixel neighboring leftwardly downwards of the noticed pixel into the variable a0 and substitutes the pixel value of the pixel neighboring rightwardly upwards of the noticed pixel into the variable a3.

At step S307, the estimation section 211 applies the variables a0, a1, a2 and a3 whose values have been set at steps S304 to S306 to the direction selective smoothing process described hereinabove with reference to FIG. 94 to arithmetically operate a smoothed value α and determines the value of the smoothed value α as a smoothed value α'.

At step S308, the estimation section 211 executes the vertical direction selective smoothing process using four pixels positioned with a space of one pixel left from the pixel neighboring leftwardly downwards of the noticed pixel to calculate a smoothed value α and substitutes the smoothed value α into the variable a0. At step S309, the estimation section 211 executes the vertical direction selective smoothing process using four pixels positioned with a space of one pixel left from the pixel neighboring rightwardly upwards of the noticed pixel to calculate a smoothed value α and substitutes the smoothed value α into the variable a3. At step S310, the estimation section 211 substitutes the pixel value of the pixel neighboring leftwardly upwards of the noticed pixel into the variable a1 and substitutes the pixel value of the pixel neighboring rightwardly downwards of the noticed pixel into the variable a2.

At step S311, the estimation section 211 applies the variables a0, a1, a2 and a3 whose values have been set at steps S308 to S310 to the direction selective smoothing process described above with reference to FIG. 94 to arithmetically operate a smoothed value α and determines the value of the smoothed value α as a smoothed value α".

At step S312, the estimation section 211 adds the smoothed value α' obtained at step S307 and the smoothed value α" obtained at step S311 and determines the sum as an estimated pixel value C1 corresponding to the noticed pixel. The processing then returns to step S283 of FIG. 99.

Figure 104A:
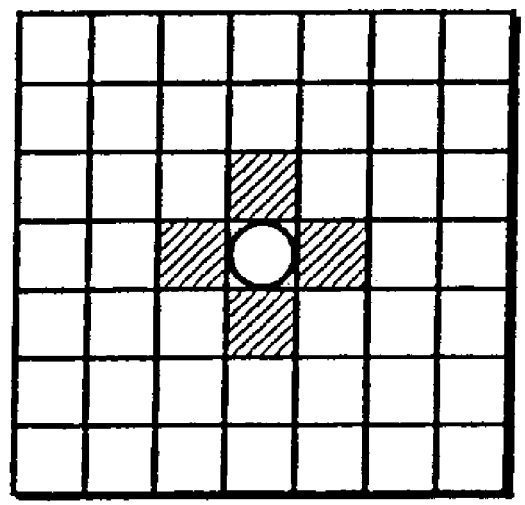
FIG. 104A is a view showing an arrangement of pixels used in an estimation pixel value C2 interpolation process.
Figure 104B:
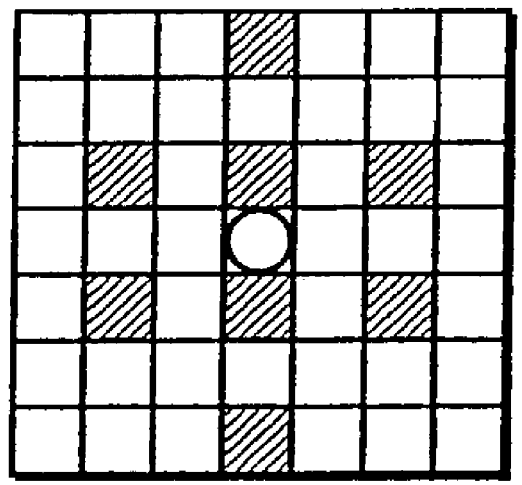
FIG. 104B is a view showing another arrangement of pixels used in the estimation pixel value C2 interpolation process.
Figure 105:
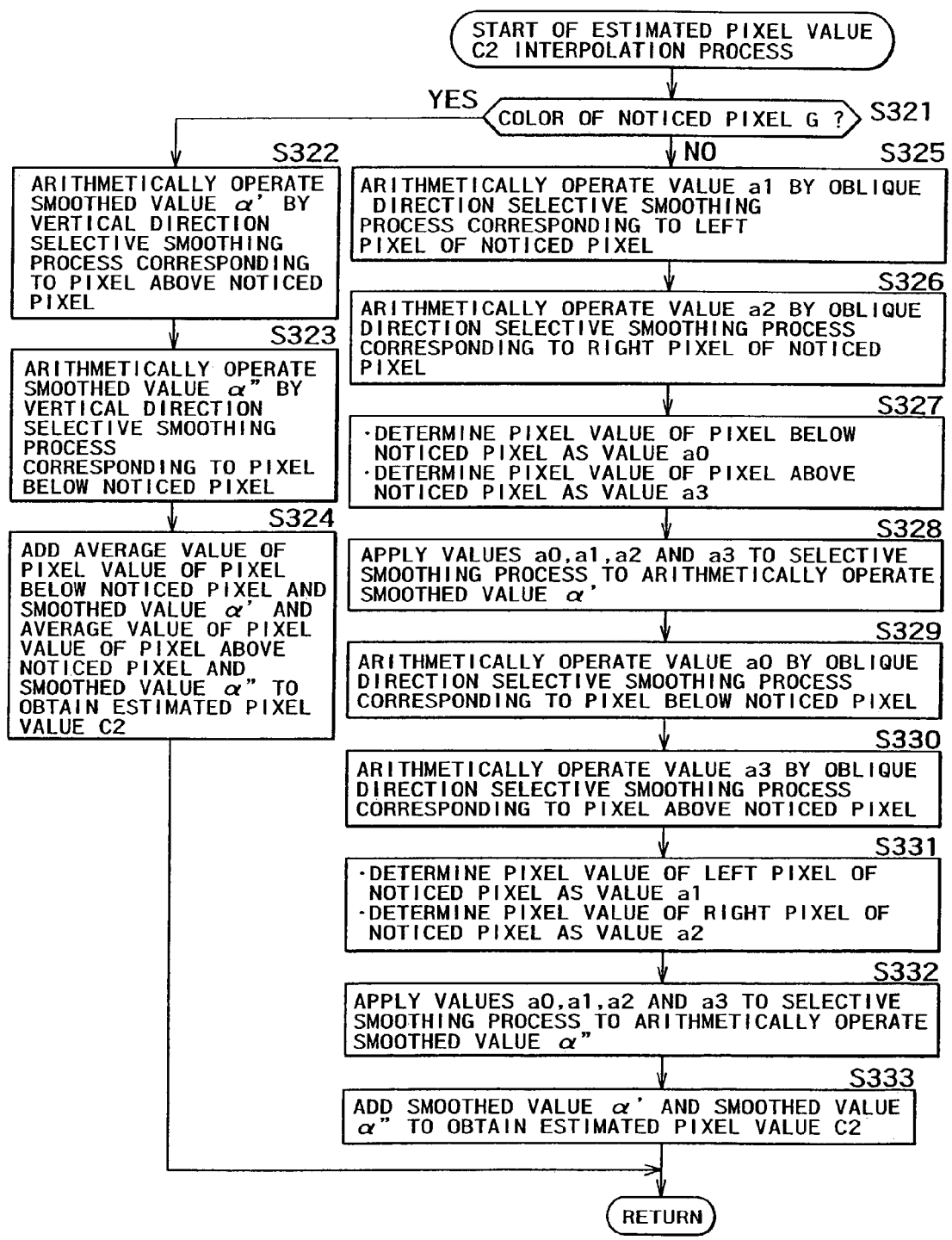
FIG. 105 is a flow chart illustrating the estimation pixel value C2 interpolation process.

At step S283, the estimation section 211 calculates a estimated pixel value C2 corresponding to the noticed pixel through a estimated pixel value C2 interpolation process wherein such four pixels centered at the noticed pixel as shown in FIG. 104A or such eight pixels centered at the noticed pixel as shown in FIG. 104B are used. The estimated pixel value C2 interpolation process is described with reference to a flow chart of FIG. 105.

At step S321, the estimation section 211 discriminates or determines whether or not the color of the noticed pixel is G. If the estimation section 211 discriminates that the color of the noticed pixel is G, then the processing advances to step S322.

At step S322, the estimation section 211 executes the vertical direction selective smoothing process using four pixels positioned with a space of one pixel left from the pixel neighboring upwardly of the noticed pixel to calculate a smoothed value α and determines it as a smoothed value α'.

At step S323, the estimation section 211 executes the vertical direction selective smoothing process using four pixels positioned with a space of one pixel left from the pixel neighboring downwardly of the noticed pixel to calculate a smoothed value α and determines it as a smoothed value α".

At step S324, the estimation section 211 adds an average value of the pixel value of the pixel neighboring downwardly of the noticed pixel and the smoothed value α' obtained at step S322 and an average value of the pixel value of the pixel neighboring upwardly of the noticed pixel and the smoothed value α" obtained at step S323 and determines the sum as an estimated pixel value C2 corresponding to the noticed pixel. The processing returns to step S284 of FIG. 99.

It is to be noted that, if it is discriminated at step S321 that the color of the noticed pixel is not G, then the processing advances to step S325.

At step S325, the estimation section 211 executes the oblique direction selective smoothing process using four pixels positioned obliquely in the neighborhood of the pixel neighboring leftwardly of the noticed pixel to calculate a smoothed value α and substitutes it into the variable a1. At step S326, the estimation section 211 executes the oblique direction selective smoothing process using four pixels positioned obliquely in the neighborhood of the pixel neighboring rightwardly of the noticed pixel to calculate a smoothed value α and substitutes it into the variable a2. At step S327, the estimation section 211 substitutes the pixel value of the pixel neighboring downwardly of the noticed pixel into the variable a0 and substitutes the pixel value of the pixel neighboring upwardly of the noticed pixel into the variable a3.

At step S328, the estimation section 211 applies the variables a0, a1, a2 and a3 whose values have been set at steps S325 to S327 to the direction selective smoothing process described above with reference to FIG. 94 to arithmetically operate a smoothed value α and determines the value of the smoothed value α as a smoothed value α'.

At step S329, the estimation section 211 executes the oblique direction selective smoothing process using four pixels positioned obliquely in the neighborhood of the pixel neighboring downwardly of the noticed pixel to calculate a smoothed value α and substitutes it into the variable a0. At step S330, the estimation section 211 executes the oblique direction selective smoothing process using four pixels positioned obliquely in the neighborhood of the pixel neighboring upwardly of the noticed pixel to calculate a smoothed value α and substitutes it into the variable a3. At step S331, the estimation section 211 substitutes the pixel value of the pixel neighboring leftwardly of the noticed pixel into the variable a1 and substitutes the pixel value of the pixel neighboring rightwardly of the noticed pixel into the variable a2.

At step S332, the estimation section 211 applies the variables a0, a1, a2 and a3 whose values have been set at steps S329 to S331 to the direction selective smoothing process described hereinabove with reference to FIG. 94 to arithmetically operate a smoothed value α and determines the value of the smoothed value α as a smoothed value α".

At step S333, the estimation section 211 adds the smoothed value α' obtained at step S328 and the smoothed value α" obtained at step S322 and determines the sum as an estimated pixel value C2 corresponding to the noticed pixel. The processing then returns to step S284 of FIG. 99.

Figure 106:
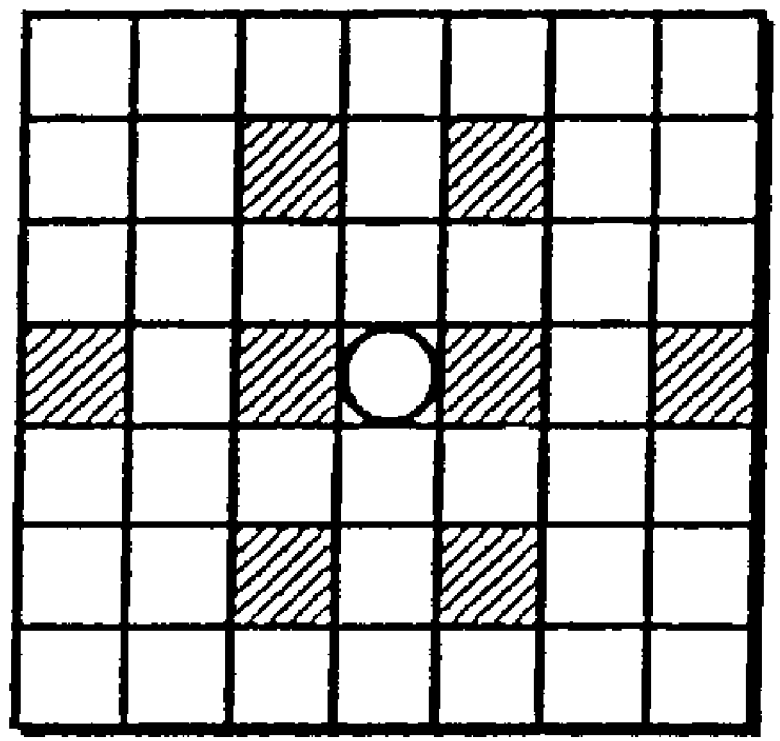
FIG. 106 is a view showing an arrangement of pixels used in an estimation pixel value C3 interpolation process.
Figure 107:
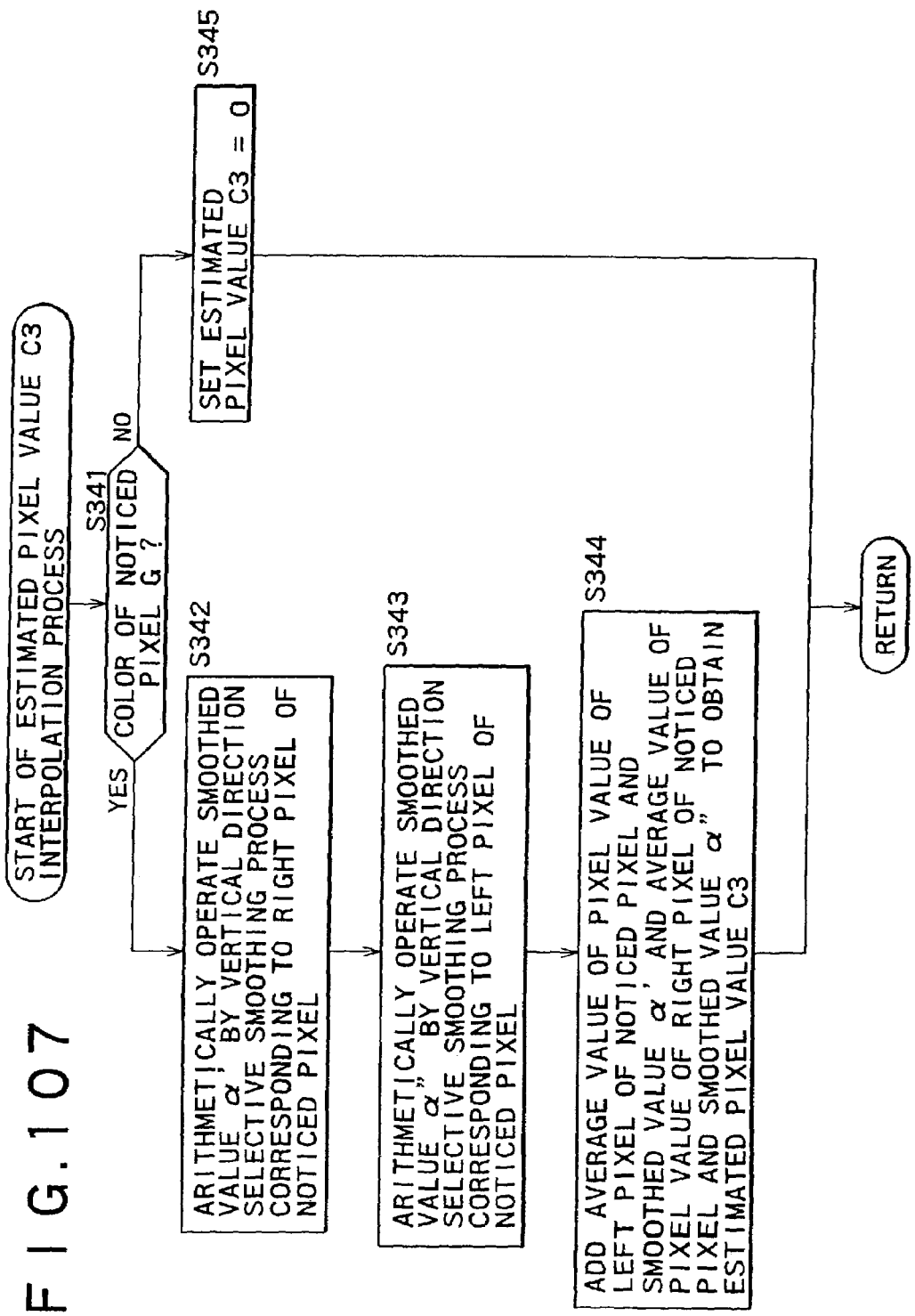
FIG. 107 is a flow chart illustrating the estimation pixel value C3 interpolation process.

At step S284, the estimation section 211 calculates a estimated pixel value C3 corresponding to the noticed pixel through an estimated pixel value C3 interpolation process wherein such eight pixels centered at the noticed pixel as shown in FIG. 106 are used. The estimated pixel value C3 interpolation process is described with reference to a flow chart of FIG. 107.

At step S341, the estimation section 211 discriminates whether or not the color of the noticed pixel is G. If the estimation section 211 discriminates that the color of the noticed pixel is G, then the processing advances to step S342.

At step S342, the estimation section 211 executes the vertical direction selective smoothing process using four pixels positioned with a space of one pixel left from the pixel neighboring rightwardly of the noticed pixel to calculate a smoothed value α and determines it as a smoothed value α'.

At step S343, the estimation section 211 executes the vertical direction selective smoothing process using four pixels positioned with a space of one pixel left from the pixel neighboring leftwardly of the noticed pixel to calculate a smoothed value α and determines it as a smoothed value α".

At step S344, the estimation section 211 adds an average value of the pixel value of the pixel neighboring leftwardly of the noticed pixel and the smoothed value α' obtained at step S342 and an average value of the pixel value of the pixel neighboring rightwardly of the noticed pixel and the smoothed value α" obtained at step S343 and determines the sum as an estimated pixel value C3 corresponding to the noticed pixel. The processing then returns to step S285 of FIG. 99.

It is to be noted that, if it is discriminated at step S341 that the color of the noticed pixel is not G, then the processing advances to step S345. At step S345, the estimation section 211 sets the estimated pixel value C3 corresponding to the noticed pixel to 0. The processing then returns to step S285 of FIG. 99.

At step S285, the estimation section 211 refers to the color mosaic pattern information and the sensitivity mosaic pattern information to discriminate the color and the sensitivity of the noticed pixel, and applies, based on a result of the discrimination, the estimated pixel values C0 to C3 corresponding to the noticed pixel obtained at steps S281 to S284 to a synthetic sensitivity compensation LUT (similar to the synthetic sensitivity compensation LUT described above with reference to FIGS. 90 to 92) built therein to calculate estimated values R', G' and B'.

In particular, where the color of the noticed pixel is G and the sensitivity is S0, a value LUT(C2) when the estimated pixel value C2 is applied to the synthetic sensitivity compensation LUT is determined as the estimated value R', and a value LUT((C0+C1/)2)) when an average value of the estimated pixel values C0+C1 is applied to the synthetic sensitivity compensation LUT is determined as the estimated value G' while a value LUT(C3) when the estimated pixel value C3 is applied to the synthetic sensitivity compensation LUT is determined as the estimated value B'.

Where the color of the noticed pixel is G and the sensitivity is S1, a value LUT(C3) when the estimated pixel value C3 is applied to the synthetic sensitivity compensation LUT is determined as the estimated value R', and a value LUT((C0+C1/)2)) when an average value of the estimated pixel values C0+C1 is applied to the synthetic sensitivity compensation LUT is determined as the estimated value G' while a value LUT(C2) when the estimated pixel value C2 is applied to the synthetic sensitivity compensation LUT is determined as the estimated value B'.

Where the color of the noticed pixel is R, a value LUT(C0) when the estimated pixel value C0 is applied to the synthetic sensitivity compensation LUT is determined as the estimated value R', and a value LUT(C2) when an average value of the estimated pixel value C2 is applied to the synthetic sensitivity compensation LUT is determined as the estimated value G' while a value LUT(C1) when the estimated pixel value C1 is applied to the synthetic sensitivity compensation LUT is determined as the estimated value B'.

Where the color of the noticed pixel is B, a value LUT(C1) when the estimated pixel value C1 is applied to the synthetic sensitivity compensation LUT is determined as the estimated value R', and a value LUT(C2) when an average value of the estimated pixel value C2 is applied to the synthetic sensitivity compensation LUT is determined as the estimated value G' while a value LUT(C0) when the estimated pixel value C0 is applied to the synthetic sensitivity compensation LUT is determined as the estimated value B'.

Since, in the estimation process of RGB components by the estimation section 211, the estimated pixel values C0 to C3 produced by making use of the direction selective smoothing process are used in such a manner as described above, deterioration of the resolution of an image signal is suppressed.

It is described above that the monochromatic image production sections 183 and 184 of the fourth example of the configuration of the image processing section 7 are configured similarly to the example of the configuration of the monochromatic image production section 182 shown in FIG.

84 and execute a process similar to the monochromatic image production process (FIG. 95) of the monochromatic image production section 182 described with reference to FIG. 95. However, the monochromatic image production sections 182 to 184 may in one embodiment otherwise execute unique processes individually optimized therefore in place of the monochromatic candidate image process (step S261 of FIG. 95) included in the monochromatic image production process.

Figure 108:
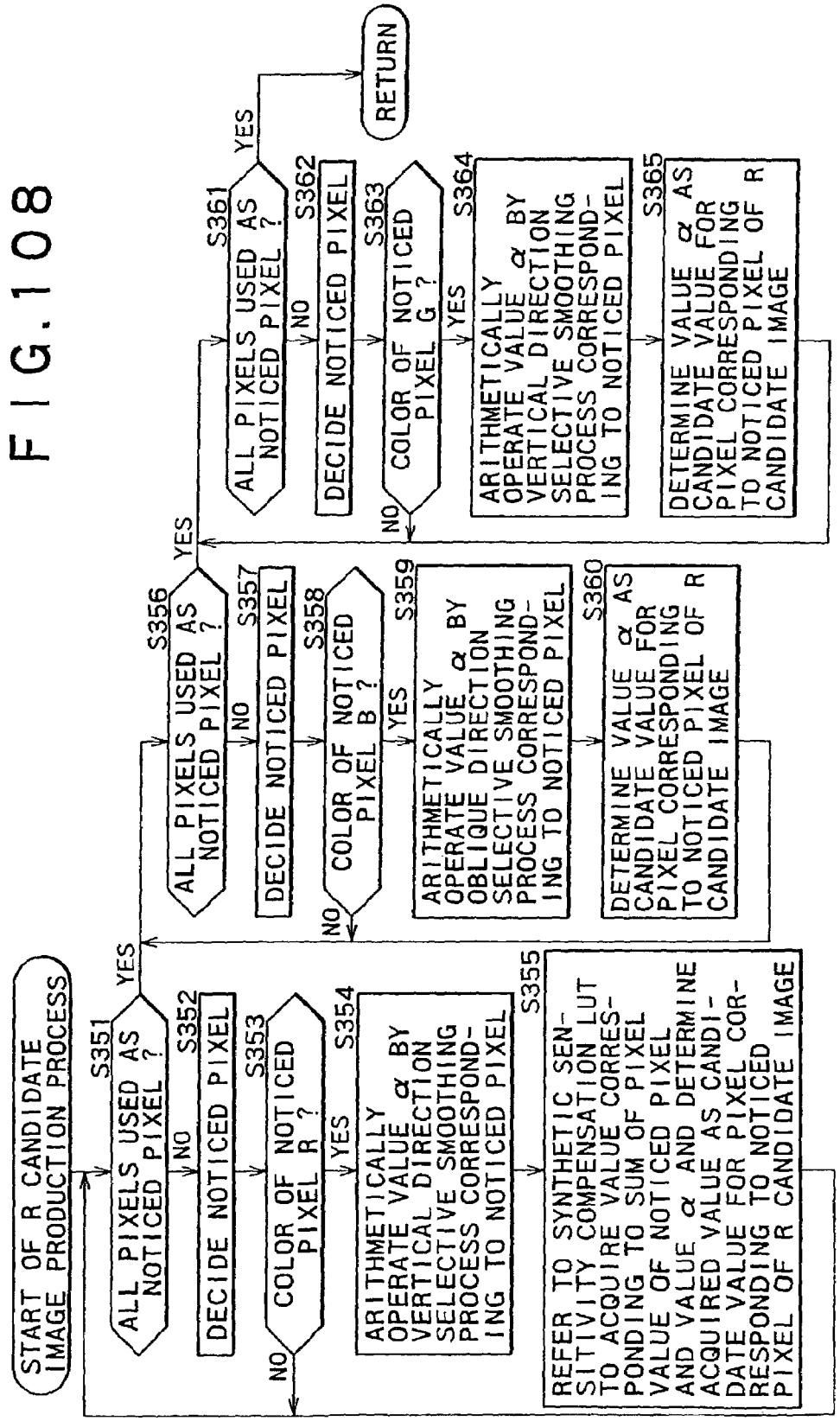
FIG. 108 is a flow chart illustrating an R candidate image production process by an interpolation section 201-R.

The R candidate image production process executed by the monochromatic image production section 182 in place of the monochromatic candidate image production process at step S261 is described with reference to a flow chart of FIG. 108. It is to be noted that, for the convenience of description, the interpolation section 201 which composes the monochromatic image production section 182 is hereinafter referred to as interpolation section 201-R.

At step S351, the interpolation section 201-R discriminates whether or not all pixels of the color and sensitivity mosaic image have been used as a noticed pixel for the first time. If the interpolation section 201-R discriminates that all pixels have not been used as a noticed pixel for the first time, then the processing advances to step S352. At step S352, the interpolation section 201-R determines one by one a pixel as a noticed pixel for the first time beginning with the left lowermost pixel and ending with the right uppermost pixel of the color and sensitivity mosaic image.

At step S353, the interpolation section 201-R discriminates whether or not the color of the noticed pixel for the first time is R. If the interpolation section 201-R discriminates that the color of the noticed pixel for the first time is R, then the processing advances to step S354. At step S354, the interpolation section 201-R executes the vertical direction selective smoothing process using four pixels positioned upwardly, downwardly, leftwardly and rightwardly of the noticed pixel for the first time with a space of one pixel left therebetween to calculate a smoothed value α. At step S355, the interpolation section 201-R applies the sum of the pixel value of the noticed pixel for the first time and the smoothed value α calculated at step S354 to a synthetic sensitivity compensation LUT (a synthetic sensitivity compensation LUT similar to that described with reference to FIGS. 90 to 92) built therein and determines the resulting value as a pixel value corresponding to the noticed pixel for the first time of an R candidate image. The processing then returns to step S351.

It is to be noted that, if it is discriminated at step S353 that the color of the noticed pixel for the first time is not R, then the processing returns to step S351 skipping the steps S354 and S355.

Thereafter, the processing at steps S351 to S355 is repeated until it is discriminated at step S351 that all pixels of the color and sensitivity mosaic image have been used as a noticed pixel for the first time. When it is discriminated at step S351 that all pixels of the color and sensitivity mosaic image have been used as a noticed pixel for the first time, the processing advances to step S356.

At step S356, the interpolation section 201-R discriminates whether or not all pixels of the color and sensitivity mosaic image have been used as a noticed pixel for the second time. If the interpolation section 201-R discriminates that all pixels have not been used as a noticed pixel for the second time, then the processing advances to step S357. At step S357, the interpolation section 201-R determines one by one a pixel as a noticed pixel for the second time beginning with the left lowermost pixel and ending with the right uppermost pixel of the color and sensitivity mosaic image.

At step S358, the interpolation section 201-R discriminates whether or not the color of the noticed pixel for the second time is B. If the interpolation section 201-R discriminates that the color of the noticed pixel for the second time is B, then the processing advances to step S359. At step S359, the interpolation section 201-R executes the oblique direction selective smoothing process using four pixels positioned obliquely in the neighborhood of the noticed pixel for the second time to calculate a smoothed value α. At step S360, the interpolation section 201-R determines the smoothed value α calculated at step S359 as a pixel value corresponding to the noticed pixel for the second time of the R candidate image. The processing returns to step S356.

It is to be noted that, if it is discriminated at step S358 that the color of the noticed pixel for the second time is not B, then the processing returns to step S356 skipping the steps S359 and S360.

Thereafter, the processing at steps S356 to S360 is repeated until it is discriminated at step S356 that all pixels of the color and sensitivity mosaic image have been used as a noticed pixel for the second time. When it is discriminated at step S356 that all pixels of the color and sensitivity mosaic image have been used as a noticed pixel for the second time, the processing advances to step S361.

At step S361, the interpolation section 201-R discriminates whether or not all pixels of the color and sensitivity mosaic image have been used as a noticed pixel for the third time. If the interpolation section 201-R discriminates that all pixels have not been used as a noticed pixel for the third time, then the processing advances to step S362. At step S362, the interpolation section 201-R determines one by one a pixel as a noticed pixel for the third time beginning with the left lowermost pixel and ending with the right uppermost pixel of the color and sensitivity mosaic image.

At step S363, the interpolation section 201-R discriminates whether or not the color of the noticed pixel for the third time is G. If the interpolation section 201-R discriminates that the color of the noticed pixel for the third time is G, then the processing advances to step S364. At step S364, the interpolation section 201-R executes the vertical direction selective smoothing process using four pixels positioned upwardly, downwardly, leftwardly and rightwardly of the noticed pixel for the third time to calculate a smoothed value α. At step S365, the interpolation section 201-R determines the smoothed value α calculated at step S364 as a pixel value corresponding to the noticed pixel for the third time of an R candidate image.

It is to be noted that, if it is discriminated at step S363 that the color of the noticed pixel for the third time is not G, then the processing returns to step S361 skipping the steps S364 and S365.

Thereafter, the processing at steps S361 to S365 is repeated until it is discriminated at step S361 that all pixels of the color and sensitivity mosaic image have been used as a noticed pixel for the third time. When it is discriminated at step S361 that all pixels of the color and sensitivity mosaic image have been used as a noticed pixel for the third time, the R candidate image production process is ended.

Figure 109:
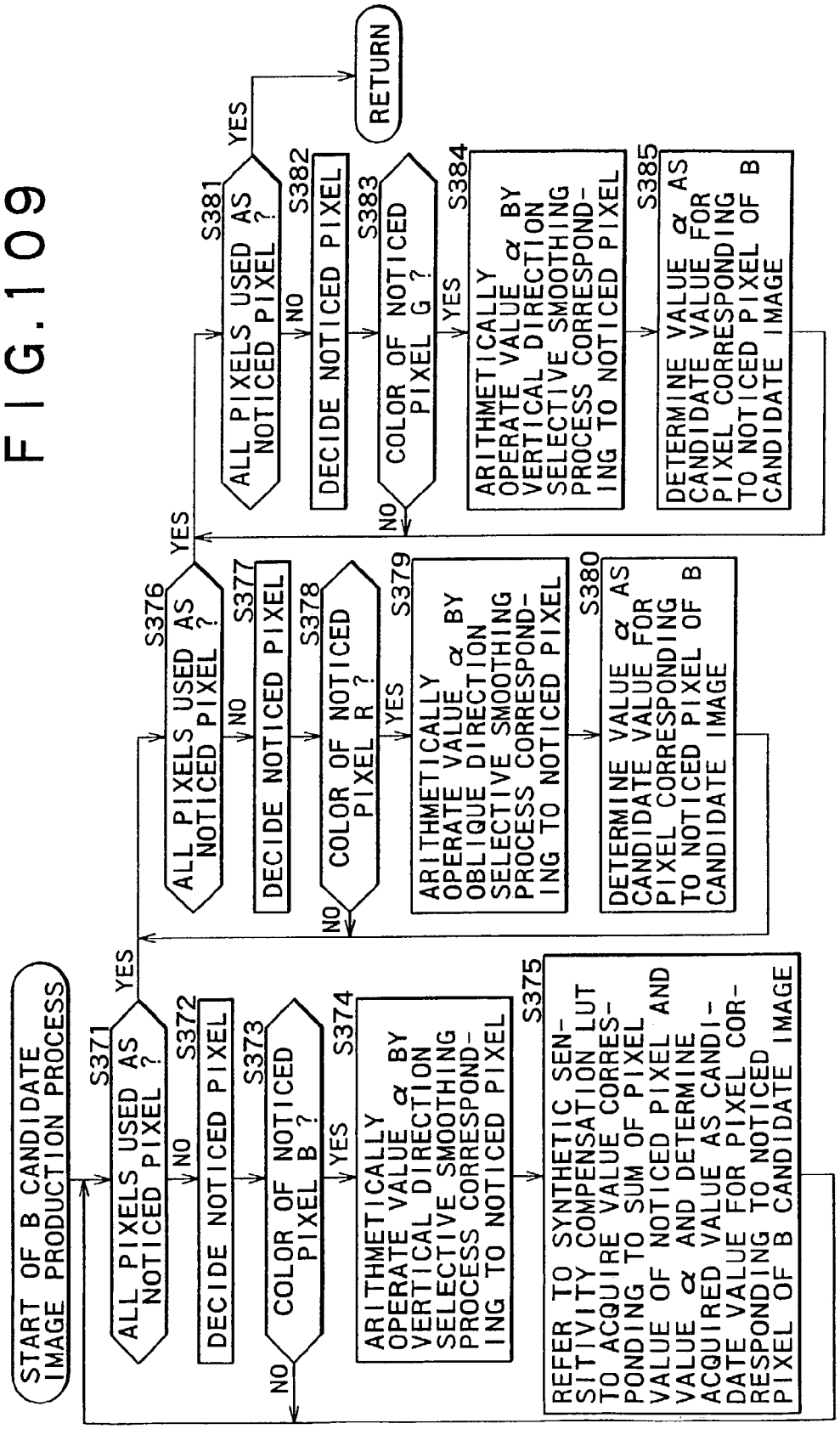
FIG. 109 is a flow chart illustrating a B candidate image production process by an interpolation section 201-B.

The B candidate image production process executed by the monochromatic image production section 184 is described with reference to a flow chart of FIG. 109. It is to be noted that, for the convenience of description, the component of the monochromatic image production section 184 which corresponds to the interpolation section 201 of the monochromatic image production section 182 is hereinafter referred to as interpolation section 201-B.

At step S371, the interpolation section 201-B discriminates whether or not all pixels of the color and sensitivity mosaic image have been used as a noticed pixel for the first time. If the interpolation section 201-B discriminates that all pixels have not been used as a noticed pixel for the first time, then the processing advances to step S372. At step S372, the interpolation section 201-B determines one by one a pixel as a noticed pixel for the first time beginning with the left lowermost pixel and ending with the right uppermost pixel of the color and sensitivity mosaic image.

At step S373, the interpolation section 201-B discriminates whether or not the color of the noticed pixel for the first time is B. If the interpolation section 201-B discriminates that the color of the noticed pixel for the first time is B, then the processing advances to step S374. At step S374, the interpolation section 201-B executes the vertical direction selective smoothing process using four pixels positioned upwardly, downwardly, leftwardly and rightwardly of the noticed pixel for the first time with a space of one pixel left therebetween to calculate a smoothed value $\alpha$. At step S375, the interpolation section 201-B applies the sum of the pixel value of the noticed pixel for the first time and the smoothed value $\alpha$ calculated at step S374 to a synthetic sensitivity compensation LUT (a synthetic sensitivity compensation LUT similar to that described with reference to FIGS. 90 to 92) built therein and determines the resulting value as a pixel value corresponding to the noticed pixel for the first time of a B candidate image. The processing then returns to step S371.

It is to be noted that, if it is discriminated at step S373 that the color of the noticed pixel for the first time is not B, then the processing returns to step S371 skipping the steps S374 and S375.

Thereafter, the processing at steps S371 to S375 is repeated until it is discriminated at step S371 that all pixels of the color and sensitivity mosaic image have been used as a noticed pixel for the first time. When it is discriminated at step S371 that all pixels of the color and sensitivity mosaic image have been used as a noticed pixel for the first time, the processing advances to step S376.

At step S376, the interpolation section 201-B discriminates whether or not all pixels of the color and sensitivity mosaic image have been used as a noticed pixel for the second time. If the interpolation section 201-B discriminates that all pixels have not been used as a noticed pixel for the second time, then the processing advances to step S377. At step S377, the interpolation section 201-B determines one by one a pixel as a noticed pixel for the second time beginning with the left lowermost pixel and ending with the right uppermost pixel of the color and sensitivity mosaic image.

At step S378, the interpolation section 201-B discriminates whether or not the color of the noticed pixel for the second time is R. If the interpolation section 201-B discriminates that the color of the noticed pixel for the second time is R, then the processing advances to step S379. At step S379, the interpolation section 201-B executes the oblique direction selective smoothing process using four pixels positioned obliquely in the neighborhood of the noticed pixel for the second time to calculate a smoothed value $\alpha$. At step S380, the interpolation section 201-B determines the smoothed value $\alpha$ calculated at step S379 as a pixel value corresponding to the noticed pixel for the second time of the B candidate image. The processing then returns to step S376.

It is to be noted that, if it is discriminated at step S378 that the color of the noticed pixel for the second time is not R, then the processing returns to step S376 skipping the steps S379 and S380.

Thereafter, the processing at steps S376 to S380 is repeated until it is discriminated at step S376 that all pixels of the color and sensitivity mosaic image have been used as a noticed pixel for the second time. When it is discriminated at step S376 that all pixels of the color and sensitivity mosaic image have been used as a noticed pixel for the second time, the processing advances to step S381.

At step S381, the interpolation section 201-B discriminates whether or not all pixels of the color and sensitivity mosaic image have been used as a noticed pixel for the third time. If the interpolation section 201-B discriminates that all pixels have not been used as a noticed pixel for the third time, then the processing advances to step S382. At step S382, the interpolation section 201-B determines one by one a pixel as a noticed pixel for the third time beginning with the left lowermost pixel and ending with the right uppermost pixel of the color and sensitivity mosaic image.

At step S383, the interpolation section 201-B discriminates whether or not the color of the noticed pixel for the third time is G. If the interpolation section 201-B discriminates that the color of the noticed pixel for the third time is G, then the processing advances to step S384. At step S384, the interpolation section 201-B executes the vertical direction selective smoothing process using four pixels positioned upwardly, downwardly, leftwardly and rightwardly in the neighborhood of the noticed pixel for the third time to calculate a smoothed value $\alpha$. At step S385, the interpolation section 201-B determines the smoothed value $\alpha$ calculated at step S384 as a pixel value corresponding to the noticed pixel for the third time of a B candidate image. The processing then returns to step S381.

It is to be noted that, if it is discriminated at step S383 that the color of the noticed pixel for the third time is not G, then the processing returns to step S381 skipping the steps S384 and S385.

Thereafter, the processing at steps S381 to S385 is repeated until it is discriminated at step S381 that all pixels of the color and sensitivity mosaic image have been used as a noticed pixel for the third time. When it is discriminated at step S381 that all pixels of the color and sensitivity mosaic image have been used as a noticed pixel for the third time, the B candidate image production process is ended.

Figure 110:
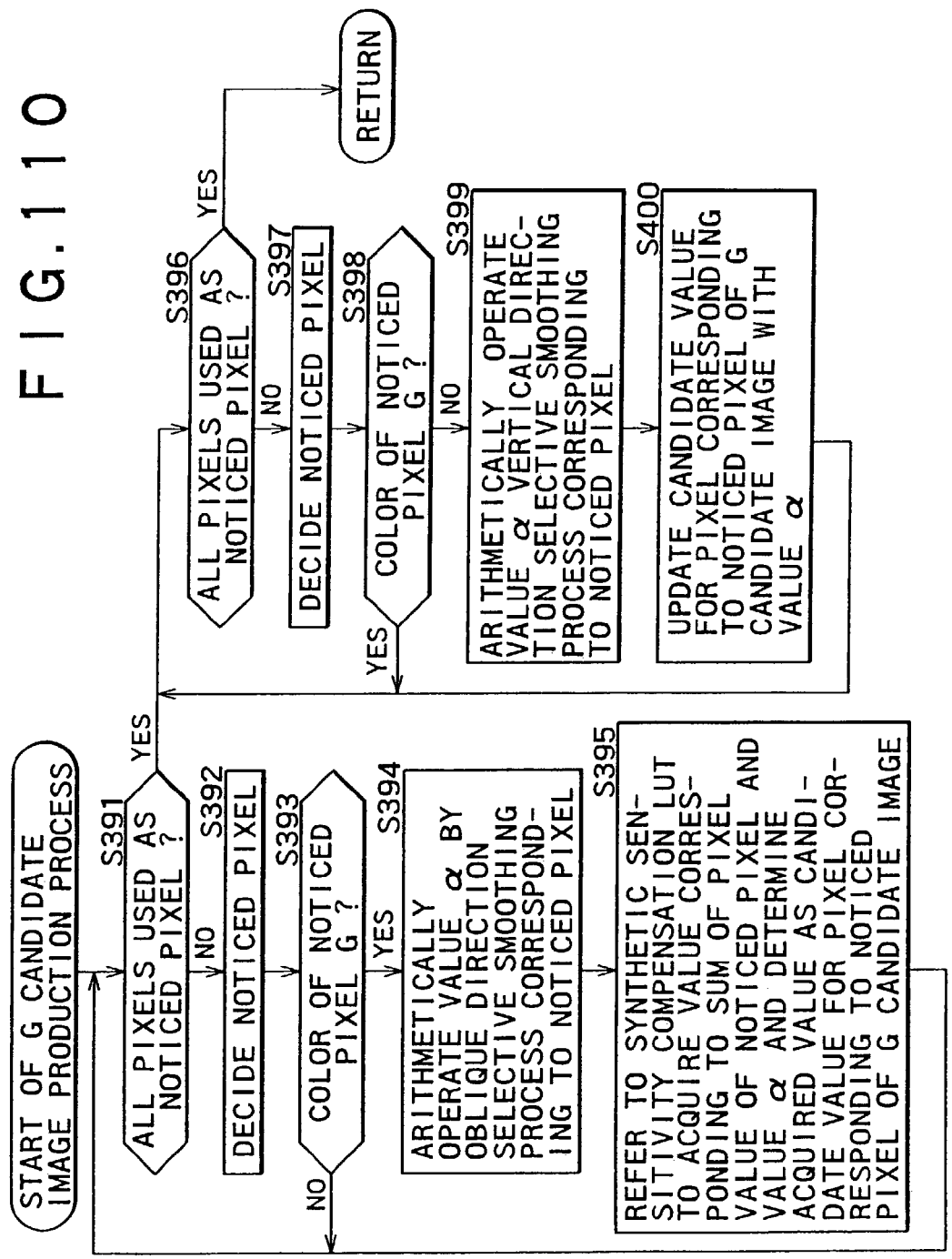
FIG. 110 is a flow chart illustrating a G candidate image production process by an interpolation section 201-G.

The G candidate image production process executed by the monochromatic image production section 183 is described with reference to a flow chart of FIG. 110. It is to be noted that, for the convenience of description, the component of the monochromatic image production section 183 which corresponds to the interpolation section 201 of the monochromatic image production section 182 is hereinafter referred to as interpolation section 201-G.

At step S391, the interpolation section 201-G discriminates whether or not all pixels of the color and sensitivity mosaic image have been used as a noticed pixel for the first time. If the interpolation section 201-G discriminates that all pixels have not been used as a noticed pixel for the first time, then the processing advances to step S392. At step S392, the interpolation section 201-G determines one by one a pixel as a noticed pixel for the first time beginning with the left lowermost pixel and ending with the right uppermost pixel of the color and sensitivity mosaic image.

At step S393, the interpolation section 201-G discriminates whether or not the color of the noticed pixel for the first time is G. If the interpolation section 201-G discriminates that the color of the noticed pixel for the first time is G, then the processing advances to step S394. At step S394, the interpolation section 201-G executes the oblique direction selective smoothing process using four pixels positioned obliquely in the neighborhood of the noticed pixel for the first time to calculate a smoothed value α. At step S395, the interpolation section 201-G applies the sum of the pixel value of the noticed pixel for the first time and the smoothed value α calculated at step S394 to a synthetic sensitivity compensation LUT (a synthetic sensitivity compensation LUT similar to that described with reference to FIGS. 90 to 92) built therein and determines the resulting value as a pixel value corresponding to the noticed pixel for the first time of a G candidate image. The processing then returns to step S391.

It is to be noted that, if it is discriminated at step S393 that the color of the noticed pixel for the first time is not G, then the processing returns to step S391 skipping the steps S394 and S395.

Thereafter, the processing at steps S391 to S395 is repeated until it is discriminated at step S391 that all pixels of the color and sensitivity mosaic image have been used as a noticed pixel for the first time. When it is discriminated at step S391 that all pixels of the color and sensitivity mosaic image have been used as a noticed pixel for the first time, the processing advances to step S396.

At step S396, the interpolation section 201-G discriminates whether or not all pixels of the color and sensitivity mosaic image have been used as a noticed pixel for the second time. If the interpolation section 201-G discriminates that all pixels have not been used as a noticed pixel for the second time, then the processing advances to step S397. At step S397, the interpolation section 201-G determines one by one a pixel as a noticed pixel for the second time beginning with the left lowermost pixel and ending with the right uppermost pixel of the color and sensitivity mosaic image.

At step S398, the interpolation section 201-G discriminates whether or not the color of the noticed pixel for the second time is G. If the interpolation section 201-G discriminates that the color of the noticed pixel for the second time is not G, then the processing advances to step S399. At step S399, the interpolation section 201-G executes the vertical direction selective smoothing process using four pixels positioned upwardly, downwardly, leftwardly and rightwardly in the neighborhood of the noticed pixel for the second time to calculate a smoothed value α. At step S400, the interpolation section 201-G determines the smoothed value α calculated at step S399 as a pixel value corresponding to the noticed pixel for the second time of the G candidate image. The processing then returns to step S396.

It is to be noted that, if it is discriminated at step S398 that the color of the noticed pixel for the second time is G, then the processing returns to step S396 skipping the steps S399 and S400.

Thereafter, the processing at steps S396 to S400 is repeated until it is discriminated at step S396 that all pixels of the color and sensitivity mosaic image have been used as a noticed pixel for the second time. When it is discriminated at step S396 that all pixels of the color and sensitivity mosaic image have been used as a noticed pixel for the second time, the G candidate image production process is ended.

Incidentally, as described above, in the fourth demosaic process, a luminance image and monochromatic images are produced from a color and sensitivity mosaic image, and all colors are restored by making use of the correlation between the luminance and the color components to restore all pixels having a uniform sensitivity and all color components. However, the luminance image to be produced first may have a biased spectral characteristic only if color information to be restored has the correlation and the signal can be restored with a high resolution. For example, the characteristic of a color mosaic arrangement of a color and sensitivity mosaic image that it includes a number of pixels of G equal to twice that of pixels of R or pixels of B like a Bayer arrangement may be utilized to produce an image of a G component in place of a luminance image, and the correlation between G and R or between G and B may be utilized to produce an image of an R component and an image of a B component.

Figure 111:
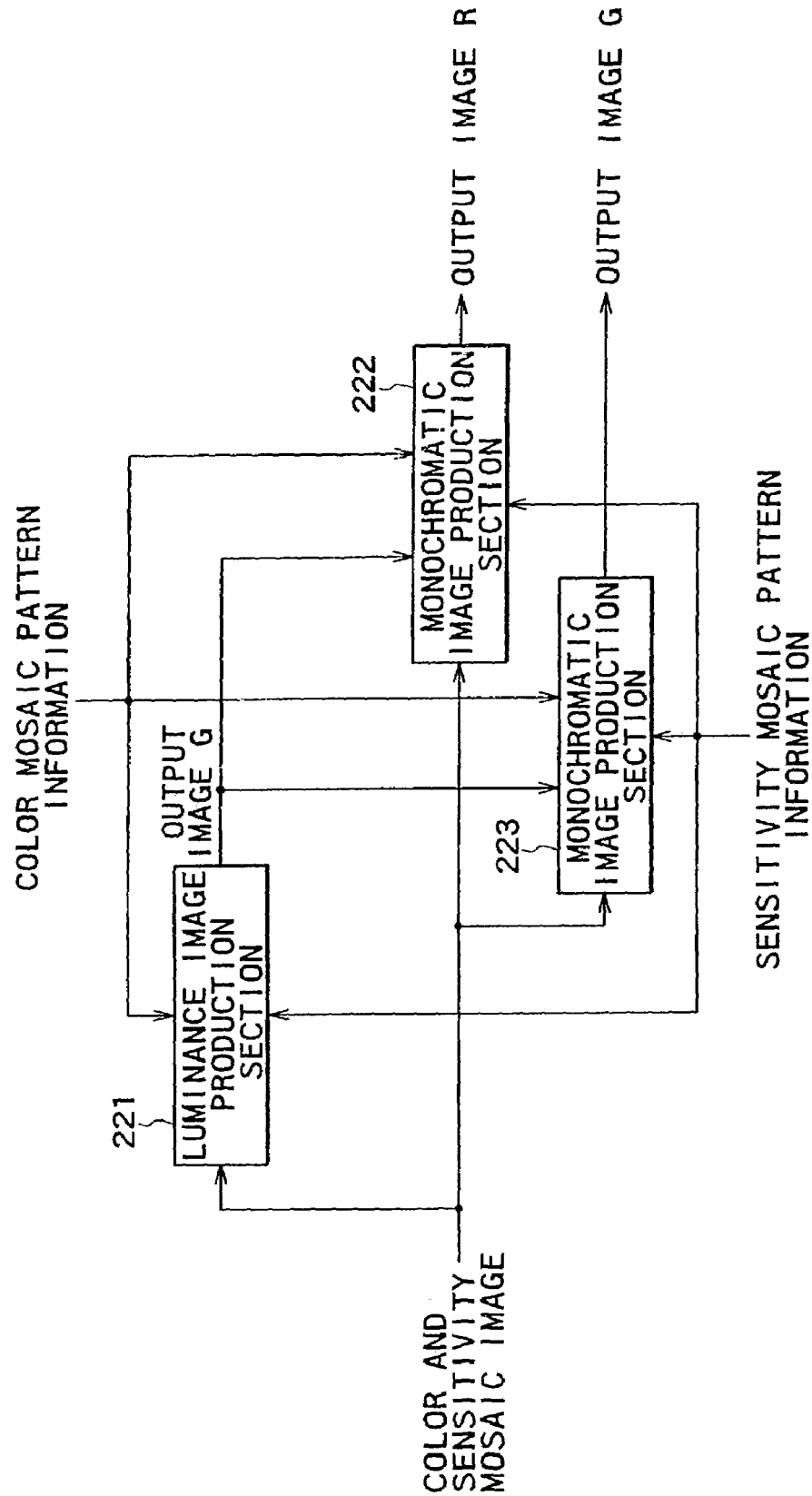
FIG. 111 is a block diagram showing a fifth embodiment of a configuration of the image processing section 7.

To execute such processing as just described, the image processing section 7 may in one embodiment be configured in such a manner as shown in FIG. 111. A luminance image production section 221 executes processing similar to that of the interpolation section 201 (FIG. 84) of the monochromatic image production section 182 in the fourth example of the configuration of the image processing section 7 to produce an output image G. Monochromatic image production sections 222 and 223 execute processing similar to that of the monochromatic image production sections 182 and 184 in the fourth example of the configuration of the image processing section 7 to produce an output image R and an output image B, respectively.

It is to be noted that, while the series of processes described above can be executed by hardware, it may in an embodiment be executed by software. Where the series of processes is executed by software, a program which constructs the software is installed from a recording medium into a computer incorporated in hardware for exclusive use or, for example, a personal computer for universal use which can execute various functions by installing various programs.

The recording medium is formed as a package medium such as, as shown in FIG. 1, a magnetic disc 16 (including a floppy disc), an optical disc 17 (including a CD-ROM (Compact Disc-Read Only Memory) and a DVD (Digital Versatile Disc)), or a magneto-optical disc 18 (including an MD (Mini Disc)), or a semiconductor memory 19 which has the program recorded thereon or therein and is distributed to provide the program to a user separately from a computer. The recording medium alternatively is formed as a ROM, a hard disc or the like in which the program is recorded and which is provided to a user in a state wherein the program is incorporated in a computer.

It is to be noted that, in the present specification, the steps which describe the program recorded in a recording medium may be but need not necessarily be processed in a time series in the order as described, and include processes which are executed in parallel or individually without being processed in a time series.

INDUSTRIAL APPLICABILITY

As described above, according to an embodiment the present invention, appearance of a color moire on a restoration image can be suppressed.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. An image processing apparatus for producing a restoration image wherein each pixel has all of a plurality of color components using a color and sensitivity mosaic image wherein each pixel has a sensitivity and one of the plurality of color components and a color mosaic image wherein each pixel has one of the plurality of color components, the image processing apparatus comprising:

a sensitivity uniformization unit for uniformizing the sensitivities of the pixels of the color and sensitivity mosaic image;

a first color difference image production unit for producing a first color difference image corresponding to the color mosaic image based on color mosaic pattern information which indicates an arrangement of the color components of the color mosaic image, wherein said first color difference image production unit includes:
  (a) a first smoothing unit for smoothing a first color component of the color mosaic image to produce a first smoothed image,
  (b) a second smoothing unit for smoothing a second color component of the color mosaic image to produce a second smoothed image, and
  (c) a first subtraction unit for subtracting color components of corresponding pixels of the first smoothed image and the second smoothed image to produce said first color difference image; and a second color difference image production unit for producing a second color difference image corresponding to the color mosaic image based on the color mosaic pattern information, wherein the second color difference image production unit includes:
  (a) a third smoothing unit for smoothing the first color component of the color mosaic image to produce a third smoothed image,
  (b) a fourth smoothing unit for smoothing the second color component of the color mosaic image to produce a fourth smoothed image, and
  (c) a second subtraction unit for subtracting color components of corresponding pixels of the third smoothed image and the fourth smoothed image to produce the second color difference image; and a luminance image production unit for producing a luminance image using: (i) the first color difference image; (ii) the second color difference image; and (iii) the color mosaic image; and a restoration unit for restoring all of the color components corresponding to each pixel using: (i) the first color difference image; (ii) the second color difference image; and (iii) the luminance image.

2. The image processing apparatus of claim 1, wherein each of said smoothing units use a direction selective smoothing process to produce at least one of: the first smoothed image; the second smoothed image; the third smoothed image; and the fourth smoothed image.

3. The image processing apparatus of claim 1, wherein the luminance image production unit includes a luminance candidate image production unit for producing a luminance candidate image using the first and second color difference images and the color mosaic image, and a noise removal unit for removing noise components of the luminance candidate image to produce the luminance image.

4. The image processing apparatus of claim 3, wherein the noise removal unit removes the noise components of the luminance candidate image using the direction selective smoothing process to produce the luminance image.

5. The image processing apparatus of claim 1, further comprising a gradation conversion unit for performing a gradation conversion process for the color mosaic image and supplying the resulting image to the first and second color difference image production units and the luminance image production unit.

6. The image processing apparatus of claim 5, further comprising a gradation reverse conversion unit for performing a gradation reverse conversion process corresponding to the gradation conversion process for all of the color components corresponding to each pixel restored by the restoration unit.

7. An image processing method for an image processing apparatus for producing a restoration image wherein each pixel has all of a plurality of color components using a color and sensitivity mosaic image wherein each pixel has a sensitivity and one of the plurality of color components and a color mosaic image wherein each pixel has one of the plurality of color components, the method comprising:

uniformizing the sensitivities of the pixels of the color and sensitivity mosaic image;

producing a first color difference image corresponding to the color mosaic image based on color mosaic pattern information which indicates an arrangement of the color components of the color mosaic image, wherein producing the first color difference image includes:
  (a) smoothing a first color component of the color mosaic image to produce a first smoothed image,
  (b) smoothing a second color component of the color mosaic image to produce a second smoothed image, and
  (c) subtracting color components of corresponding pixels of the first smoothed image and the second smoothed image to produce the first color difference image; and producing a second color difference image corresponding to the color mosaic image based on the color mosaic pattern information, wherein producing the second color difference image includes:
  (a) smoothing the first color component of the color mosaic image to produce a third smoothed image,
  (b) smoothing the second color component of the color mosaic image to produce a fourth smoothed image, and
  (c) subtracting color components of corresponding pixels of the third smoothed image and the fourth smoothed image to produce the second color difference image; and producing a luminance image using: (i) the first color difference image; (ii) the second color difference image; and (iii) the color mosaic image; and restoring all of the color components corresponding to each pixel using: (i) the first color difference image; (ii) the second color difference image; and (iii) the luminance image.

8. The method of claim 7, wherein smoothing each of said color components includes using a direction selective smoothing process to produce at least one of: (i) the first smoothed image: (ii) the second smoothed image; (iii) the third smoothed image; and (iv) the fourth smoothed image.

9. The method of claim 7, wherein producing the luminance image further comprises the steps of:

producing a luminance candidate image using the first and second color difference images and the color mosaic image; and removing noise components of the luminance candidate to produce the luminance image.

10. The method of claim 9, wherein the process of the noise removal removes the noise components of the luminance candidate image using a direction selective smoothing process to produce the luminance image.

11. The method of claim 7, further comprising:

performing a gradation conversion process for the color mosaic image to produce a resulting image; and supplying the resulting image to the processes of: (i) the first color difference image production; (ii) the second color difference image production; and (iii) the luminance image production.

12. The method of claim 11, further comprising performing a gradation reverse conversion corresponding to the gradation conversion process for all of the color components corresponding to each pixel restored by the process of the restoration.

13. A recording medium on which is stored a computer-readable program for producing a restoration image wherein each pixel has all of a plurality of color components using a color and sensitivity mosaic image wherein each pixel has a sensitivity and one of the plurality of color components and a color mosaic image wherein each pixel has one of the plurality of color components, the program comprising:
  a sensitivity uniformization step of uniformizing the sensitivities of the pixels of the color and sensitivity mosaic image;
  a first color difference image production step of producing a first color difference image corresponding to the color mosaic image based on color mosaic patter information which indicates an arrangement of the color components of the color mosaic image, wherein the first color difference image production step includes:
    (a) a first smoothing step of smoothing a first color component of the color mosaic image to produce a first smoothed image,
    (b) a second smoothing step of smoothing a second color component of the color mosaic image to produce a second smoothed image, and
    (c) a first subtraction step of subtracting color components of corresponding pixels of the first smoothed image and the second smoothed image to produce the first color difference image; and
  a second color difference image production step of producing a second color difference image corresponding to the color mosaic image based on the color mosaic pattern information, wherein the second color difference image production step includes:
    (a) a third smoothing step of smoothing the first color component of the color mosaic image to produce a third smoothed image,
    (b) a fourth smoothing step of smoothing the second color component of the color mosaic image to produce a fourth smoothed image, and
    (c) a second subtraction step of subtracting color components of corresponding pixels of the third smoothed image and the fourth smoothed image to produce the second color difference image; and
  a luminance image production step of producing a luminance image using: (i) the first color difference image; (ii) the second color difference image; and (iii) the color mosaic image; and
  a restoration step of restoring all of the color components corresponding to each pixel using: (i) the first color difference image; (ii) the second color difference image; and (iii) the luminance image.

14. The recording medium of claim 13, wherein each of said smoothing steps use a direction selective smoothing process to produce at least one of: the first smoothed image; the second smoothed image; the third smoothed image; and the fourth smoothed image.

15. The recording medium of claim 13, wherein the luminance image production step further includes:
  a luminance candidate image production step of producing a luminance candidate image using the first and second color difference images and the color mosaic image; and
  a noise removal step of removing noise components of the luminance candidate image to produce the luminance image.

16. The recording medium of claim 15, wherein the process of the noise removal step removes the noise components of the luminance candidate image using the direction selective smoothing process to produce the luminance image.

17. The recording medium of claim 13, wherein the program further comprises a gradation conversion step of performing a gradation conversion process for the color mosaic image to produce a resulting image and supplying the resulting image to the processes of the first and second color difference image production steps and the process of the luminance image production step.

18. The recording medium of claim 17, wherein the program further comprises a gradation reverse conversion step of performing a gradation reverse conversion step corresponding to the gradation conversion process for all of the color components corresponding to each pixel restored by the process of the restoration step.

19. The image processing apparatus of claim 1, wherein the sensitivity uniformization unit does not change the colors of the pixels of the color and sensitivity mosaic image.

20. The image processing apparatus of claim 1, wherein the sensitivity uniformization unit changes the colors of the pixels of the color and sensitivity mosaic image.

21. The image processing apparatus of claim 1, wherein the sensitivity uniformization unit includes a sensitivity compensation unit, a validity discrimination unit, and a missing interpolation unit.

22. The image processing apparatus of claim 1, wherein the sensitivity uniformization unit includes interpolation units.

23. The image processing apparatus of claim 2, wherein the first and second smoothing units use the direction selective smoothing process while detecting contours in the color mosaic image.

24. The method of claim 7, wherein uniformizing the sensitivities of the pixels does not change the colors of the pixels of the color and sensitivity mosaic image.

25. The method of claim 7, wherein uniformizing the sensitivities of the pixels changes the colors of the pixels of the color and sensitivity mosaic image.

26. The method of claim 7, wherein uniformizing the sensitivities further comprises compensating sensitivities, discriminating whether sensitivities are valid, and interpolating missing sensitivities.

27. The method of claim 7, wherein the step of uniformizing the sensitivities further comprises interpolating sensitivities.

28. The method of claim 8, wherein the direction selective smoothing process is used while detecting contours in the color mosaic image.

29. The recording medium of claim 13, wherein the sensitivity uniformization step does not change the colors of the pixels of the color and sensitivity mosaic image.

30. The recording medium of claim 13, wherein the sensitivity uniformization step changes the colors of the pixels of the color and sensitivity mosaic image.

31. The recording medium of claim 13, wherein the sensitivity uniformization step further includes the steps of compensating sensitivities, discriminating whether sensitivities are valid, and interpolating missing sensitivities.

32. The recording medium of claim 13, wherein the sensitivity uniformization step further includes the step of interpolating sensitivities.

33. The recording medium of claim 14, wherein the processes of the first and second smoothing steps use the direction selective smoothing process while detecting contours in the color mosaic image.

34. The image processing apparatus of claim 5, wherein each of said smoothing units determine whether each pixel of the resulting image has been used as a notice pixel.

35. The method of claim 11, which includes determining whether each pixel of the resulting image has been used as a notice pixel.

36. The recording medium of claim 17, wherein each of said smoothing steps includes determining whether each pixel of the resulting image has been used as a notice pixel.

* * * * *